US012740313B2

(12) United States Patent
Lee et al.

(10) Patent No.: US 12,740,313 B2
(45) Date of Patent: Sep. 15, 2026

(54) ORGANOMETALLIC COMPOUND AND LIGHT-EMITTING DEVICE INCLUDING THE SAME

(71) Applicant: Samsung Display Co., Ltd., Yongin-si (KR)

(72) Inventors: Hyun-jung Lee, Yongin-si (KR); Il-Joon Kang, Yongin-si (KR); Soo-byung Ko, Yongin-si (KR); Sujin Shin, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1069 days.

(21) Appl. No.: 17/742,222

(22) Filed: May 11, 2022

(65) Prior Publication Data

US 2023/0047086 A1 Feb. 16, 2023

(30) Foreign Application Priority Data

Jun. 23, 2021 (KR) ........................ 10-2021-0081664

(51) Int. Cl.
*H10K 85/30* (2023.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
CPC .... H10K 85/346; H10K 50/11; H10K 59/123; H10K 2101/10; H10K 2101/30;
(Continued)

(56) References Cited

U.S. PATENT DOCUMENTS 7,652,287 B2 * 1/2010 Jeong ................. H10D 30/6755
257/E29.151
9,238,668 B2 1/2016 Li et al.
(Continued)

FOREIGN PATENT DOCUMENTS

| KR | 10-2015-0043225 A | 4/2015 |
|---|---|---|
| KR | 10-2021-0017822 A | 2/2021 |
| KR | 10-2022-0128311 A | 9/2022 |

*Primary Examiner* — Braelyn R Watson
(74) *Attorney, Agent, or Firm* — Womble Bond Dickinson (US) LLP

(57) ABSTRACT

An organometallic compound represented by Formula 1 emits deep blue light. A light-emitting device including the organometallic compound, and an electronic apparatus including the light-emitting device may have excellent or suitable driving voltage, luminescence efficiency, color conversion efficiency, and/or lifespan characteristics:
(Continued)

Formula 1

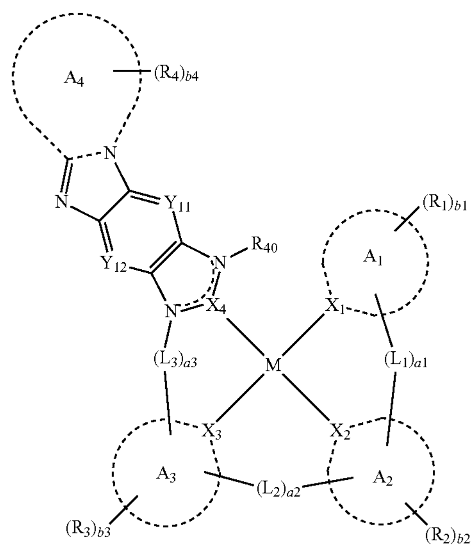

In Formula 1, $X_1$ to $X_4$ are each independently C or N, $Y_{11}$ is $C(Z_{11})$ or N, and $Y_{12}$ is $C(Z_{12})$ or N.

19 Claims, 3 Drawing Sheets

(51) Int. Cl.

| | |
|---|---|
| ***C09K 11/06*** | (2006.01) |
| ***H10K 50/11*** | (2023.01) |
| ***H10K 59/123*** | (2023.01) |
| ***H10K 101/00*** | (2023.01) |
| ***H10K 101/10*** | (2023.01) |
| ***H10K 101/30*** | (2023.01) |

(52) U.S. Cl.
CPC ................. *C09K 2211/1074* (2013.01); *C09K 2211/185* (2013.01); *H10K 50/11* (2023.02); *H10K 59/123* (2023.02); *H10K 2101/10* (2023.02); *H10K 2101/30* (2023.02); *H10K 2101/90* (2023.02)

(58) Field of Classification Search
CPC .. H10K 2101/90; H10K 50/12; H10K 85/658; H10K 85/40; H10K 85/654; H10K 85/6572; H10K 85/6574; H10K 50/125; H10K 50/86; H10K 59/38; H10K 59/40; H10K 85/30–351; H10K 85/371; H10K 85/381; C07F 15/0086; C07F 5/00; C07F 5/003; C07F 5/06–069; C07F 7/00; C07F 7/003; C07F 7/22–28; C07F 9/00; C07F 9/005; C09K 11/06; C09K 2211/1074; C09K 2211/185; C09K 2211/182–188; H01L 51/0087; H01L 51/0077; H01L 51/0078; H01L 51/0079; H01L 51/008; H01L 51/0081; H01L 51/0082; H01L 51/0083; H01L 51/0084; H01L 51/0085; H01L 51/0086; H01L 51/0088; H01L 51/0089; H01L 51/0091; H01L 51/0092
See application file for complete search history.

(56) References Cited

U.S. PATENT DOCUMENTS

| | | | | |
|---|---|---|---|---|
| 9,318,725 | B2 | 4/2016 | Li | |
| 9,425,415 | B2 | 8/2016 | Li et al. | |
| 9,461,254 | B2 | 10/2016 | Tsai et al. | |
| 9,698,359 | B2 | 7/2017 | Li et al. | |
| 9,899,614 | B2 | 2/2018 | Li et al. | |
| 2004/0080267 | A1* | 4/2004 | Cok ...................... | H10K 59/40 313/512 |
| 2013/0048963 | A1 | 2/2013 | Beers et al. | |
| 2014/0364605 | A1 | 12/2014 | Li et al. | |
| 2015/0236274 | A1* | 8/2015 | Hatakeyama ........ | H10K 85/631 548/405 |
| 2017/0346029 | A1* | 11/2017 | Kim .................... | H10K 85/111 |
| 2020/0119289 | A1 | 4/2020 | Lin et al. | |
| 2020/0152891 | A1 | 5/2020 | Li et al. | |
| 2021/0043856 | A1 | 2/2021 | Min et al. | |
| 2022/0310944 | A1* | 9/2022 | Fleetham .............. | C07B 59/004 |

* cited by examiner

ORGANOMETALLIC COMPOUND AND LIGHT-EMITTING DEVICE INCLUDING THE SAME

CROSS-REFERENCE TO RELATED APPLICATION

This application claims priority to and the benefit of Korean Patent Application No. 10-2021-0081664, filed on Jun. 23, 2021, in the Korean Intellectual Property Office, the entire content of which is hereby incorporated by reference.

BACKGROUND

1. Field

One or more aspects of embodiments of the present disclosure relate to an organometallic compound and a light-emitting device including the organometallic compound.

2. Description of the Related Art

Organic light-emitting devices are self-emissive devices that have wide viewing angles, high contrast ratios, short response times, and excellent or suitable characteristics in terms of luminance, driving voltage, and/or response speed, compared to devices in the art.

An example organic light-emitting device includes a first electrode located on a substrate, and a hole transport region, an emission layer, an electron transport region, and a second electrode sequentially stacked on the first electrode. Holes provided from the first electrode move toward the emission layer through the hole transport region, and electrons provided from the second electrode move toward the emission layer through the electron transport region. Carriers (such as holes and electrons) may recombine in the emission layer to produce excitons. These excitons transition from an excited state to the ground state to thereby generate light.

SUMMARY

One or more aspects of embodiments of the present disclosure are directed toward an organometallic compound having low driving voltage, excellent or suitable luminescence efficiency, long lifespan, and/or excellent or suitable color purity, and a light-emitting device including the same.

Additional aspects will be set forth in part in the description that follows and, in part, will be apparent from the description, or may be learned by practice of the presented embodiments of the disclosure.

One or more embodiments of the present disclosure provide a light-emitting device including:

a first electrode, a second electrode facing the first electrode, and an interlayer located between the first electrode and the second electrode and including an emission layer, wherein the emission layer includes:

i) a first compound, which is an organometallic compound represented by Formula 1, and ii) a second compound including at least one π electron-deficient nitrogen-containing $C_1$-$C_{60}$ cyclic group, a third compound including a group represented by Formula 3, a fourth compound to emit delayed fluorescence, or any combination thereof, and the first compound, the second compound, the third compound, and the fourth compound are different from each other.

Formula 1

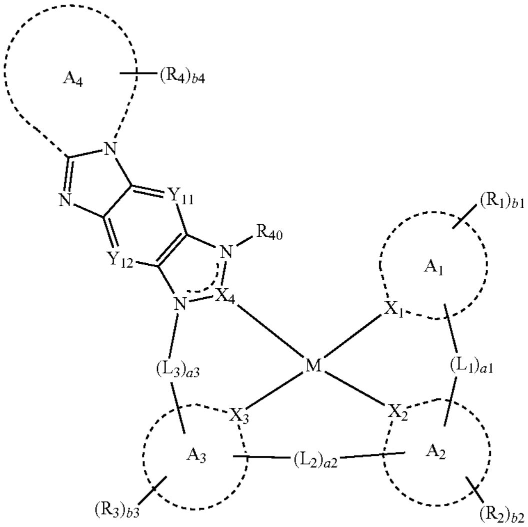

Formula 3

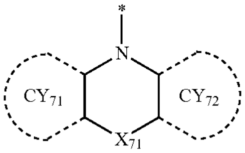

In Formula 1,

M may be platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_4$ may each independently be C or N, $Y_{11}$ may be $C(Z_{11})$ or N, $Y_{12}$ may be $C(Z_{12})$ or N, $A_1$ to $A_4$ may each independently be a $C_3$-$C_{60}$ carbocyclic group or a $C_1$-$C_{60}$ heterocyclic group, $L_1$ to $L_3$ may each independently be a single bond, a double bond, $*—N(Z_{21})—*'$, $*—B(Z_{21})—*'$, $*—P(Z_{21})—*'$, $*—C(Z_{21})(Z_{22})—*'$, $*—Si(Z_{21})(Z_{22})—*'$, $*—Ge(Z_{21})(Z_{22})—*'$, $*—S—*'$, $*—Se—*'$, $*—O—*'$, $*—C(=O)—*'$, $*—S(=O)—*'$, $*—S(=O)_2—*'$, $*—C(Z_{21})=*'$, $*=C(Z_{21})—*'$, $*—C(Z_{21})=C(Z_{22})—*'$, $*—C(=S)—*'$, or $*—C≡C—*'$,

* and *' each indicate a binding site to a neighboring atom, a1 to a3 may each independently be an integer from 0 to 3, $R_1$ to $R_4$, $R_{40}$, $Z_{11}$, $Z_{12}$, $Z_{21}$, and $Z_{22}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), two or more neighboring groups of $R_1$ to $R_4$, $R_{40}$, $Z_{11}$, $Z_{12}$, $Z_{21}$, and $Z_{22}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b1 to b4 may each independently be an integer from 0 to 10, when b1 is 2 or more, two or more $R_1$(s) may be identical to or different from each other, when b2 is 2 or more, two or more $R_2$(s) may be identical to or different from each other, when b3 is 2 or more, two or more $R_3$(s) may be identical to or different from each other, and when b4 is 2 or more, two or more $R_4$(s) may be identical to or different from each other, $R_{10a}$ may be:

deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(=O)($Q_{11}$), —S(=O)($Q_{11}$), —S(=O)$_2$($Q_{11}$), —P(=O)($Q_{11}$)($Q_{12}$), —P(=S)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(=O)($Q_{21}$), —S(=O)($Q_{21}$), —S(=O)$_2$($Q_{21}$), —P(=O)($Q_{21}$)($Q_{22}$), —P(=S)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)($Q_{31}$), —S(=O)$_2$($Q_{31}$), —P(=O)($Q_{31}$)($Q_{32}$), or —P(=S)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and wherein, in Formula 3, ring $CY_{71}$ and ring $CY_{72}$ may each independently be a π electron-rich $C_3$-$C_{60}$ cyclic group or a pyridine group, $X_{71}$ may be a single bond or a linking group including O, S, N, B, C, Si, or any combination thereof, and

* may indicate a binding site to a neighboring atom in Formula 3.

One or more embodiments of the present disclosure provide an electronic apparatus including the light-emitting device.

One or more embodiments of the present disclosure provide the organometallic compound represented by Formula 1.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
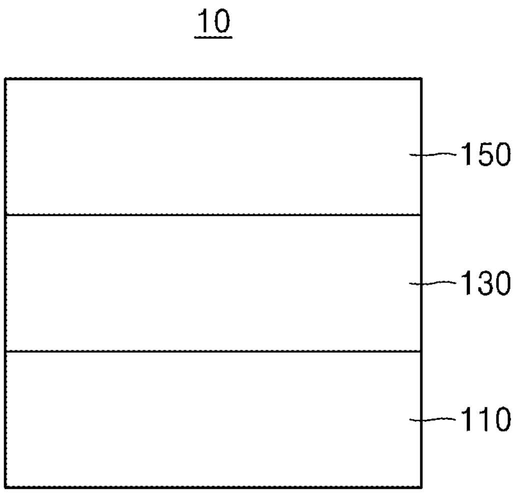
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" may indicate only a, only b, only c, both (e.g., simultaneously) a and b, both (e.g., simultaneously) a and c, both (e.g., simultaneously) b and c, all of a, b, and c, or variations thereof.

As used herein, singular forms such as "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list.

The term "may" will be understood to refer to "one or more embodiments," some of which include the described element and some of which exclude that element and/or include an alternate element. Similarly, alternative language such as "or" refers to "one or more embodiments," each including a corresponding listed item.

According to an aspect, an organometallic compound may be represented by Formula 1:

Formula 1

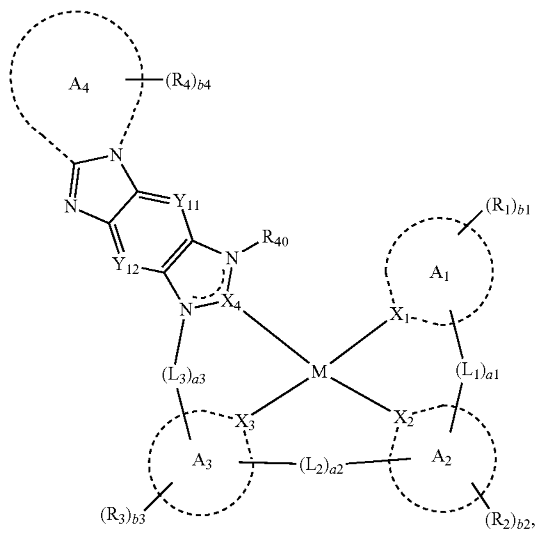

wherein, in Formula 1, M may be platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm).

In an embodiment, M may be platinum (Pt), palladium (Pd), copper (Cu), silver (Ag), or gold (Au).

In an embodiment, M may be platinum (Pt), but embodiments of the present disclosure are not limited thereto.

In Formula 1, $X_1$ to $X_4$ may each independently be C or N.

In an embodiment, $X_1$ may be N, and $X_2$ to $X_4$ may each be C, but embodiments of the present disclosure are not limited thereto.

In an embodiment, the bond between $X_1$ and M, the bond between $X_2$ and M, and the bond between $X_3$ and M may each be a covalent bond, and the bond between $X_4$ and M may be a coordinate bond, but embodiments of the present disclosure are not limited thereto.

In Formula 1, $Y_{11}$ may be $C(Z_{11})$ or N, and $Y_{12}$ may be $C(Z_{12})$ or N. $Z_{11}$ and $Z_{12}$ may be the same as described in the present specification.

In an embodiment, $Y_{11}$ may be $C(Z_{11})$, $Y_{12}$ may be $C(Z_{12})$, and $Z_{11}$ and $Z_{12}$ may each independently be: hydrogen, deuterium, —F, —Cl, —Br, —I, a hydroxyl group, a cyano group, or a nitro group; or a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, —$Si(Q_{31})(Q_{32})(Q_{33})$, —$B(Q_{31})(Q_{32})$, or any combination thereof. $Q_{31}$ to $Q_{33}$ may be the same as those described in the present specification.

In Formula 1, $A_1$ to $A_4$ may each independently be a $C_3$-$C_{60}$ carbocyclic group or a $C_1$-$C_{60}$ heterocyclic group.

In an embodiment, $A_1$ to $A_3$ may each independently be:

a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

In an embodiment, $A_1$ and $A_3$ may each independently be a benzene group, a pyridine group, or a pyrimidine group, and $A_2$ may be a carbazole group, but embodiments of the present disclosure are not limited thereto.

In an embodiment, $A_4$ may be a cyclohexane group, a pyridine group, a pyrimidine group, a pyrazine group, a pyridazine group, a quinoline group, an isoquinoline group, a piperidine group, a tetrahydropyridine group, a dihydropyridine group, a hexahydropyrimidine group, a tetrahydropyrimidine group, a piperazine group, a tetrahydropyrazine group, a dihydropyrazine group, a hexahydropyridazine group, a tetrahydropyridazine group, a dihydropyridazine group, a 1,2,3,4-tetrahydroisoquinoline group, a 1,2,3,4-tetrahydroquinoline group, a 5,6,7,8-tetrahydroisoquinoline group, or a 5,6,7,8-tetrahydroquinoline group, but embodiments of the present disclosure are not limited thereto.

In an embodiment, a group represented by

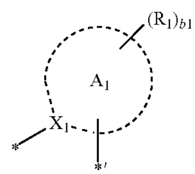

in Formula 1 may be represented by one of Formulae A1(1) to A1(15):

A1(1)

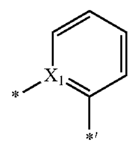

A1(2)

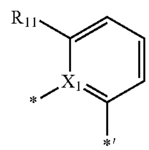

-continued

A1(3)

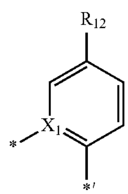

A1(4)

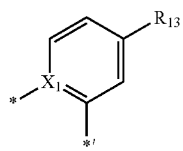

A1(5)

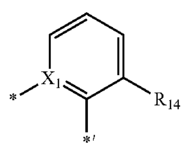

A1(6)

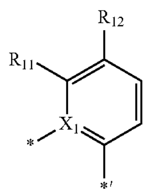

A1(7)

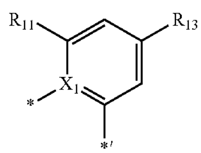

A1(8)

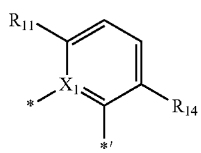

A1(9)

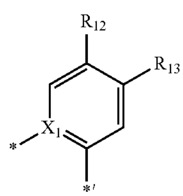

A1(10)

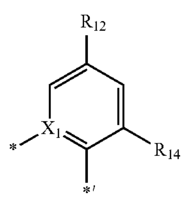

A1(11)

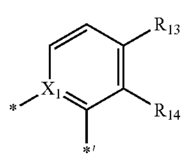

-continued

A1(12)

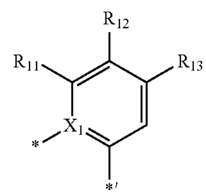

A1(13)

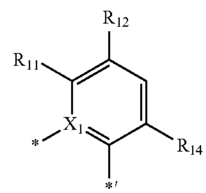

A1(14)

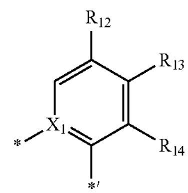

A1(15)

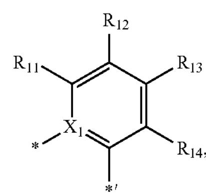

wherein, in Formulae A1(1) to A1(15), $X_1$ may be the same as described in the present specification, $R_{11}$ to $R_{14}$ may each independently be the same as described in connection with $R_1$, wherein $R_{11}$ to $R_{14}$ are each not hydrogen, and

* and *' each indicate a binding site to a neighboring atom.

In an embodiment, a group represented by

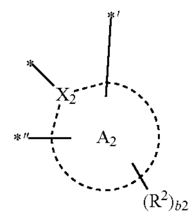

in Formula 1 may be represented by one of Formulae A2(1) to A2(7):

A2(1)

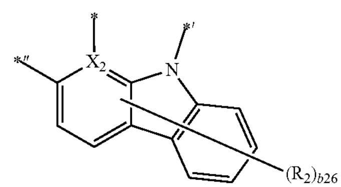

-continued
A2(2)
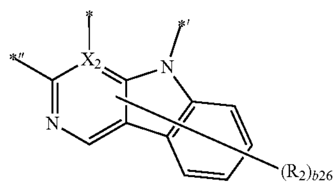
A2(3)
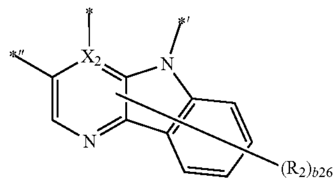
A2(4)
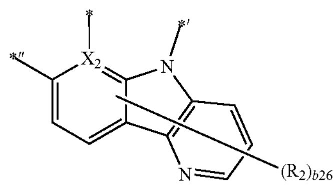
A2(5)
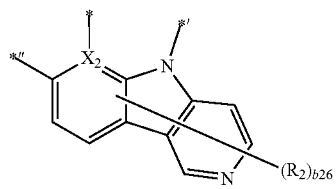
A2(6)
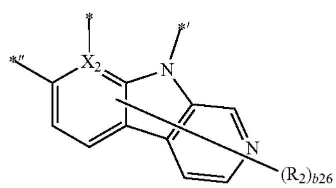
A2(7)
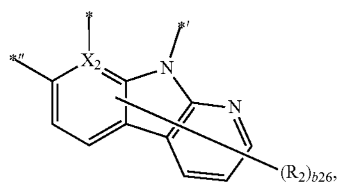
wherein, in Formulae A2(1) to A2(7),
$X_2$ and $R_2$ may each independently be the same as described in the present specification,
b26 may be an integer from 0 to 6,
b25 may be an integer from 0 to 5, and
*, *', and *" each indicates a binding site to a neighboring atom.
In an embodiment, a group represented by
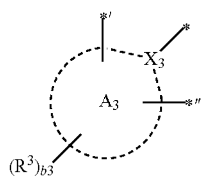
in Formula 1 may be represented by one of Formulae A3(1) to A3(8):
A3(1)
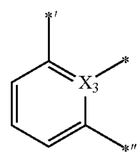
A3(2)
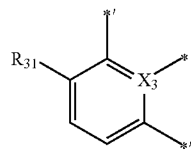
A3(3)
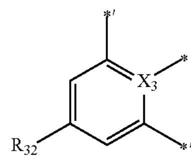
A3(4)
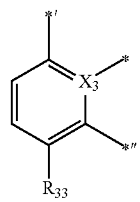
A3(5)
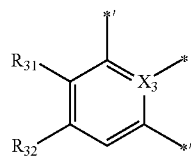
A3(6)
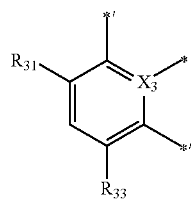
A3(7)
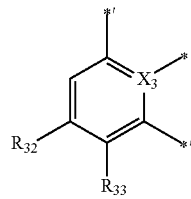
A3(8)
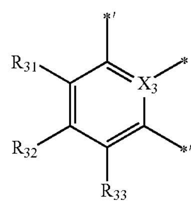

wherein, in Formulae A3(1) to A3(8), $X_3$ may be the same as described in the present specification, $R_{31}$ to $R_{33}$ may each independently be the same as described in connection with $R_3$, wherein $R_{31}$ to $R_{33}$ are each not hydrogen, and

*, *', and *" each indicates a binding site to a neighboring atom.

In an embodiment, a group represented by

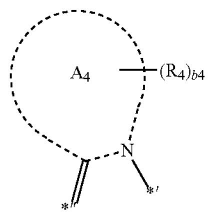

in Formula 1 may be represented by one of Formulae A4(1) to A4(8):

A4(1)

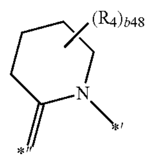

A4(2)

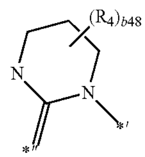

A4(3)

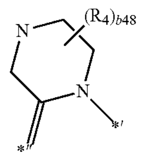

A4(4)

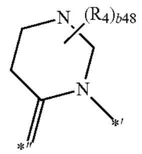

A4(5)

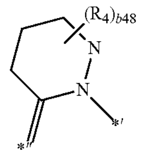

A4(6)

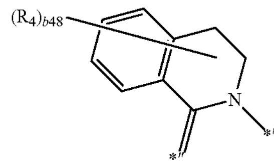

-continued

A4(7)

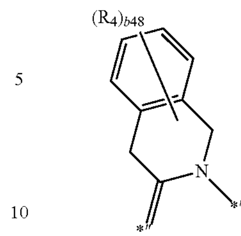

A4(8)

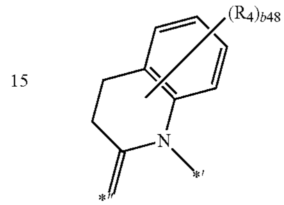

wherein, in Formulae A4(1) to A4(8), $R_4$ may be the same as described in the present specification, b48 may be an integer from 0 to 8, b47 may be an integer from 0 to 7, and

*' and *" each indicates a binding site to a neighboring atom.

In Formula 1, $L_1$ to $L_3$ may each independently be a single bond, a double bond, *—N($Z_{21}$)—*', *—B($Z_{21}$)—*', *—P($Z_{21}$)—*', *—C($Z_{21}$)($Z_{22}$)—*', *—Si($Z_{21}$)($Z_{22}$)—*', *—Ge($Z_{21}$)($Z_{22}$)—*', *—S*', *—Se—*', *—O—*', *—C(=O)—*', *—S(=O)—*', *—S(=O)$_2$—*', *—C($Z_{21}$)=*', *=C($Z_{21}$)—*', *—C($Z_{21}$)=C($Z_{22}$)—*', *—C(=S)—*', or *—C≡C—*', * and *' each indicate a binding site to a neighboring atom, and $Z_{21}$ and $Z_{22}$ may each independently be the same as those described in the present specification.

In an embodiment, $L_1$ to $L_3$ may each independently be a single bond, *—C($Z_{21}$)($Z_{22}$)—*', *—S*', *—O—*', *—C(=O)—*', or *—S(=O)—*'.

In an embodiment, $L_1$ to $L_3$ may each independently be a single bond, *—C($Z_{21}$)($Z_{22}$)—*', *—O—*', or *—C(=O)*'.

In Formula 1, a1 to a3 may each independently be an integer from 0 to 3. a1, a2, and a3 in Formula 1 indicate numbers (e.g., the multiplicity) of $L_1$, $L_2$, and $L_3$, respectively. When a1, a2, or a3 is 2 or more, the two or more $L_1$(s), two or more $L_2$(s), or two or more $L_3$(s) may each be identical to or different from each other.

In an embodiment, a1 to a3 may each independently be 0 or 1, but embodiments of the present disclosure are not limited thereto.

In Formula 1, $R_1$ to $R_4$, $R_{40}$, $Z_{11}$, $Z_{12}$, $Z_{21}$, and $Z_{22}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$). $R_{10a}$ and $Q_1$ to $Q_3$ may each independently be the same as described in the present specification.

In Formula 1, two or more neighboring groups of $R_1$ to $R_4$, $R_{40}$, $Z_{11}$, $Z_{12}$, $Z_{21}$, and $Z_{22}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, $R_1$ to $R_4$, $R_{40}$, $Z_{11}$, $Z_{12}$, $Z_{21}$, and $Z_{22}$ may each independently be: hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopropyl group, a cyclobutyl group, a cyclopentyl group, a cyclohexyl group, a cycloheptyl group, a cyclooctyl group, an adamantanyl group, a norbornanyl group, a norbornenyl group, a cyclopropenyl group, a cyclobutenyl group, a cyclopentenyl group, a cyclohexenyl group, a cycloheptenyl group, a phenyl group, a naphthyl group, —Si($Q_{31}$)($Q_{32}$)($Q_{33}$), —B($Q_{31}$)($Q_{32}$), or any combination thereof, a cyclopropyl group, a cyclobutyl group, a cyclopentyl group, a cyclohexyl group, a cycloheptyl group, a cyclooctyl group, an adamantanyl group, a norbornanyl group, a norbornenyl group, a cyclopropenyl group, a cyclobutenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, a carbazolyl group, a phenanthrolinyl group, a benzofuranyl group, a benzothiophenyl group, a dibenzofuranyl group, a dibenzothiophenyl group, a benzocarbazolyl group, or a dibenzocarbazolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopropyl group, a cyclobutyl group, a cyclopentyl group, a cyclohexyl group, a cycloheptyl group, a cyclooctyl group, an adamantanyl group, a norbornanyl group, a norbornenyl group, a cyclopropenyl group, a cyclobutenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, a carbazolyl group, a phenanthrolinyl group, a benzofuranyl group, a benzothiophenyl group, a dibenzofuranyl group, a dibenzothiophenyl group, a benzocarbazolyl group, a dibenzocarbazolyl group, —Si($Q_{31}$)($Q_{32}$)($Q_{33}$), —B($Q_{31}$)($Q_{32}$), or any combination thereof, or —Si($Q_1$)($Q_2$)($Q_3$), or —B($Q_1$)($Q_2$). $Q_1$ to $Q_3$ and $Q_{31}$ to $Q_{33}$ may each independently be the same as described in the present specification.

In an embodiment, $R_1$ to $R_4$, $R_{40}$, $Z_{11}$, $Z_{12}$, $Z_{21}$, and $Z_{22}$ may each independently be hydrogen, deuterium, —F, —Cl, —Br, —I, a hydroxyl group, a cyano group, a nitro group, a group represented by one of Formulae 9-1 to 9-20, a group represented by one of Formulae 10-1 to 10-254, —Si($Q_1$)($Q_2$)($Q_3$), or —B($Q_1$)($Q_2$). $Q_1$ to $Q_3$ may each independently be the same as described in the present specification:

9-1

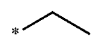

9-2

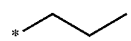

9-3

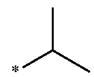

9-4

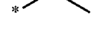

9-5

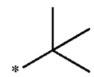

9-6

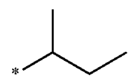

9-7

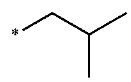

9-8

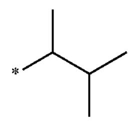

9-9

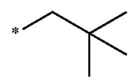

9-10

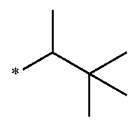

9-11

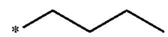

9-12

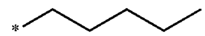

9-13

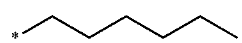

9-14

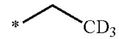

9-15

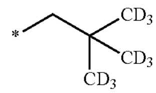

9-16

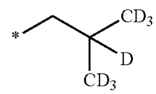

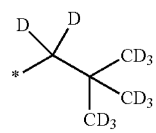

-continued
9-17
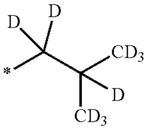
9-18
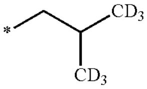
9-19
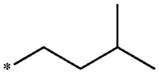
9-20
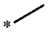
10-1
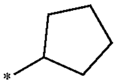
10-2
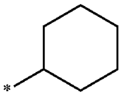
10-3
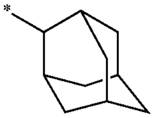
10-4
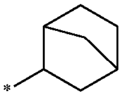
10-5
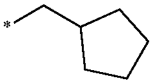
10-6
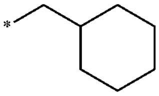
10-7
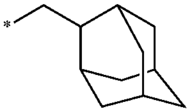
10-8
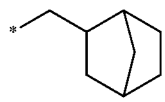
10-9
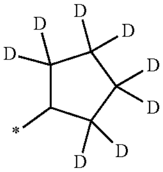
-continued
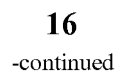
10-10
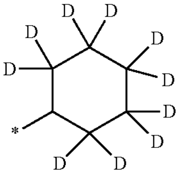
10-11
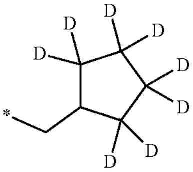
10-12
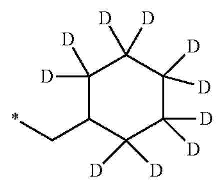
10-13
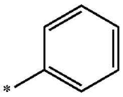
10-14
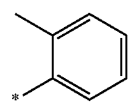
10-15
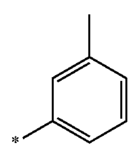
10-16
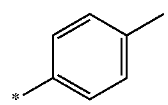
10-17
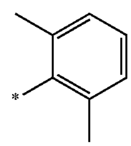
10-18
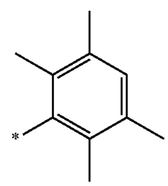
10-19
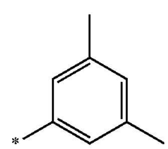

-continued
10-20
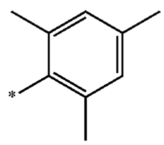
10-21
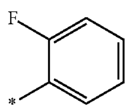
10-22
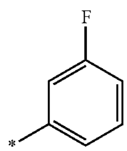
10-23
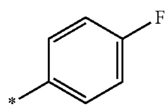
10-24
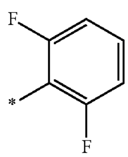
10-25
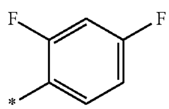
10-26
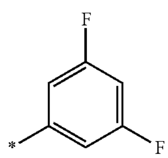
10-27
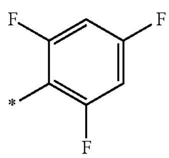
10-28
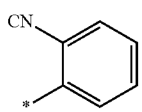
10-29
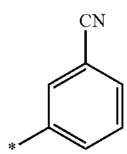
10-30
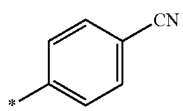
-continued
10-31
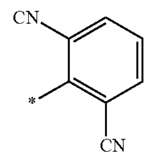
10-32
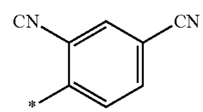
10-33
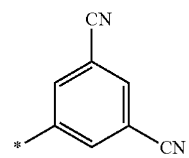
10-34
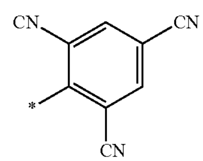
10-35
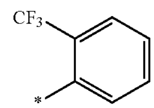
10-36
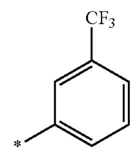
10-37
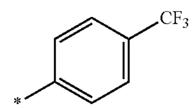
10-38
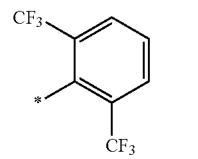
10-39
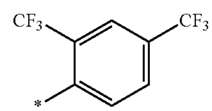
10-40
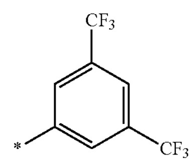
10-41
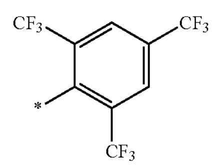

-continued
10-42
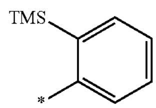
10-43
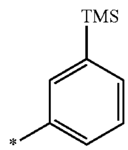
10-44
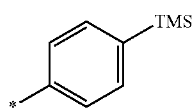
10-45
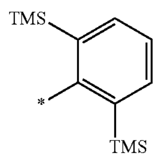
10-46
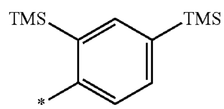
10-47
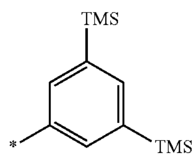
10-48
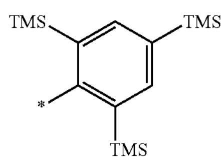
10-49
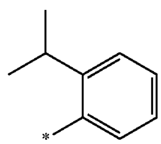
10-50
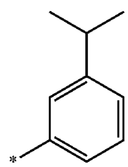
10-51
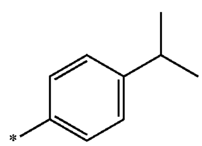
-continued
10-52
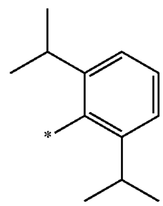
10-53
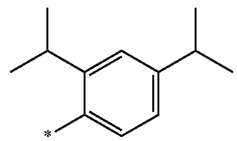
10-54
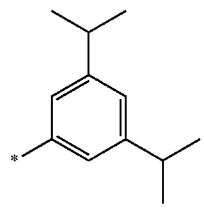
10-55
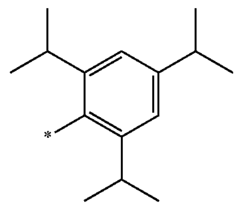
10-56
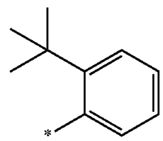
10-57
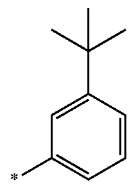
10-58
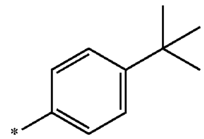
10-59
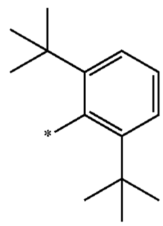

-continued
10-60
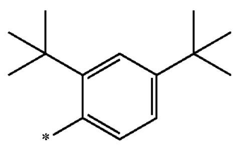
10-61
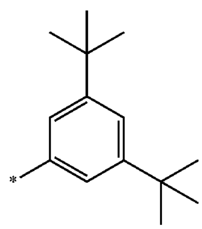
10-62
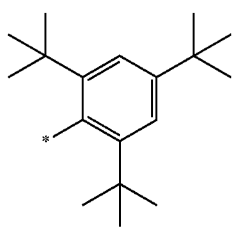
10-63
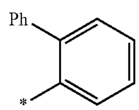
10-64
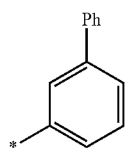
10-65
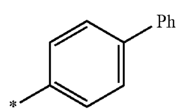
10-66
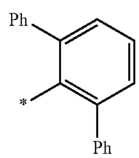
10-67
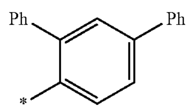
10-68
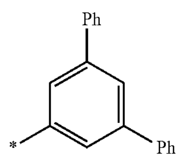
10-69
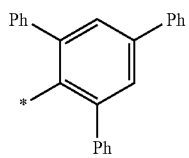
-continued
10-70
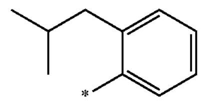
10-71
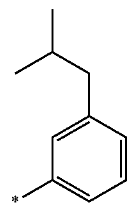
10-72
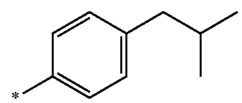
10-73
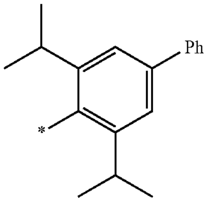
10-74
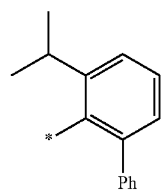
10-75
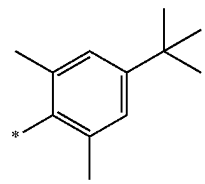
10-76
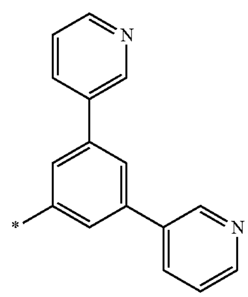
10-77
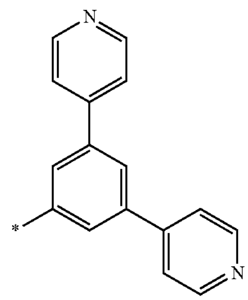

-continued
10-78
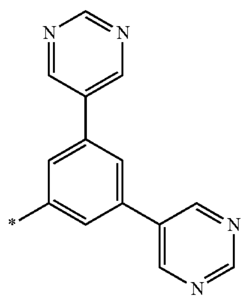
10-79
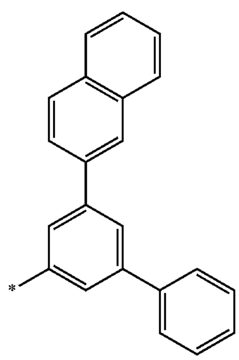
10-80
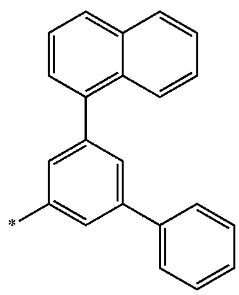
10-81
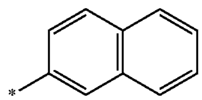
10-82
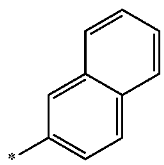
10-83
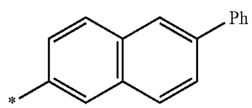
10-84
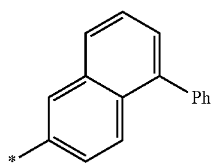
-continued
10-85
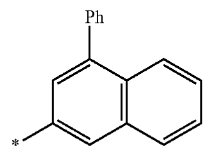
10-86
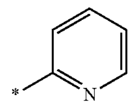
10-87
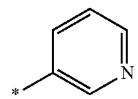
10-88
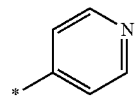
10-89
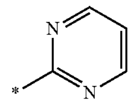
10-90
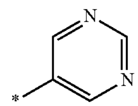
10-91
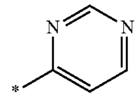
10-92
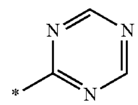
10-93
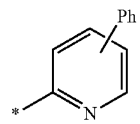
10-94
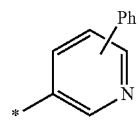
10-95
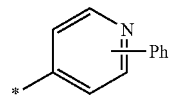
10-96
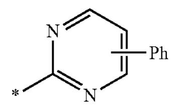
10-97
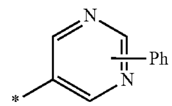

-continued
10-98
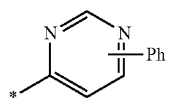
10-99
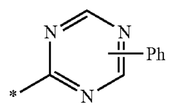
10-100
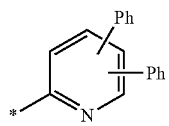
10-101
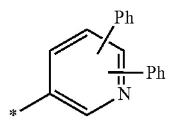
10-102
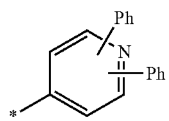
10-103
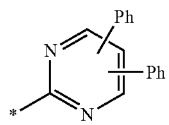
10-104
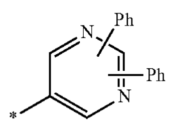
10-105
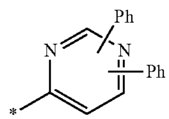
10-106
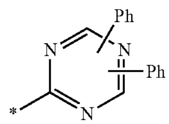
10-107
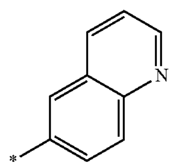
10-108
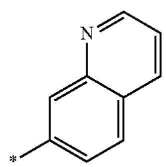
-continued
10-109
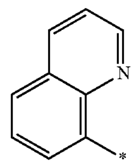
10-110
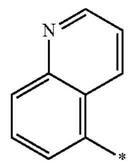
10-111
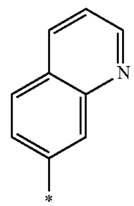
10-112
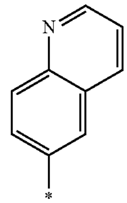
10-113
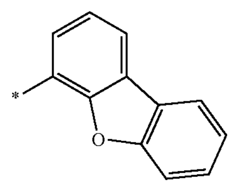
10-114
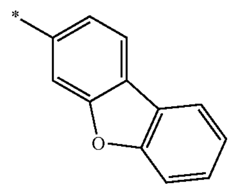
10-115
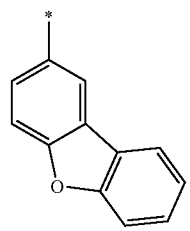
10-116
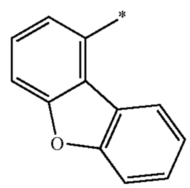

-continued
10-117
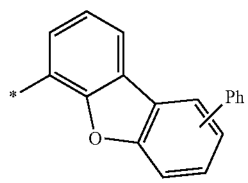
10-118
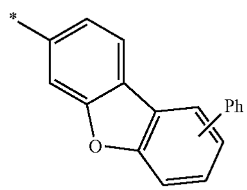
10-119
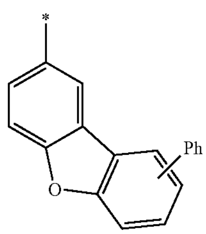
10-120
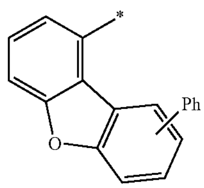
10-121
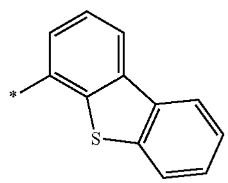
10-122
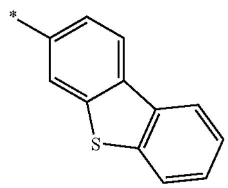
10-123
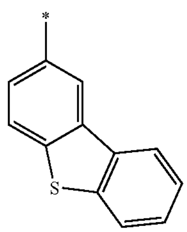
10-124
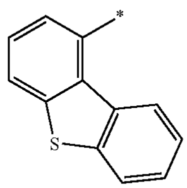
-continued
10-125
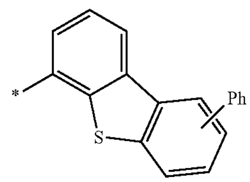
10-126
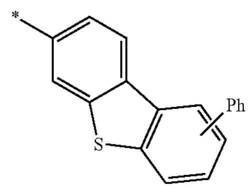
10-127
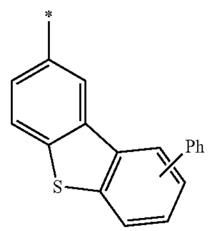
10-128
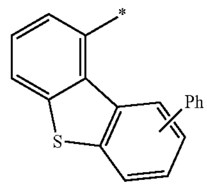
10-129
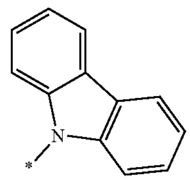
10-130
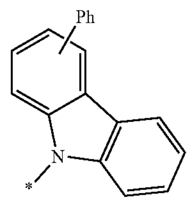
10-131
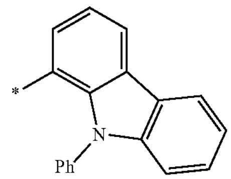
10-132
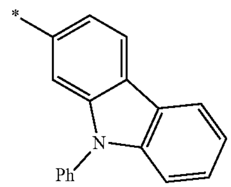

-continued
10-133
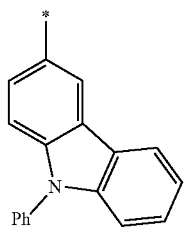
10-134
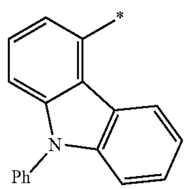
10-135
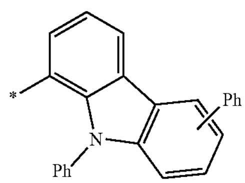
10-136
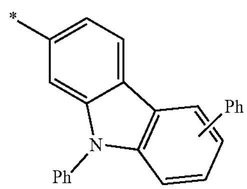
10-137
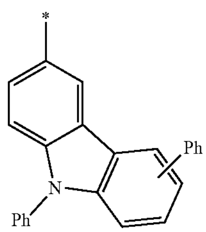
10-138
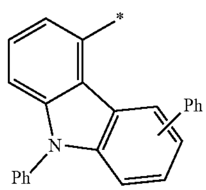
10-139
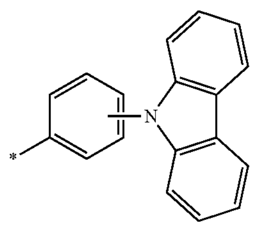
-continued
10-140
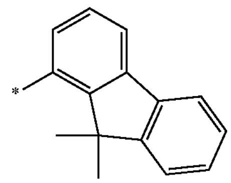
10-141
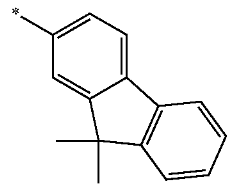
10-142
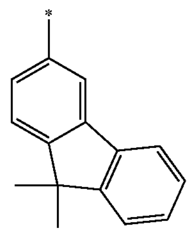
10-143
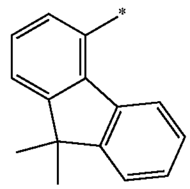
10-144
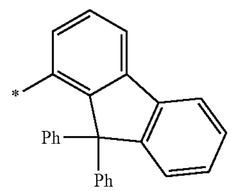
10-145
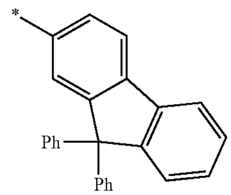
10-146
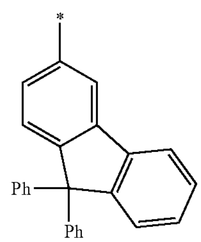

-continued
10-147
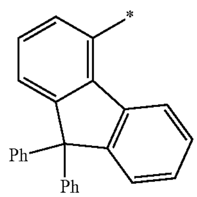
10-148
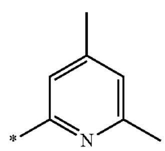
10-149
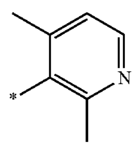
10-150
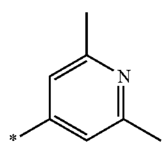
10-151
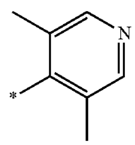
10-152
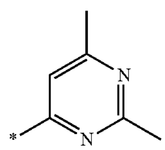
10-153
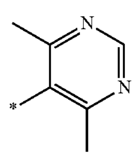
10-154
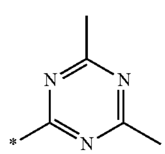
10-155
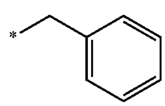
10-156
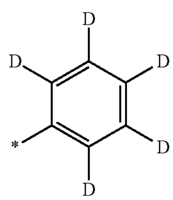
-continued
10-157
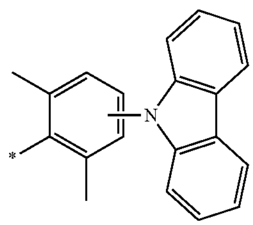
10-158
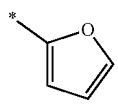
10-159
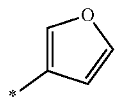
10-160
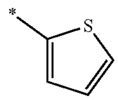
10-161
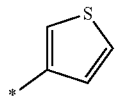
10-162
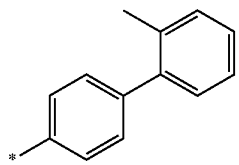
10-163
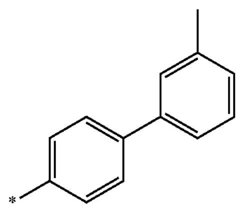
10-164
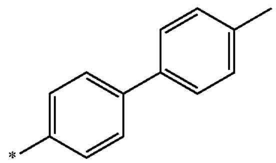
10-165
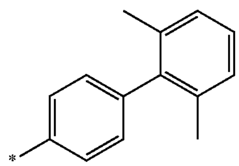
10-166
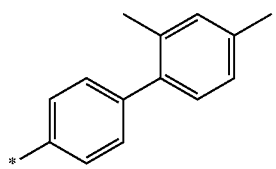

-continued
10-167
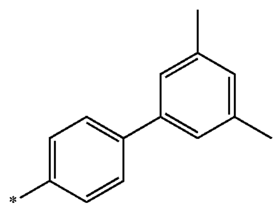
10-168
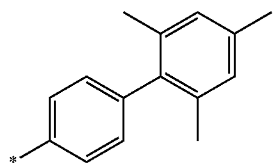
10-169
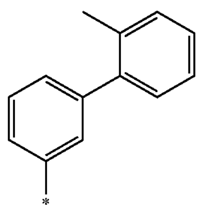
10-170
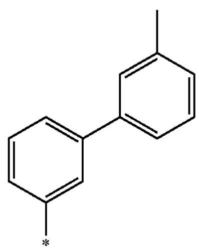
10-171
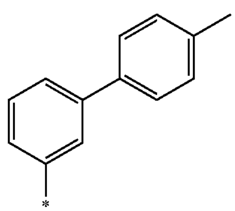
10-172
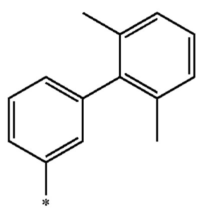
10-173
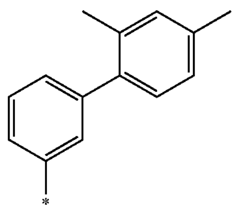
-continued
10-174
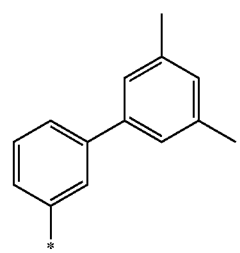
10-175
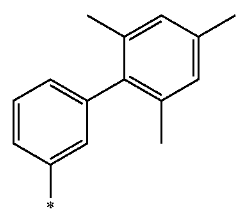
10-176
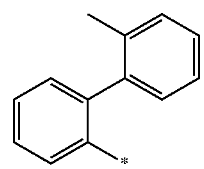
10-177
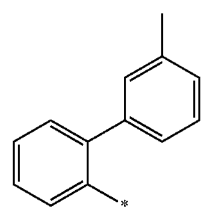
10-178
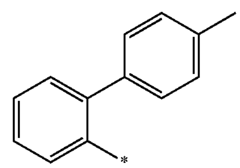
10-179
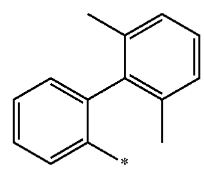
10-180
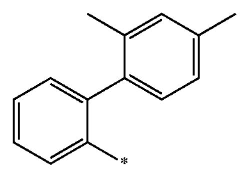
10-181
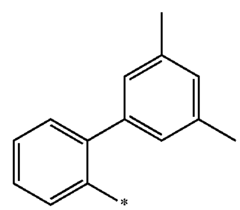

-continued
10-182
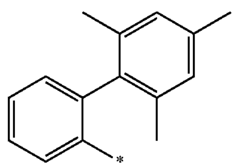
10-183
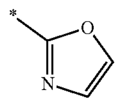
10-184
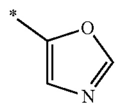
10-185
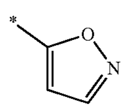
10-186
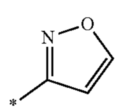
10-187
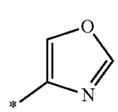
10-188
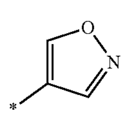
10-189
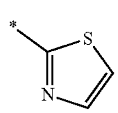
10-190
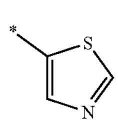
10-191
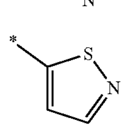
10-192
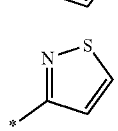
10-193
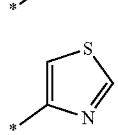
10-194
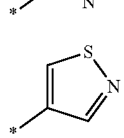
10-195
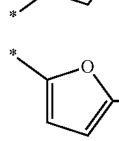
-continued
10-196
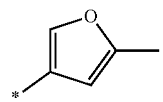
10-197
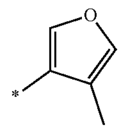
10-198
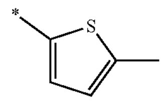
10-199
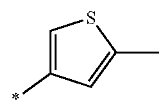
10-200
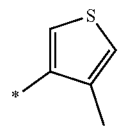
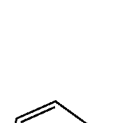
10-201
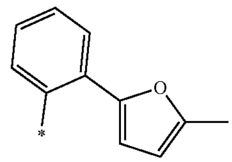
10-202
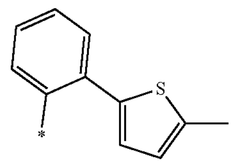
10-203
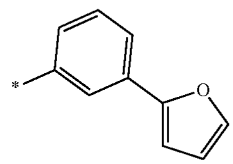
10-204
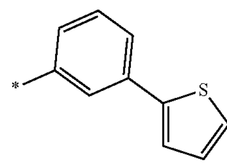
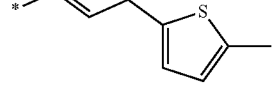
10-205
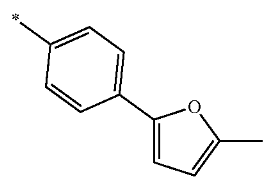

-continued
10-206
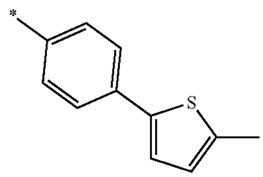
10-207
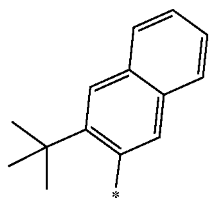
10-208
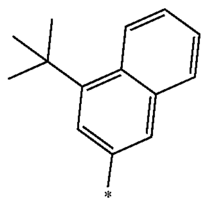
10-209
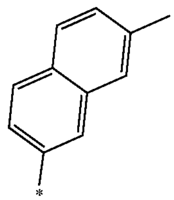
10-210
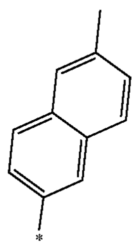
10-211
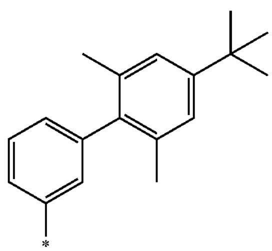
10-212
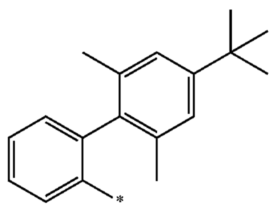
-continued
10-213
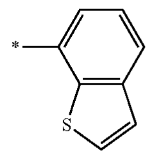
10-214
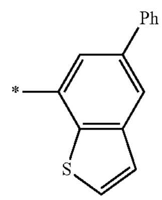
10-215
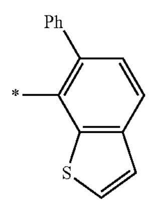
10-216
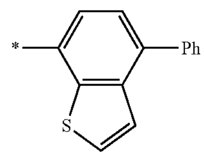
10-217
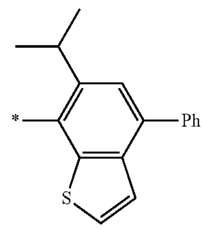
10-218
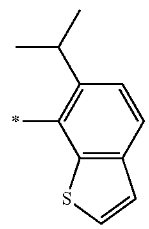
10-219
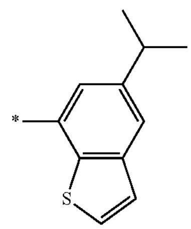
10-220
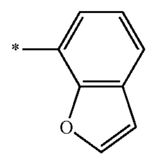

-continued
10-221
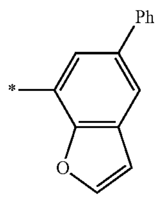
10-222
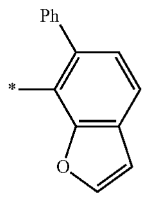
10-223
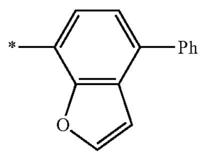
10-224
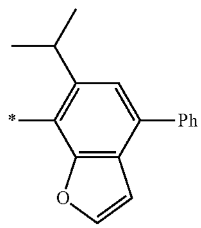
10-225
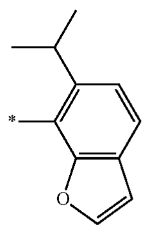
10-226
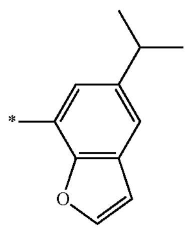
10-227
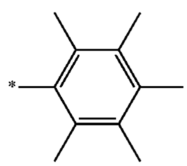
-continued
10-228
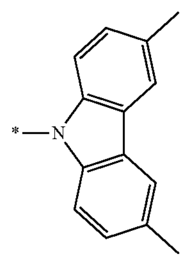
10-229
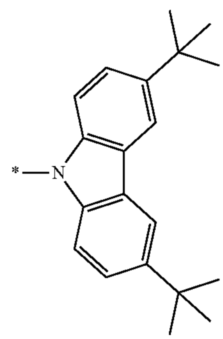
10-230
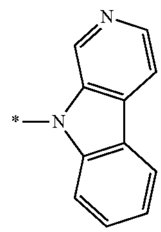
10-231
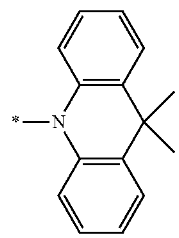
10-232
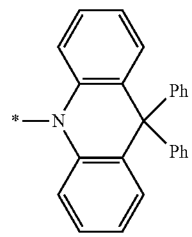
10-233
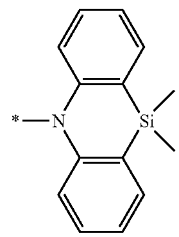

-continued
10-234
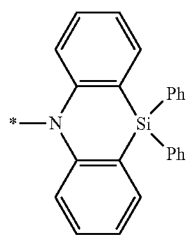
10-235
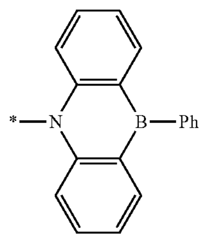
10-236
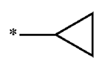
10-237
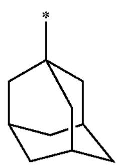
10-238
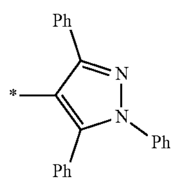
10-239
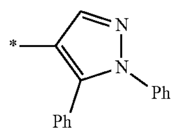
10-240
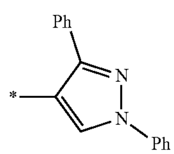
10-241
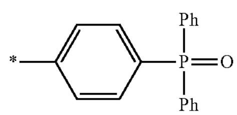
10-242
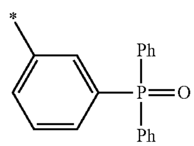
10-243
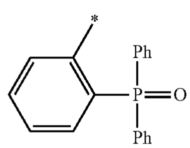
-continued
10-244
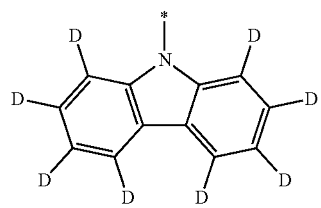
10-245
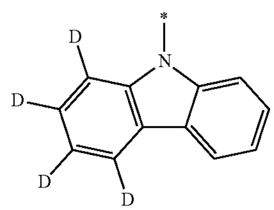
10-246
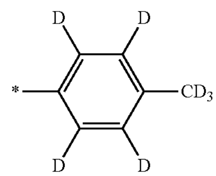
10-247
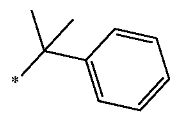
10-248
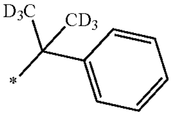
10-249
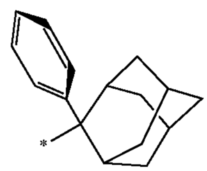
10-250
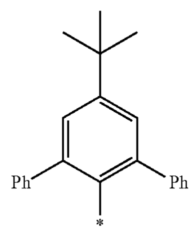
10-251
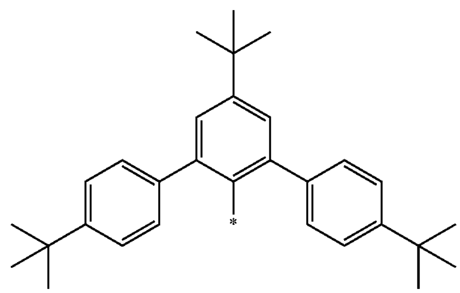

-continued
10-252
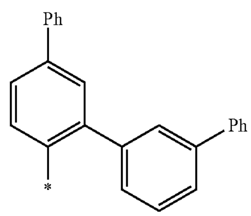
10-253
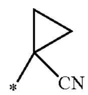
-continued
10-254
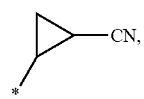
wherein, in Formulae 9-1 to 9-20 and Formulae 10-1 to 10-254,
* indicates a binding site to a neighboring atom, D is deuterium, Ph is a phenyl group, and TMS is a trimethylsilyl group.
In an embodiment, the organometallic compound represented by Formula 1 may be selected from among Compounds 1 to 98:
1
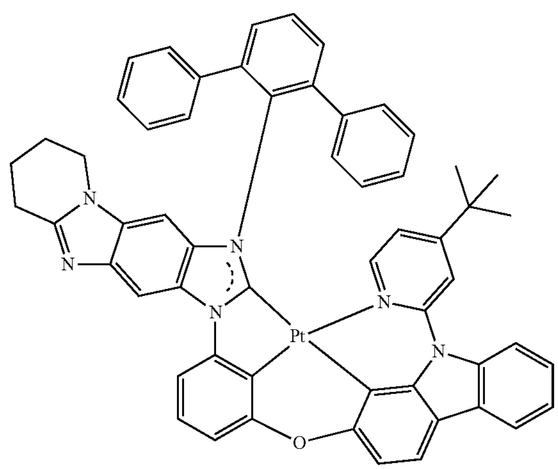
2
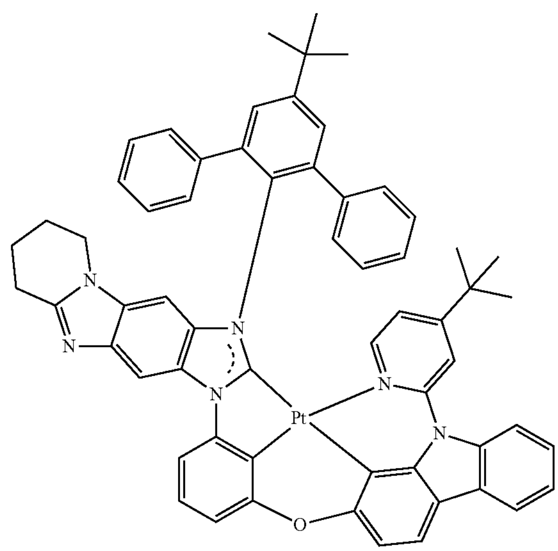
3
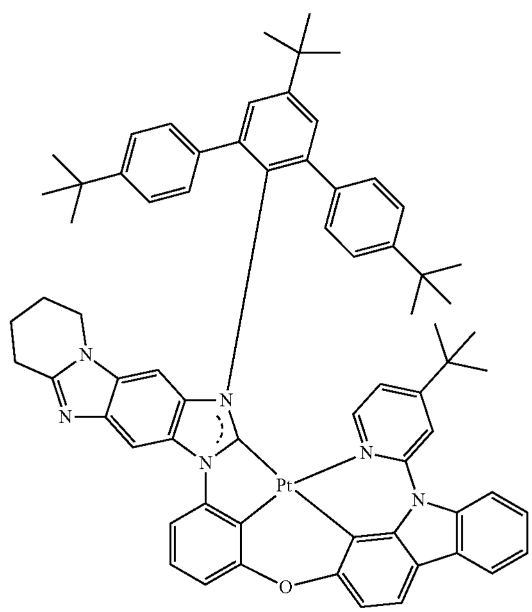
4
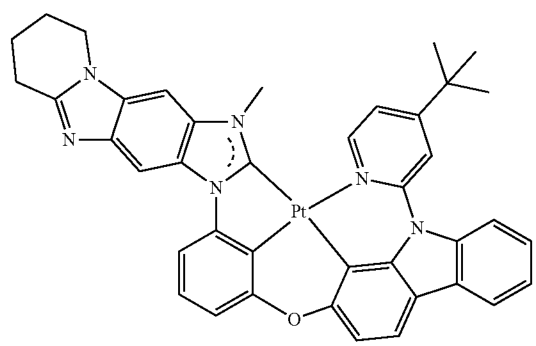

-continued
5
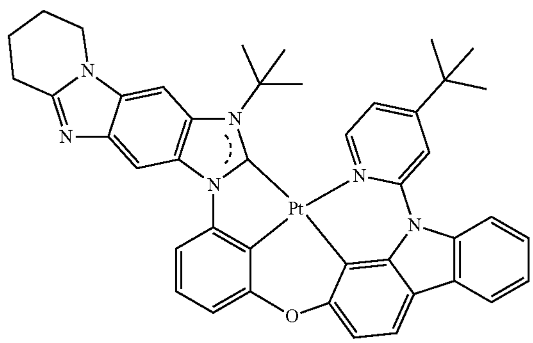
6
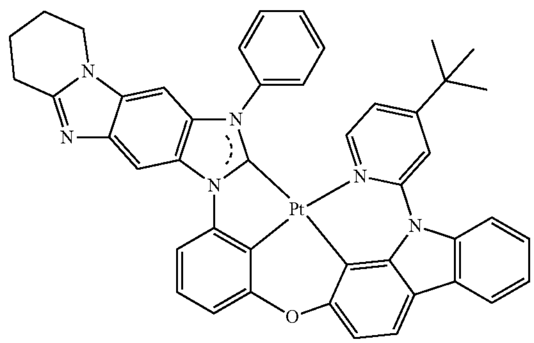
7
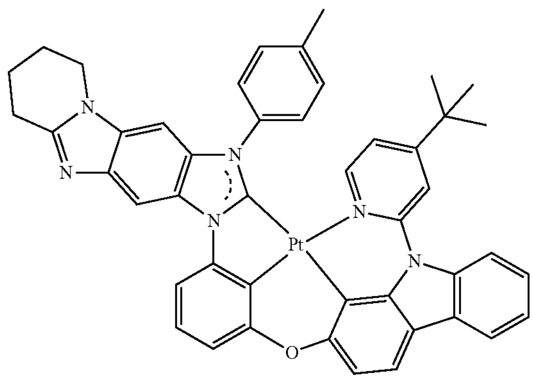
8
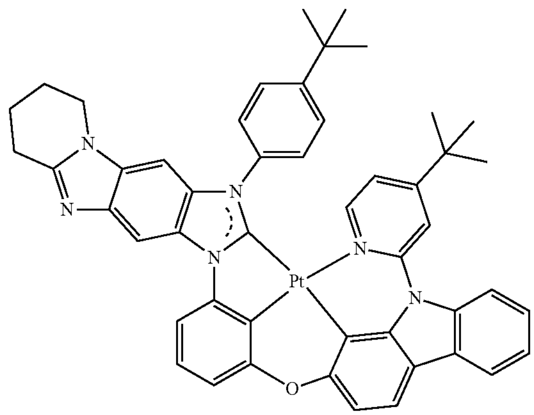
9
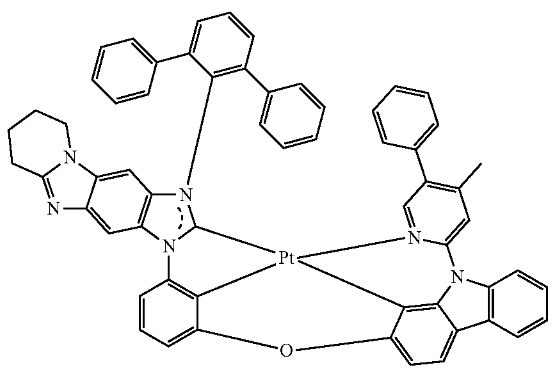
10
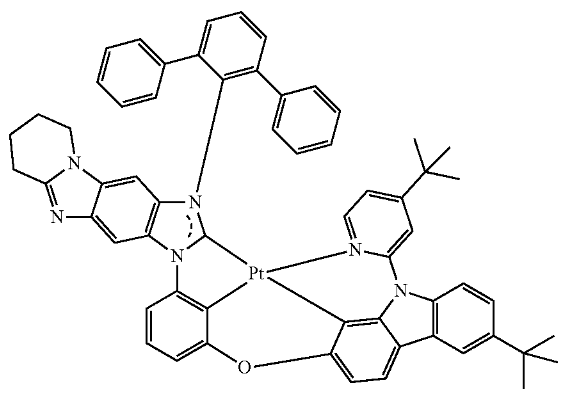

-continued
11
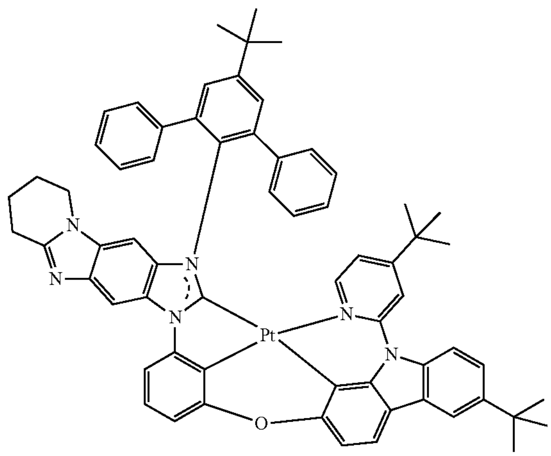
12
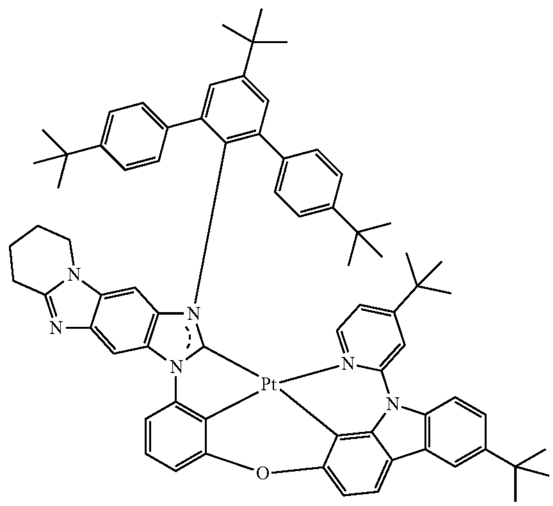
13
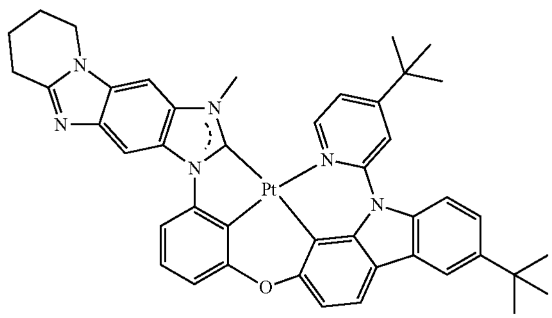
14
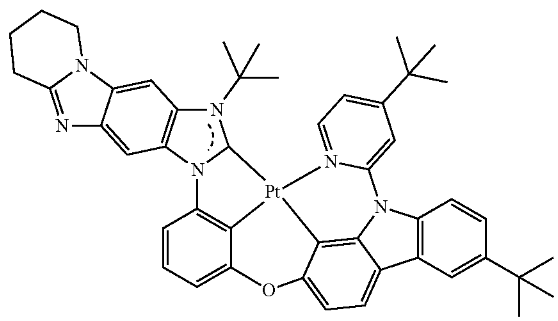
15
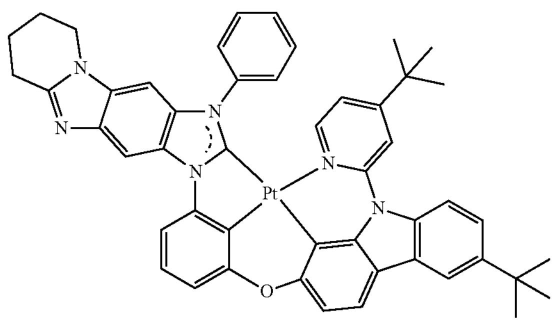
16
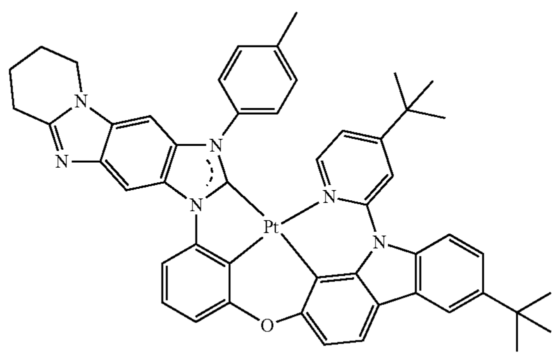
17
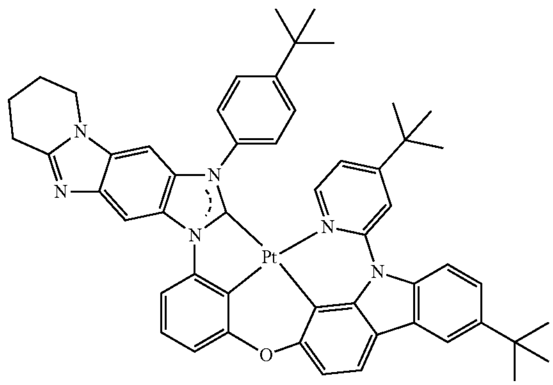
18
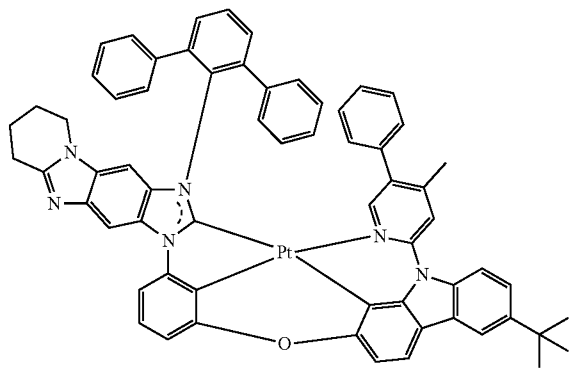

-continued
19
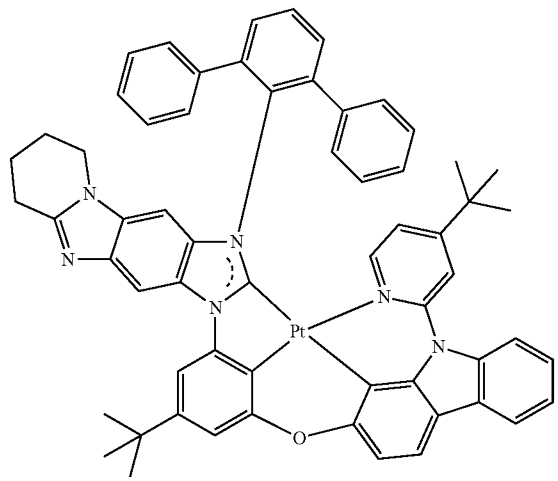
20
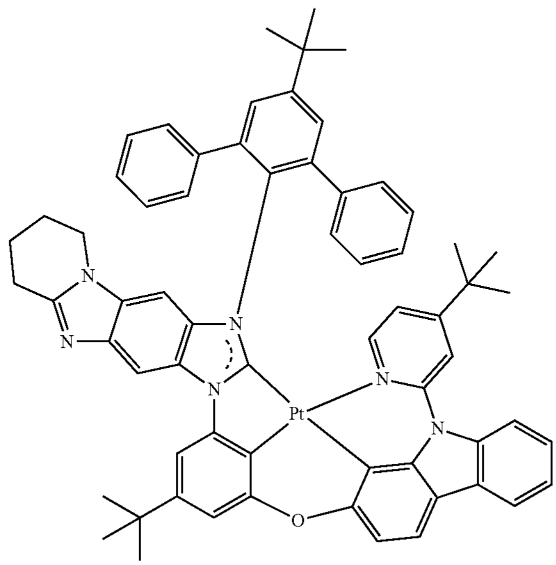
21
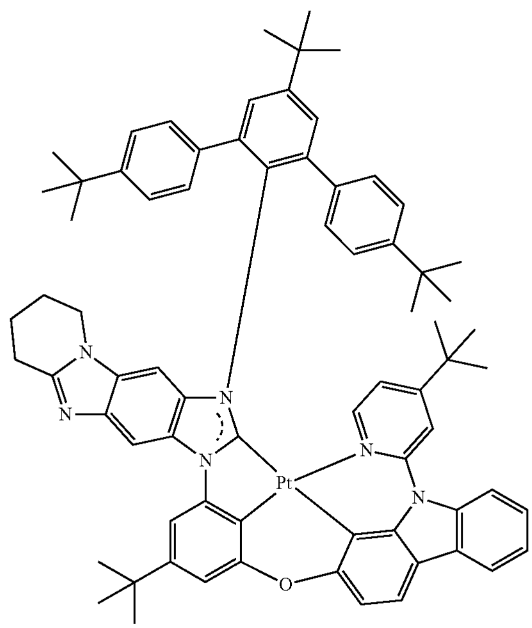
22
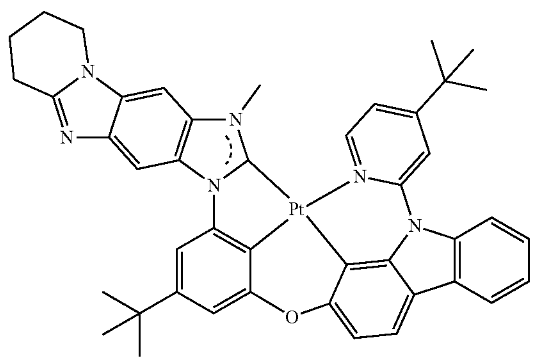
23
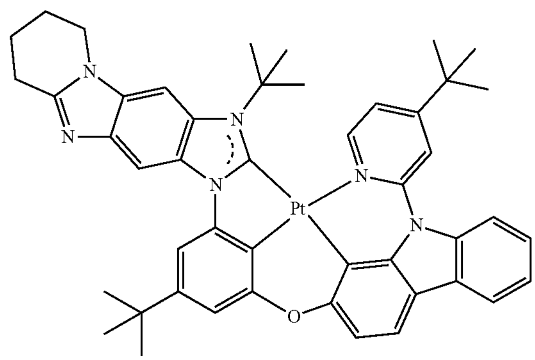
24
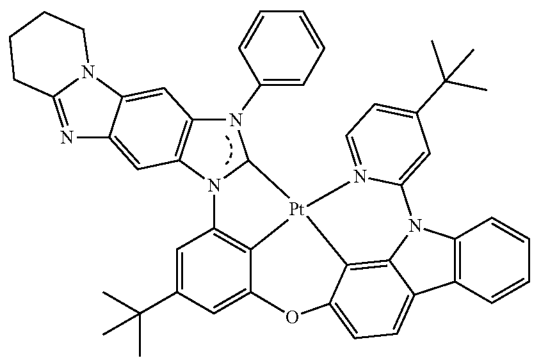

-continued
25
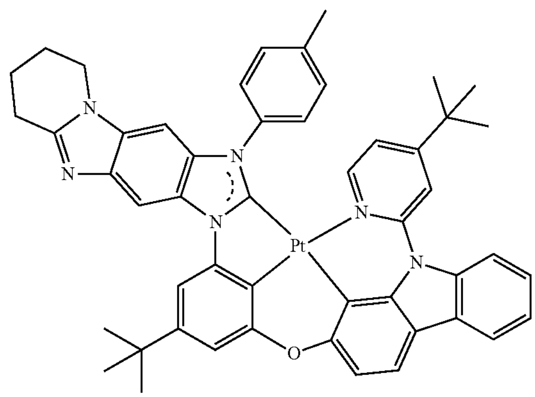
26
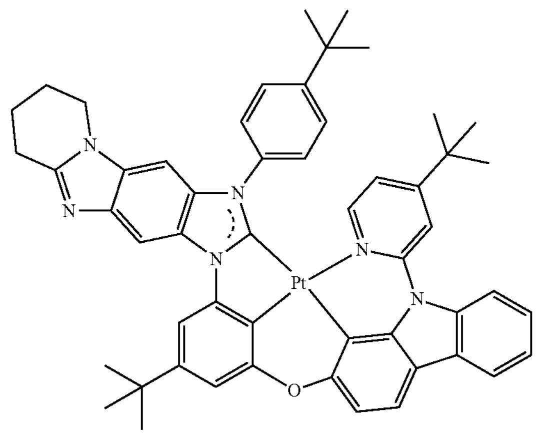
27
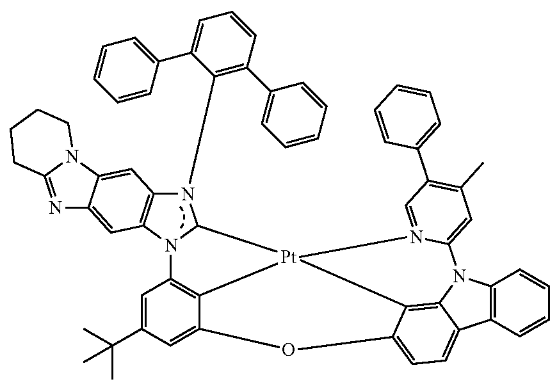
28
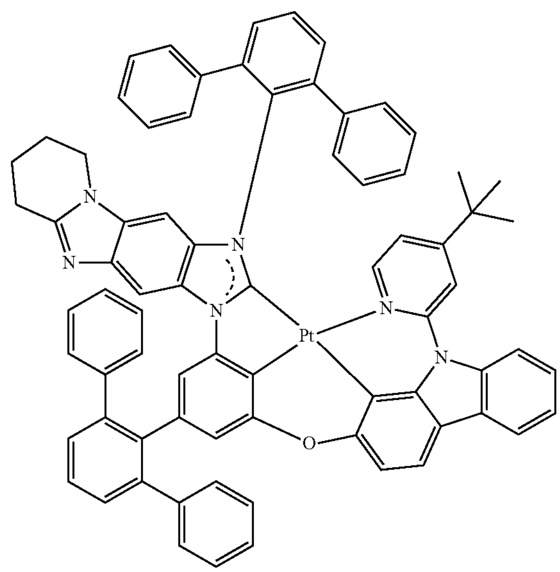
29
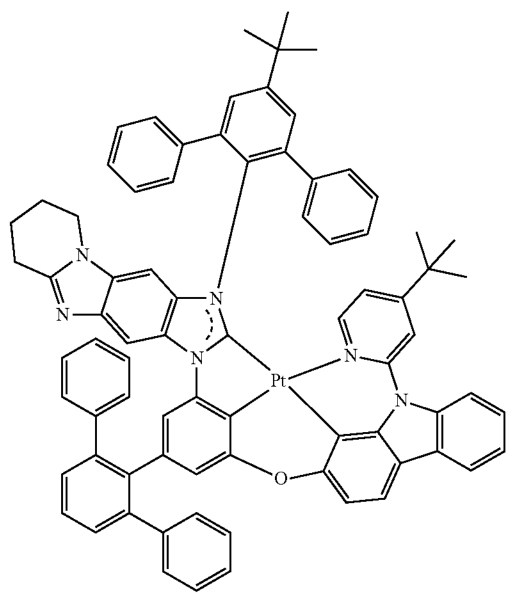
30
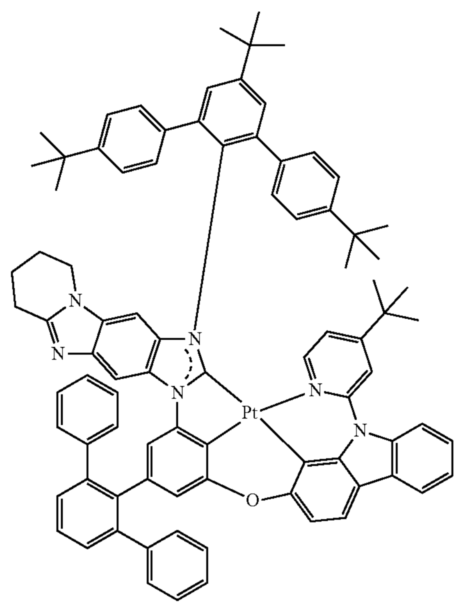

-continued
31
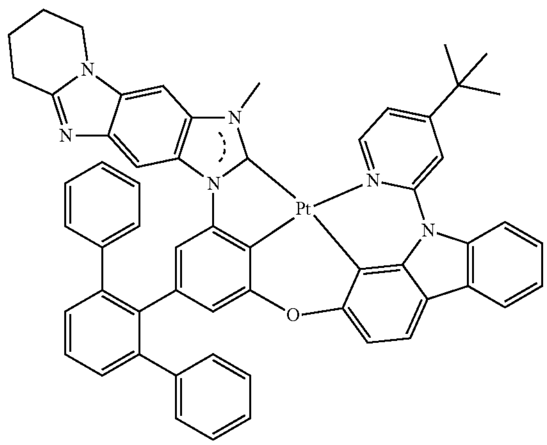
32
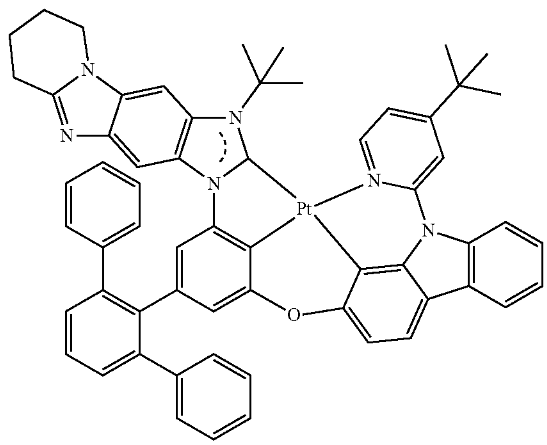
33
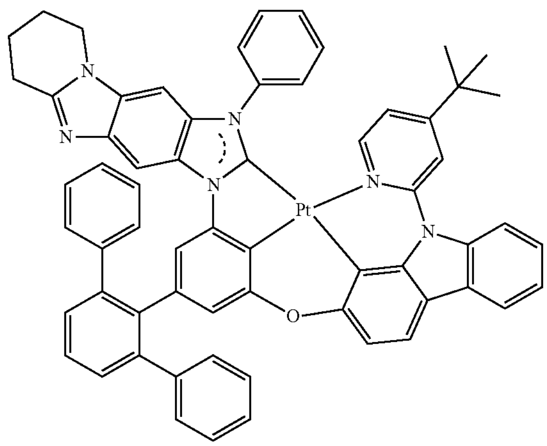
34
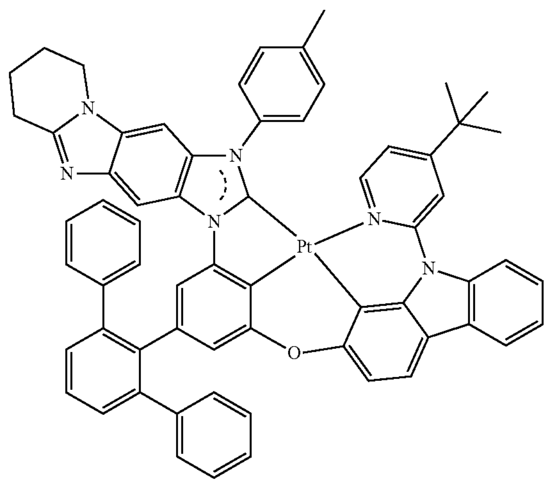
35
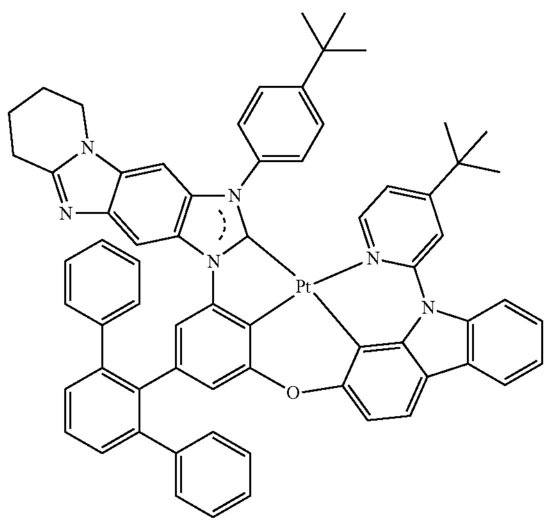
36
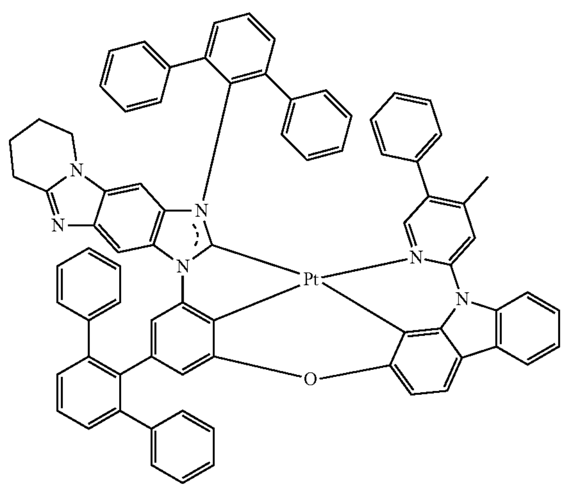

-continued
37
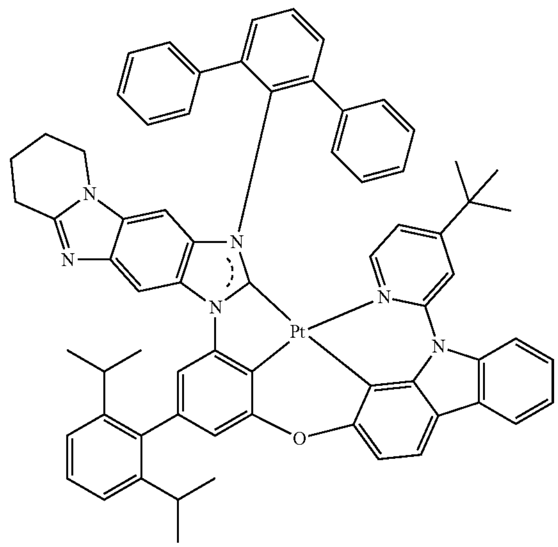
38
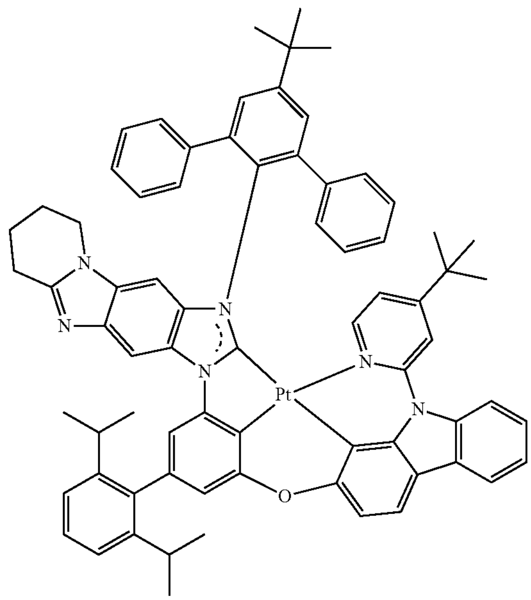
39
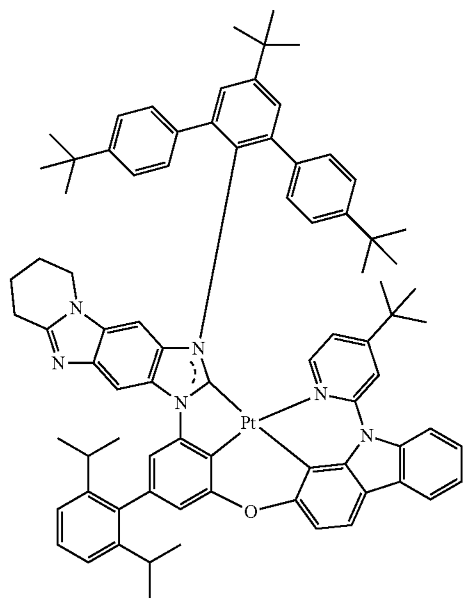
40
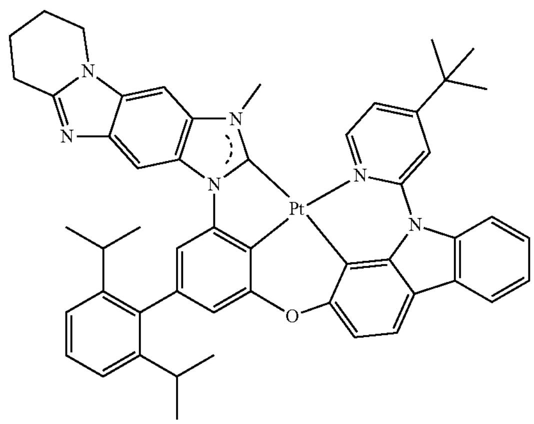
41
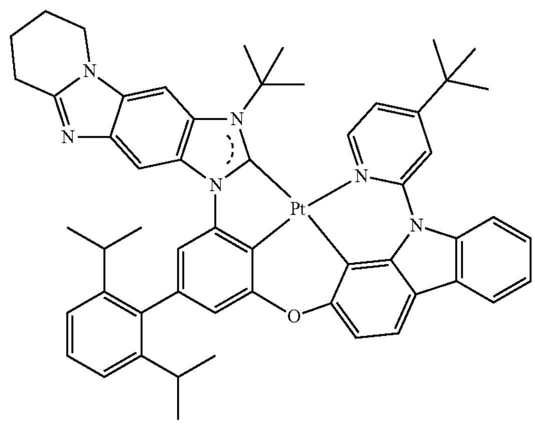
42
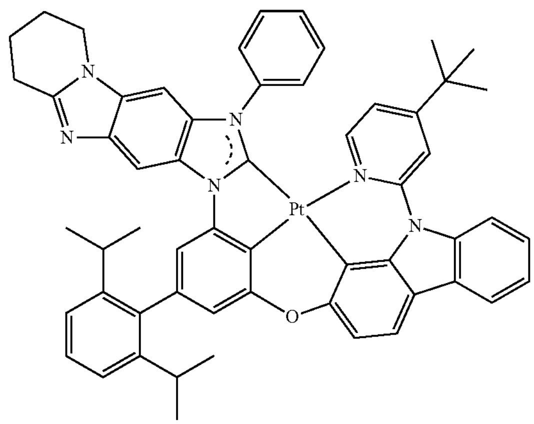

-continued
43
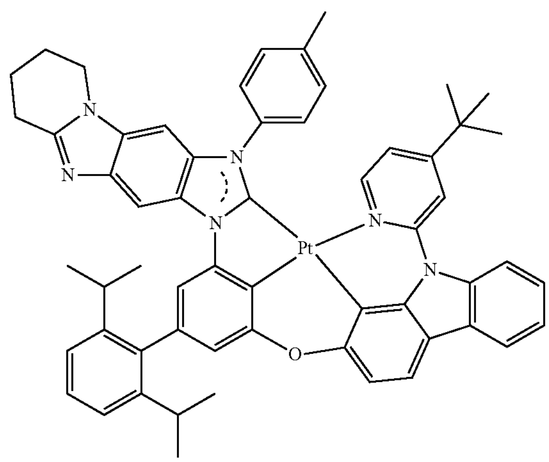
44
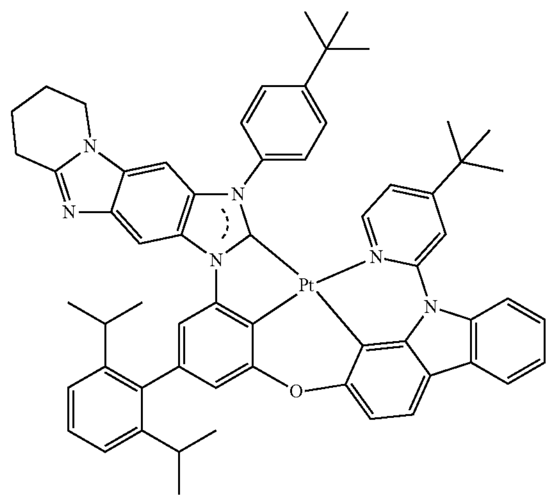
45
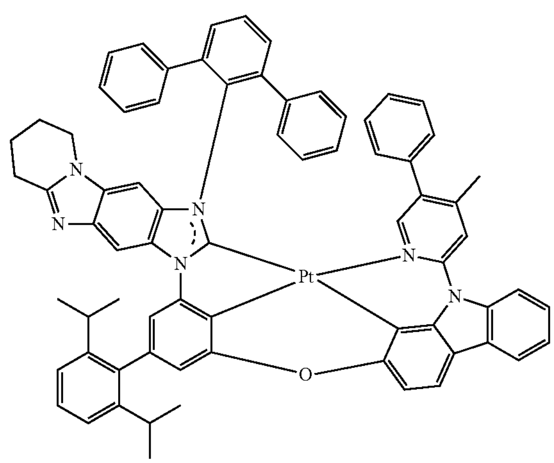
46
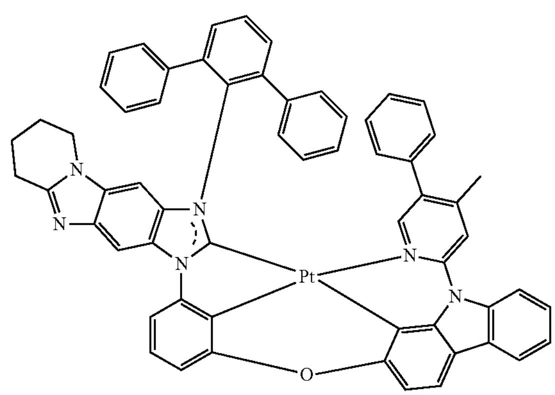
47
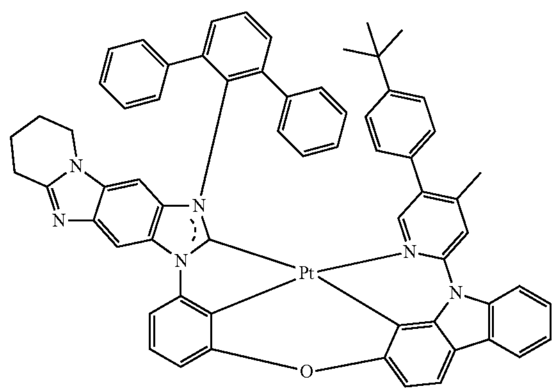
48
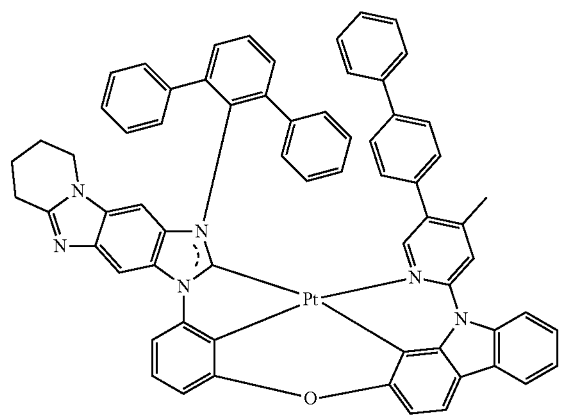

-continued
49
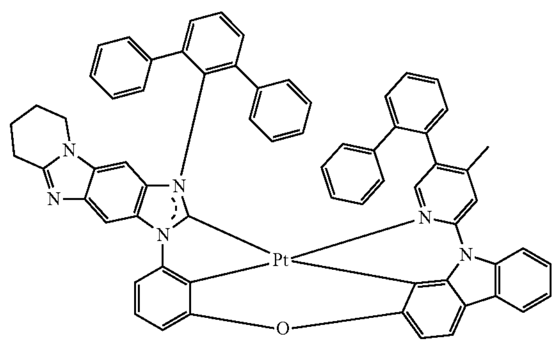
50
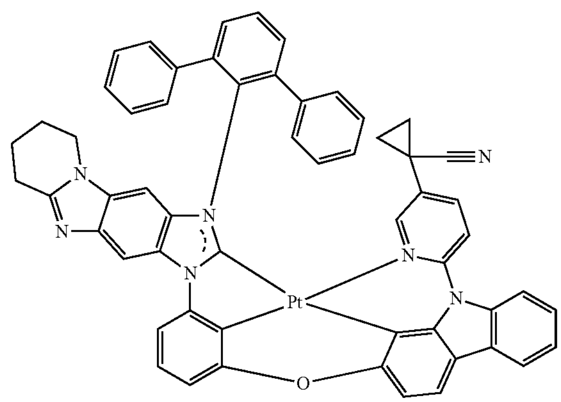
51
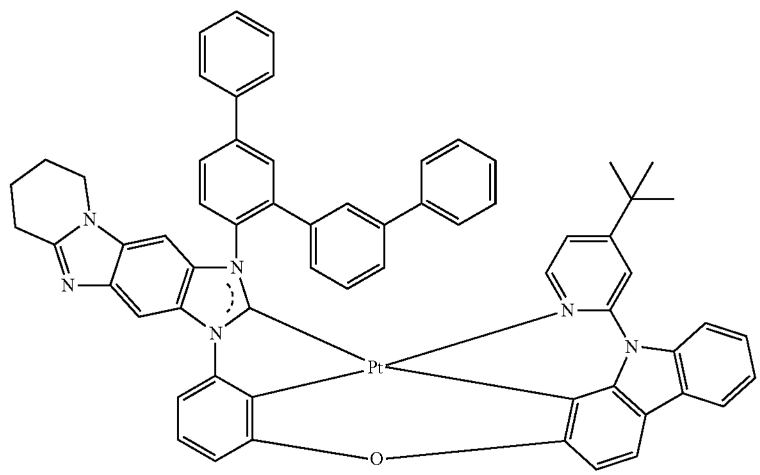
52
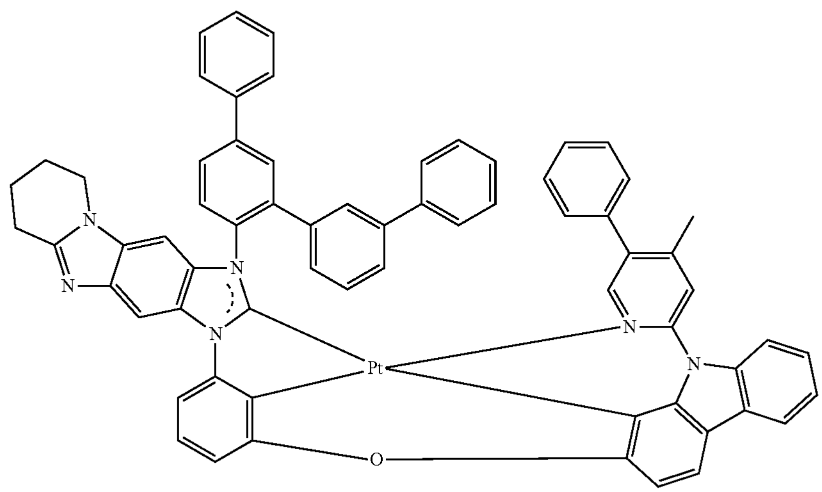

-continued
53
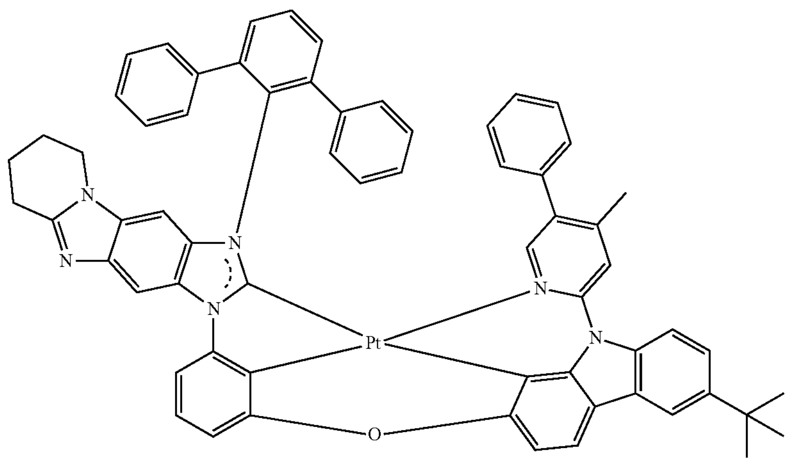
54
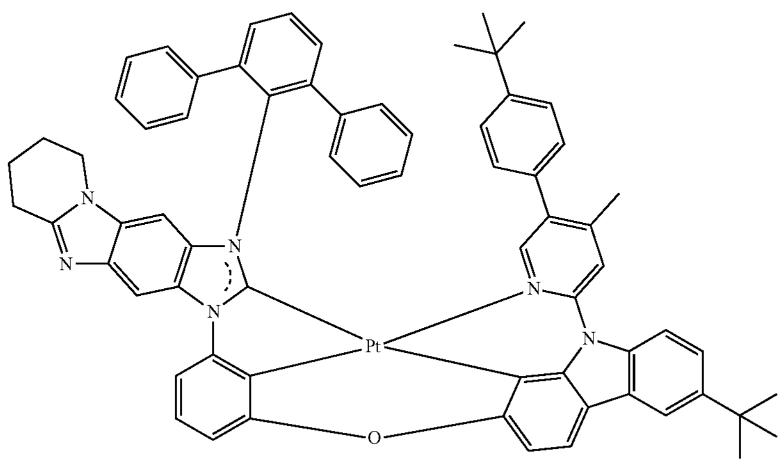
55
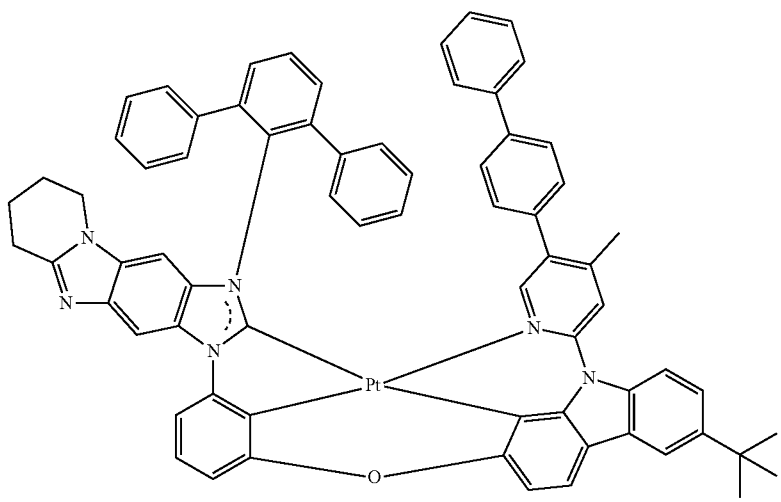

-continued
56
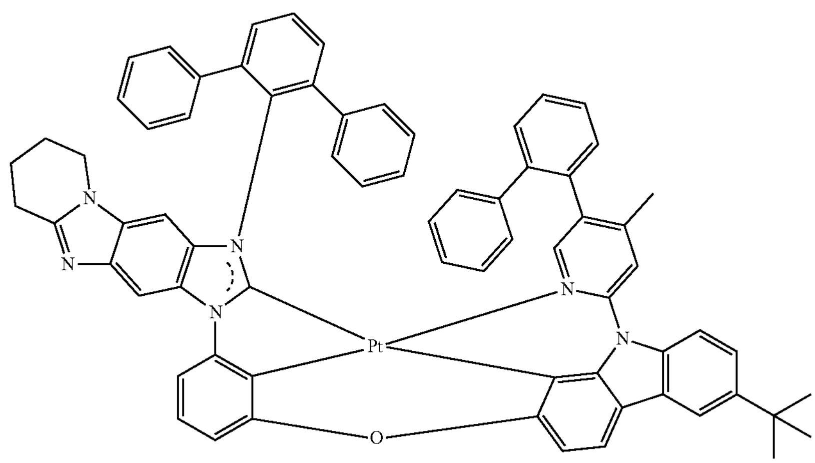
57
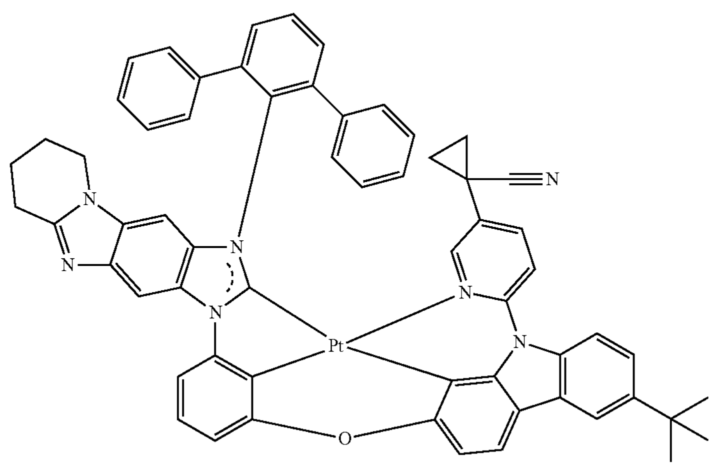
58
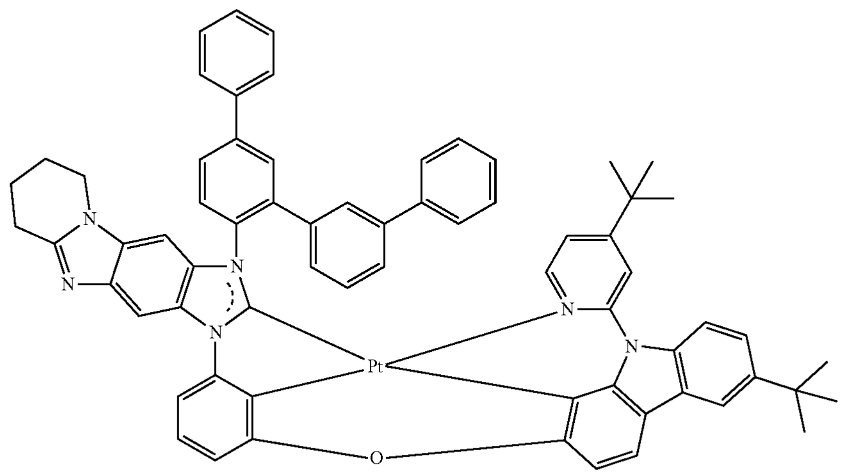

-continued
59
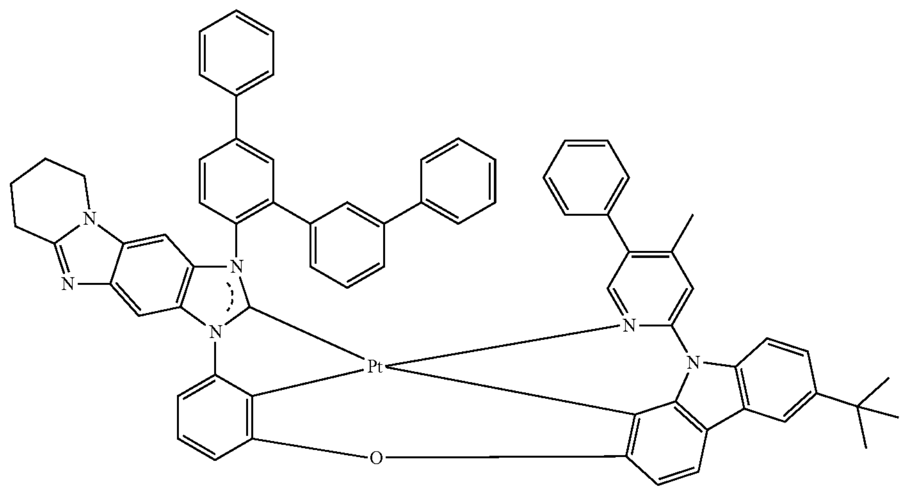
60
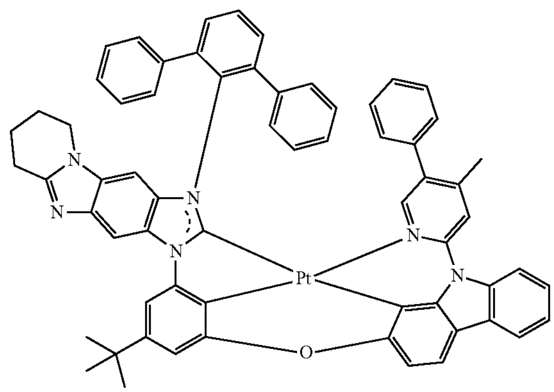
61
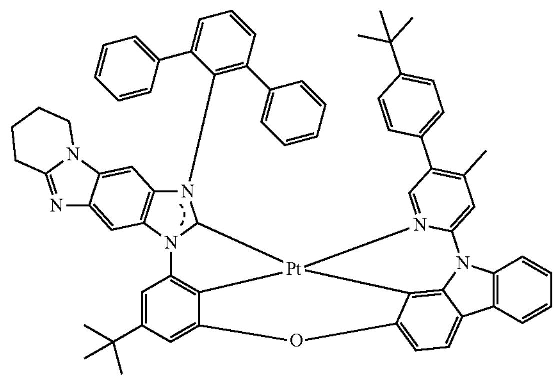
62
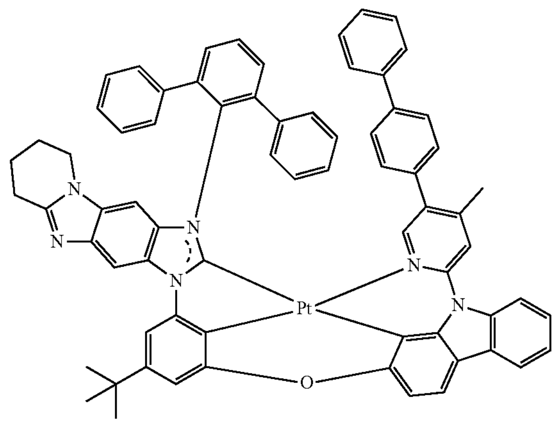
63
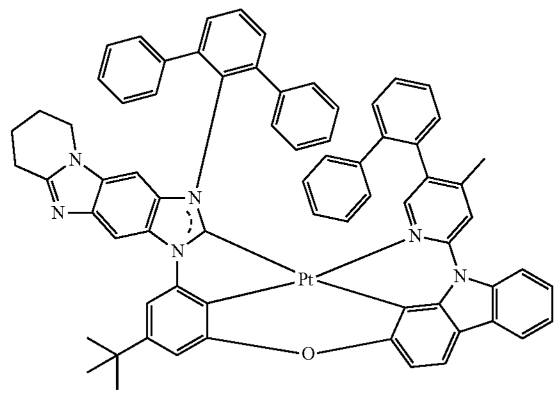

-continued
64
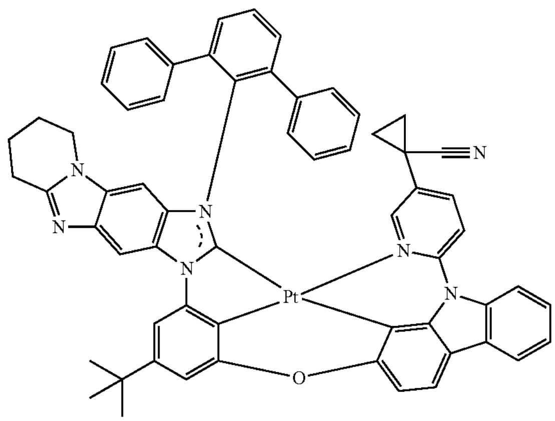
65
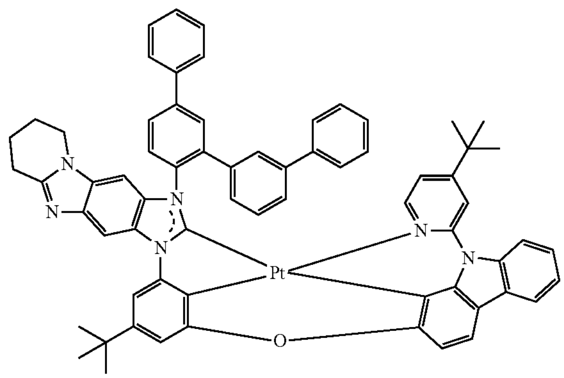
66
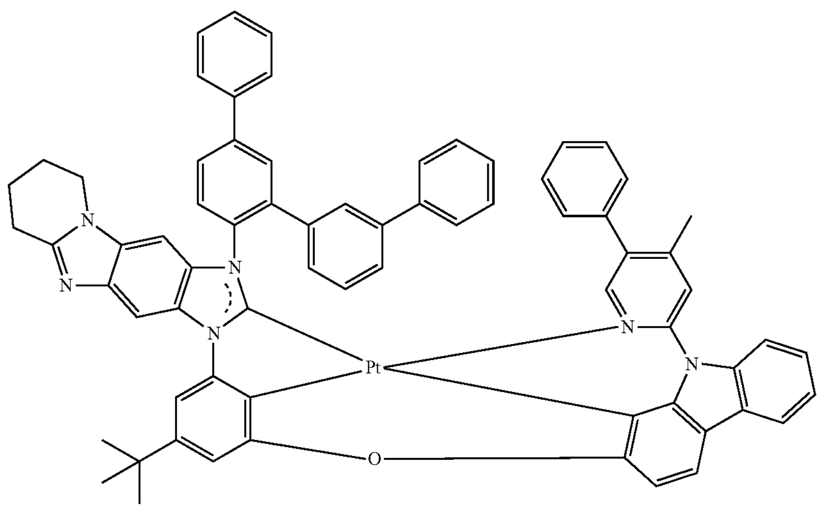
67
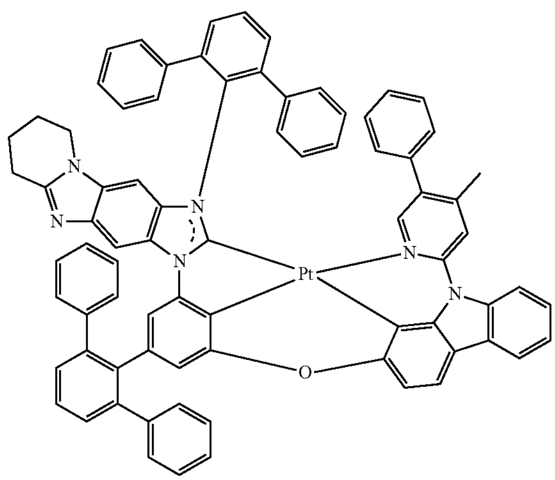
68
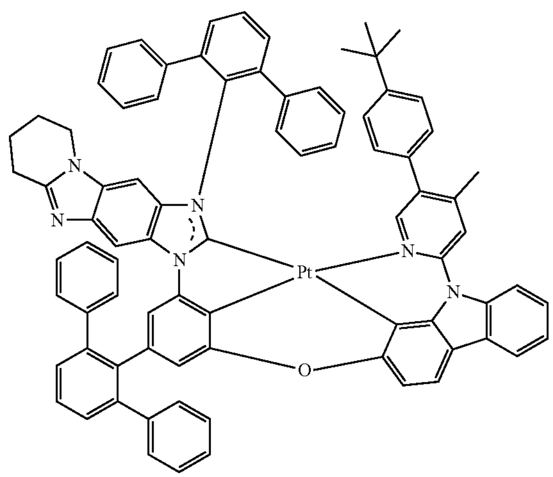

-continued
69
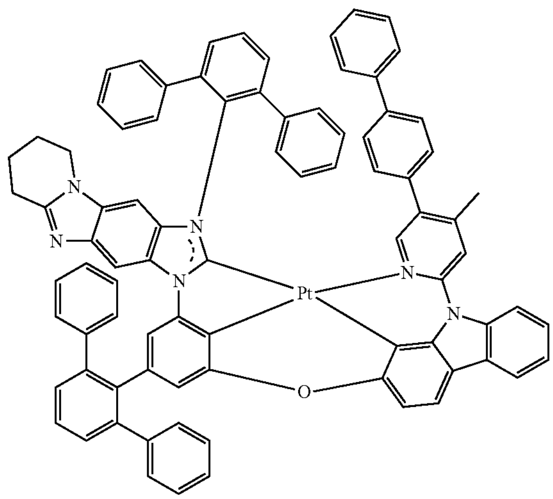
70
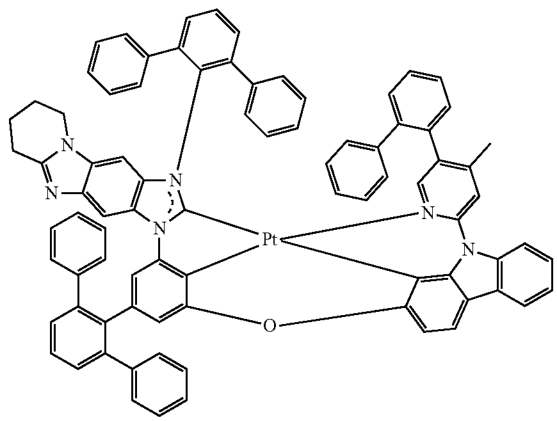
71
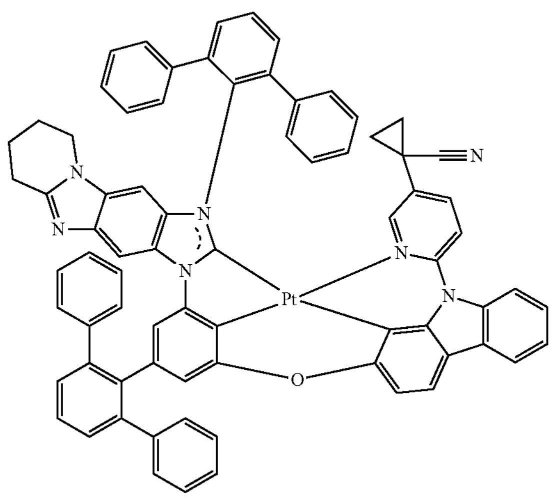
72
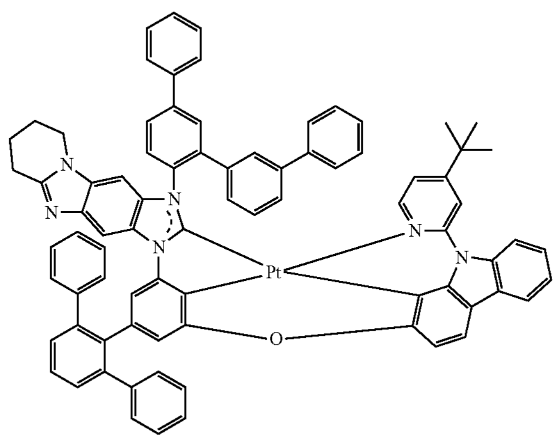
73
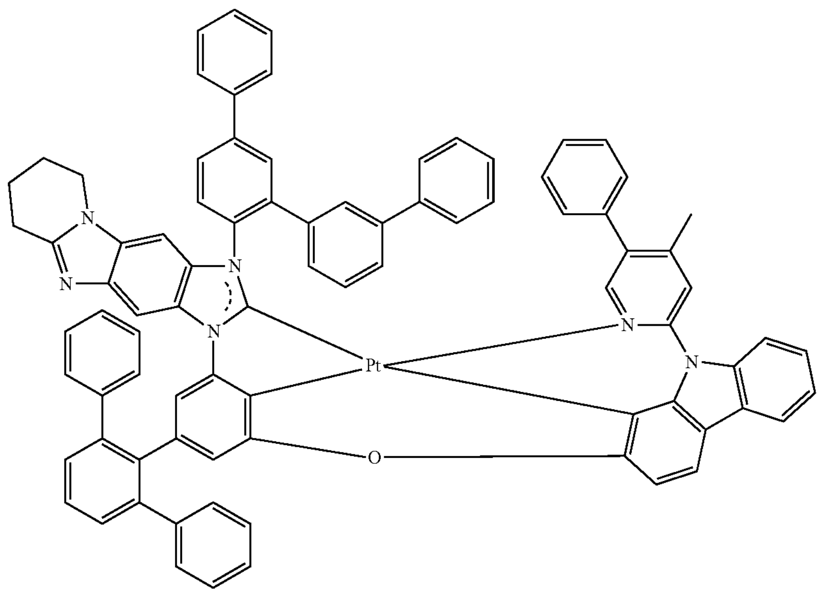

-continued
74
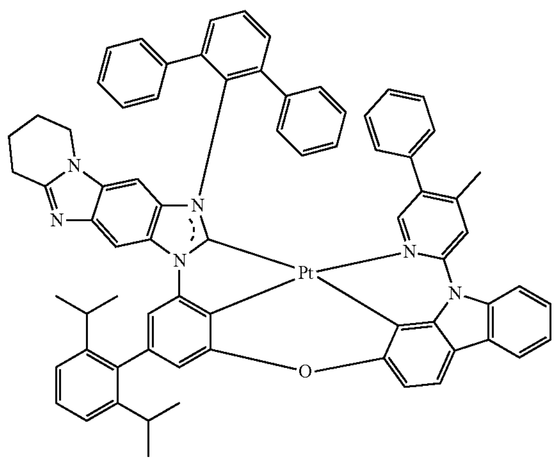
75
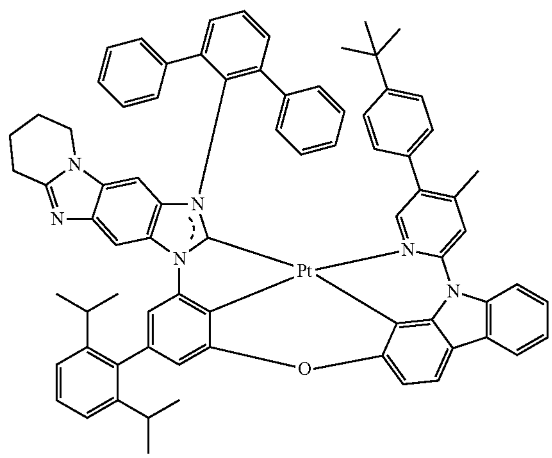
76
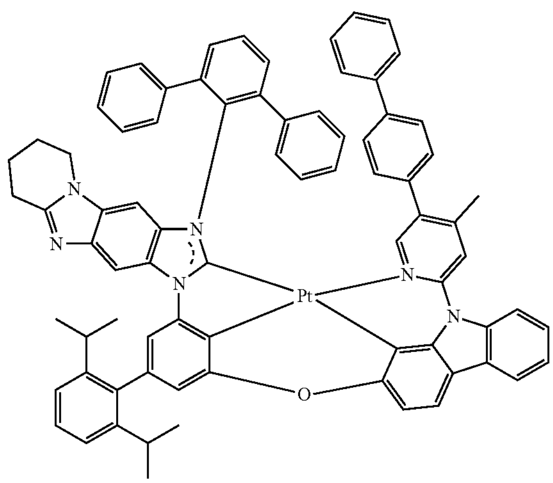
77
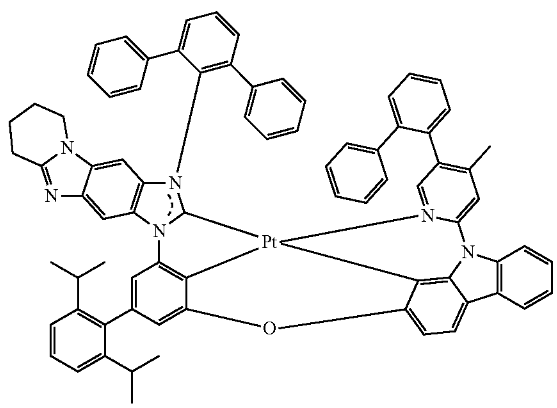
78
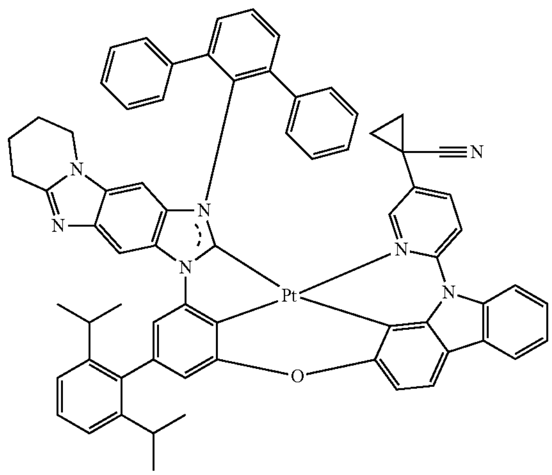
79
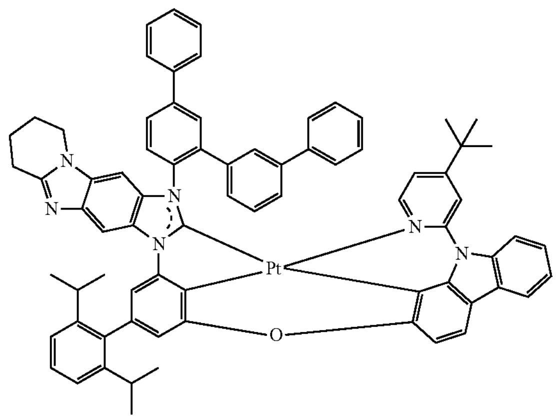

-continued
80
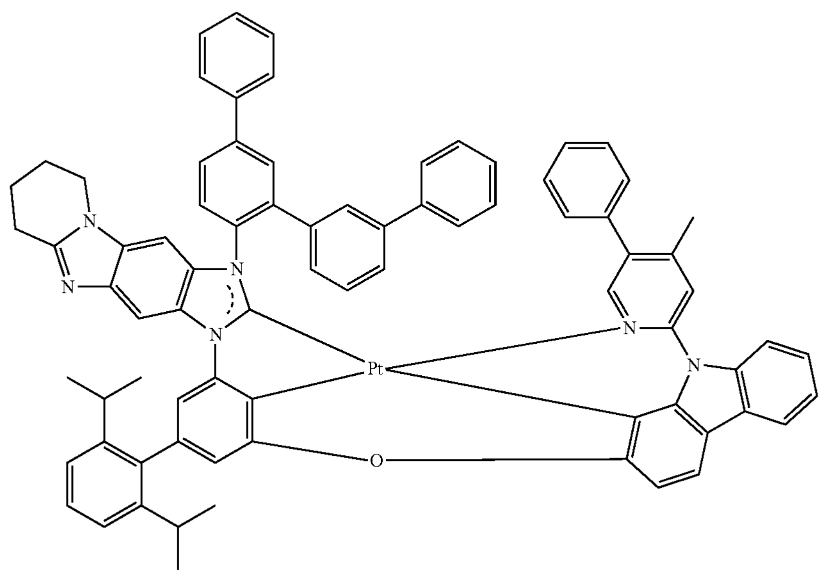
81
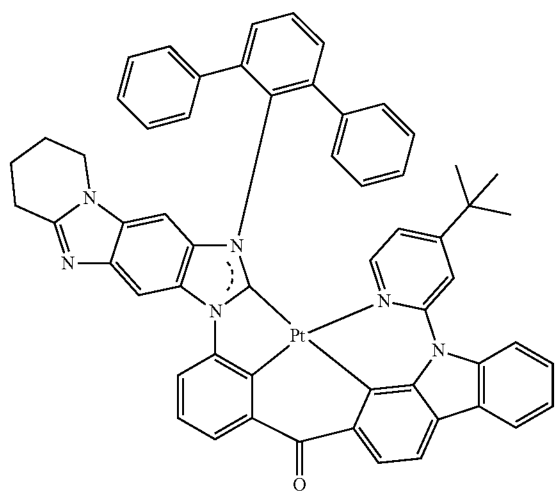
82
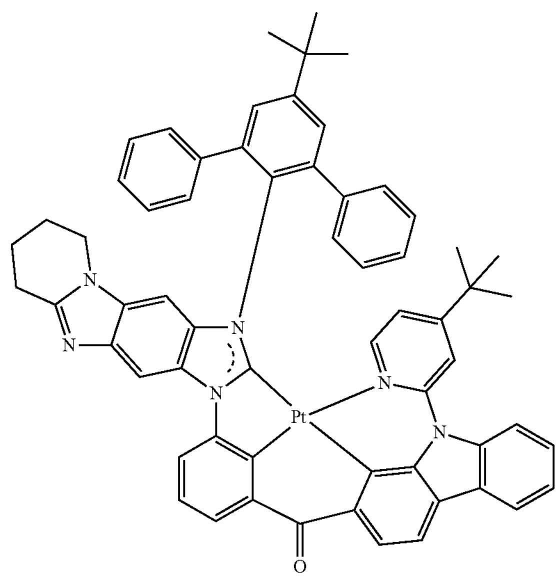

-continued
83
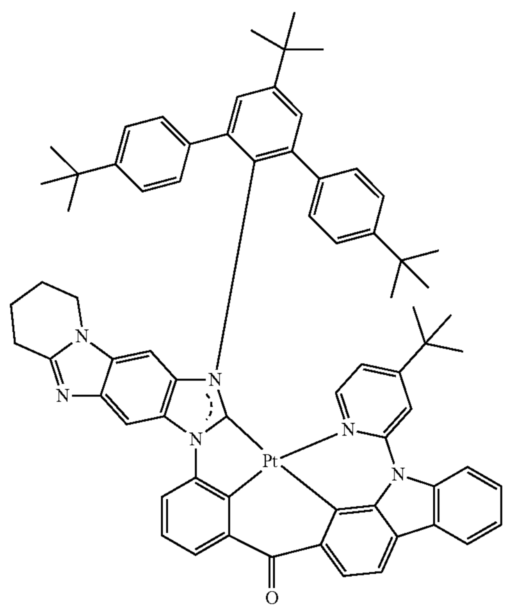
84
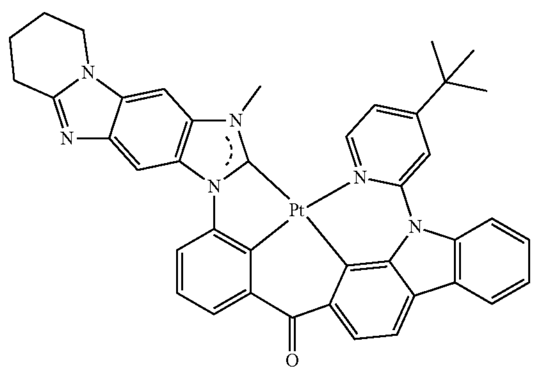
85
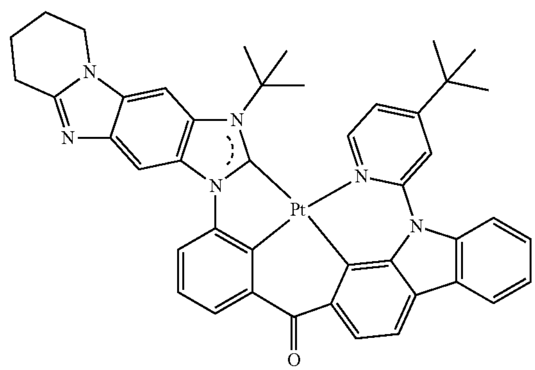
86
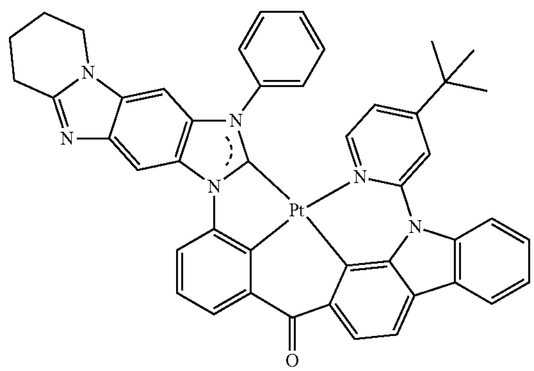
87
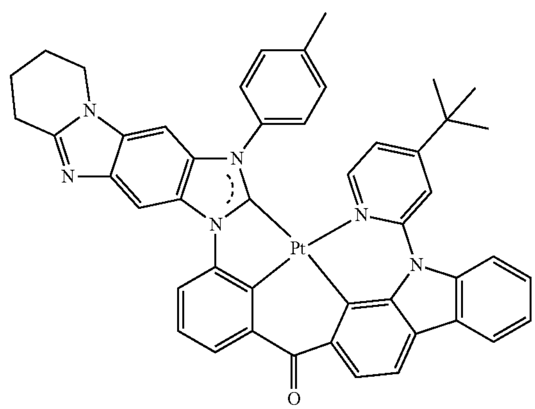
88
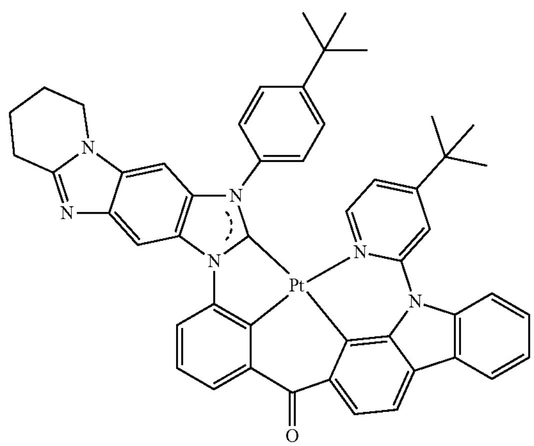

-continued
89
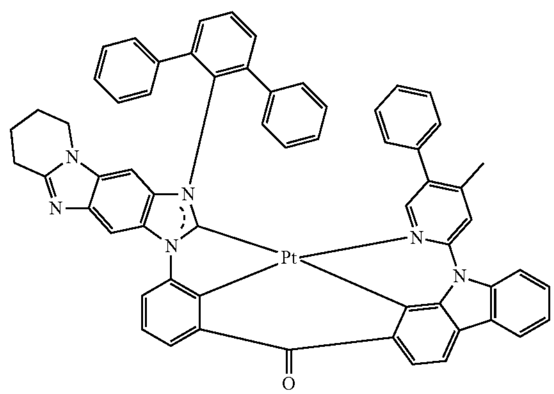
90
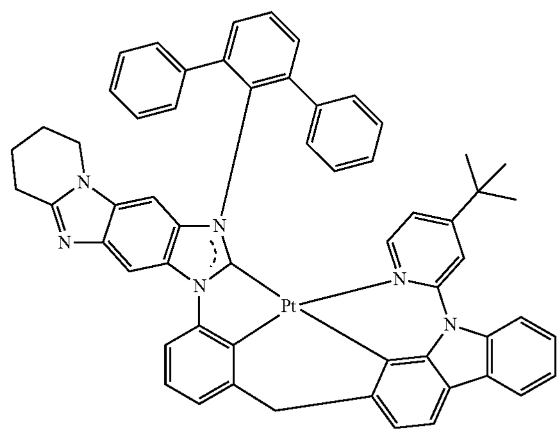
91
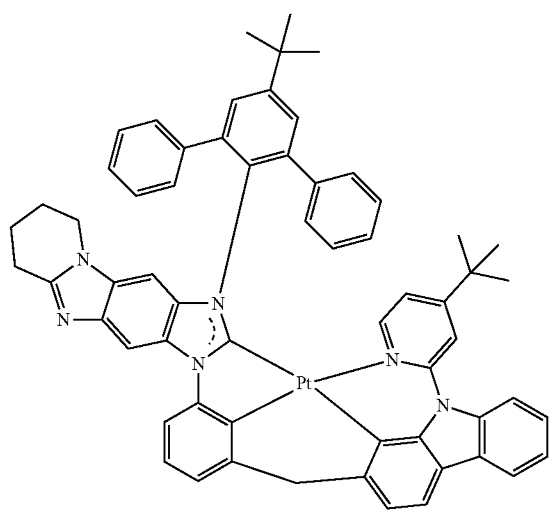
92
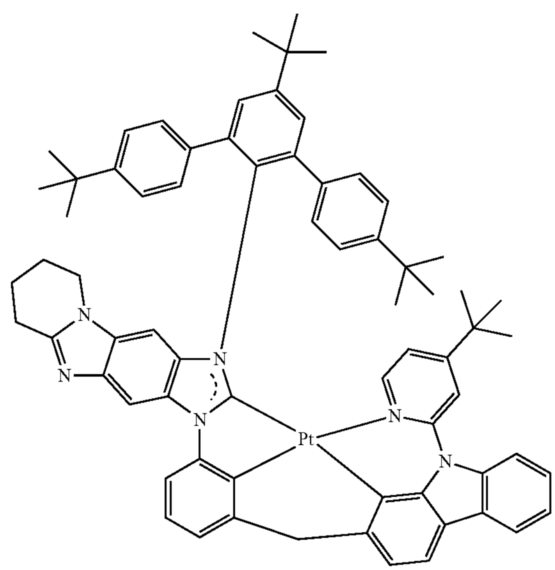
93
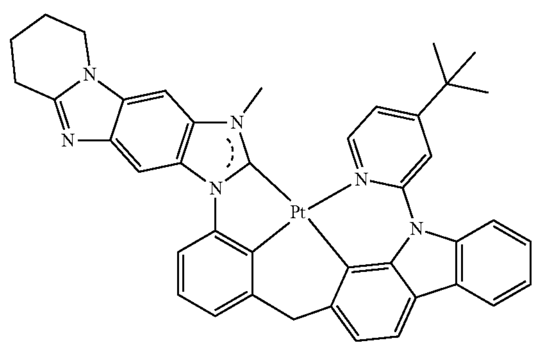
94
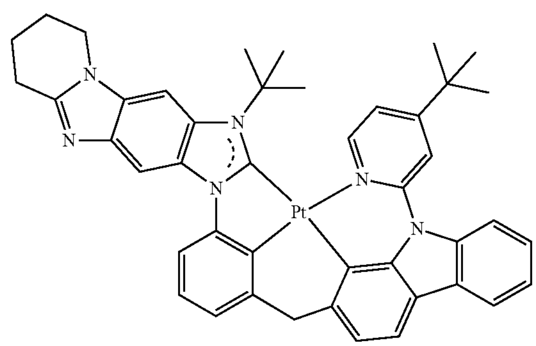

-continued

95

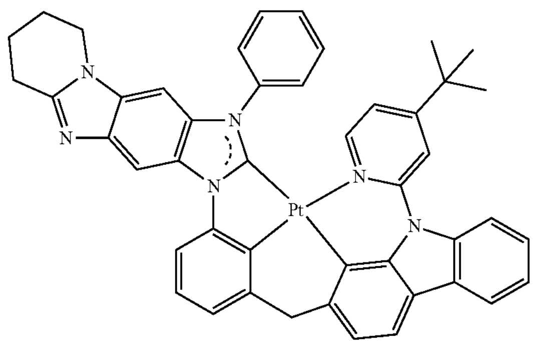

96

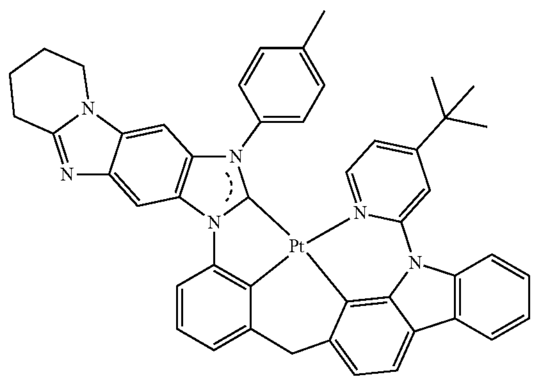

97

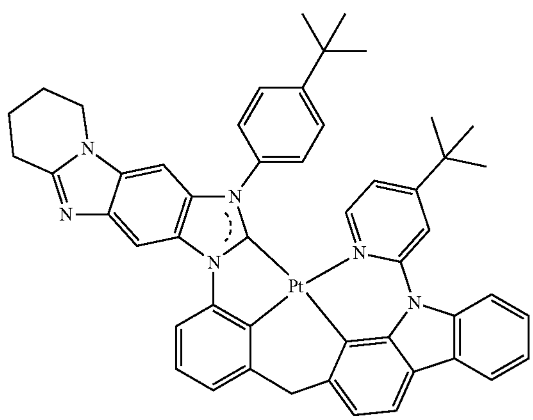

98

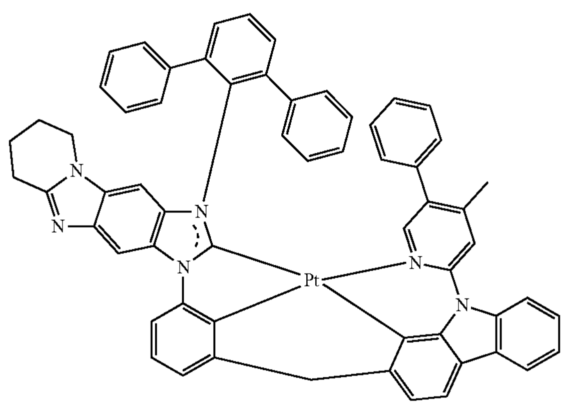

.

In an embodiment, the organometallic compound represented by Formula 1 may be to emit blue light having a maximum emission wavelength of about 450 nm or more and about 500 nm or less.

In an embodiment, the organometallic compound represented by Formula 1 may have a lowest excitation triplet energy level of about 2.5 eV or more and about 2.8 eV or less.

In an embodiment, the organometallic compound represented by Formula 1 may satisfy at least one of Conditions 1 to 3:

LUMO energy level of the first compound>−1.50 eV     Condition 1

Absolute value of difference between LUMO energy level and HOMO energy level of the first compound≥3.40 eV     Condition 2

Energy level of $^3$MC state of the first compound>0.45 kcal/mol;     Condition 3 wherein the highest occupied molecular orbital (HOMO) energy level and the lowest unoccupied molecular orbital (LUMO) energy level of the first compound may each be measured by differential pulse voltammetry, and the energy level of the triplet metal centered ($^3$MC) state of the first compound may be evaluated utilizing a density functional theory (DFT) method. The HOMO energy level and the LUMO energy level of the first compound may each be a negative value.

The organometallic compound represented by Formula 1 includes a core structure including the $A_4$ moiety. Accordingly, a binding force between M and $X_4$ may be increased, the rigidity (e.g., planar rigidity) of the structure may be increased, and the stability of the organometallic compound may thus be improved. For example, an energy level of a $^3$MC of the organometallic compound and an energy level of a triplet metal-to-ligand charge transfer state ($^3$MLCT) of the organometallic compound may be improved (e.g., may become more favorable for emission), and thus, the organometallic compound may have long lifespan effects. Therefore, an electronic device, for example, an organic light-emitting device, including the organometallic compound may have low driving voltage, excellent or suitable luminescence efficiency, long lifespan, and excellent or suitable color purity, and thus, may be utilized in the manufacture of a high-quality electronic apparatus.

Methods of synthesizing the organometallic compound represented by Formula 1 may be easily understood by those of ordinary skill in the art by referring to Synthesis Examples and Examples described herein.

At least one organometallic compound represented by Formula 1 may be utilized in a light-emitting device (for example, an organic light-emitting device). Therefore, provided is a light-emitting device including: a first electrode; a second electrode facing the first electrode; and an interlayer located between the first electrode and the second electrode and including an emission layer, wherein the interlayer includes the organometallic compound represented by Formula 1 as described in the present specification.

In an embodiment, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In an embodiment, the organometallic compound may be included between the first electrode and the second electrode of the light-emitting device. Therefore, the organometallic compound may be included in the interlayer of the light-emitting device, for example, in the emission layer of the interlayer.

In an embodiment, the interlayer in the light-emitting device may include:

i) a first compound, which is the organometallic compound represented by Formula 1; and ii) a second compound including at least one π electron-deficient nitrogen-containing $C_1$-$C_{60}$ cyclic group, a third compound including a group represented by Formula 3, a fourth compound to emit (e.g., capable of emitting) delayed fluorescence, or any combination thereof, and the first compound, the second compound, the third compound, and the fourth compound may be different from each other:

Formula 3

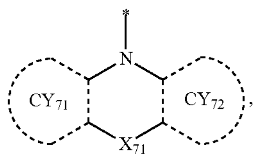

wherein, in Formula 3, ring $CY_{71}$ and ring $CY_{72}$ may each independently be a π electron-rich $C_3$-$C_{60}$ cyclic group or a pyridine group, $X_{71}$ is a single bond or a linking group including O, S, N, B, C, Si, or any combination thereof, and

* indicates a binding site to a neighboring atom in Formula 3.

Description of First Compound to Fourth Compound

The second compound may include a pyridine group, a pyrimidine group, a pyrazine group, a pyridazine group, a triazine group, or any combination thereof. For example, the at least one π electron-deficient nitrogen-containing $C_1$-$C_{60}$ cyclic group in the second compound may be a pyridine group, a pyrimidine group, a pyrazine group, a pyridazine group, a triazine group, or any combination thereof.

In an embodiment, the light-emitting device may further include at least one of the second compound and the third compound, in addition to the first compound.

In an embodiment, the light-emitting device may further include the fourth compound, in addition to the first compound.

In an embodiment, the light-emitting device may include all of the first compound to the fourth compound.

In an embodiment, the interlayer may include the second compound. The interlayer may further include the third compound, the fourth compound, or a combination thereof, in addition to the first compound and the second compound.

In an embodiment, a difference between a triplet energy level and a singlet energy level of the fourth compound may be about 0 eV or more and about 0.5 eV or less (or about 0 eV or more and about 0.3 eV or less).

In an embodiment, the fourth compound may include at least one cyclic group including boron (B) and nitrogen (N) as ring-forming atoms.

In an embodiment, the fourth compound may be a $C_8$-$C_{60}$ polycyclic group-containing compound in which two or more cyclic groups are condensed while sharing boron (B)(e.g., two or more rings are condensed with a B atom therebetween).

In an embodiment, the fourth compound may include a condensed cyclic ring moiety, in which at least one third ring is condensed with at least one fourth ring, the third ring may be a cyclopentane group, a cyclohexane group, a cycloheptane group, a cyclooctane group, a cyclopentene group, a cyclohexene group, a cycloheptane group, a cyclooctene group, an adamantane group, a norbornene group, a norbornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring may be a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In In an embodiment, the interlayer may include the fourth compound. The interlayer may further include the second compound, the third compound, or a combination thereof, in addition to the first compound and the fourth compound.

In an embodiment, the interlayer may include the third compound.

The emission layer in the interlayer may include: i) the first compound; and ii) the second compound, the third compound, the fourth compound, or any combination thereof.

The emission layer may be to emit phosphorescent or fluorescent light emitted from the first compound. In an embodiment, the phosphorescent or fluorescent light emitted from the first compound may be blue light.

In an embodiment, the emission layer of the light-emitting device may include the first compound and the second compound, and the first compound and the second compound may form an exciplex.

In an embodiment, the emission layer of the light-emitting device may include the first compound, the second compound, and the third compound, and the first compound and the second compound may form an exciplex.

In an embodiment, the emission layer of the light-emitting device may include the first compound and the fourth compound, and the fourth compound may facilitate improvements in color purity, luminescence efficiency, and/or lifespan characteristics of the light-emitting device.

In an embodiment, the second compound may include a compound represented by Formula 2:

Formula 2

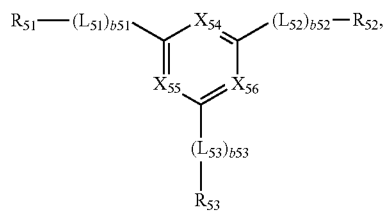

wherein, in Formula 2, $L_{51}$ to $L_{53}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b51 to b53 may each independently be an integer from 1 to 5, $X_{54}$ may be N or $C(R_{54})$, $X_{55}$ may be N or $C(R_{55})$, $X_{56}$ may be N or $C(R_{56})$, and at least one of $X_{54}$ to $X_{56}$ may be N, $R_{51}$ to $R_{56}$ may each independently be the same as described in the present specification, and $R_{10a}$ is the same as described in the present specification.

In an embodiment, the third compound may include a compound represented by Formula 3-1, a compound represented by Formula 3-2, a compound represented by Formula 3-3, a compound represented by Formula 3-4, a compound represented by Formula 3-5, or any combination thereof:

Formula 3-1

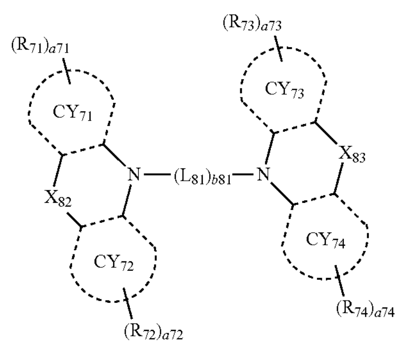

Formula 3-2

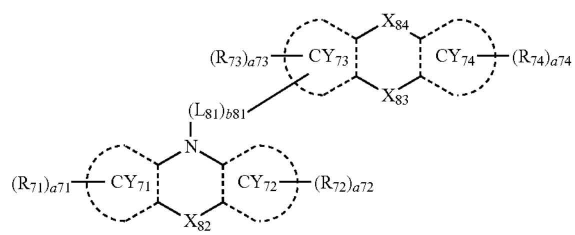

Formula 3-3

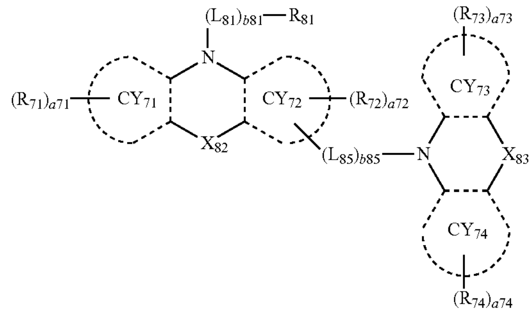

Formula 3-4

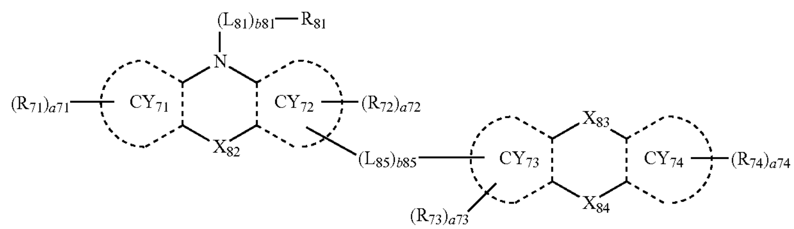

Formula 3-5

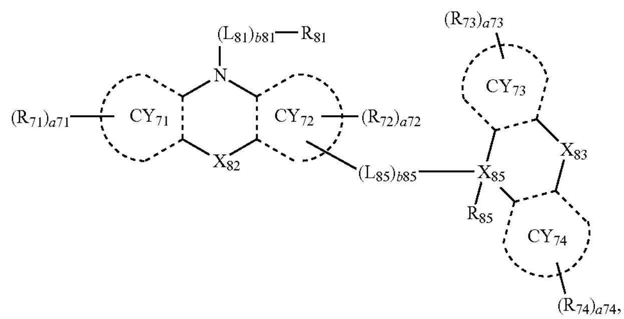

wherein, in Formulae 3-1 to 3-5, ring $CY_{71}$ to ring $CY_{74}$ may each independently be a π electron-rich $C_3$-$C_{60}$ cyclic group or a pyridine group, $X_{82}$ may be a single bond, O, S, N—[$(L_{82})_{b82}$-$R_{82}$], C($R_{82a}$)($R_{82b}$), or Si($R_{82a}$)($R_{82b}$), $X_{83}$ may be a single bond, O, S, N—[$(L_{83})_{b83}$-$R_{83}$], C($R_{83a}$)($R_{83b}$), or Si($R_{83a}$)($R_{83b}$), $X_{84}$ may be O, S, N—[$(L_{84})_{b84}$-$R_{84}$], C($R_{84a}$)($R_{84b}$), or Si($R_{84a}$)($R_{84b}$), $X_{85}$ may be C or Si, $L_{81}$ to $L_{85}$ may each independently be a single bond, *—C($Q_4$)($Q_5$)-*', *—Si($Q_4$)($Q_5$)-*', a π electron-rich $C_3$-$C_{60}$ cyclic group unsubstituted or substituted with at least one $R_{10a}$, or a pyridine group unsubstituted or substituted with at least one $R_{10a}$, wherein $Q_4$ and $Q_5$ may each independently be the same as described in connection with $Q_1$, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may each independently be the same as described in the present specification, a71 to a74 may each independently be an integer from 0 to 20, and $R_{10a}$ may be the same as described in the present specification.

In an embodiment, the fourth compound may include a compound represented by Formula 502, a compound represented by Formula 503, or a combination thereof:

Formula 502

Formula 503

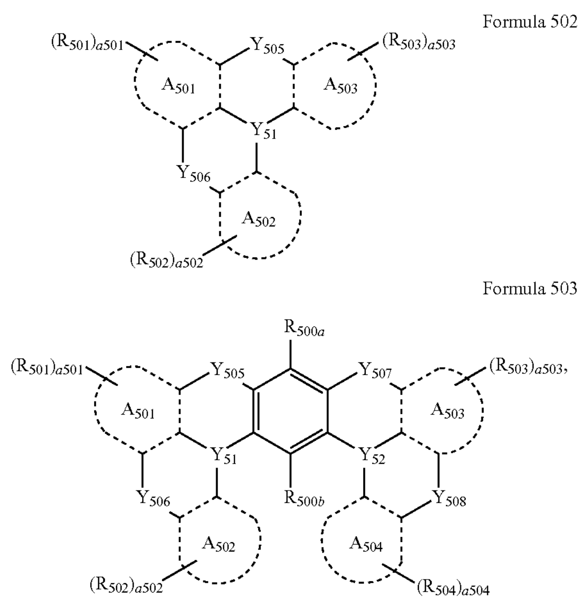

wherein, in Formulae 502 and 503, ring $A_{501}$ to ring $A_{504}$ may each independently be a $C_3$-$C_{60}$ carbocyclic group or a $C_1$-$C_{60}$ heterocyclic group, $Y_{505}$ may be O, S, N($R_{505}$), B($R_{505}$), C($R_{505a}$)($R_{505b}$), or Si($R_{505a}$)($R_{505b}$), $Y_{506}$ may be O, S, N($R_{506}$), B($R_{506}$), C($R_{506a}$)($R_{506b}$), or Si($R_{506a}$)($R_{506b}$), $Y_{507}$ may be O, S, N($R_{507}$), B($R_{507}$), C($R_{507a}$)($R_{507b}$), or Si($R_{507a}$)($R_{507b}$), $Y_{508}$ may be O, S, N($R_{508}$), B($R_{508}$), C($R_{508a}$)($R_{508b}$), or Si($R_{508a}$)($R_{508b}$), $Y_{51}$ and $Y_{52}$ may each independently be B, P(═O), or S(═O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ may each independently be the same as those described in the present specification, a501 to a504 may each independently be an integer from 0 to 20, and $R_{10a}$ is the same as described in the present specification.

Description of Formulae 2, 3-1 to 3-5, 502, and 503 b51 to b53 in Formula 2 indicate numbers of $L_{51}$ to $L_{53}$, respectively, and may each be an integer from 1 to 5. When b51 is 2 or more, two or more $L_{51}$(s) may be identical to or different from each other, when b52 is 2 or more, two or more $L_{52}$(s) may be identical to or different from each other, and when b53 is 2 or more, two or more $L_{53}$(s) may be identical to or different from each other. In an embodiment, b51 to b53 may each independently be 1 or 2.

$L_{51}$ to $L_{53}$ in Formula 2 may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxasiline group, a dibenzothiasiline group, a dibenzodihydroazasiline group, a dibenzodihydrodisiline group, a dibenzodihydrosiline group, a dibenzodioxine group, a dibenzooxathiine group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(═O)($Q_{31}$), —S(═O)$_2$($Q_{31}$), —P(═O)($Q_{31}$)($Q_{32}$), or any combination thereof, wherein $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In an embodiment, in Formula 2, the bond between $L_{51}$ and $R_{51}$, the bond between $L_{52}$ and $R_{52}$, the bond between $L_{53}$ and $R_{53}$, the bond between two or more $L_{51}$(s), the bond between two or more $L_{52}$(s), the bond between two or more $L_{53}$(s), the bond between $L_{51}$ and the carbon atom between $X_{54}$ and $X_{55}$ in Formula 2, the bond between $L_{52}$ and the carbon atom between $X_{54}$ and $X_{56}$ in Formula 2, and the bond between $L_{53}$ and the carbon atom between $X_{55}$ and $X_{56}$ in Formula 2 may each be a "carbon-carbon single bond".

In Formula 2, $X_{54}$ may be N or $C(R_{54})$, $X_{55}$ may be N or $C(R_{55})$, $X_{56}$ may be N or $C(R_{56})$, and at least one of $X_{54}$ to $X_{56}$ may be N. $R_{54}$ to $R_{56}$ may each independently be the same as described in the present specification. In an embodiment, two or three of $X_{54}$ to $X_{56}$ may be N.

$R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in the present specification may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$. $Q_1$ to $Q_3$ may each independently be the same as described in the present specification.

In an embodiment, i) $R_1$ to $R_4$, $R_{40}$, $Z_{11}$, $Z_{12}$, $Z_{21}$, and $Z_{22}$ in Formula 1 ii) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$ and $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and iii) $R_{10a}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

Formula 91

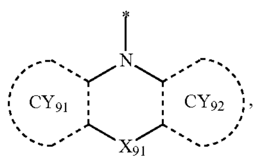

wherein, in Formula 91, ring $CY_{91}$ and ring $CY_{92}$ may each independently be a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ may each independently be the same as described in connection with $R_{82}$, $R_{82a}$, and $R_{82b}$ in the present specification, $R_{10a}$ is the same as described in the present specification, and

* indicates a binding site to a neighboring atom.

In an embodiment, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, $R_{91}$, $R_{91a}$, and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In an embodiment, i) $R_1$ to $R_4$, $R_{40}$, $Z_{11}$, $Z_{12}$, $Z_{21}$, and $Z_{22}$ in Formula 1 ii) $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, and iii) $R_{10a}$ may each independently be hydrogen, deuterium, —F, a cyano group, a nitro group, $—CH_3$, $—CD_3$, $—CD_2H$, $—CDH_2$, $—CF_3$, $—CF_2H$, $—CFH_2$, a group represented by one of Formulae 9-1 to 9-20 in the present specification, a group represented by one of Formulae 10-1 to 10-254 in the present specification, $—C(Q_1)(Q_2)(Q_3)$, $—Si(Q_1)(Q_2)(Q_3)$, or $—P(=O)(Q_1)(Q_2)$(wherein $Q_1$ to $Q_3$ may each independently be the same as described in the present specification).

In Formulae 3-1 to 3-5, 502, and 503, a71 to a74 and a501 to a504 may respectively indicate the number of $R_{71}$(s) to $R_{74}$(s) and $R_{501}$(s) to $R_{504}$(s), and a71 to a74 and a501 to a504 may each independently be an integer from 0 to 20. When a71 is 2 or greater, at least two $R_{71}$(s) may be identical to or different from each other, when a72 is 2 or greater, at least two $R_{72}$(s) may be identical to or different from each other, when a73 is 2 or greater, at least two $R_{73}$(s) may be identical to or different from each other, when a74 is 2 or greater, at least two $R_{74}$(s) may be identical to or different from each other, when a501 is 2 or greater, at least two $R_{501}$(s) may be identical to or different from each other, when a502 is 2 or greater, at least two $R_{502}$(s) may be identical to or different from each other, when a503 is 2 or greater, at least two $R_{503}$(s) may be identical to or different from each other, and when a504 is 2 or greater, at least two $R_{504}$(s) may be identical to or different from each other. a71 to a74 and a501 to a504 may each independently be an integer from 0 to 8.

In an embodiment, a group represented by $*-(L_{51})_{b51}-R_{51}$ and a group represented by $*-(L_{52})_{b52}-R_{52}$ in Formula 2 may each not be a phenyl group.

In an embodiment, a group represented by $*-(L_{51})_{b51}-R_{51}$ and a group represented by $*-(L_{52})_{b52}-R_{52}$ in Formula 2 may be identical to each other.

In an embodiment, a group represented by $*-(L_{51})_{b51}-R_{51}$ and a group represented by $*-(L_{52})_{b52}-R_{52}$ in Formula 2 may be different from each other.

In an embodiment, b51 and b52 in Formula 2 may each be 1, 2, or 3, and $L_{51}$ and $L_{52}$ may each independently be a benzene group, a pyridine group, a pyrimidine group, a pyridazine group, a pyrazine group, or a triazine group, each unsubstituted or substituted with at least one $R_{10a}$.

In an embodiment, $R_{51}$ and $R_{52}$ in Formula 2 may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, or $—Si(Q_1)(Q_2)(Q_3)$, and wherein $Q_1$ to $Q_3$ may each independently be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, a group represented by $*-(L_{51})_{b51}-R_{51}$ in Formula 2 may be a group represented by one of Formulae CY51-1 to CY51-26, and/or a group represented by $*-(L_{52})_{b52}-R_{52}$ in Formula 2 may be a group represented by one of Formulae CY52-1 to CY52-26, and/or a group represented by $*-(L_{53})_{b53}-R_{53}$ in Formula 2 may be a group represented by one of Formulae CY53-1 to CY53-27, $—C(Q_1)(Q_2)(Q_3)$, or $—Si(Q_1)(Q_2)(Q_3)$.

CY51-1

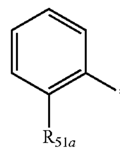

CY51-2

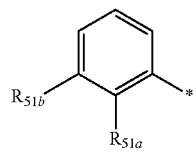

CY51-3

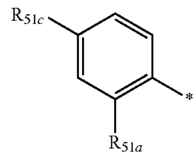

-continued
CY51-4
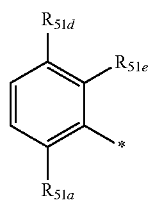
CY51-5
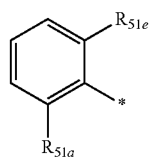
CY51-6
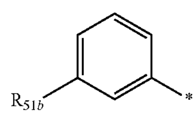
CY51-7
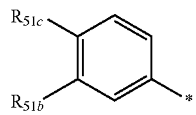
CY51-8
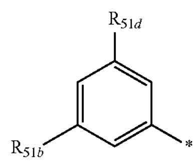
CY51-9
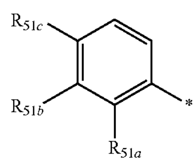
CY51-10
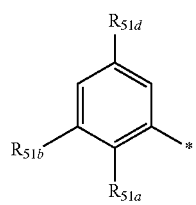
CY51-11
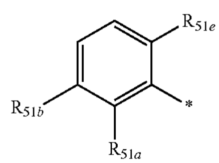
CY51-12
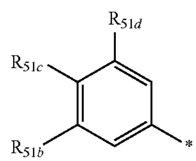
CY51-13
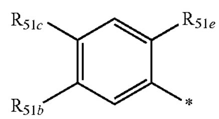
-continued
CY51-14
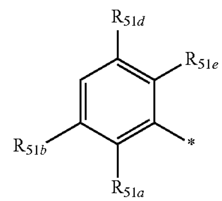
CY51-15
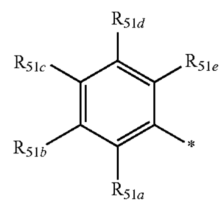
CY51-16
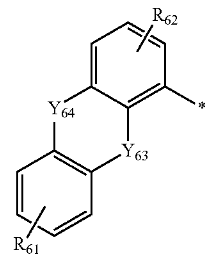
CY51-17
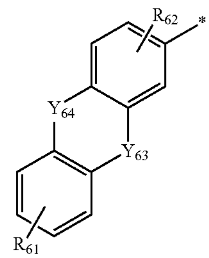
CY51-18
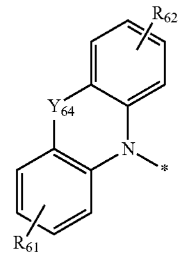
CY51-19
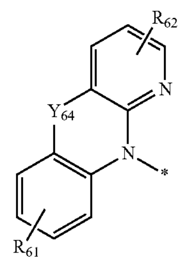

-continued
CY51-20
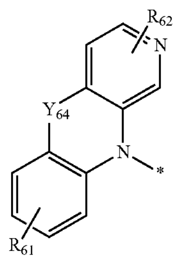
CY51-21
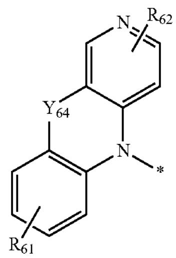
CY51-22
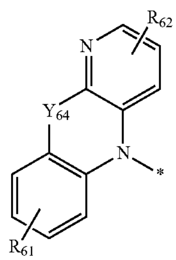
CY51-23
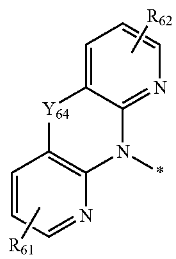
CY51-24
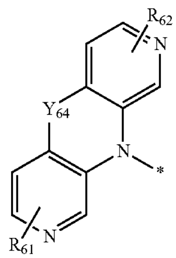
CY51-25
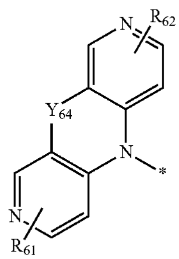
-continued
CY51-26
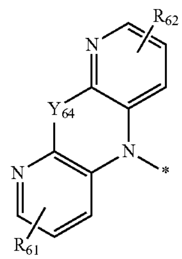
CY52-1
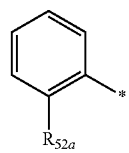
CY52-2
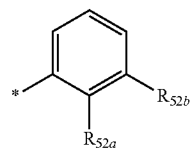
CY52-3
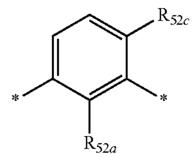
CY52-4
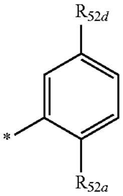
CY52-5
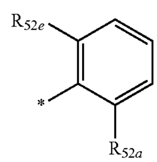
CY52-6
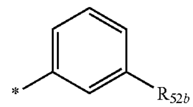
CY52-7
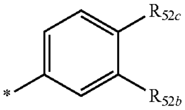
CY52-8
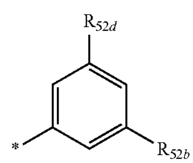

-continued
CY52-9
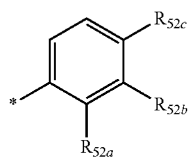
CY52-10
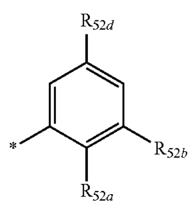
CY52-11
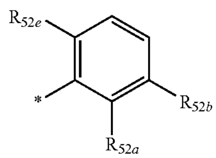
CY52-12
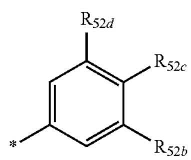
CY52-13
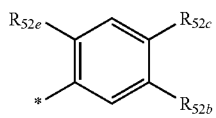
CY52-14
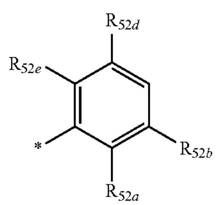
CY52-15
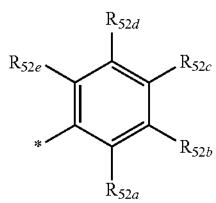
CY52-16
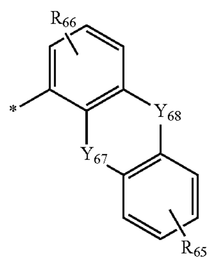
-continued
CY52-17
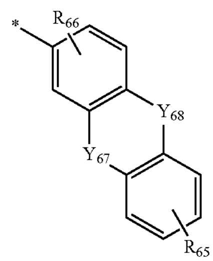
CY52-18
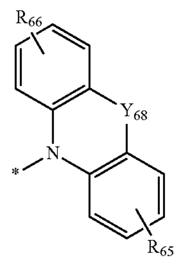
CY52-19
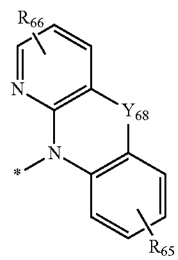
CY52-20
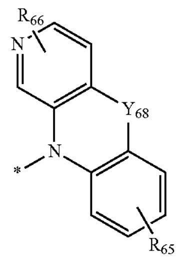
CY52-21
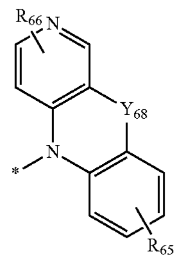
CY52-22
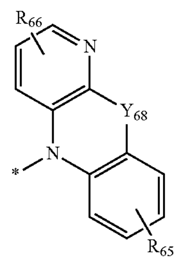

-continued
CY52-23
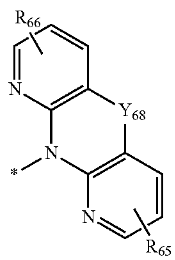
CY52-24
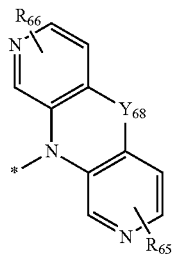
CY52-25
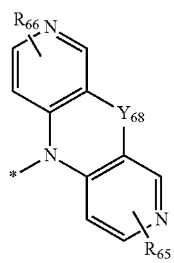
CY52-26
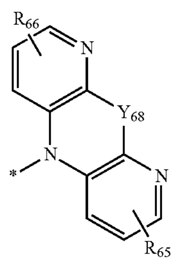
CY53-1
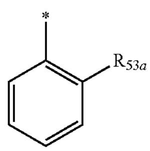
CY53-2
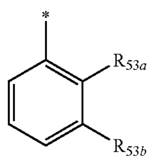
CY53-3
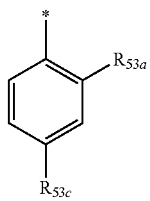
-continued
CY53-4
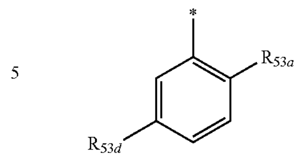
CY53-5
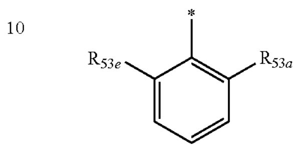
CY53-6
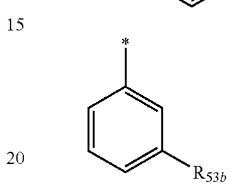
CY53-7
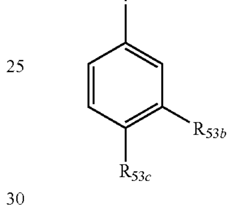
CY53-8
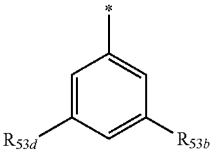
CY53-9
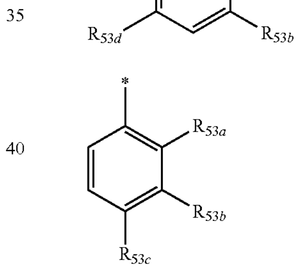
CY53-10
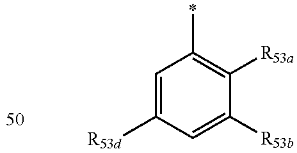
CY53-11
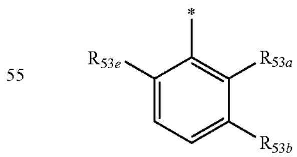
CY53-12
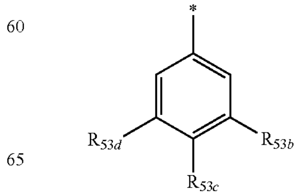

-continued
CY53-13
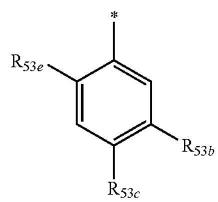
CY53-14
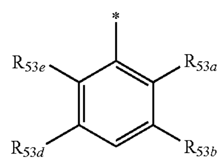
CY53-15
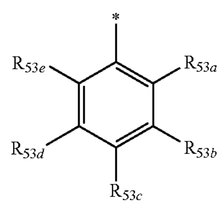
CY53-16
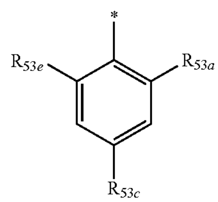
CY53-17
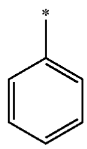
CY53-18
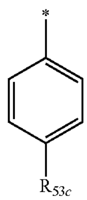
CY53-19
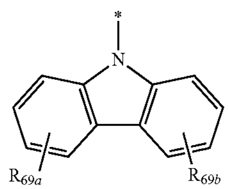
CY53-20
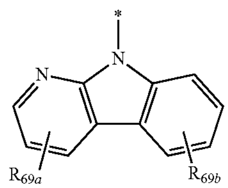
-continued
CY53-21
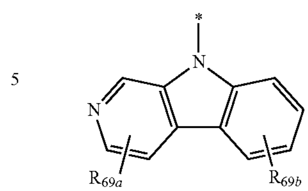
CY53-22
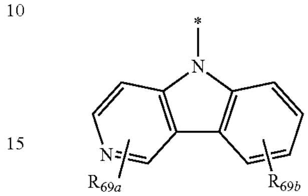
CY53-23
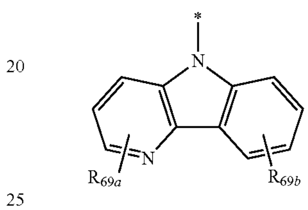
CY53-24
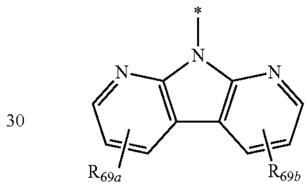
CY53-25
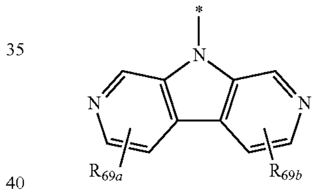
CY53-26
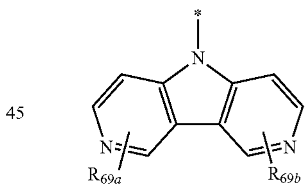
CY53-27
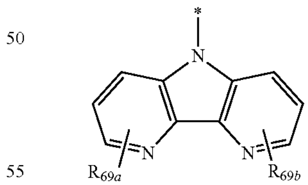
,
wherein, in Formulae CY51-1 to CY51-26, CY52-1 to CY52-26, and CY53-1 to CY53-27,
$Y_{63}$ may be a single bond, O, S, $N(R_{63})$, $B(R_{63})$, $C(R_{63a})(R_{63b})$, or $Si(R_{63a})(R_{63b})$,
$Y_{64}$ may be a single bond, O, S, $N(R_{64})$, $B(R_{64})$, $C(R_{64a})(R_{64b})$, or $Si(R_{64a})(R_{64b})$,
$Y_{67}$ may be a single bond, O, S, $N(R_{67})$, $B(R_{67})$, $C(R_{67a})(R_{67b})$, or $Si(R_{67a})(R_{67b})$,
$Y_{68}$ may be a single bond, O, S, $N(R_{68})$, $B(R_{68})$, $C(R_{68a})(R_{68b})$, or $Si(R_{68a})(R_{68b})$, in some embodiments, $Y_{63}$ and $Y_{64}$ in Formulae CY51-16 and CY51-17 may not simultaneously be a single bond, in some embodiments, $Y_{67}$ and $Y_{68}$ in Formulae CY52-16 and CY52-17 may not simultaneously be a single bond, $R_{51a}$ to $R_{51e}$, $R_{61}$ to $R_{64}$, $R_{63a}$, $R_{63b}$, $R_{64a}$, and $R_{64b}$ may each be understood by referring to the description of $R_{51}$, and $R_{51a}$ to $R_{51e}$ may not each be (e.g., may not simultaneously be) hydrogen, $R_{52a}$ to $R_{52e}$, $R_{65}$ to $R_{68}$, $R_{67a}$, $R_{67b}$, $R_{68a}$, and $R_{68b}$ may each be understood by referring to the description of $R_{52}$, and $R_{52a}$ to $R_{52e}$ may not each be hydrogen, $R_{53a}$ to $R_{53e}$, $R_{69a}$, and $R_{69b}$ may each be understood by referring to the description of $R_{53}$, and $R_{53a}$ to $R_{53e}$ may not each be (e.g., may not simultaneously be) hydrogen, and

* indicates a binding site to a neighboring atom.

In an embodiment, $R_{51a}$ to $R_{51e}$ and $R_{52a}$ to $R_{52e}$ in Formulae CY51-1 to CY51-26 and Formulae CY52-1 to 52-26 may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or $—C(Q_1)(Q_2)(Q_3)$ or $—Si(Q_1)(Q_2)(Q_3)$, wherein $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, in Formulae CY51-16 and CY51-17, i) $Y_{63}$ may be O or S and $Y_{64}$ may be $Si(R_{64a})(R_{64b})$, or ii) $Y_{63}$ may be $Si(R_{63a})(R_{63b})$ and $Y_{64}$ may be O or S, and in Formulae CY52-16 and CY52-17, i) $Y_{67}$ may be O or S, and $Y_{68}$ may be $Si(R_{68a})(R_{68b})$, or ii) $Y_{67}$ may be $Si(R_{67a})(R_{67b})$, and $Y_{68}$ may be O or S.

In Formulae 3-1 to 3-5, $L_{81}$ to $L_{85}$ may each independently be:

a single bond; or $*—C(Q_4)(Q_5)-*'$ or $*—Si(Q_4)(Q_5)-*'$; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In an embodiment, in Formulae 3-1 and 3-2, a group represented by

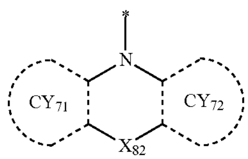

may be represented by one of Formulae CY71-1(1) to CY71-1(8), in Formulae 3-1 and 3-3, a group represented by

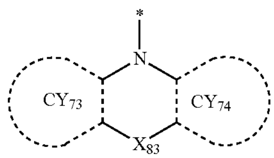

may be represented by one of Formulae CY71-2(1) to CY71-2(8), in Formulae 3-2 and 3-4, a group represented by

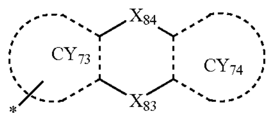

may be represented by one of Formulae CY71-3(1) to CY71-3(32), in Formulae 3-3 to 3-5, a group represented by

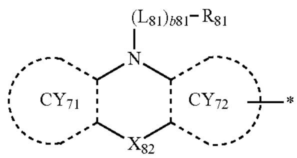

may be represented by one of Formulae CY71-4(1) to CY71-4(32), and/or in Formula 3-5, a group represented by may be represented by

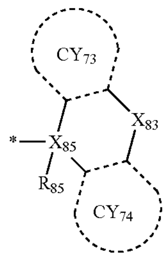

may be represented by one of Formulae CY71-5(1) to CY71-5(8):

CY71-1(1)

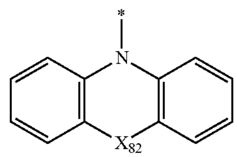

CY71-1(2)

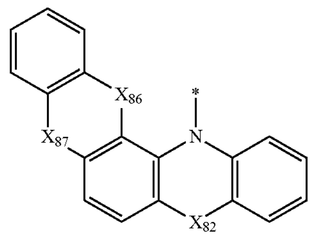

CY71-1(3)

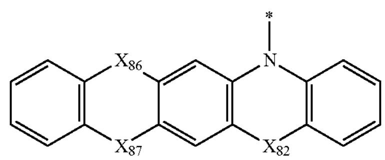

CY71-1(4)

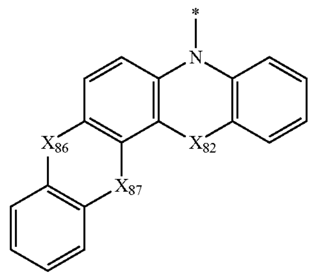

CY71-1(5)

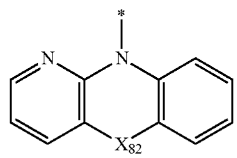

CY71-1(6)

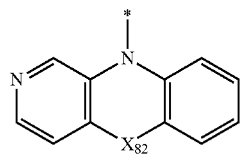

CY71-1(7)

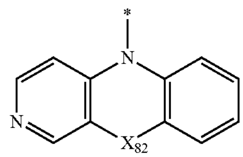

CY71-1(8)

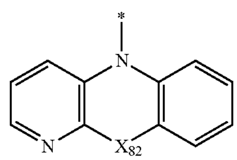

-continued
CY71-2(1)
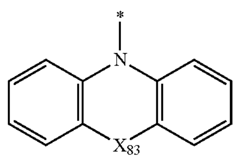
CY71-2(2)
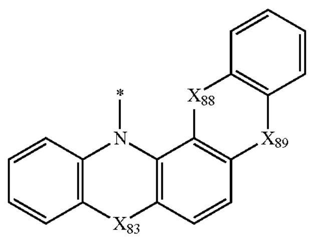
CY71-2(3)
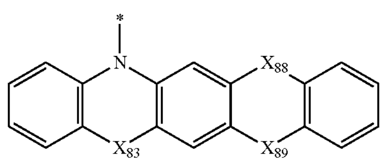
CY71-2(4)
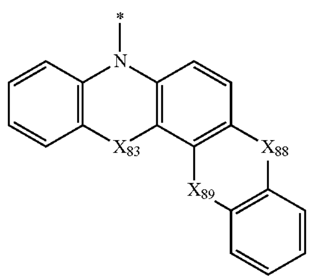
CY71-2(5)
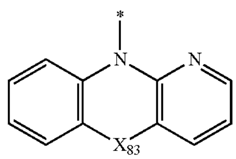
CY71-2(6)
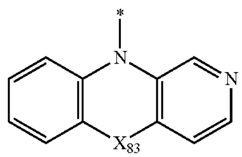
CY71-2(7)
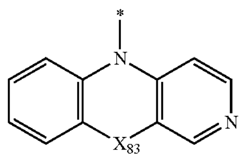
CY71-2(8)
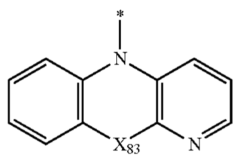
-continued
CY71-3(1)
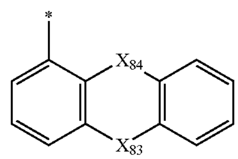
CY71-3(2)
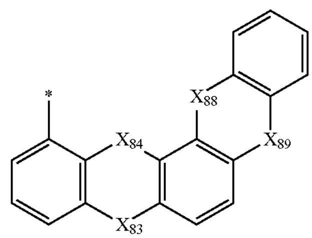
CY71-3(3)
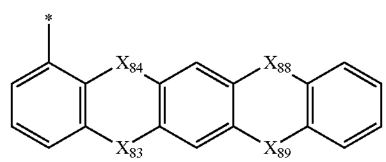
CY71-3(4)
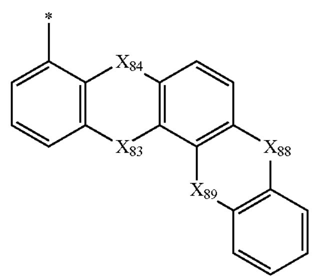
CY71-3(5)
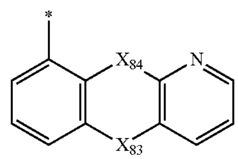
CY71-3(6)
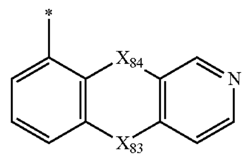
CY71-3(7)
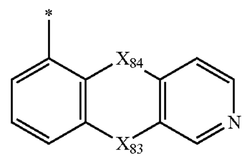
CY71-3(8)
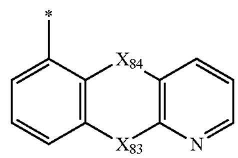

-continued
CY71-3(9)
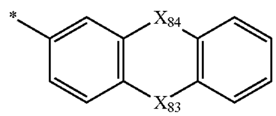
CY71-3(10)
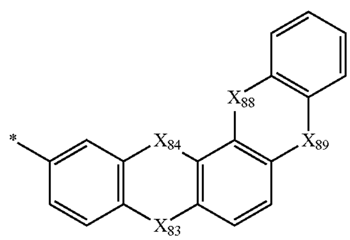
CY71-3(11)
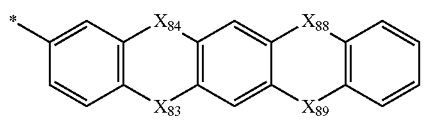
CY71-3(12)
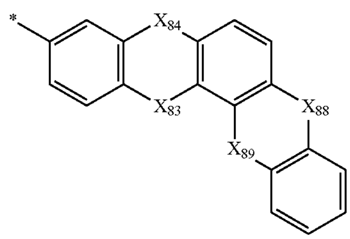
CY71-3(13)
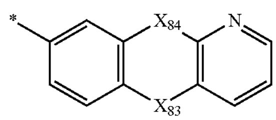
CY71-3(14)
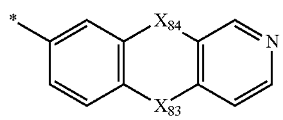
CY71-3(15)
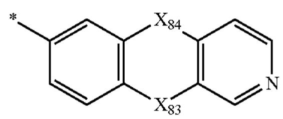
CY71-3(16)
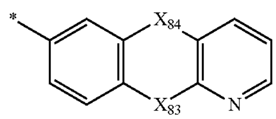
CY71-3(17)
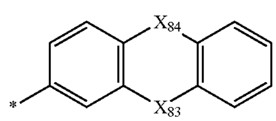
CY71-3(18)
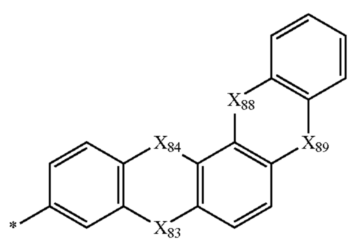
-continued
CY71-3(19)
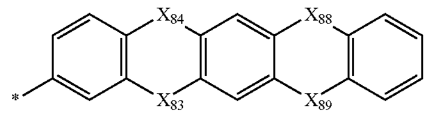
CY71-3(20)
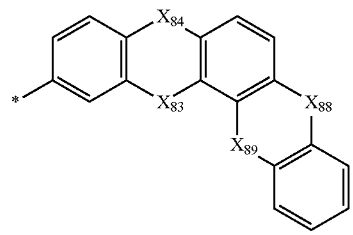
CY71-3(21)
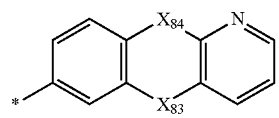
CY71-3(22)
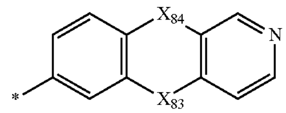
CY71-3(23)
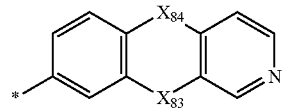
CY71-3(24)
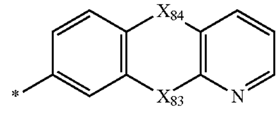
CY71-3(25)
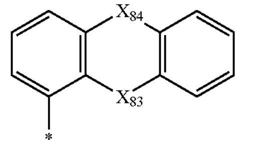
CY71-3(26)
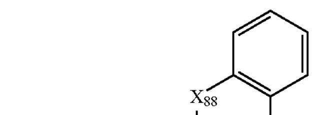
CY71-3(27)
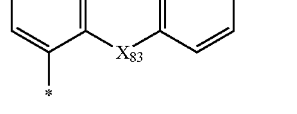
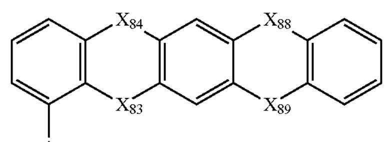

-continued
CY71-3(28)
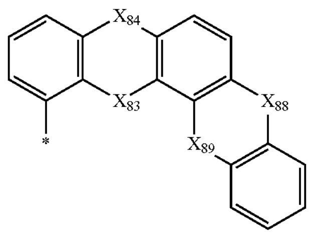
CY71-3(29)
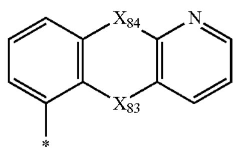
CY71-3(30)
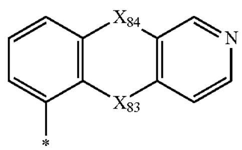
CY71-3(31)
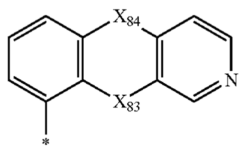
CY71-3(32)
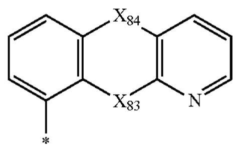
CY71-4(1)
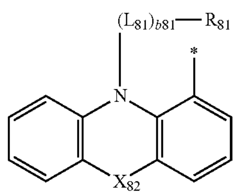
CY71-4(2)
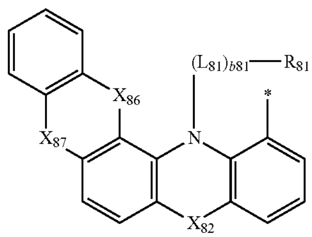
CY71-4(3)
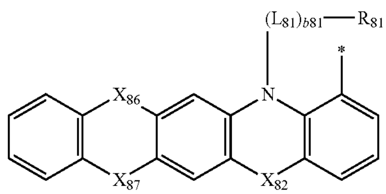
-continued
CY71-4(4)
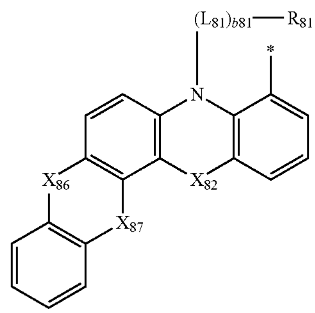
CY71-4(5)
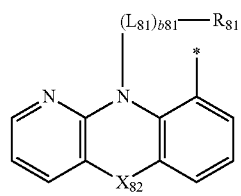
CY71-4(6)
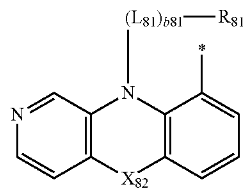
CY71-4(7)
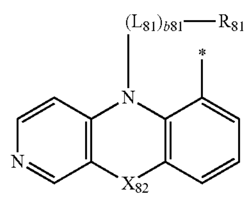
CY71-4(8)
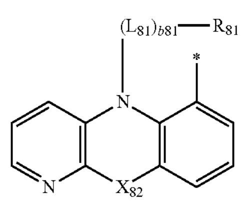
CY71-4(9)
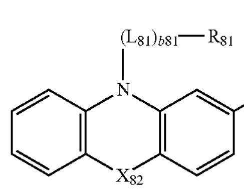
CY71-4(10)
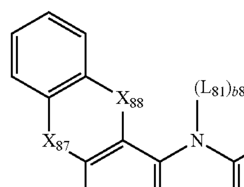

-continued
CY71-4(11)
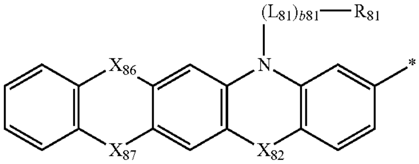
CY71-4(12)
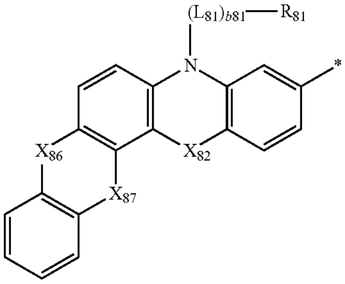
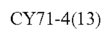
CY71-4(13)
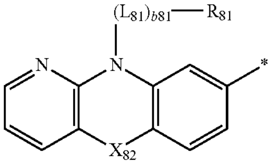
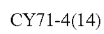
CY71-4(14)
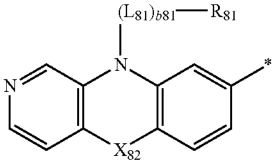
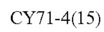
CY71-4(15)
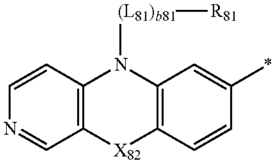
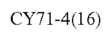
CY71-4(16)
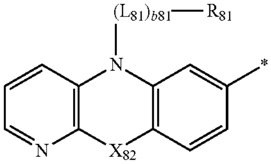
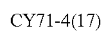
CY71-4(17)
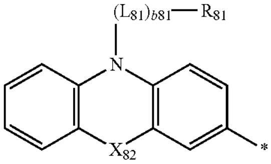
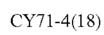
CY71-4(18)
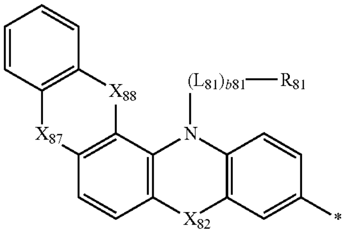
-continued
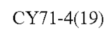
CY71-4(19)
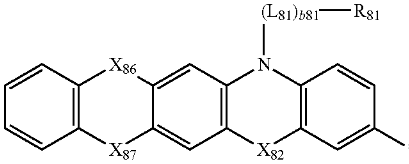
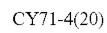
CY71-4(20)
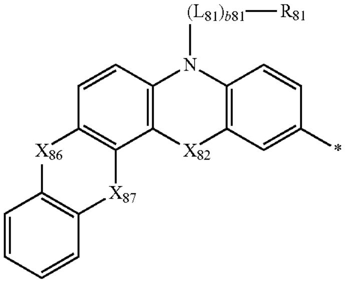
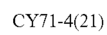
CY71-4(21)
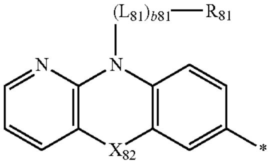
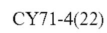
CY71-4(22)
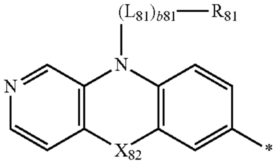
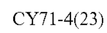
CY71-4(23)
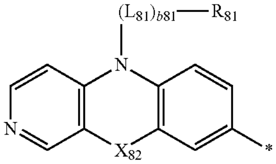
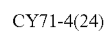
CY71-4(24)
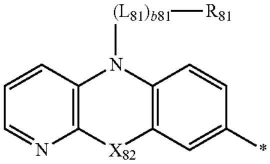
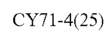
CY71-4(25)
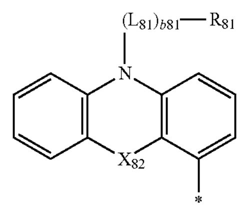

-continued
CY71-4(26)
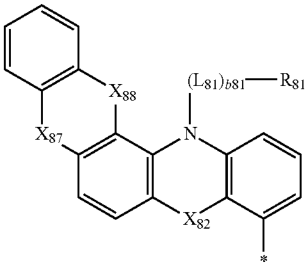
CY71-4(27)
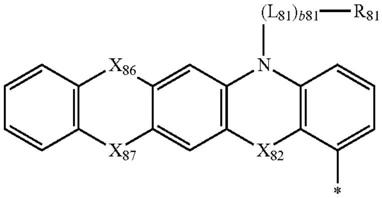
CY71-4(28)
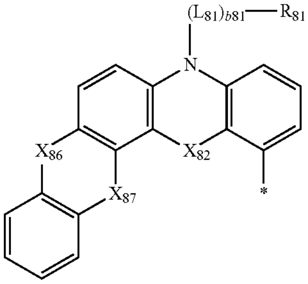
CY71-4(29)
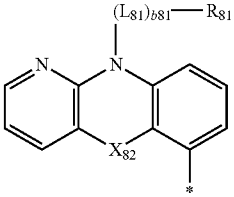
CY71-4(30)
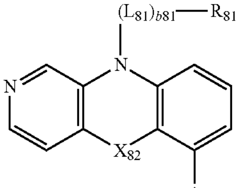
CY71-4(31)
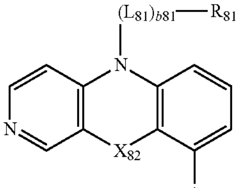
CY71-4(32)
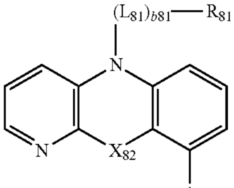
-continued
CY71-5(1)
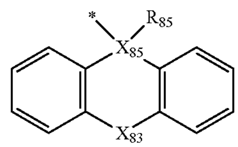
CY71-5(2)
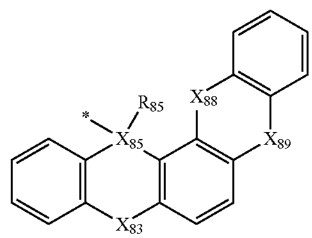
CY71-5(3)
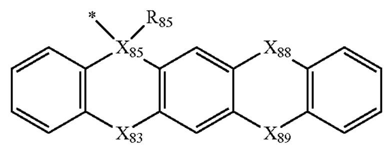
CY71-5(4)
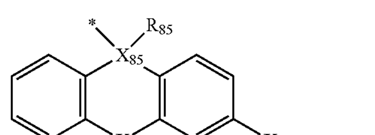
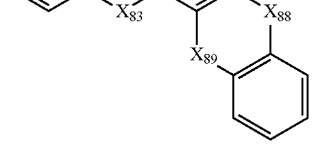
CY71-5(5)
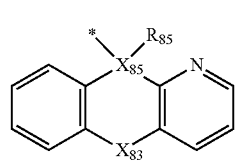
CY71-5(6)
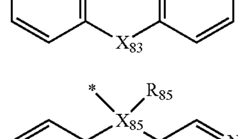
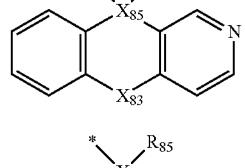
CY71-5(7)
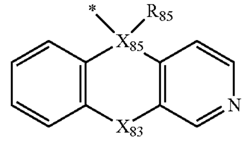
CY71-5(8)
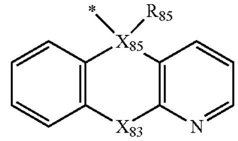
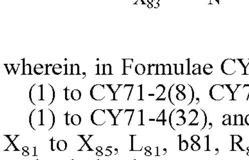
,
wherein, in Formulae CY71-1(1) to CY71-1(8), CY71-2(1) to CY71-2(8), CY71-3(1) to CY71-3(32), CY71-4(1) to CY71-4(32), and CY71-5(1) to CY71-5(8),
$X_{81}$ to $X_{85}$, $L_{81}$, b81, $R_{81}$, and $R_{85}$ may each independently be the same as described in the present specification,
$X_{86}$ may be a single bond, O, S, $N(R_{86})$, $B(R_{86})$, $C(R_{86a})(R_{86b})$, or $Si(R_{86a})(R_{86b})$, and $X_{87}$ may be a single bond, O, S, $N(R_{87})$, $B(R_{87})$, $C(R_{87a})(R_{87b})$, or $Si(R_{87a})(R_{87b})$, in Formulae CY71-1(1) to CY71-1(8) and CY71-4(1) to CY71-4(32), $X_{86}$ and $X_{87}$ may not be a single bond at the same time (e.g., simultaneously), $X_{88}$ may be a single bond, O, S, $N(R_{88})$, $B(R_{88})$, $C(R_{88a})(R_{88b})$, or $Si(R_{88a})(R_{88b})$, $X_{89}$ may be a single bond, O, S, $N(R_{89})$, $B(R_{89})$, $C(R_{89a})(R_{89b})$, or $Si(R_{89a})(R_{89b})$, in Formulae CY71-2(1) to CY71-2(8), CY71-3(1) to CY71-3(32), and CY71-5(1) to CY71-5(8), $X_{88}$ and $X_{89}$ may not be a single bond at the same time (e.g., simultaneously), and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ may each independently be the same as described in connection with $R_{81}$ in the present specification.

Examples of Second Compound, Third Compound, and Fourth Compound

In an embodiment, the second compound may include at least one of Compounds ETH1 to ETH84:

ETH1

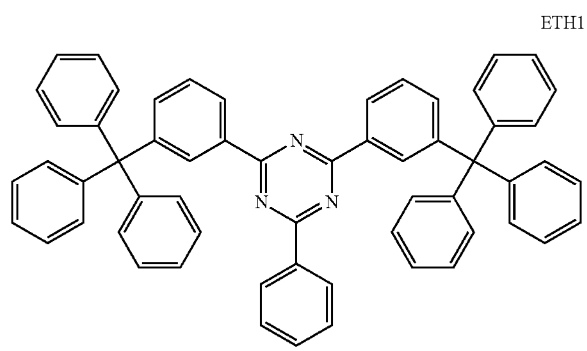

ETH2

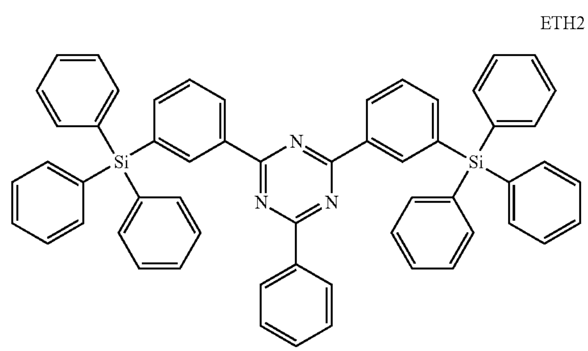

ETH3

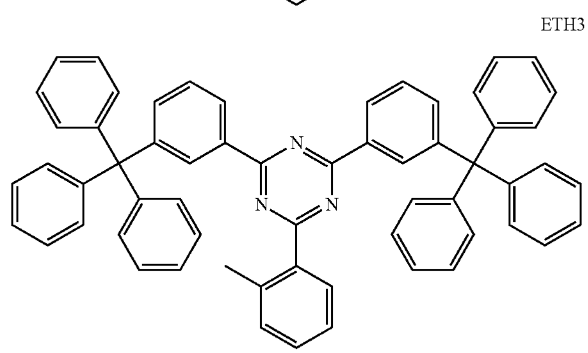

-continued

ETH4

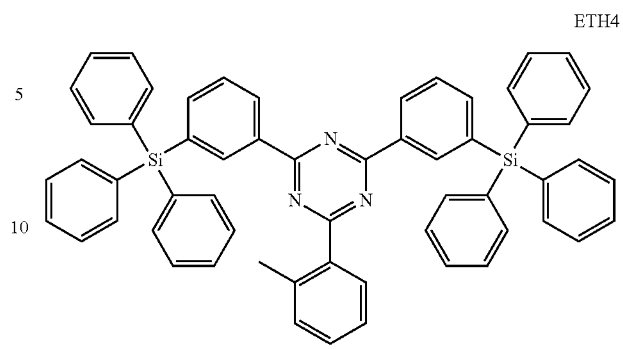

ETH5

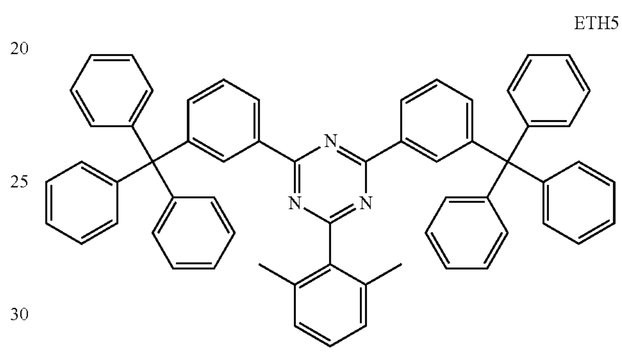

ETH6

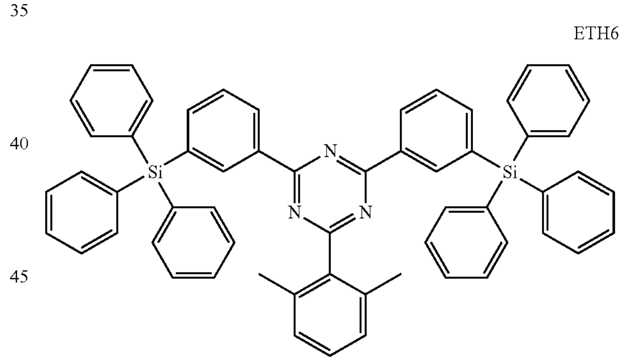

ETH7

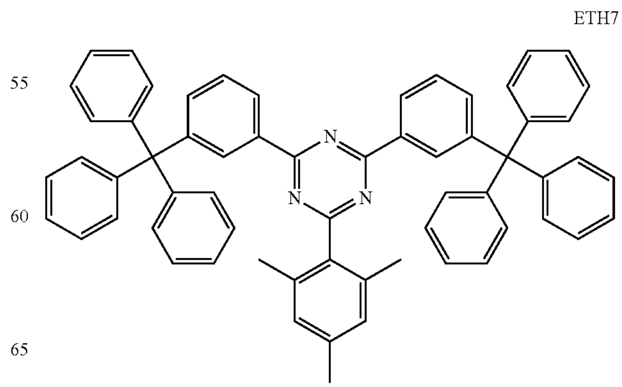

-continued
ETH8
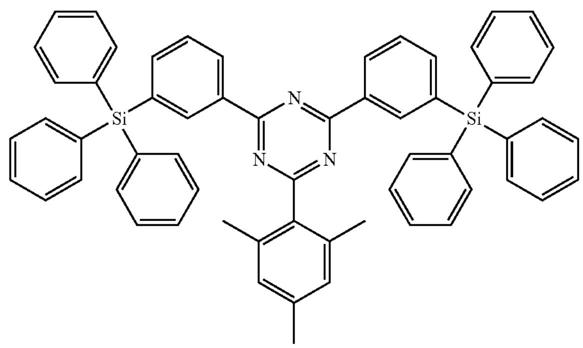
ETH9
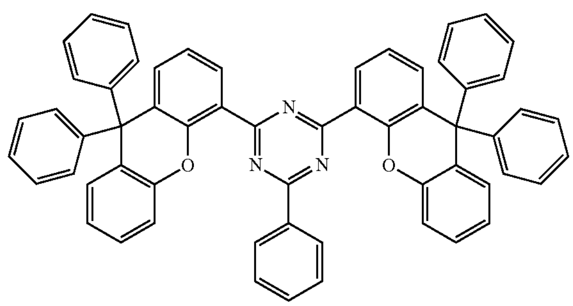
ETH10
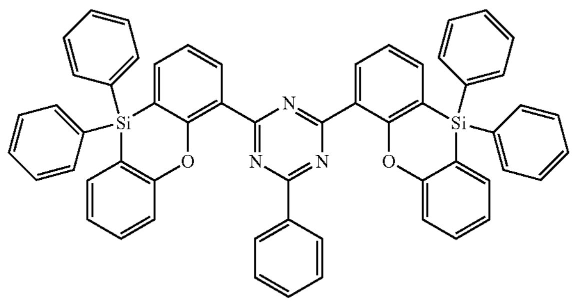
ETH11
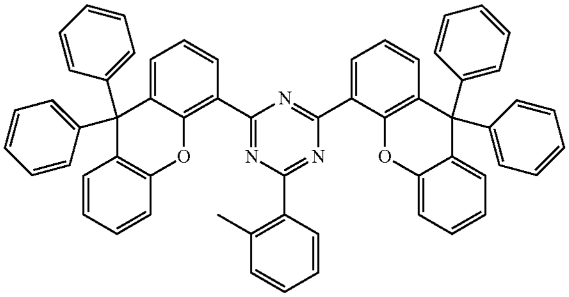
ETH12
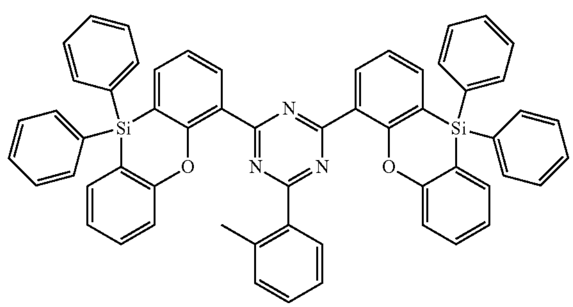
-continued
ETH13
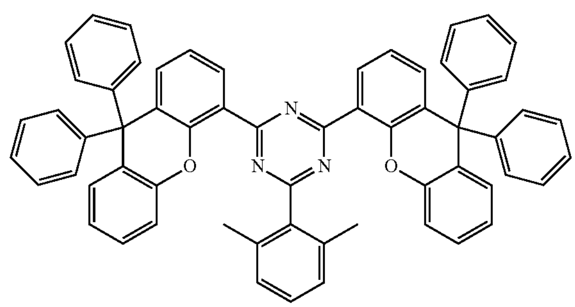
ETH14
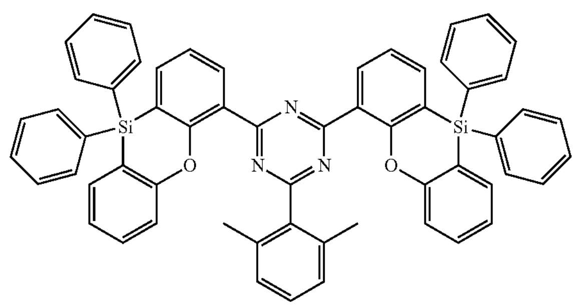
ETH15
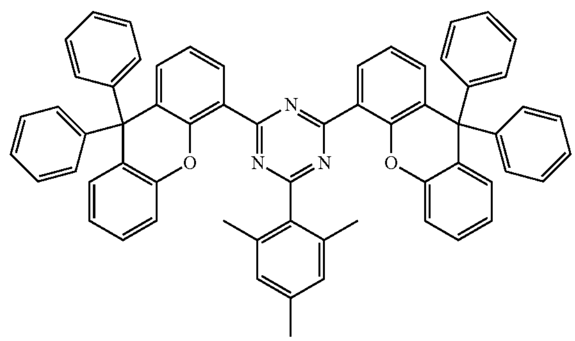
ETH16
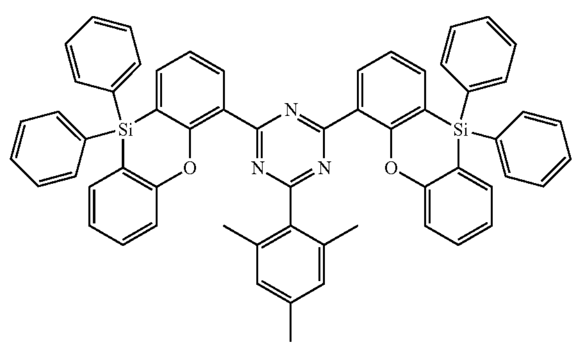

-continued
ETH17
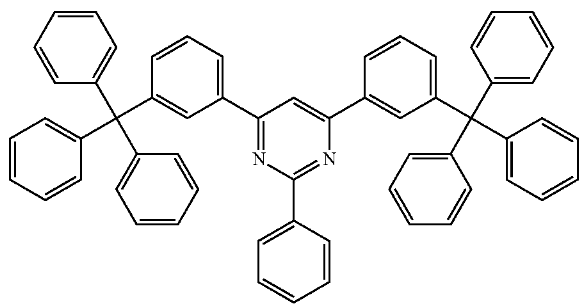
ETH18
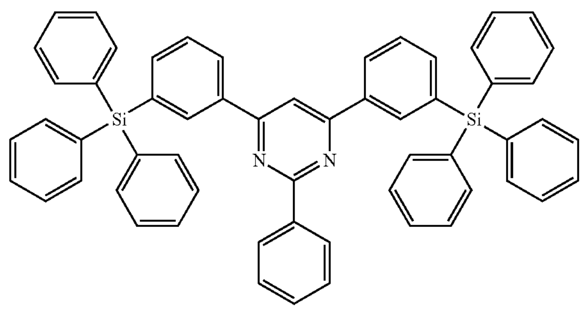
ETH19
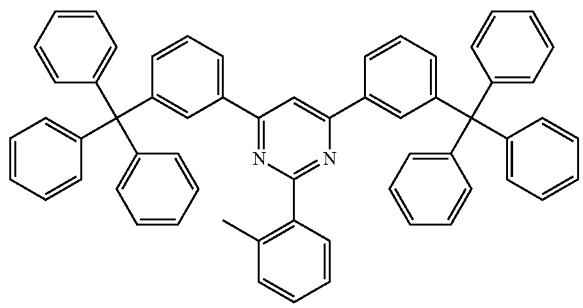
ETH20
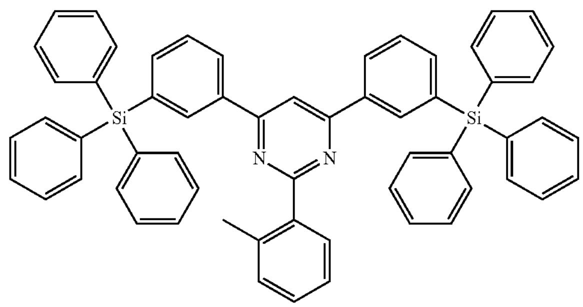
ETH21
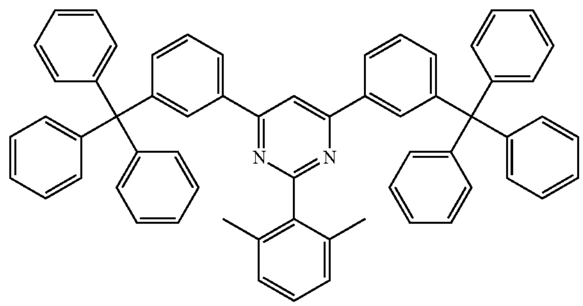
-continued
ETH22
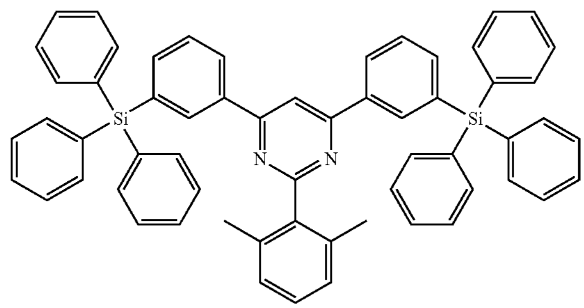
ETH23
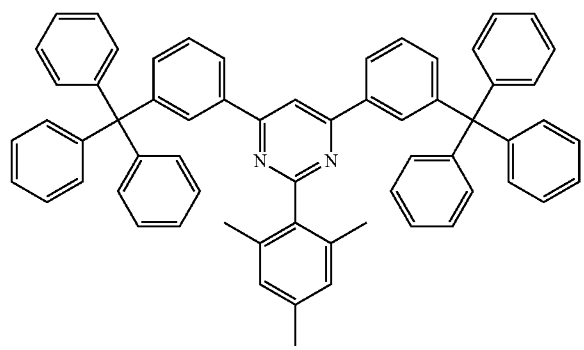
ETH24
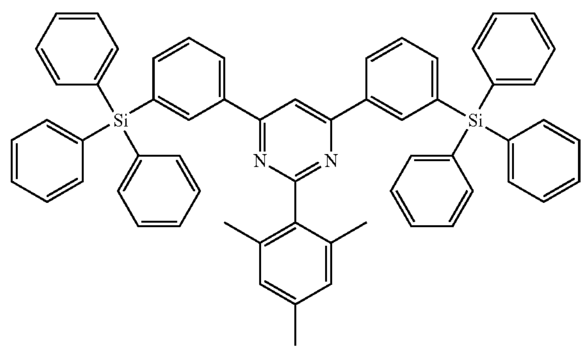
ETH25
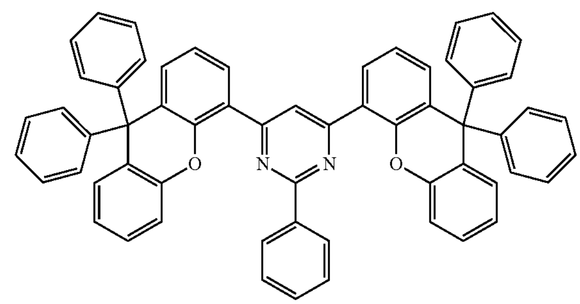

ETH26
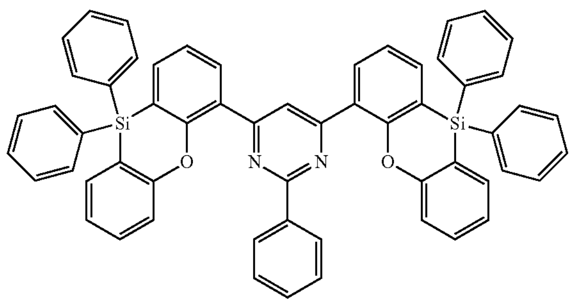
ETH27
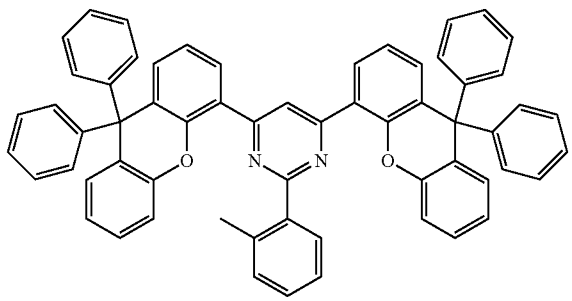
ETH28
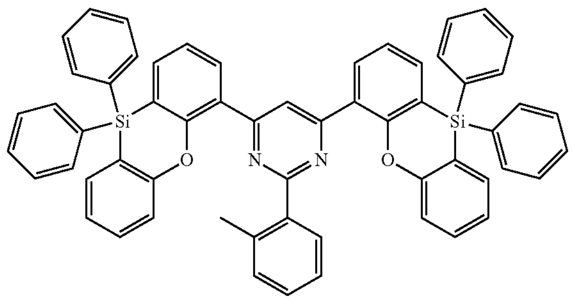
ETH29
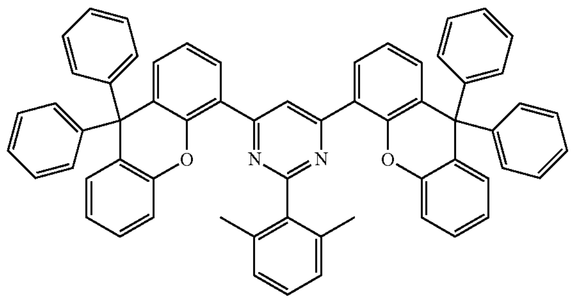
ETH30
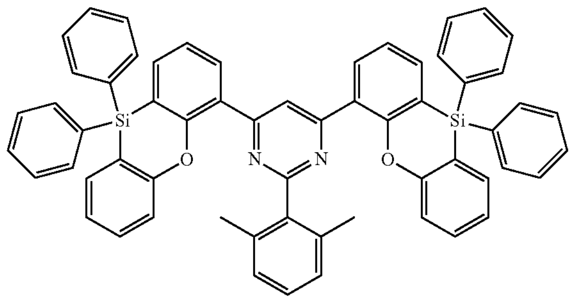
ETH31
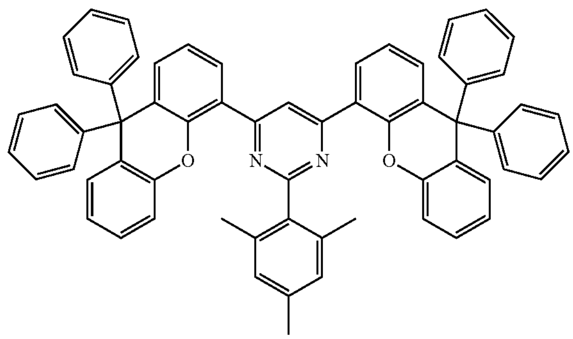
ETH32
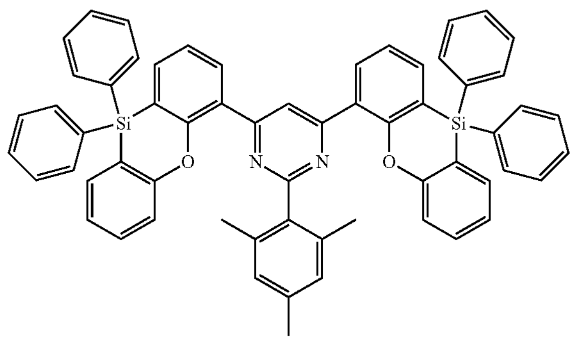
ETH33
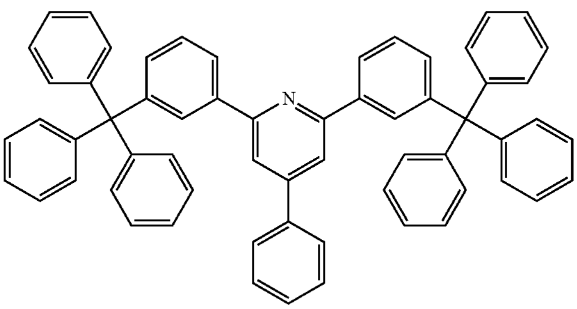
ETH34
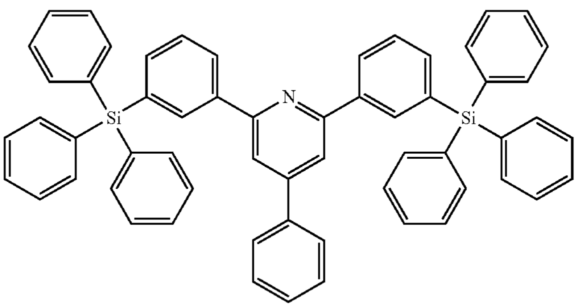

-continued
ETH35
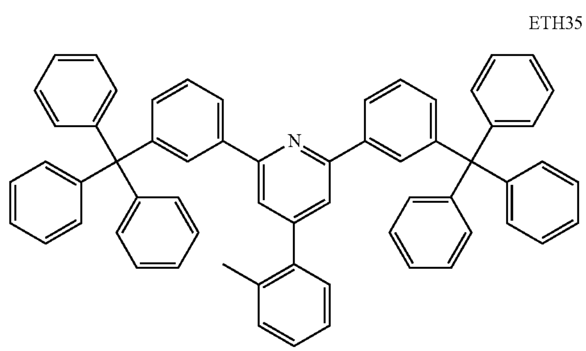
ETH36
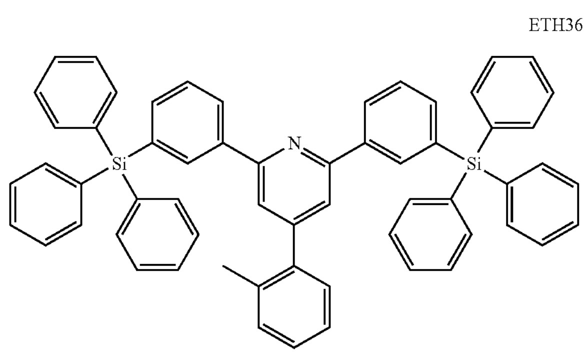
ETH37
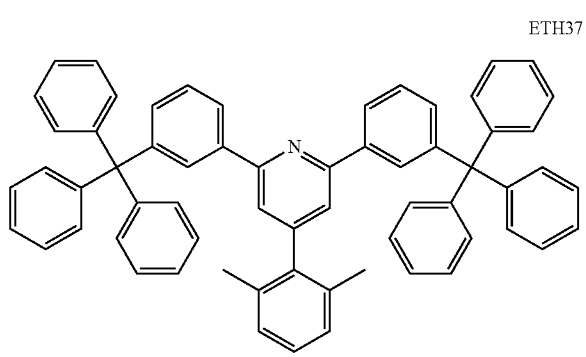
ETH38
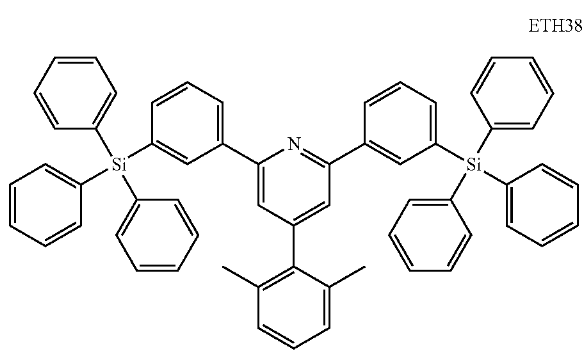
-continued
ETH39
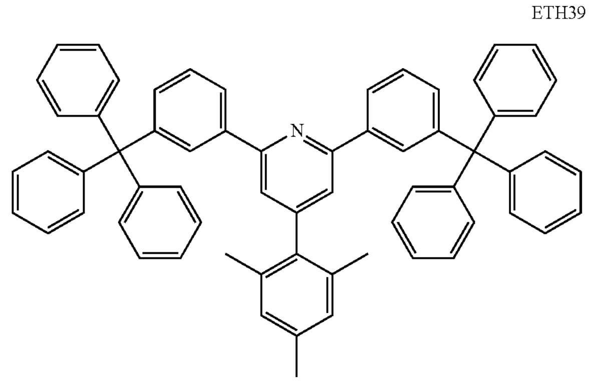
ETH40
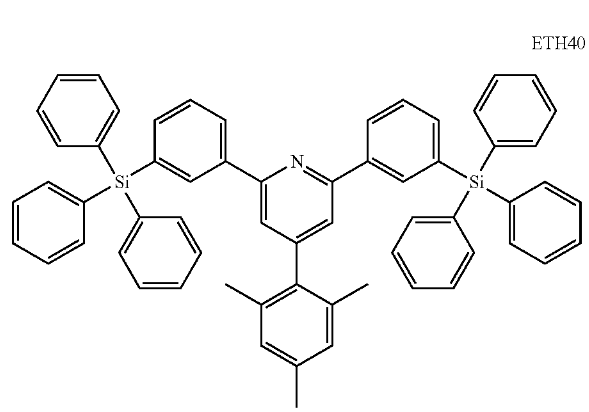
ETH41
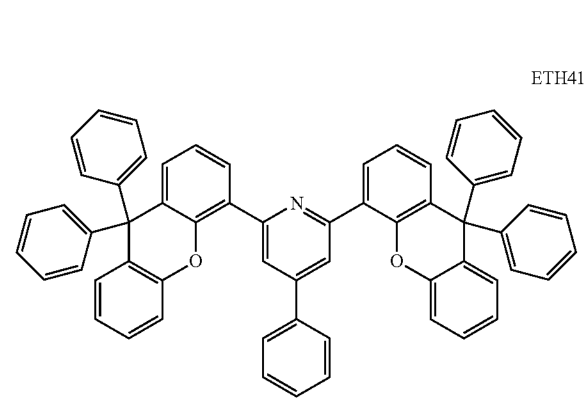
ETH42
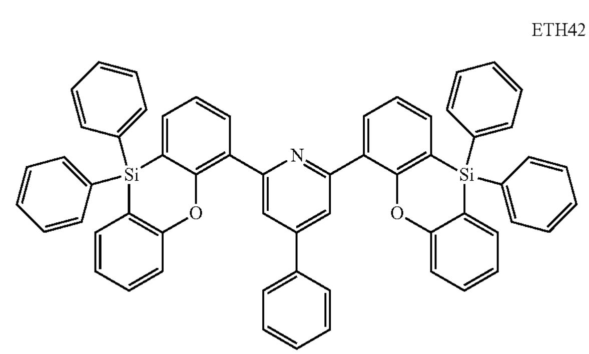

ETH43
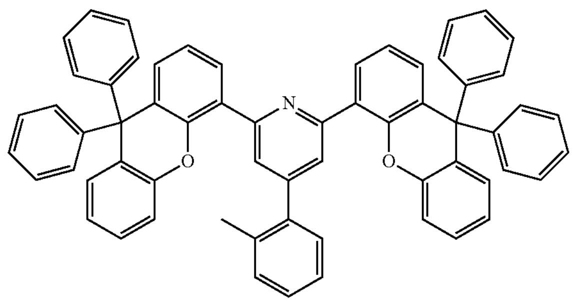
ETH44
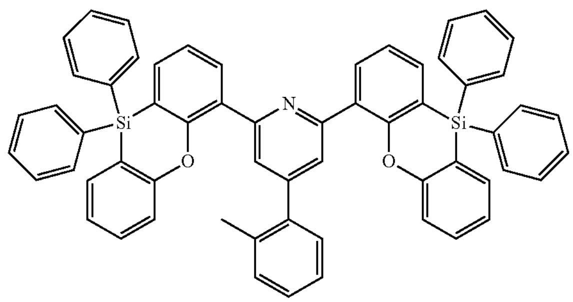
ETH45
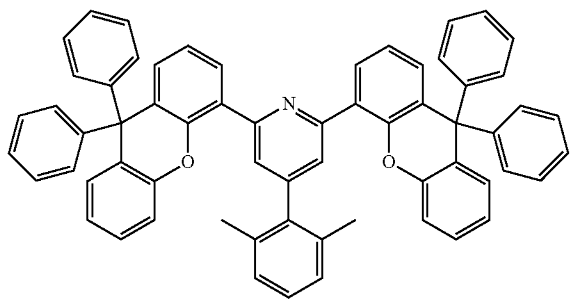
ETH46
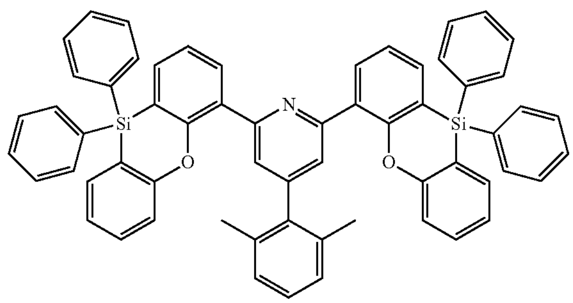
ETH47
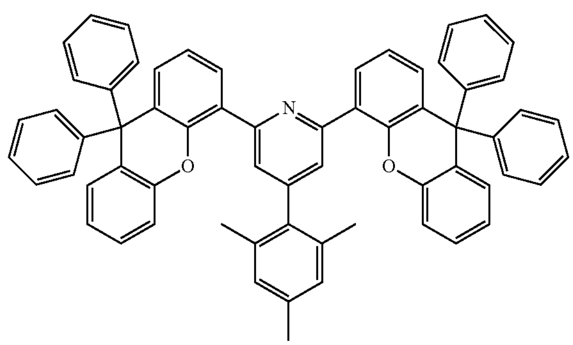
ETH48
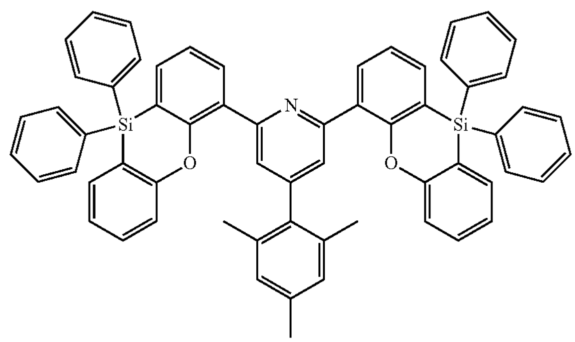
ETH49
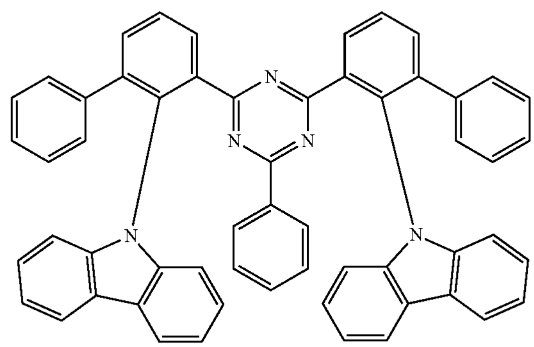
ETH50
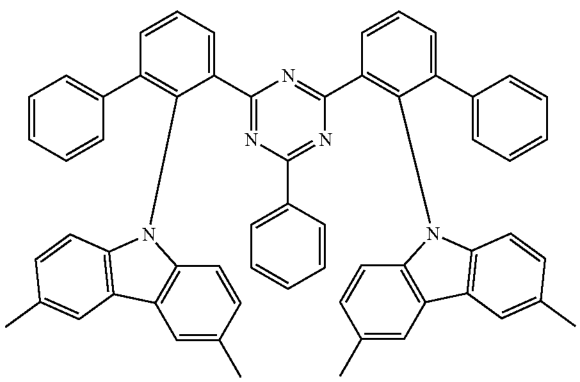
ETH51
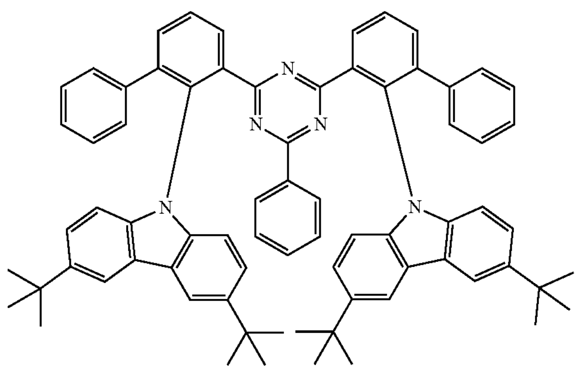

-continued
ETH52
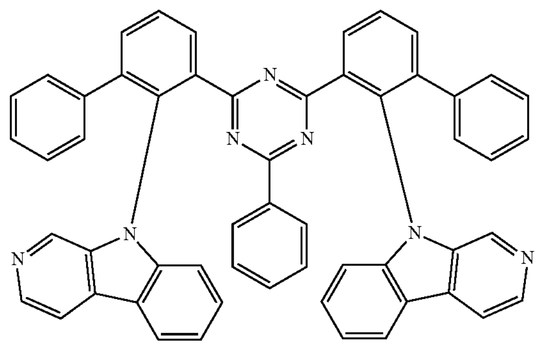
ETH53
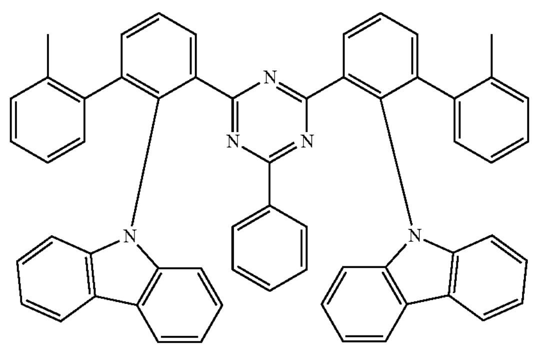
ETH54
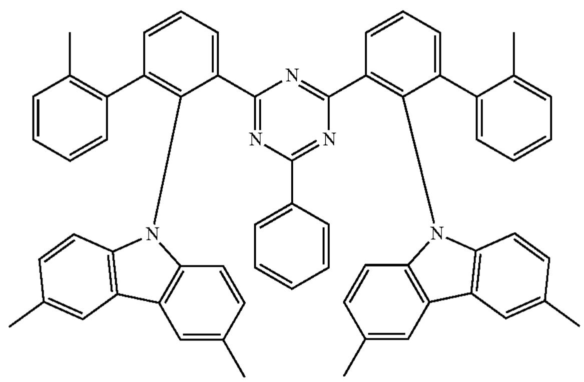
ETH55
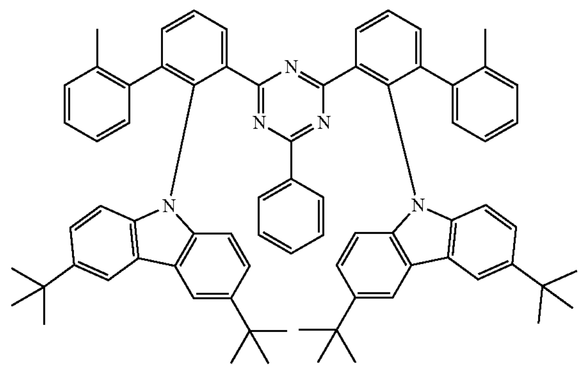
-continued
ETH56
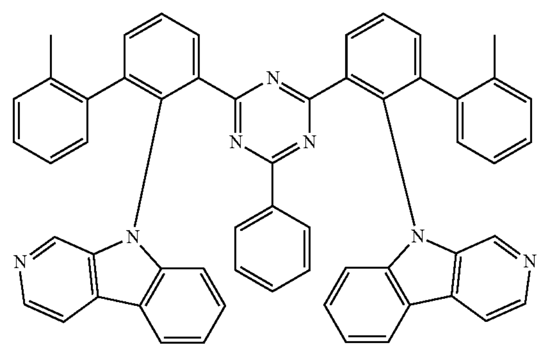
ETH57
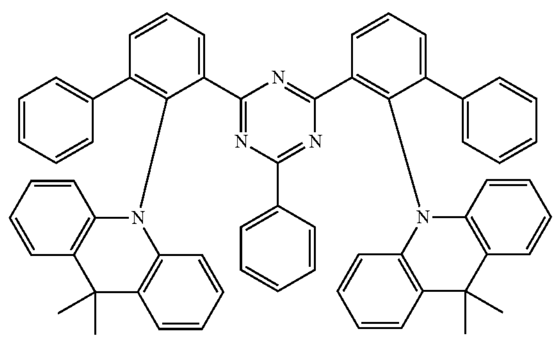
ETH58
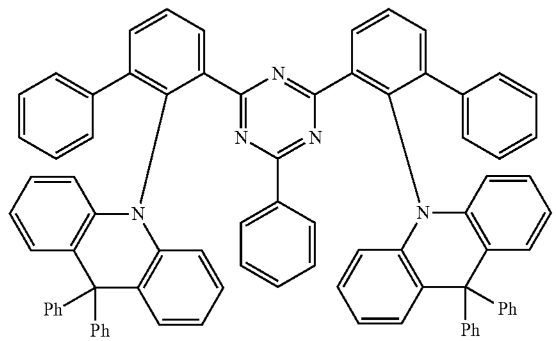
ETH59
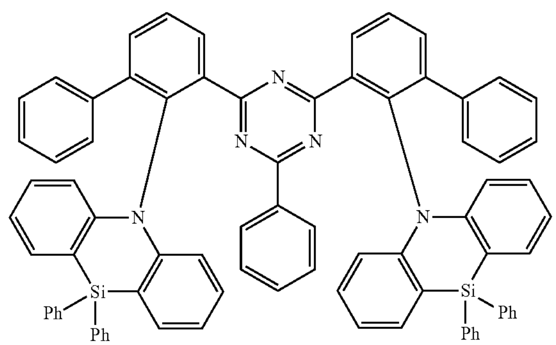

-continued
ETH60
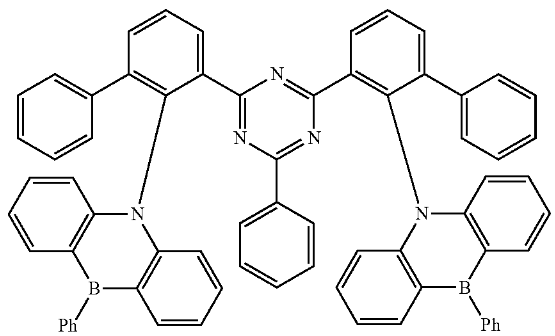
ETH61
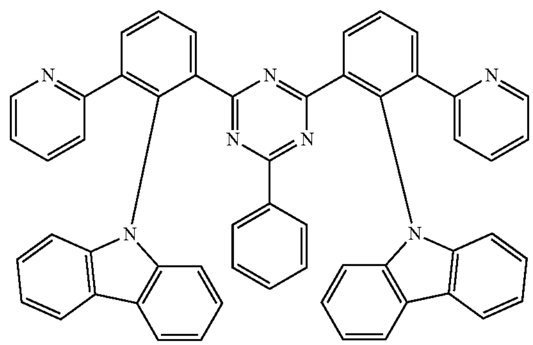
ETH62
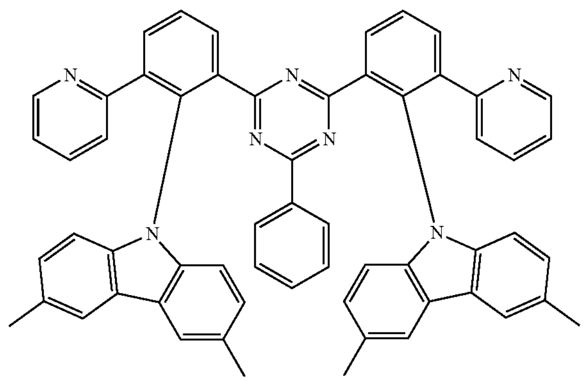
ETH63
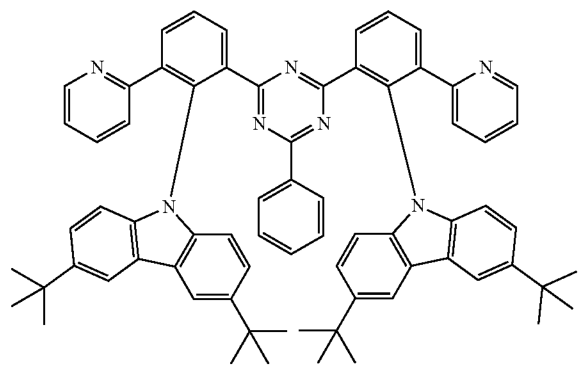
-continued
ETH64
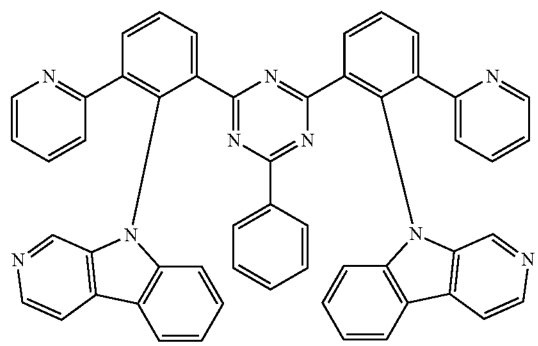
ETH65
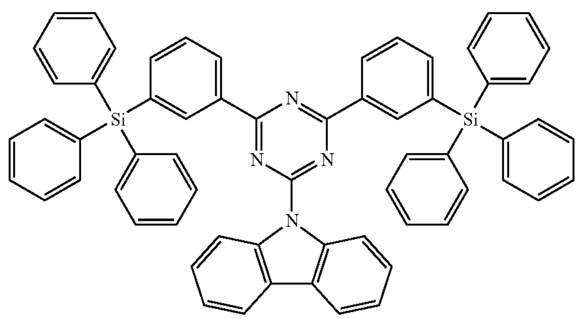
ETH66
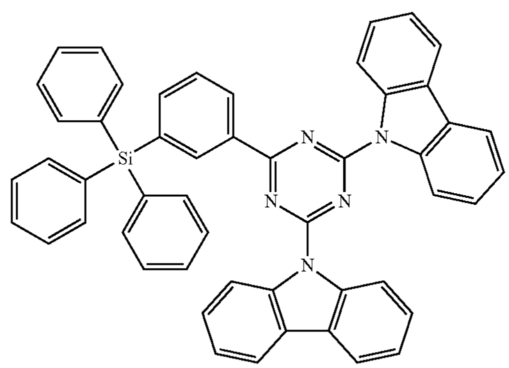
ETH67
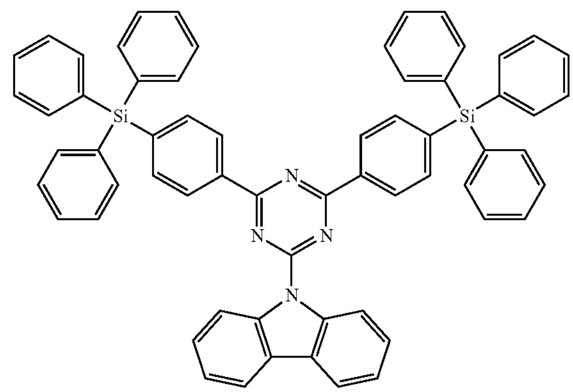

-continued
ETH68
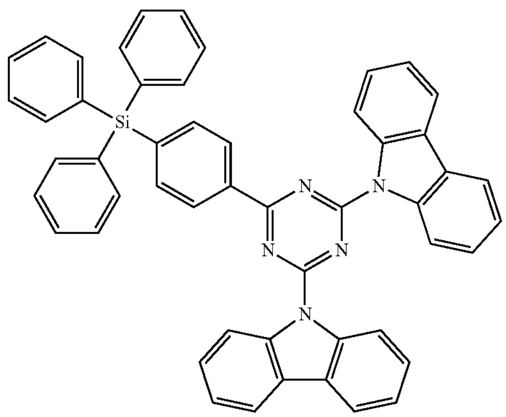
ETH69
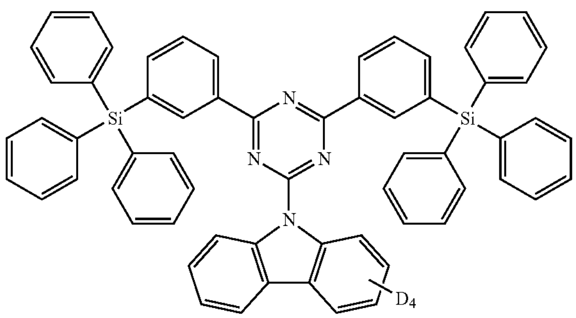
ETH70
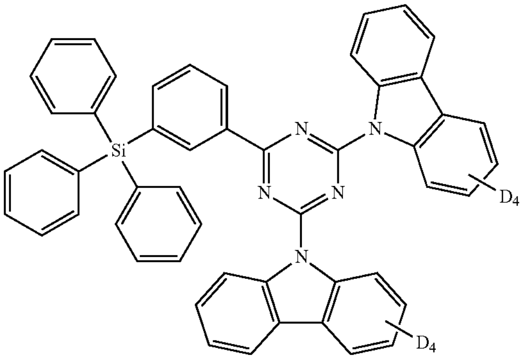
ETH71
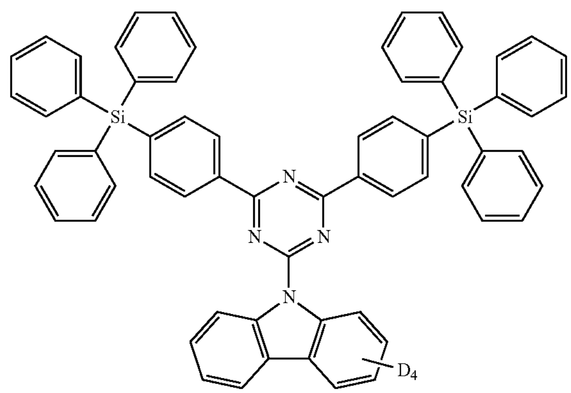
-continued
ETH72
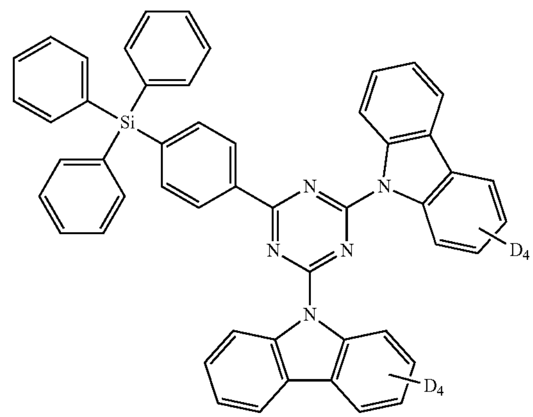
ETH73
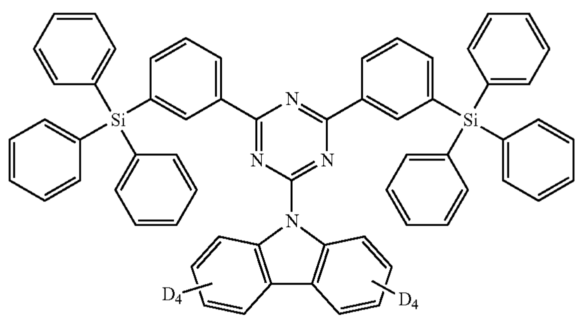
ETH74
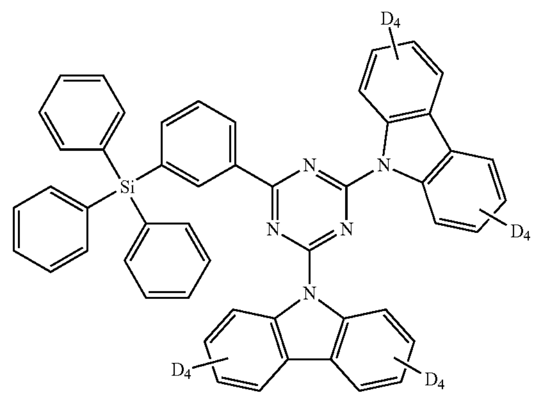
ETH75
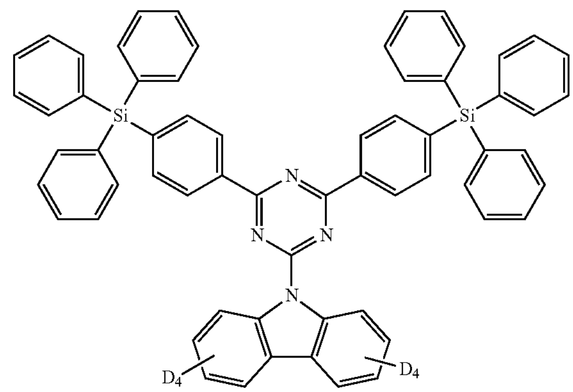

-continued
ETH76
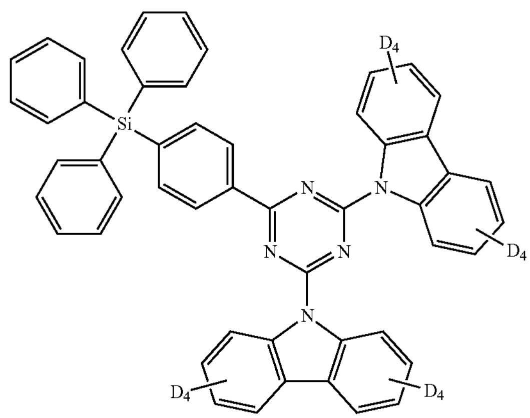
ETH77
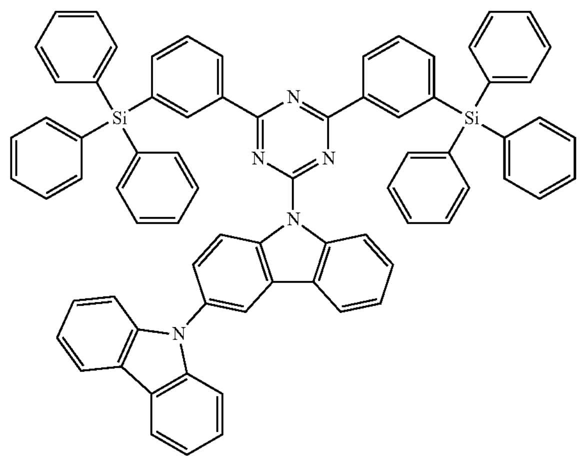
ETH78
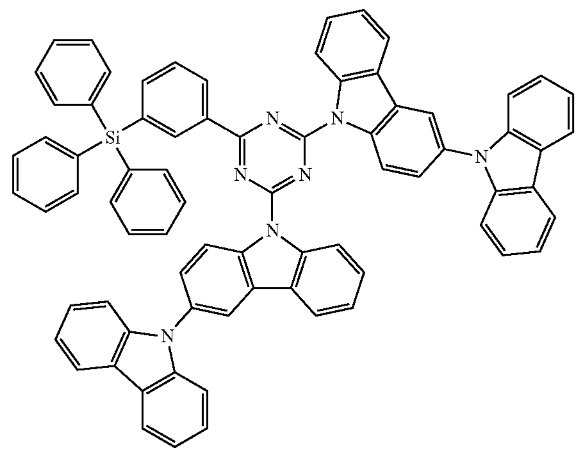
-continued
ETH79
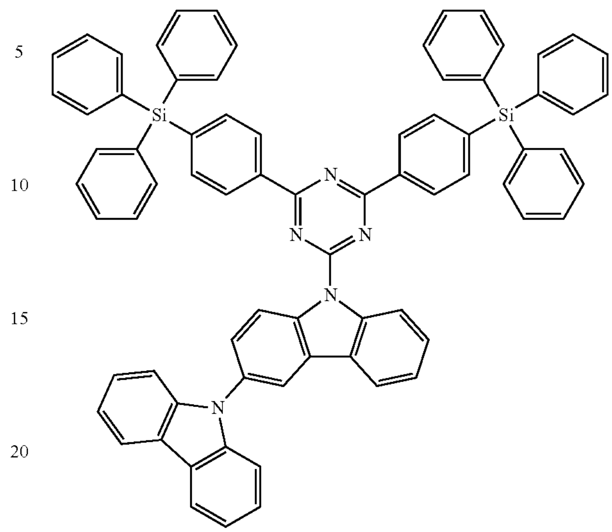
ETH80
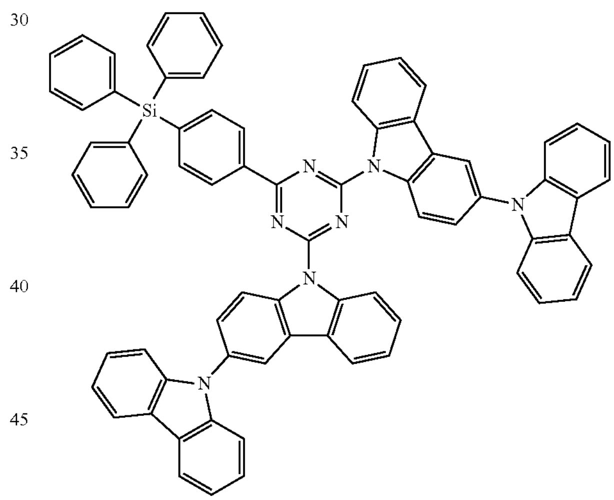
ETH781
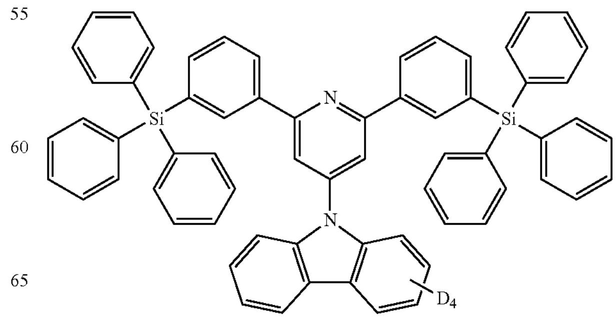

ETH82
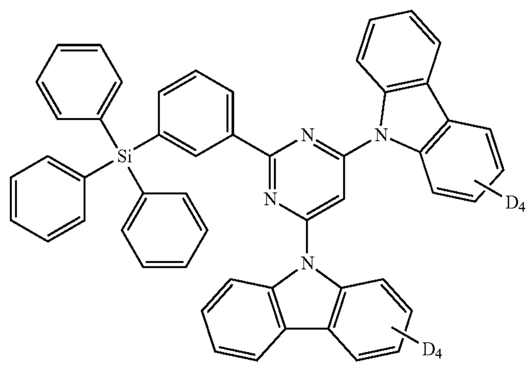
ETH83
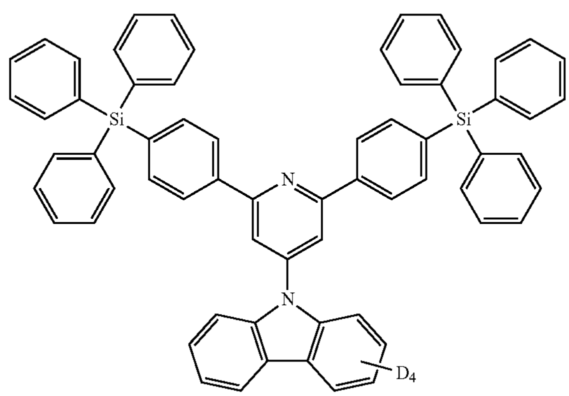
ETH84
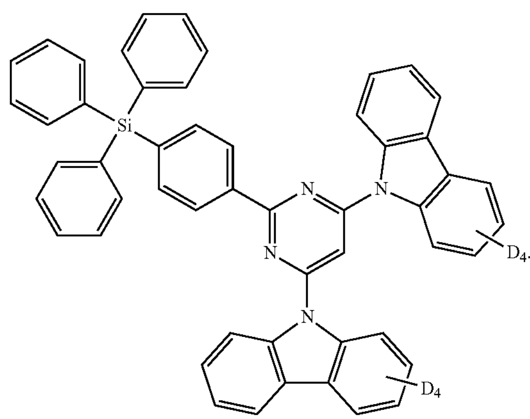
In an embodiment, the third compound may include at least one of Compounds HTH1 to HTH52:
HTH1
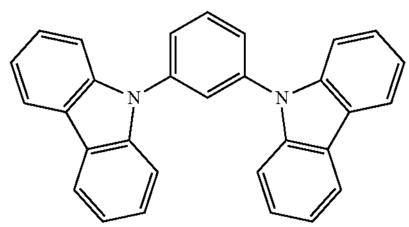
HTH2
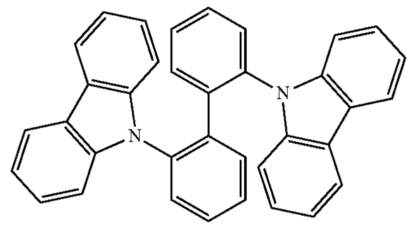
HTH3
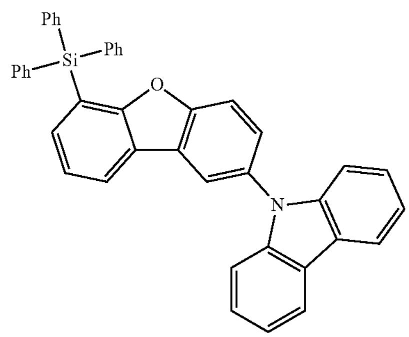
HTH4
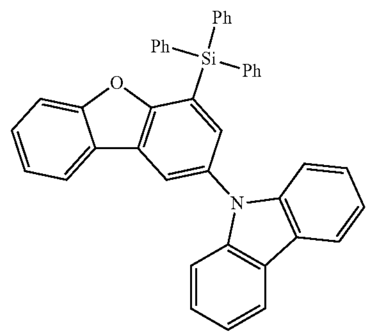
HTH5
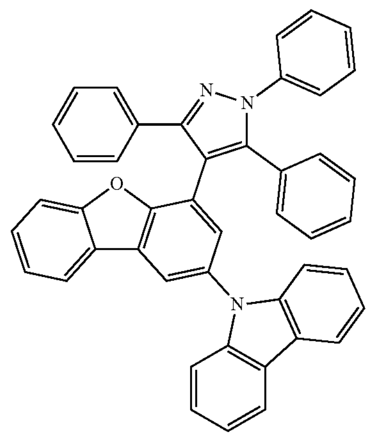

HTH6
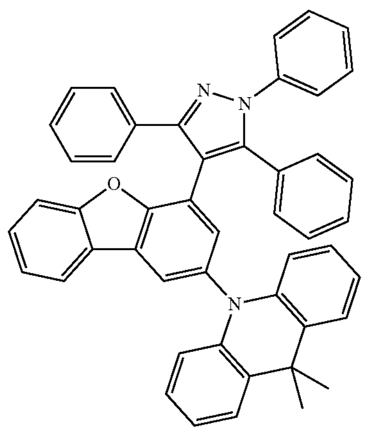
HTH7
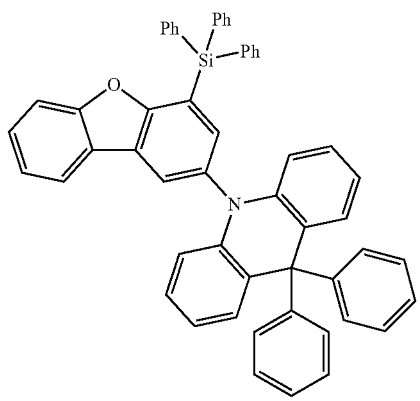
HTH8
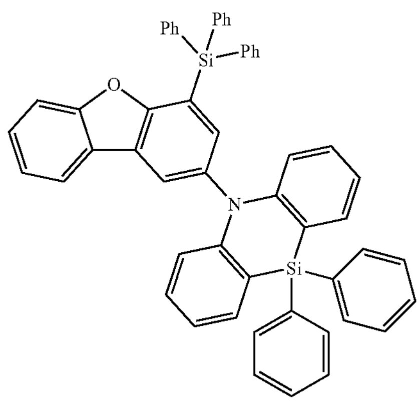
HTH9
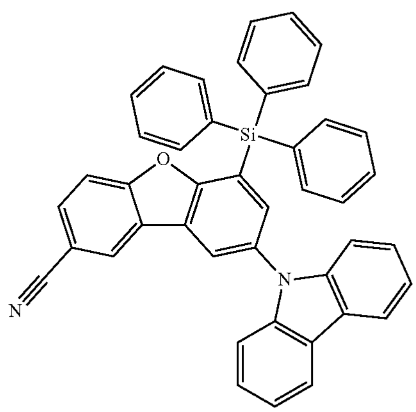
HTH10
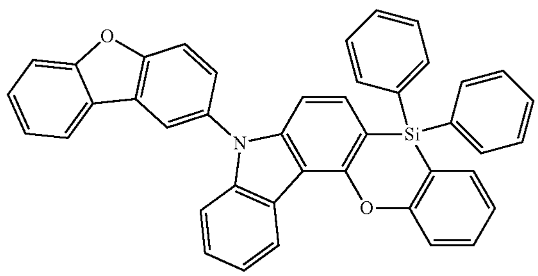
HTH11
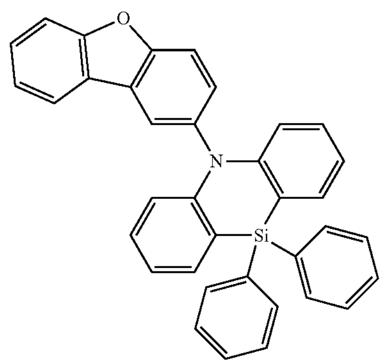
HTH12
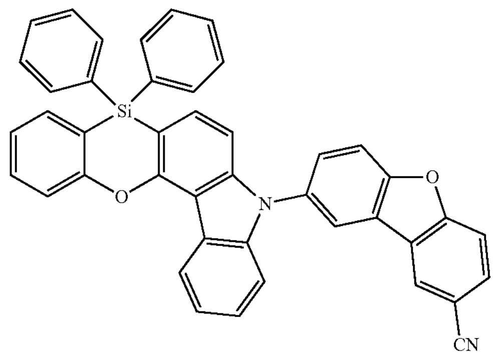
HTH13
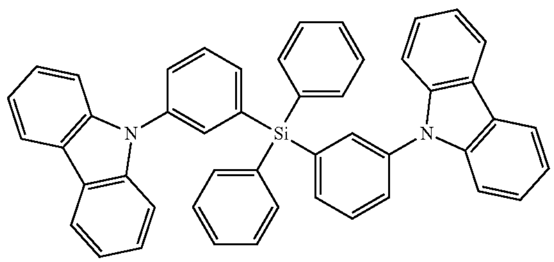

-continued
HTH14
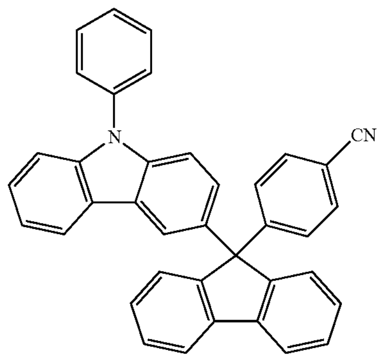
HTH15
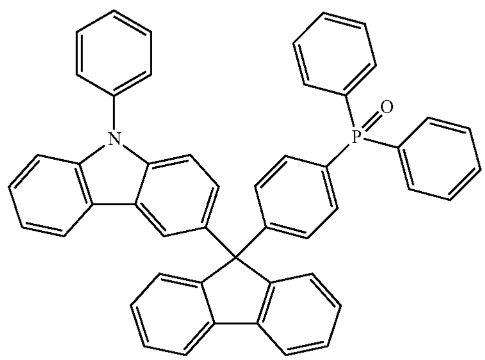
HTH16
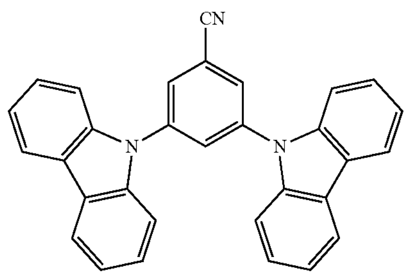
HTH17
-continued
HTH18
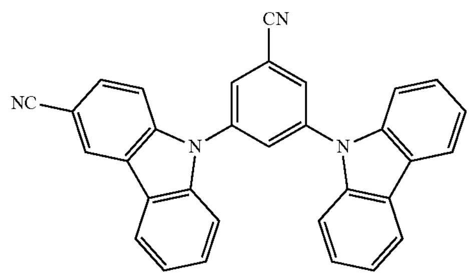
HTH19
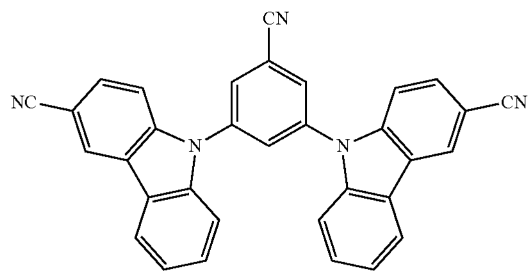
HTH20
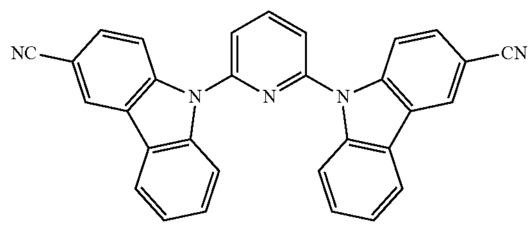
HTH21
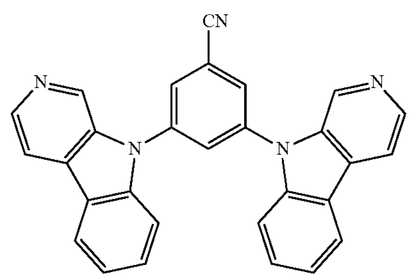
HTH22
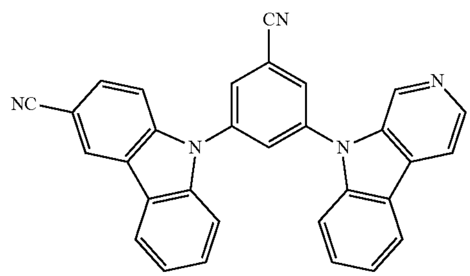

-continued
HTH23
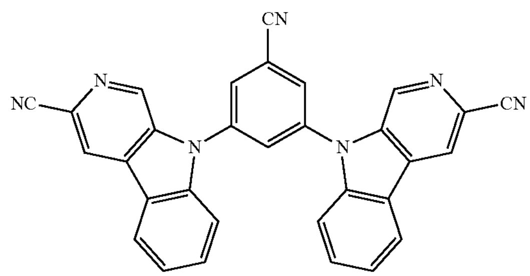
HTH24
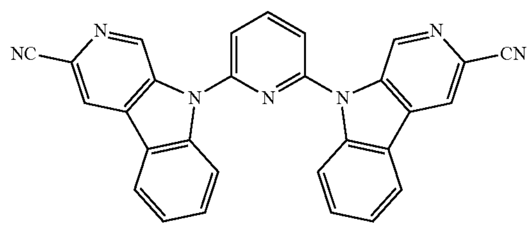
HTH25
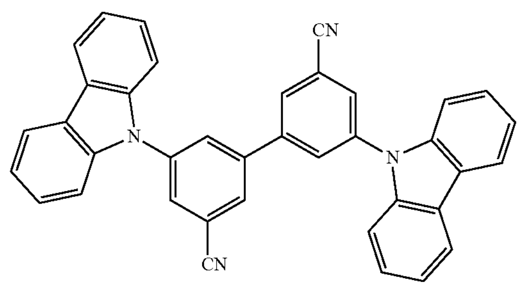
HTH26
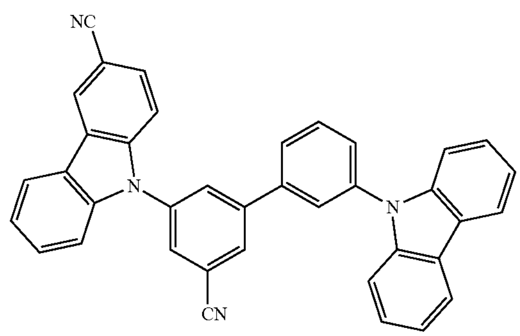
HTH27
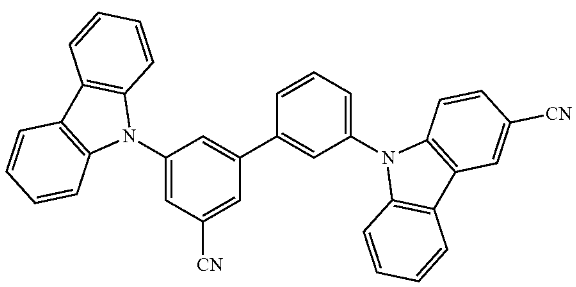
-continued
HTH28
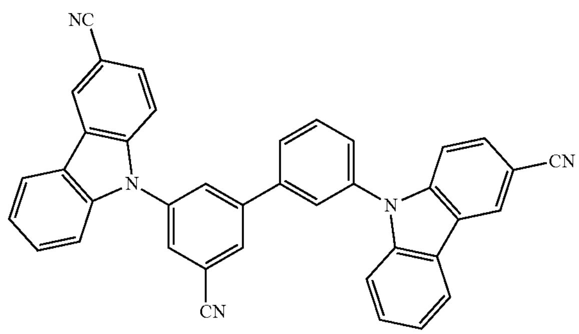
HTH29
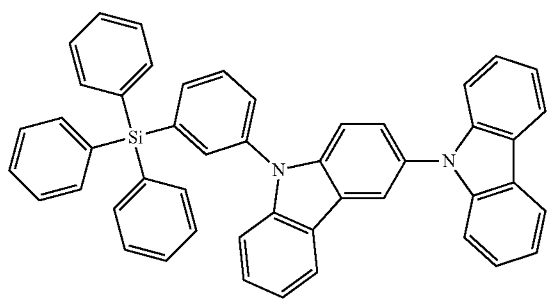
HTH30
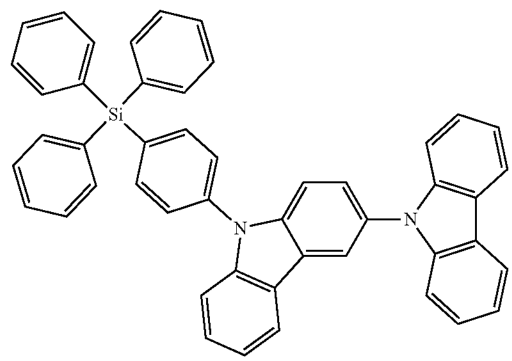
HTH31
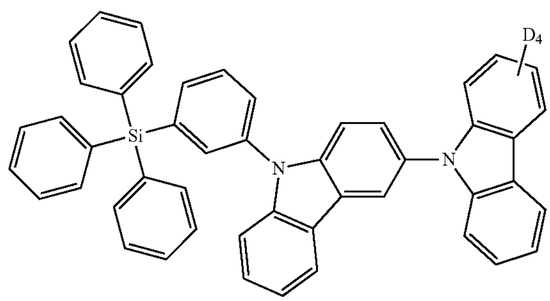

-continued
HTH32
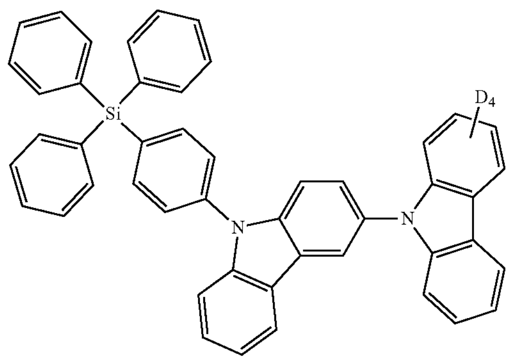
HTH33
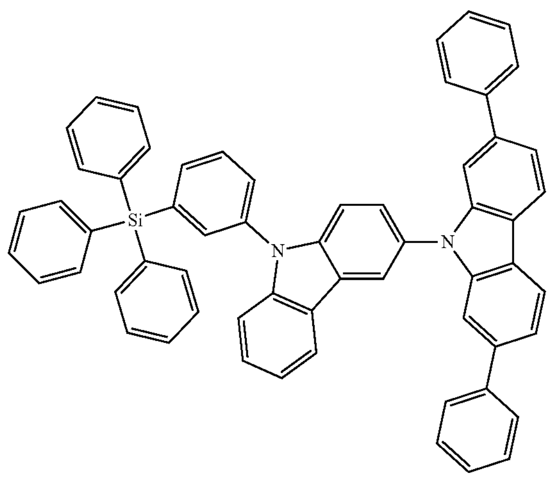
HTH34
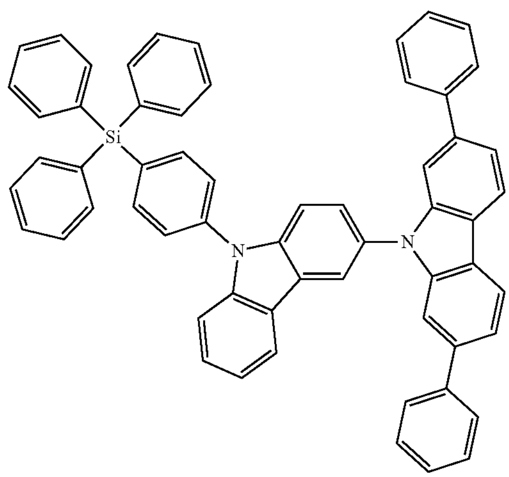
-continued
HTH35
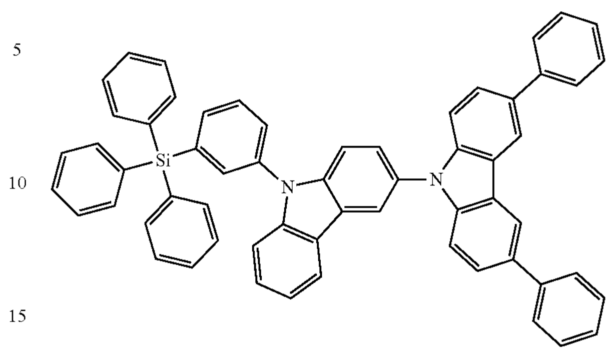
ETH36
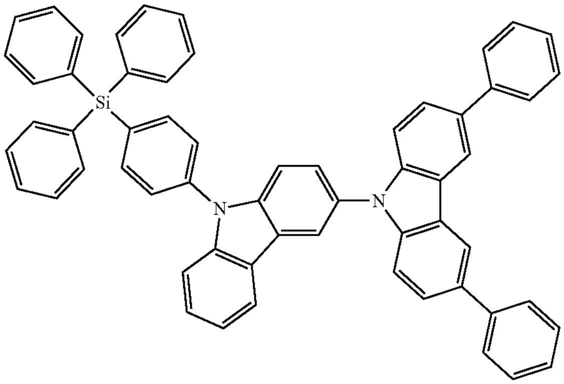
ETH37
ETH38
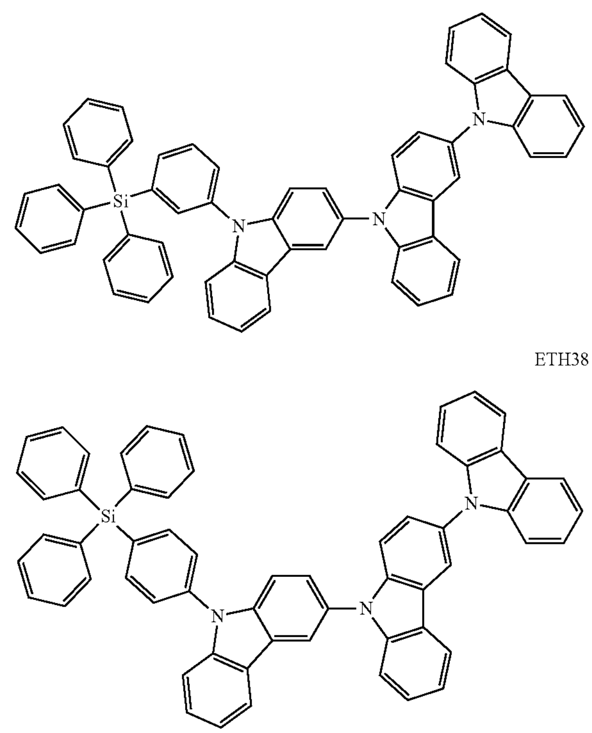

-continued
ETH39
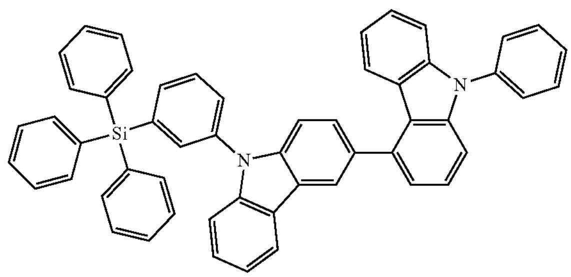
HTH40
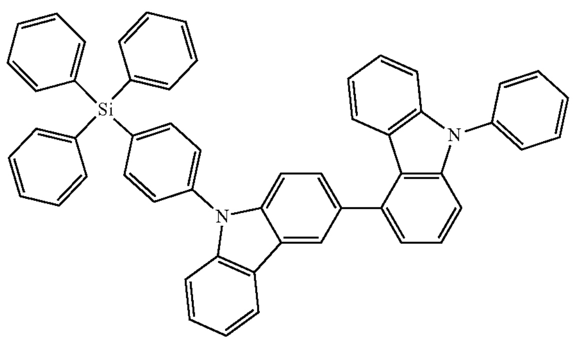
HTH41
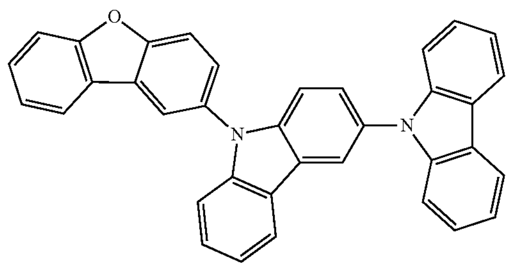
HTH42
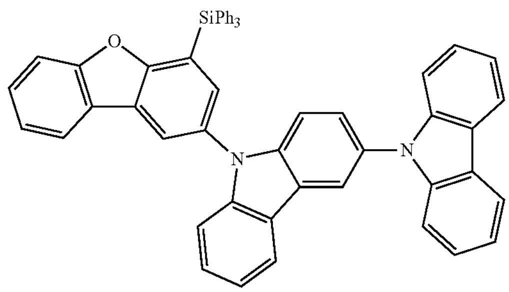
HTH43
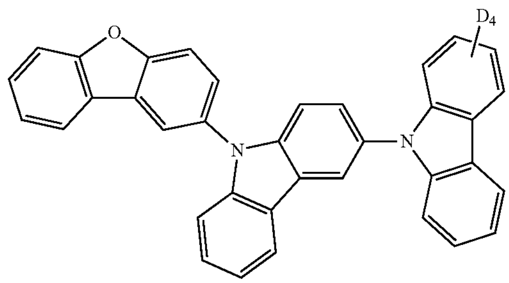
-continued
HTH44
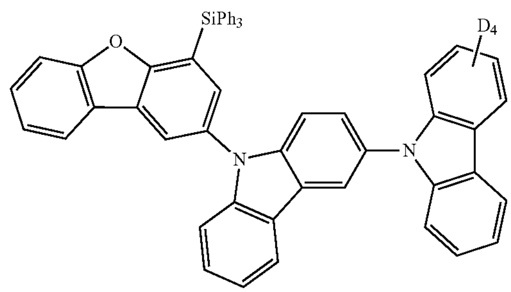
HTH45
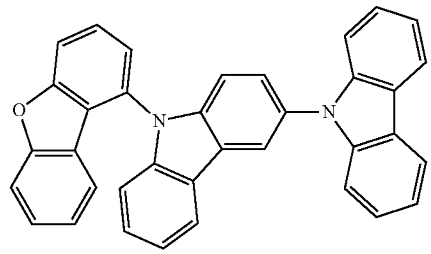
HTH46
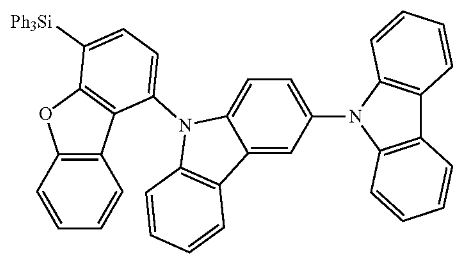
HTH47
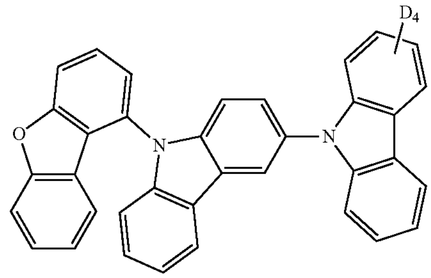
HTH48
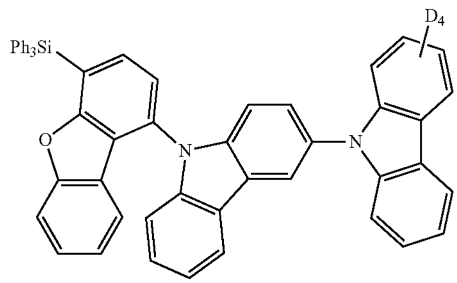

-continued
HTH49
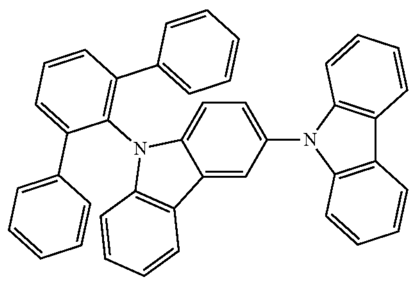
HTH50
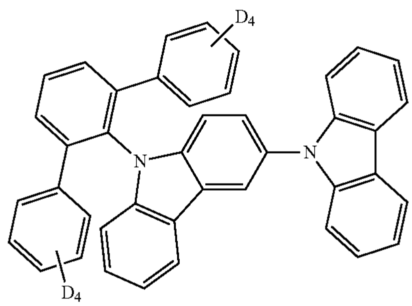
HTH51
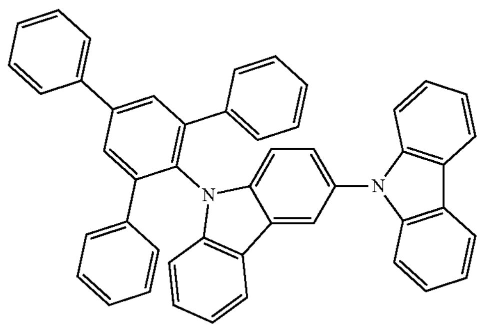
HTH52
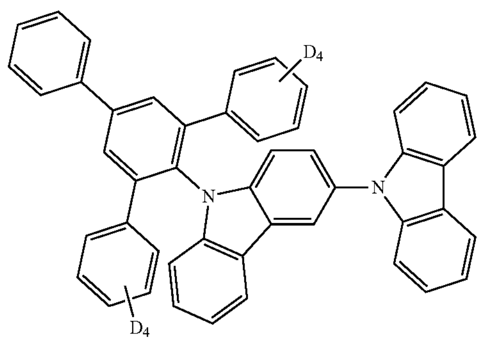
In an embodiment, the fourth compound may include at least one of Compounds DFD1 to DFD14:
DFD1
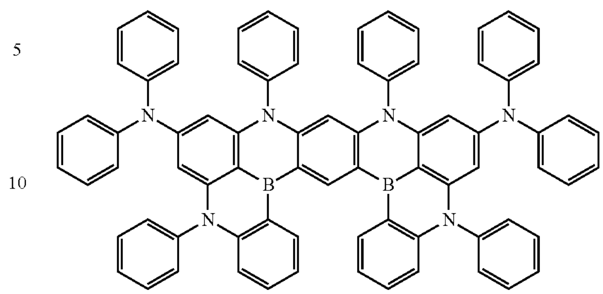
DFD2
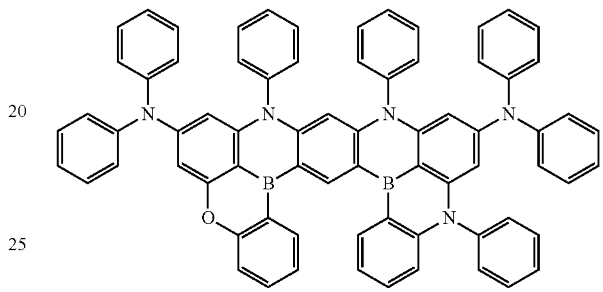
DFD3
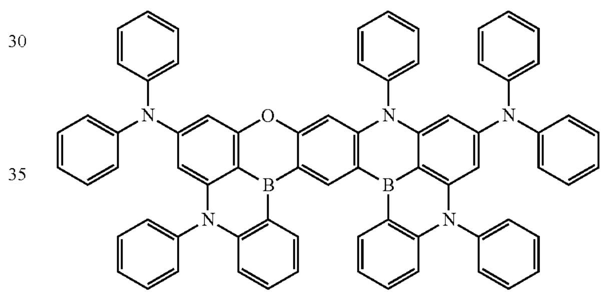
DFD4
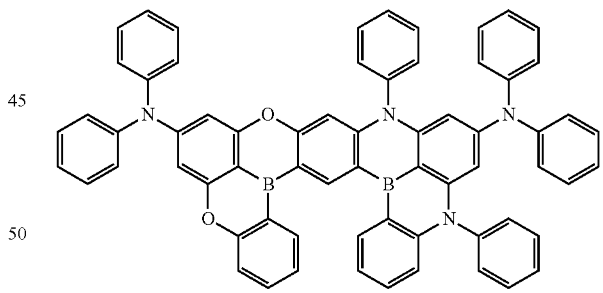
DFD5
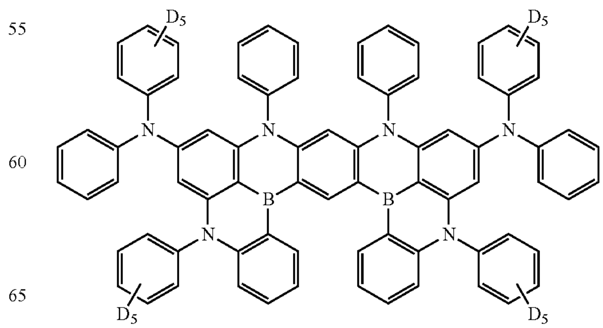

-continued
DFD6
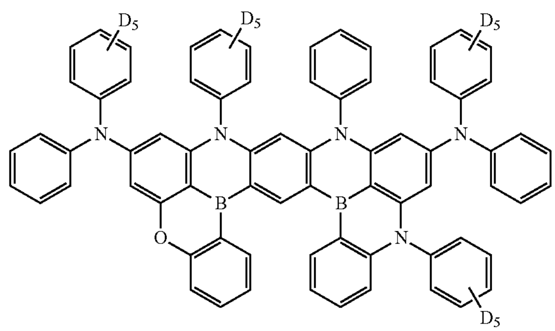
DFD7
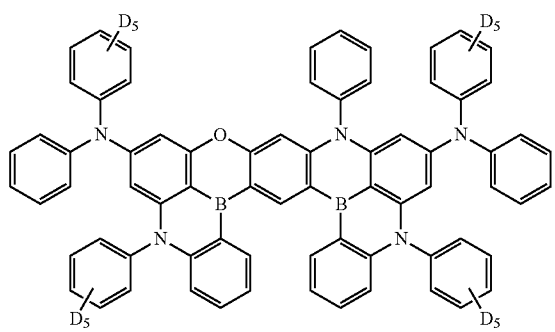
DFD8
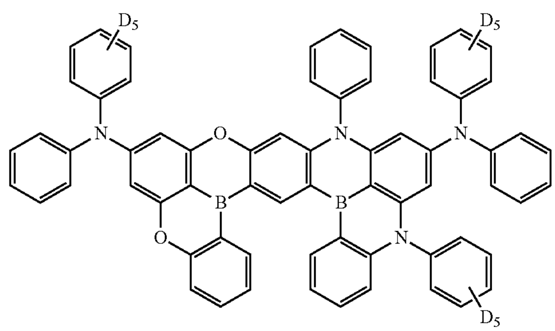
DFD9
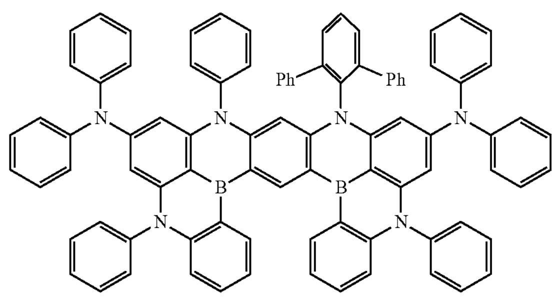
-continued
DFD10
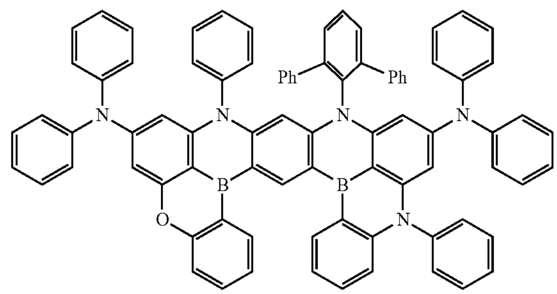
DFD11
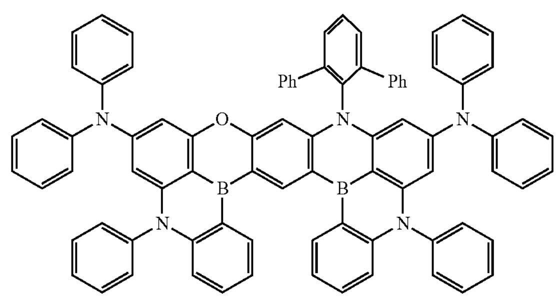
DFD12
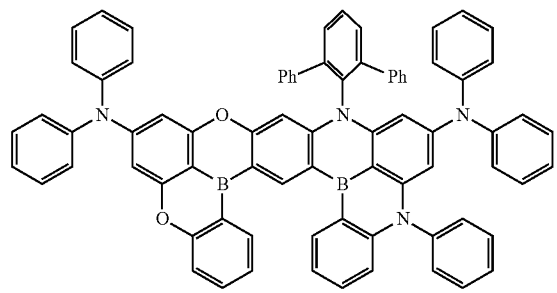
DFD13
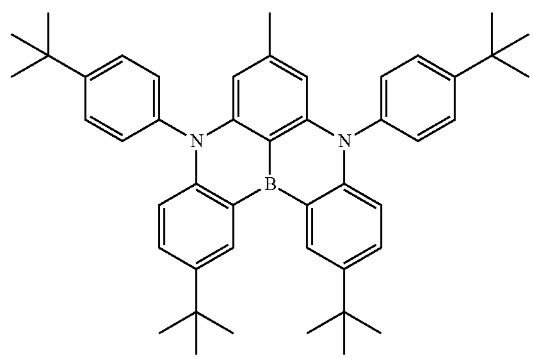

-continued

DFD14

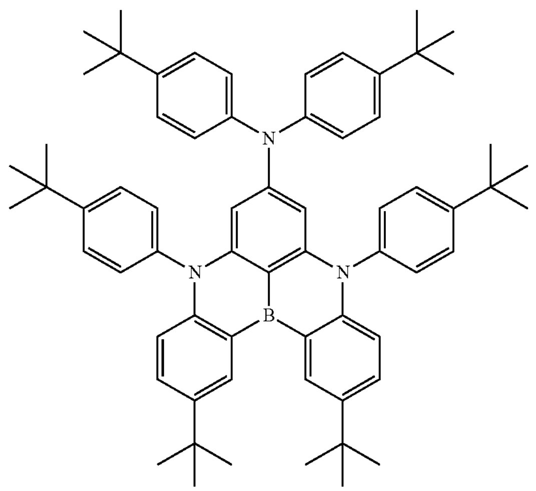

In the compounds described, Ph represents a phenyl group, $D_5$ represents substitution with five deuterium, and $D_4$ represents substitution with four deuterium. For example, a group represented by

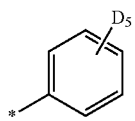

may be identical to a group represented by

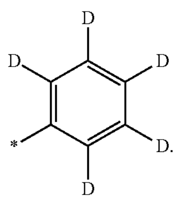

In an embodiment, the light-emitting device may satisfy at least one of Condition 1 to Condition 3:

LUMO energy level of the first compound>−1.50 eV    Condition 1

Absolute value of difference between LUMO energy level and HOMO energy level of the first compound≥3.40 eV    Condition 2

Energy level of $^3$MC state of the first compound>0.45 kcal/mol    Condition 3 wherein the HOMO energy level and the LUMO energy level of the first compound may each be measured by differential pulse voltammetry, and the energy level of a $^3$MC state of the first compound may be evaluated utilizing a DFT method. The HOMO energy level and the LUMO energy level of the first compound may each be a negative value.

In an embodiment, the light-emitting device may satisfy at least one of Condition A to Condition D:

LUMO energy level of the third compound>LUMO energy level of the first compound    Condition A LUMO energy level of the first compound>LUMO energy level of the second compound    Condition B HOMO energy level of the first compound>HOMO energy level of the third compound    Condition C HOMO energy level of the third compound>HOMO energy level of the second compound    Condition D wherein the HOMO energy levels and the LUMO energy levels of the first compound, the second, compound, and the third compound may each be a negative value, and may be measured according to any suitable method, for example, a method described in Evaluation Example 1 in the present specification.

In an embodiment, the absolute value of a difference between the LUMO energy level of the first compound and the LUMO energy level of the second compound may be about 0.1 eV or higher and about 1.0 eV or lower, the absolute value of a difference between the LUMO energy level of the first compound and the LUMO energy level of the third compound may be about 0.1 eV or higher and about 1.0 eV or lower, the absolute value of a difference between the HOMO energy level of the first compound and the HOMO energy level of the second compound may be about 1.25 eV or lower (e.g., about 1.25 eV or lower and about 0.2 eV or higher), and the absolute value of a difference between the HOMO energy level of the first compound and the HOMO energy level of the third compound may be about 1.25 eV or lower (e.g., about 1.25 eV or lower and about 0.2 eV or higher).

When the relationships between LUMO energy level and HOMO energy level satisfy the conditions described above, a suitable balance between holes and electrons injected into the emission layer can be obtained.

The light-emitting device may have a structure of a first embodiment or a second embodiment, as described below.

Descriptions of First Embodiment

According to the first embodiment, the first compound may be included in an emission layer in an interlayer of a light-emitting device, wherein the emission layer may further include a host, the first compound may be different from the host, and the emission layer may be to emit phosphorescent or fluorescent light emitted from the first compound. For example, according to the first embodiment, the first compound may be a dopant or an emitter. In an embodiment, the first compound may be a phosphorescent dopant or a phosphorescence emitter.

The phosphorescent or fluorescent light to be emitted from the first compound may be blue light.

The emission layer may further include an auxiliary dopant. The auxiliary dopant may serve to improve luminescence efficiency from the first compound by effectively transferring a dopant or the first compound as an emitter.

The auxiliary dopant may be different from the first compound and the host.

In an embodiment, the auxiliary dopant may be a delayed fluorescence-emitting compound.

In an embodiment, the auxiliary dopant may be a compound including at least one cyclic group including boron (B) and nitrogen (N) as ring-forming atoms.

Descriptions of Second Embodiment

According to the second embodiment, the first compound may be included in an emission layer in an interlayer of a light-emitting device, wherein the emission layer may further include a host and a dopant, the first compound may be different from the host and the dopant (e.g., the first compound is not the host or the dopant), and the emission layer may be to emit phosphorescent or fluorescent light (e.g., delayed fluorescence light) via the dopant.

For example, the first compound in the second embodiment may serve as an auxiliary dopant to transfer energy to a dopant (or an emitter), and is not the dopant (e.g., is not the main dopant).

In an embodiment, the first compound in the second embodiment may serve as an emitter and as an auxiliary dopant to transfer energy to a dopant (or an emitter).

For example, phosphorescent or fluorescent light to be emitted from the dopant (or the emitter) in the second embodiment may be blue phosphorescent light or blue fluorescent light (e.g., blue delayed fluorescence light).

The dopant (or the emitter) in the second embodiment may be a phosphorescent dopant material (e.g., the organometallic compound represented by Formula 1, the organometallic compound represented by Formula 401, or any combination thereof) or any fluorescent dopant material (e.g., the compound represented by Formula 501, the compound represented by Formula 502, the compound represented by Formula 503, or any combination thereof).

In the first embodiment and the second embodiment, the blue light may be blue light having a maximum emission wavelength in a range of about 390 nm to about 500 nm, about 410 nm to about 490 nm, about 430 nm to about 480 nm, about 440 nm to about 475 nm, or about 455 nm to about 470 nm.

The auxiliary dopant in the first embodiment may include, for example, the fourth compound represented by Formula 502 or Formula 503.

The host in the first embodiment and the second embodiment may be any host material (e.g., the compound represented by Formula 301, the compound represented by 301-1, the compound represented by Formula 301-2, or any combination thereof).

In an embodiment, the host in the first embodiment and the second embodiment may be the second compound, the third compound, or any combination thereof.

In an embodiment, the light-emitting device may include a capping layer located outside the first electrode and/or outside the second electrode.

In an embodiment, the light-emitting device may further include at least one of a first capping layer located outside the first electrode and a second capping layer located outside the second electrode, and the organometallic compound represented by Formula 1 may be included in at least one of the first capping layer or the second capping layer. The first capping layer and/or second capping layer may each independently be the same as described in the present specification.

In an embodiment, the light-emitting device may further include:

- a first capping layer located outside the first electrode and including the organometallic compound represented by Formula 1;
- a second capping layer located outside the second electrode and including the organometallic compound represented by Formula 1; or
- the first capping layer and the second capping layer, each optionally including the organometallic compound represented by Formula 1.

The wording "(interlayer and/or capping layer) includes an (the) organometallic compound" as utilized herein may be to mean that the (interlayer and/or capping layer) may include one kind of organometallic compound represented by Formula 1 or two different kinds of organometallic compounds, each represented by Formula 1.

For example, the interlayer and/or capping layer may include Compound 1 only as the organometallic compound. In this regard, Compound 1 may be present in the emission layer of the light-emitting device. In an embodiment, the interlayer may include, as the organometallic compound, Compound 1 and Compound 2. In this regard, Compound 1 and Compound 2 may be present in the same layer (for example, all of Compound 1 and Compound 2 may be present in the emission layer), or may be present in different layers (for example, Compound 1 may be present in the emission layer, and Compound 2 may be present in the electron transport region).

The term "interlayer" as utilized herein refers to a single layer and/or all of a plurality of layers located between the first electrode and the second electrode of the light-emitting device.

According to another aspect, provided is an electronic apparatus including the light-emitting device. The electronic apparatus may further include a thin-film transistor. For example, the electronic apparatus may further include a thin-film transistor including a source electrode and a drain electrode, wherein the first electrode of the light-emitting device may be electrically connected to the source electrode or the drain electrode. In an embodiment, the electronic apparatus may further include a color filter, a color conversion layer, a touch screen layer, a polarizing layer, or any combination thereof. The electronic apparatus may be the same as described in the present specification.

Description of FIG. 1

FIG. 1 is a schematic cross-sectional view of a light-emitting device 10 according to an embodiment of the disclosure. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

First Electrode 110

In FIG. 1, a substrate may be additionally located under the first electrode 110 and/or above the second electrode 150. As the substrate, a glass substrate or a plastic substrate may be utilized. In an embodiment, the substrate may be a flexible substrate, and may include plastics with excellent or suitable heat resistance and durability (such as polyimide, polyethylene terephthalate (PET), polycarbonate, polyethylene naphthalate, polyarylate (PAR), polyetherimide, or any combination thereof).

The first electrode 110 may be formed by, for example, depositing or sputtering a material for forming the first electrode 110 on the substrate. When the first electrode 110 is an anode, a material for forming the first electrode 110 may be a high work function material to facilitate injection of holes.

The first electrode 110 may be a reflective electrode, a semi-transmissive electrode, or a transmissive electrode. When the first electrode 110 is a transmissive electrode, the material for forming the first electrode 110 may include indium tin oxide (ITO), indium zinc oxide (IZO), tin oxide ($SnO_2$), zinc oxide (ZnO), or any combination thereof. In an embodiment, when the first electrode 110 is a semi-transmissive electrode or a reflective electrode, the material for forming the first electrode 110 may include magnesium (Mg), silver (Ag), aluminum (Al), aluminum-lithium (Al—

Li), calcium (Ca), magnesium-indium (Mg—In), magnesium-silver (Mg—Ag), or any combination thereof.

The first electrode 110 may have a single-layered structure including (e.g., consisting of) a single layer or a multilayer structure including a plurality of layers. In an embodiment, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds (such as organometallic compounds), inorganic materials (such as quantum dots), and/or the like, in addition to various suitable organic materials.

In an embodiment, the interlayer 130 may include: i) two or more emitting units sequentially stacked between the first electrode 110 and the second electrode 150, and ii) a charge generation layer located between the two or more emitting units. When the interlayer 130 includes emitting units and a charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport area may have a multi-layer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the layers of each structure being stacked sequentially from the first electrode 110.

The hole transport region may include a compound represented by Formula 201, a compound represented by Formula 202, or any combination thereof:

Formula 201

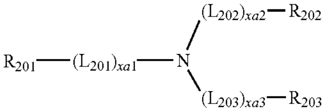

Formula 202

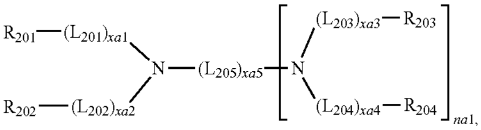

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_6$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like), which may be unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group that may be unsubstituted or substituted with at least one $R_{10a}$, and na1 may be an integer from 1 to 4.

In an embodiment, each of Formulae 201 and 202 may include at least one of groups represented by Formulae CY201 to CY217.

CY201

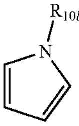

CY202

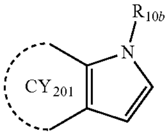

CY203

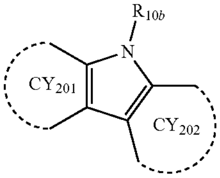

CY204

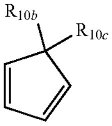

CY205

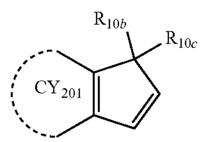

-continued

CY206

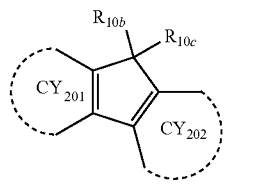

CY207

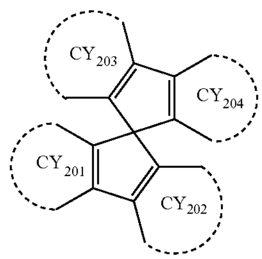

CY208

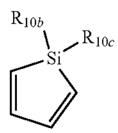

CY209

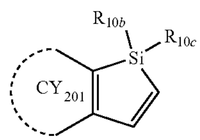

CY210

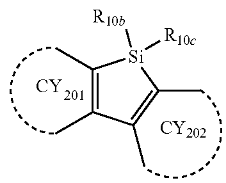

CY211

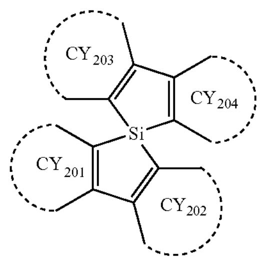

CY212

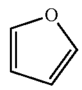

CY213

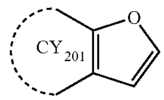

CY214

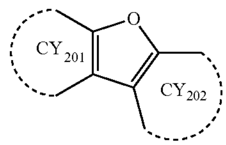

-continued

CY215

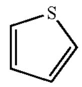

CY216

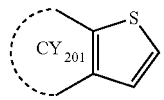

CY217

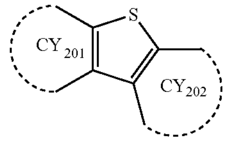

In Formulae CY201 to CY217, $R_{10b}$ and $R_{10c}$ may each be the same as described with respect to $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described above.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, each of Formulae 201 and 202 may include at least one of the groups represented by Formulae CY201 to CY203.

In an embodiment, Formula 201 may include at least one of the groups represented by Formulae CY201 to CY203 and at least one of the groups represented by Formulae CY204 to CY217.

In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207.

In an embodiment, each of Formulae 201 and 202 may not include (e.g., may exclude) groups represented by Formulae CY201 to CY203.

In an embodiment, each of Formulae 201 and 202 may not include (e.g., may exclude) groups represented by Formulae CY201 to CY203, and may include at least one of groups represented by Formulae CY204 to CY217.

In an embodiment, each of Formulae 201 and 202 may not include (e.g., may exclude) groups represented by Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzene sulfonic acid (PANI/DBSA), poly(3,4-ethylene dioxythiophene)/poly(4-styrene sulfonate)(PEDOT/PSS), polyaniline/camphor sulfonic acid (PANI/CSA), polyaniline/poly(4-styrene sulfonate)(PANI/PSS), or any combination thereof:

HT1
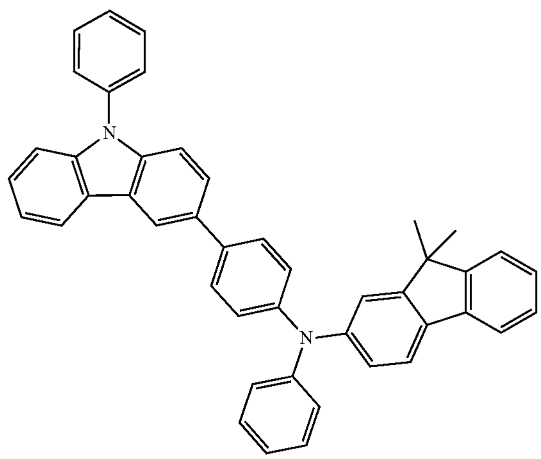
HT2
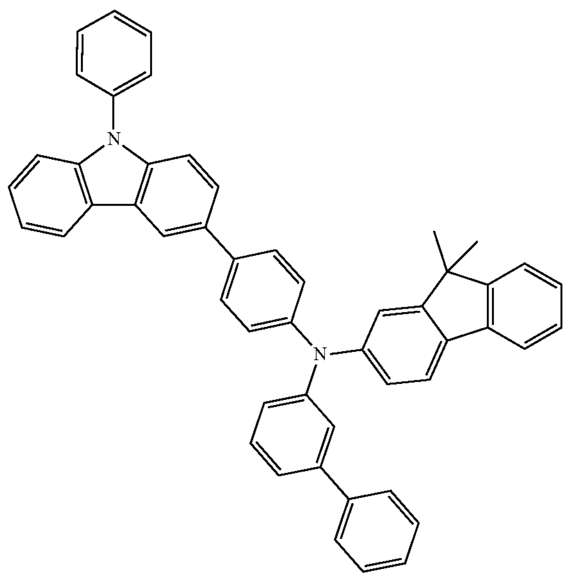
HT3
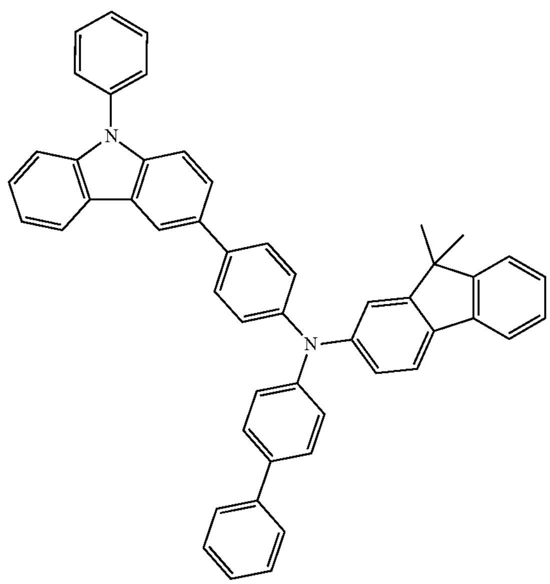
HT4
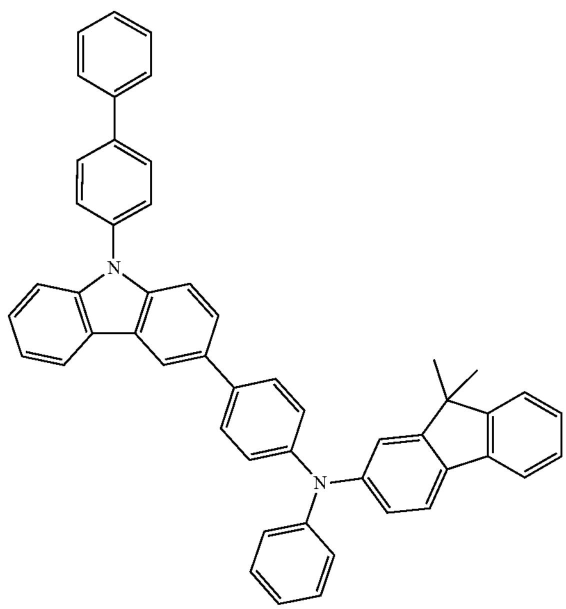

-continued
HT5
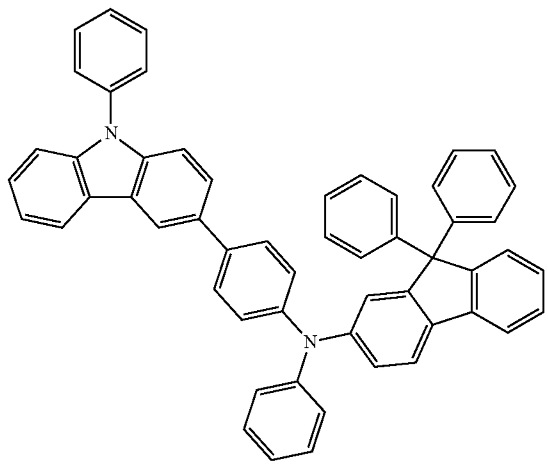
HT6
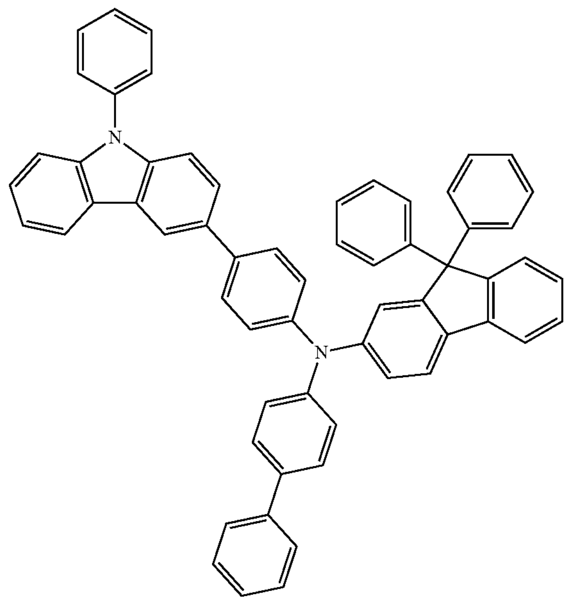
HT7
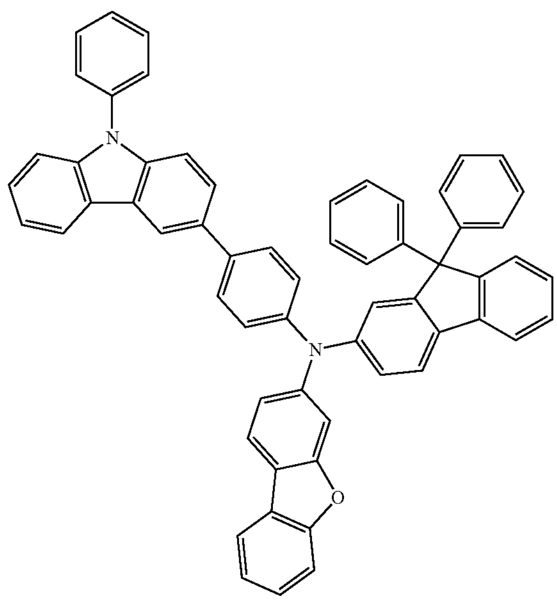
HT8
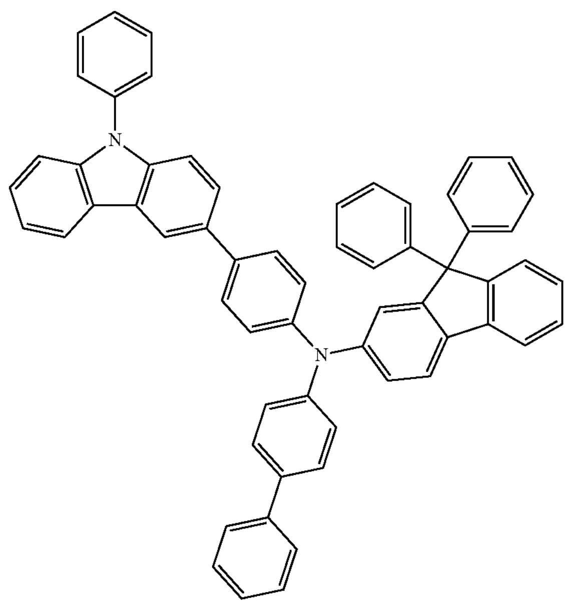

-continued
HT9
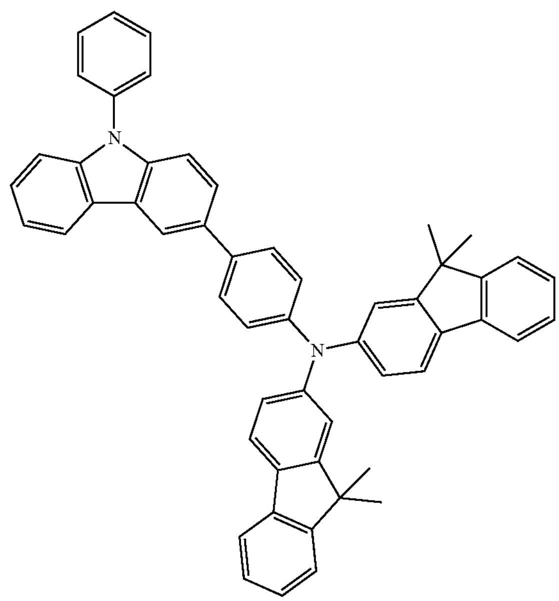
HT10
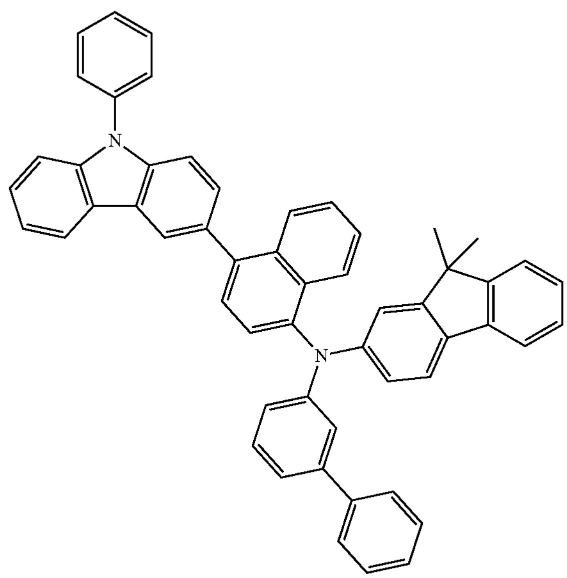
HT11
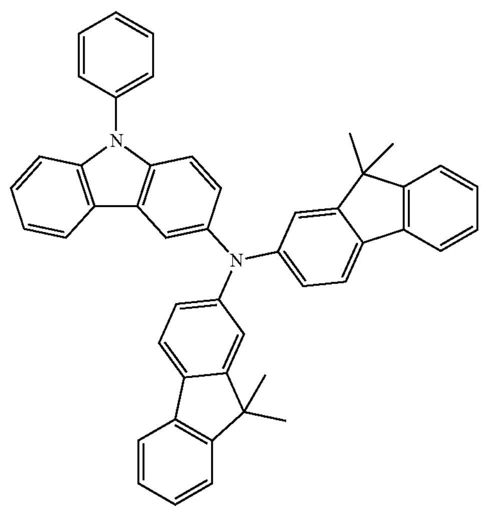
HT12
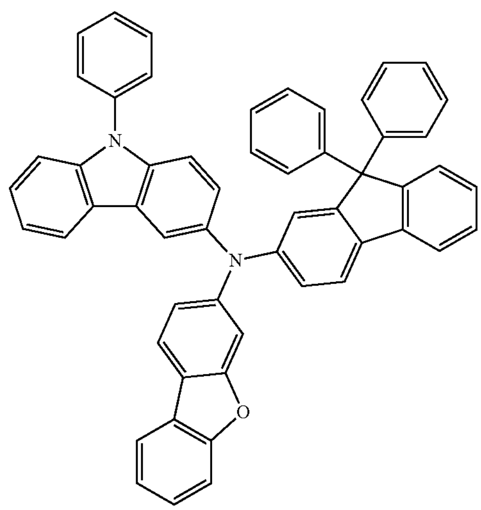

-continued
HT13
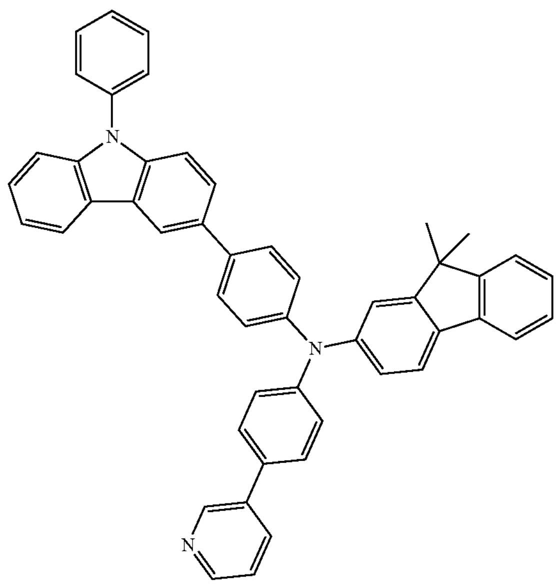
HT14
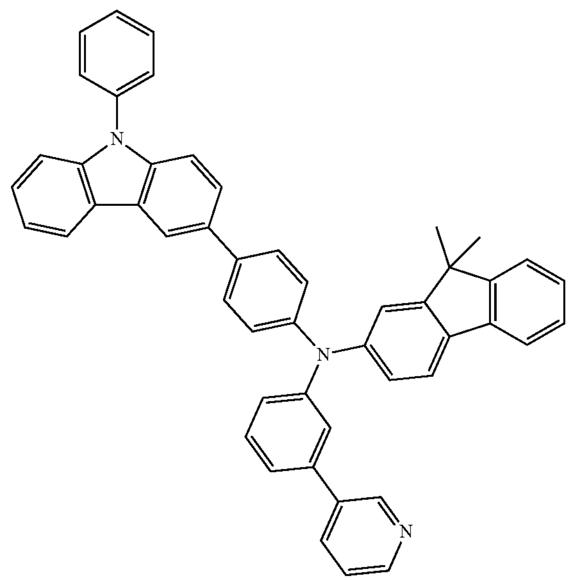
HT15
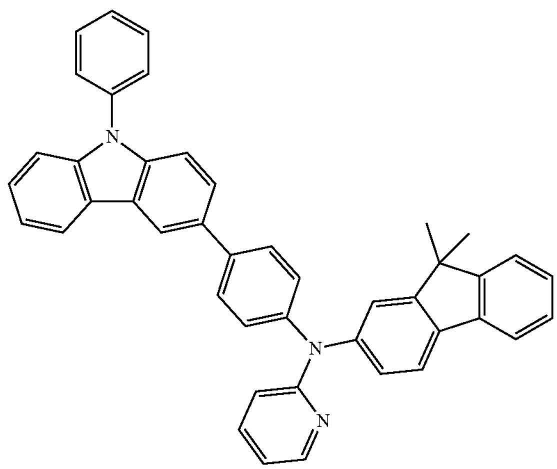
HT16
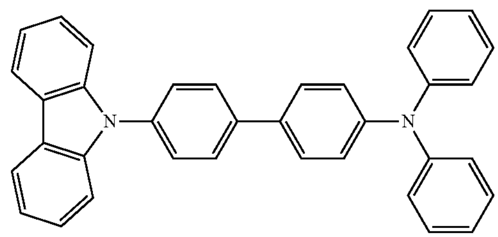
HT17
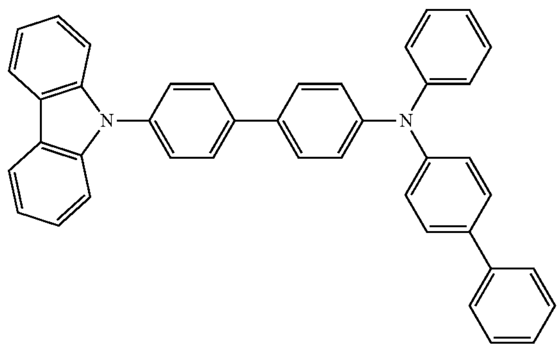
HT18
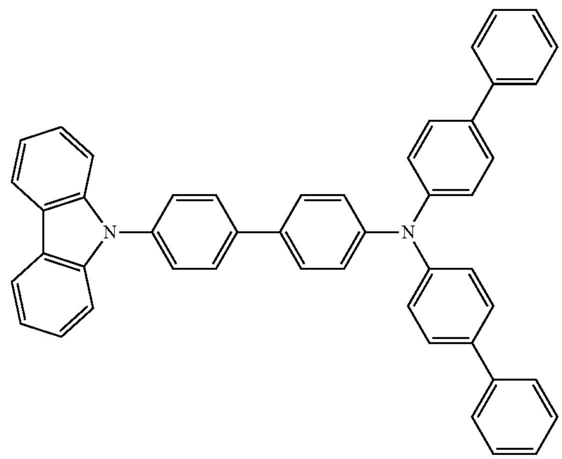

-continued
HT19
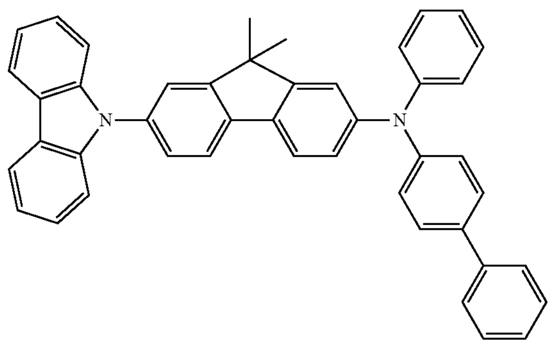
HT20
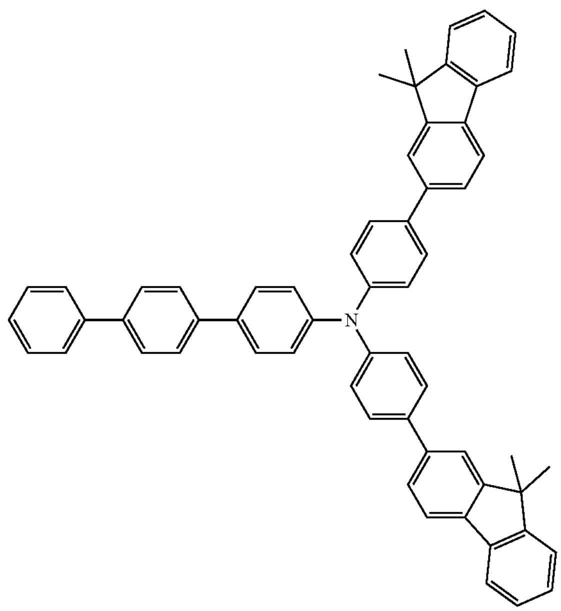
HT21
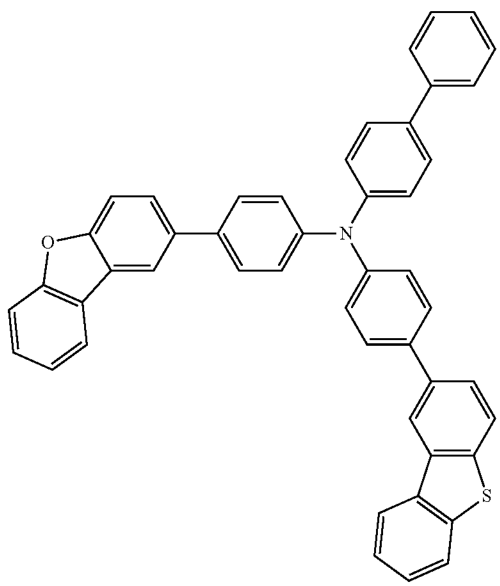
HT22
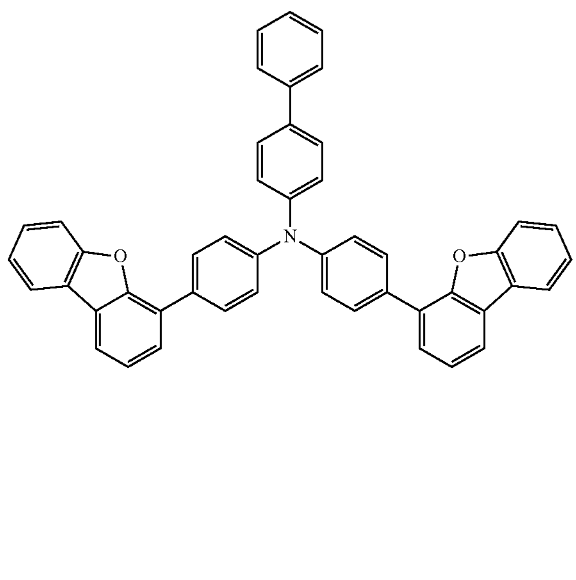

-continued
HT23
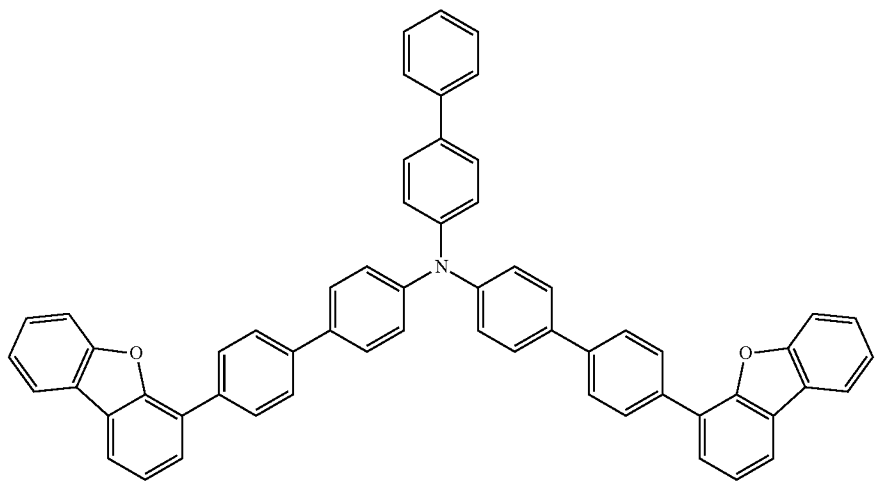
HT24
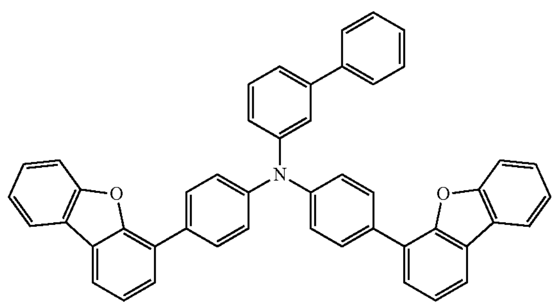
HT25
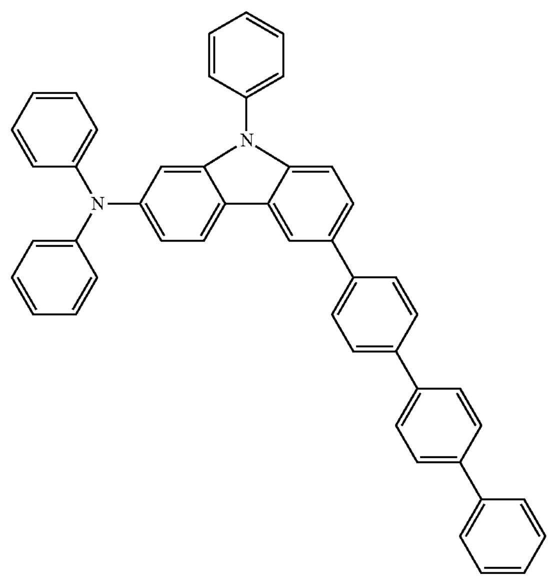
HT26
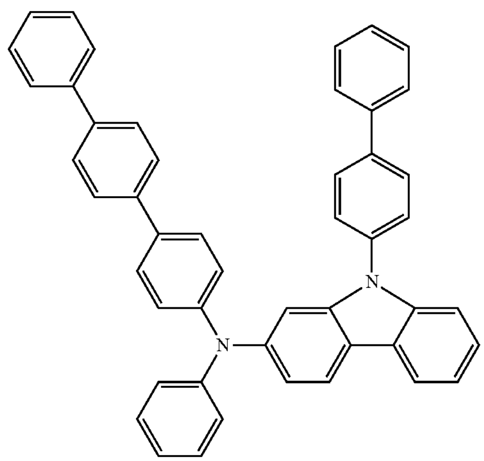
HT27
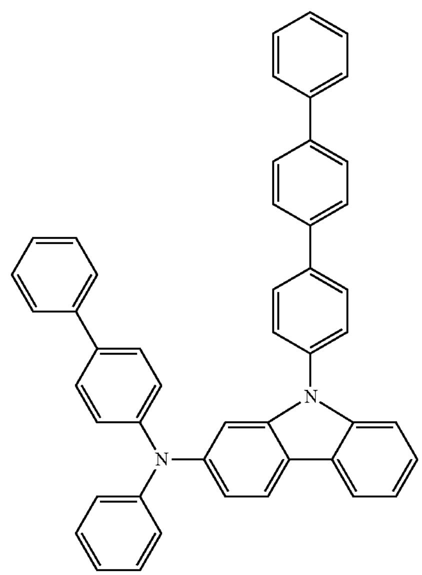

-continued
HT28
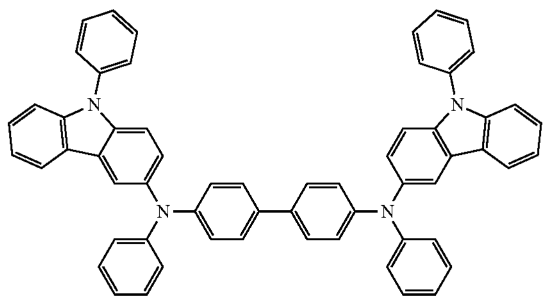
HT29
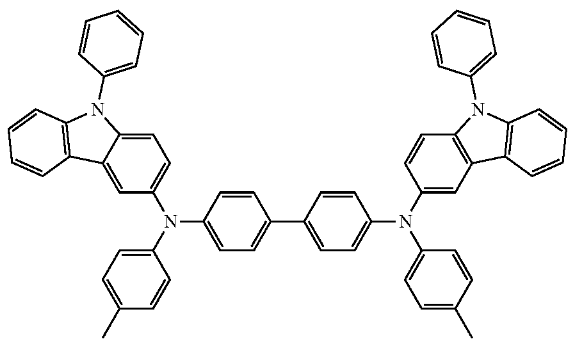
HT30
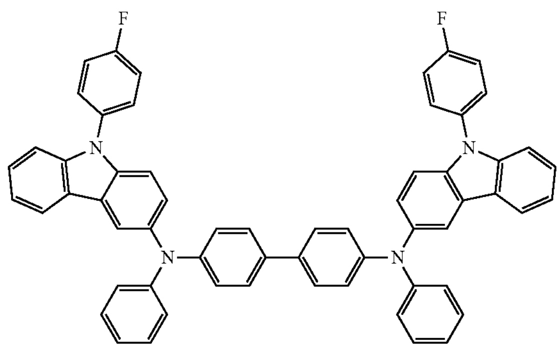
HT31
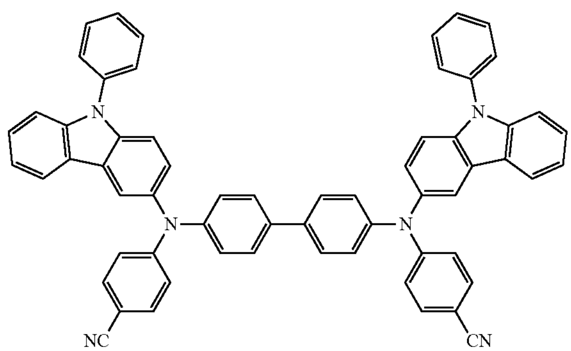
HT32
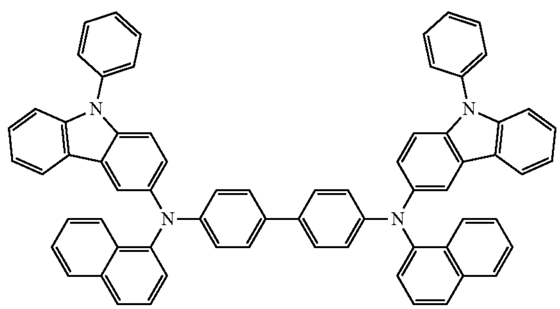
HT33
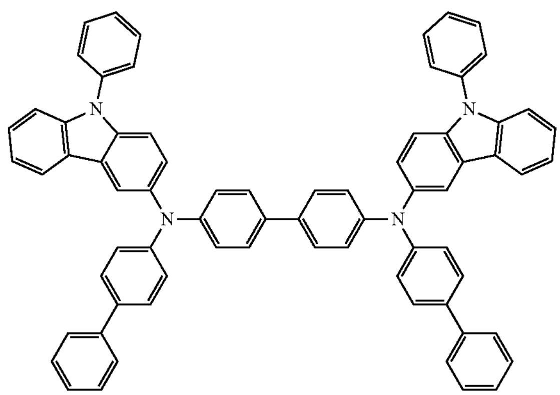

-continued
HT34
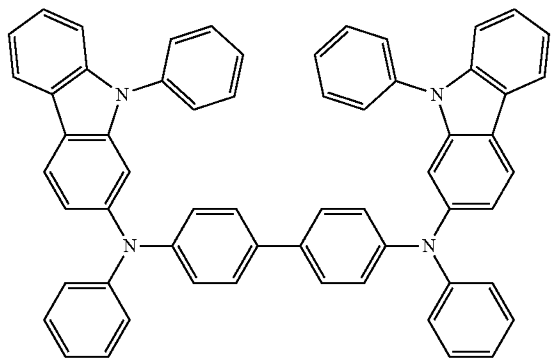
HT35
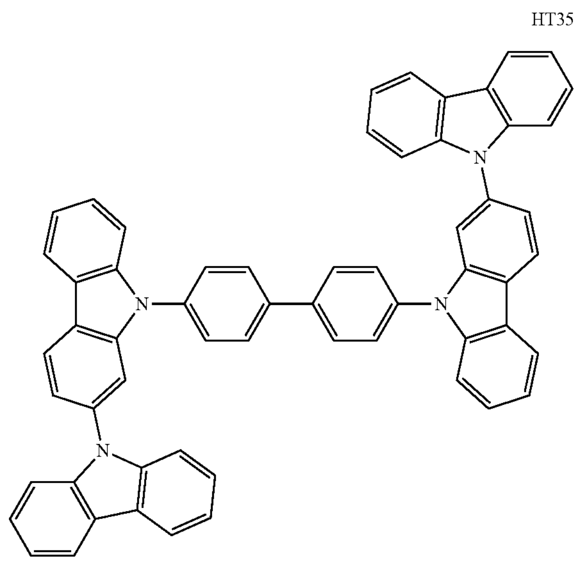
HT36
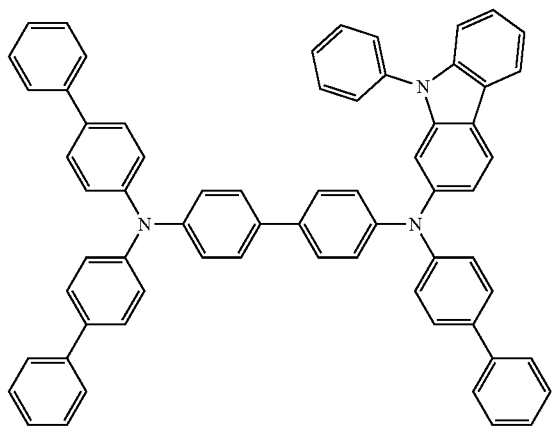
HT37
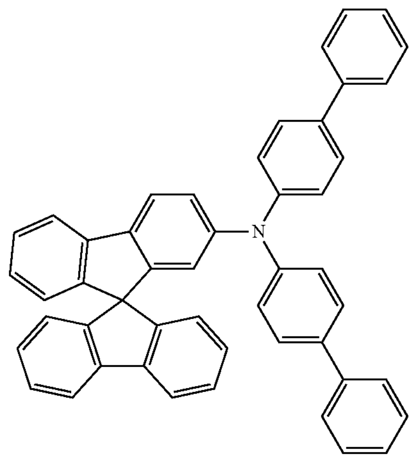
HT38
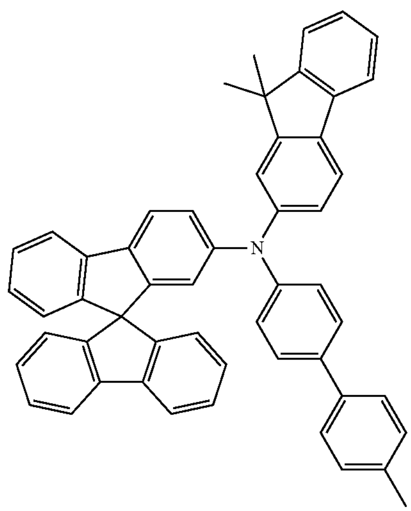
HT39
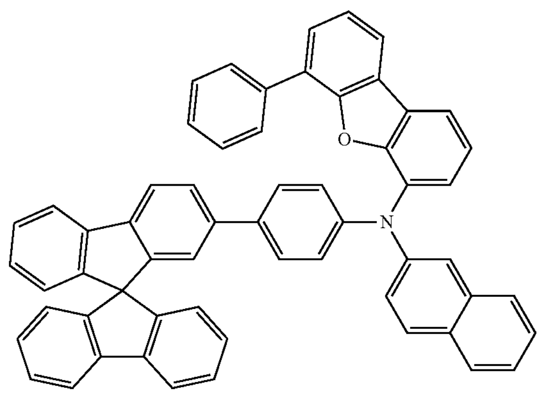

-continued
HT40
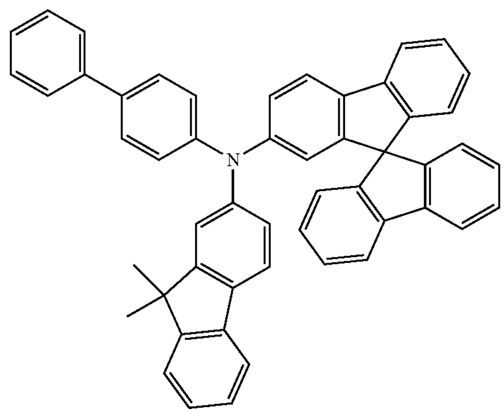
HT41
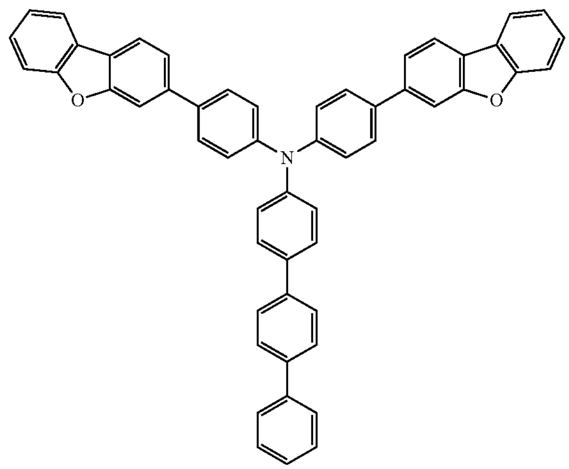
HT42
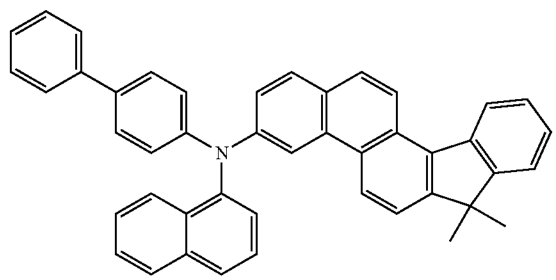
HT43
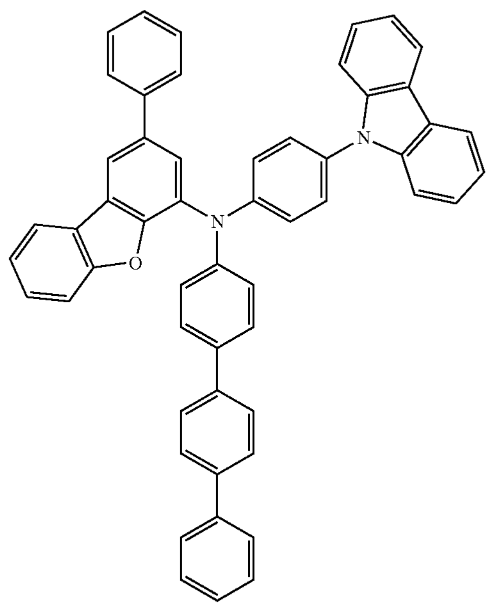
HT44
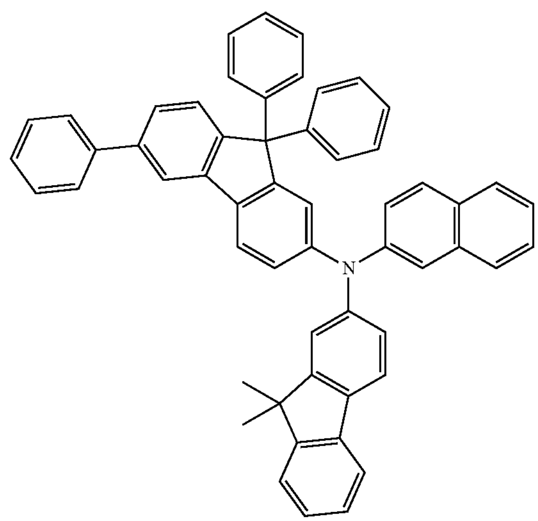
HT45
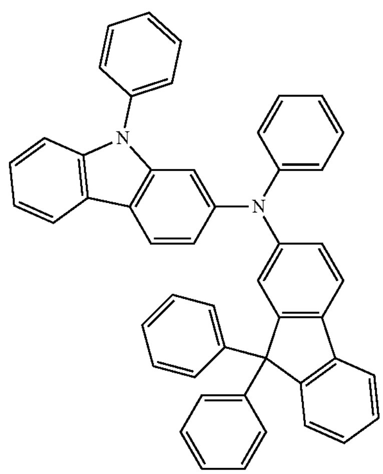

-continued
HT46
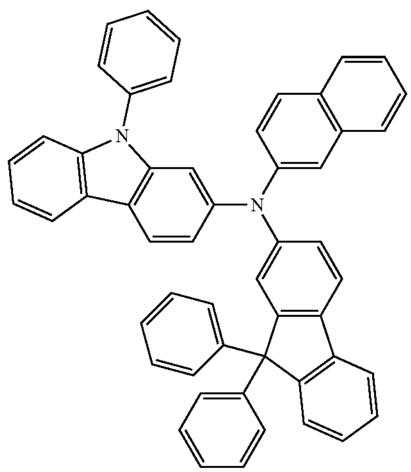
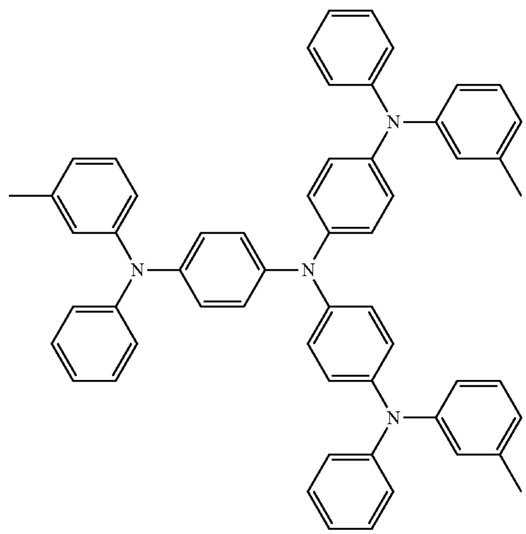
m-MTDATA
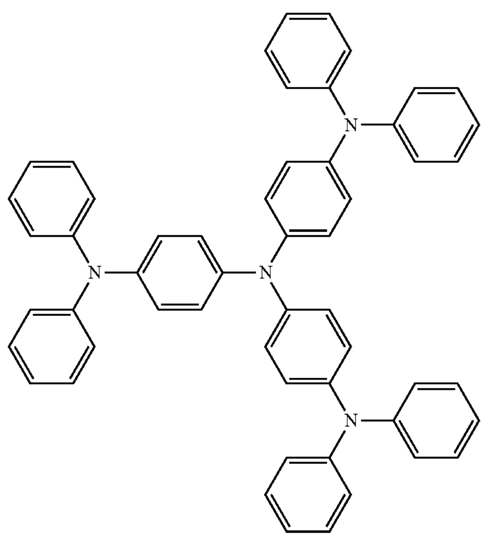
TDATA
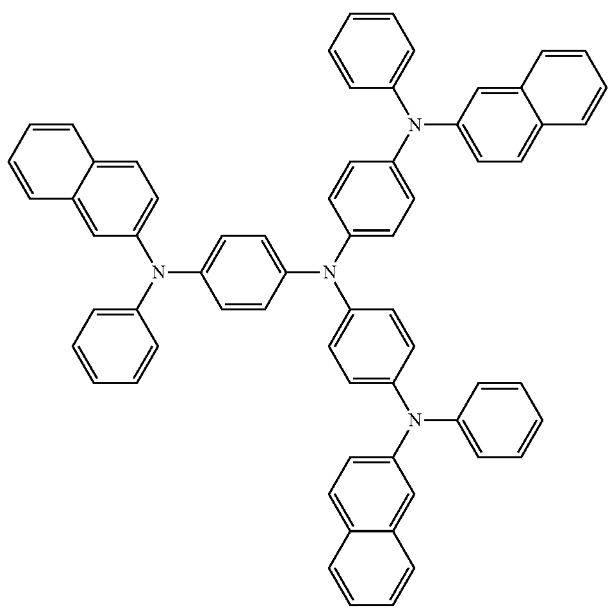
2-TNATA
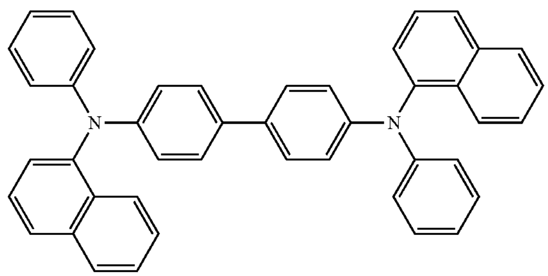
NPB
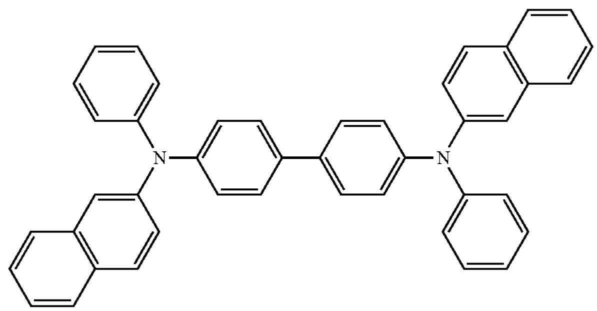
β-NPB -continued

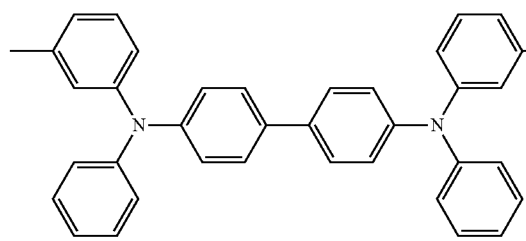

TPD

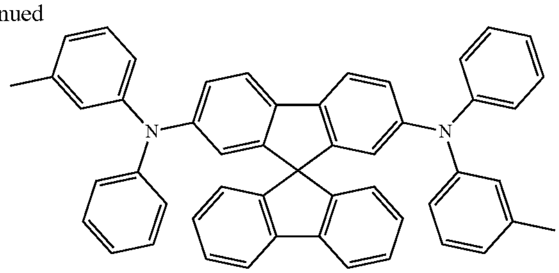

Spiro-TPD

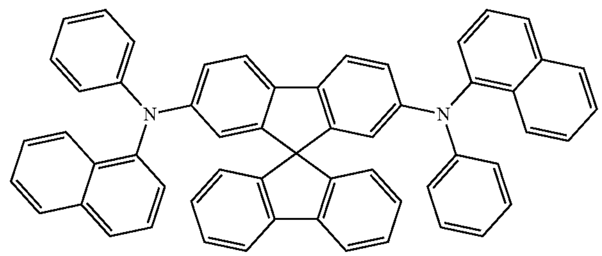

Spiro-NPB

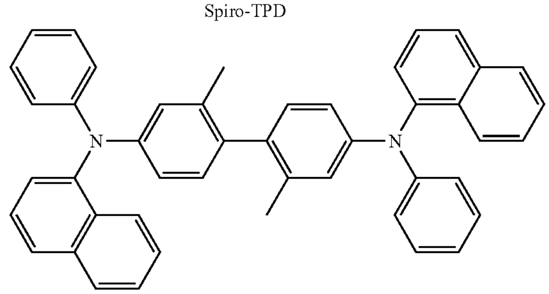

methylated-NPB

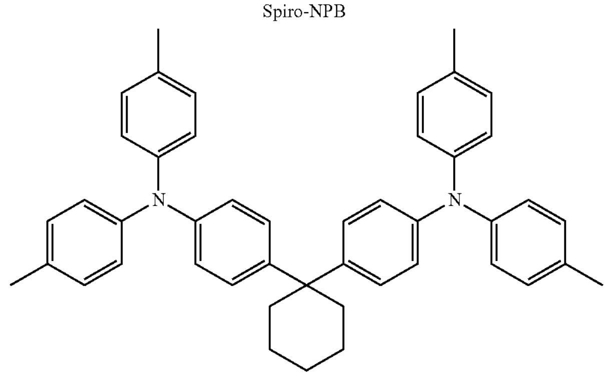

TAPC

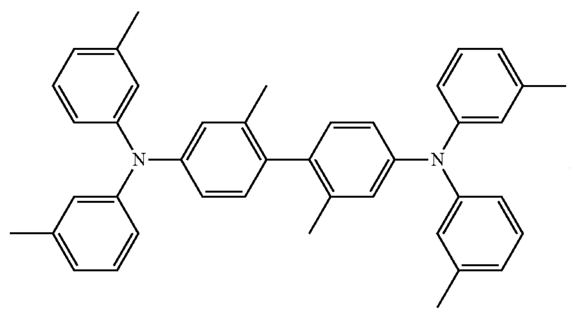

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole-transporting characteristics may be obtained without a substantial increase in driving voltage.

The emission auxiliary layer may increase light-emission efficiency by compensating for an optical resonance distance of the wavelength of light emitted by an emission layer, and the electron blocking layer may block or reduce the leakage of electrons from an emission layer to a hole transport region. Materials that may be included in the hole transport region may be included in the emission auxiliary layer and the electron blocking layer.

p-Dopant

The hole transport region may further include, in addition to these materials, a charge-generation material for the improvement of conductive properties. The charge-generation material may be substantially uniformly or non-uniformly dispersed in the hole transport region (for example, in the form of a single layer including (e.g., consisting of) a charge-generation material).

The charge-generation material may be, for example, a p-dopant.

In an embodiment, a lowest unoccupied molecular orbital (LUMO) energy level of the p-dopant may be about −3.5 eV or less.

In an embodiment, the p-dopant may include a quinone derivative, a cyano group-containing compound, a compound containing an element EL1 and an element EL2, or any combination thereof.

Examples of the quinone derivative may include TCNQ, F4-TCNQ, and/or the like.

Examples of the cyano group-containing compound may include HAT-CN, a compound represented by Formula 221, and/or the like.

Formula 221

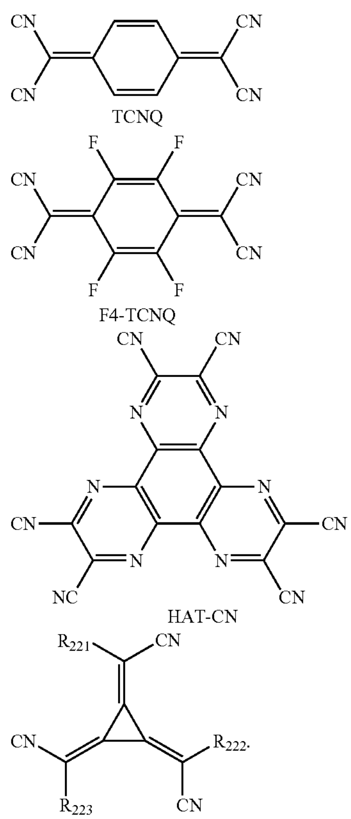

TCNQ

F4-TCNQ

HAT-CN

In Formula 221, $R_{221}$ to $R_{223}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing the element EL1 and the element EL2, the element EL1 may be a metal, a metalloid, or a combination thereof, and the element EL2 may be a non-metal, a metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and/or a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and/or tellurium (Te).

Examples of the non-metal may include oxygen (O) and/or halogen (for example, F, Cl, Br, I, etc.).

In an embodiment, examples of the compound containing the element EL1 and the element EL2 may include a metal oxide, a metal halide (for example, a metal fluoride, a metal chloride, a metal bromide, and/or a metal iodide), a metalloid halide (for example, a metalloid fluoride, a metalloid chloride, a metalloid bromide, and/or a metalloid iodide), a metal telluride, or any combination thereof.

Examples of the metal oxide may include a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), and a rhenium oxide (for example, $ReO_3$, etc.).

Examples of the metal halide may include an alkali metal halide, an alkaline earth metal halide, a transition metal halide, a post-transition metal halide, and/or a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and/or CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and/or $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, MoF3, MoC13, MoBr3, MoI3, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and $SmI_3$.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In an embodiment, the emission layer may have a stacked structure of two or more layers of a red emission layer, a green emission layer, and a blue emission layer, in which the two or more layers may contact each other or may be separated from each other. In an embodiment, the emission layer may include two or more materials of a red light-emitting material, a green light-emitting material, and a blue light-emitting material, in which the two or more materials may be mixed with each other in a single layer to emit white light.

The emission layer may include a host and a dopant. The dopant may include a phosphorescent dopant, a fluorescent dopant, or any combination thereof.

An amount of the dopant in the emission layer may be about 0.01 parts by weight to about 15 parts by weight based on 100 parts by weight of the host.

In an embodiment, the emission layer may include a quantum dot.

In an embodiment, the emission layer may include a delayed fluorescence material. The delayed fluorescence material may act as a host or as a dopant in the emission layer.

A thickness of the emission layer may be in a range of about 100 Å to about 1,000 Å, for example, about 200 Å to about 600 Å. When the thickness of the emission layer is within the range, excellent or suitable light-emission characteristics may be obtained without a substantial increase in driving voltage.

Host

The host in the emission layer may include the second compound or the third compound described in the present specification, or any combination thereof.

The host may include a compound represented by Formula 301:

Formula 301

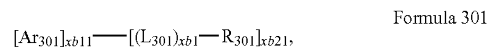

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described in connection with $Q_1$.

In an embodiment, when xb11 in Formula 301 is 2 or more, two or more $Ar_{301}$(s) may be linked to each other via a single bond.

In an embodiment, the host may include a compound represented by Formula 301-1, a compound represented by Formula 301-2, or any combination thereof:

Formula 301-1

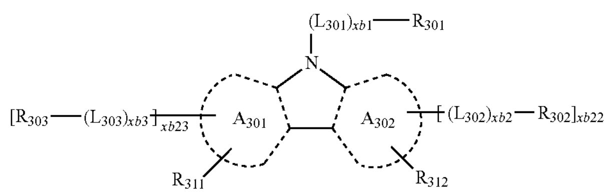

-continued

Formula 301-2

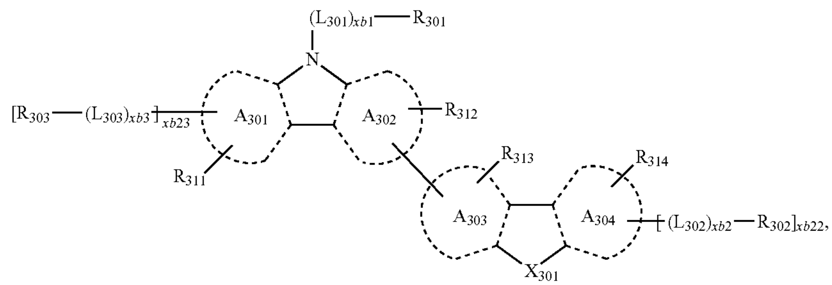

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N—[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each independently be the same as described in the present specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or a combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

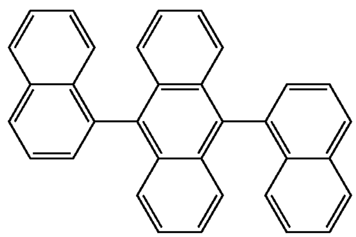

H2

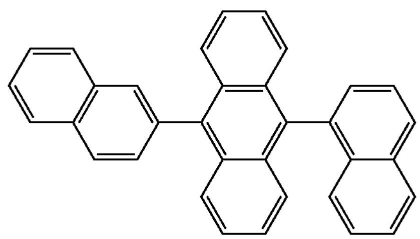

-continued

H3

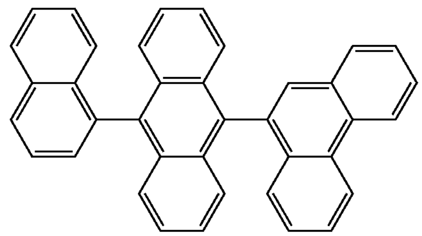

H4

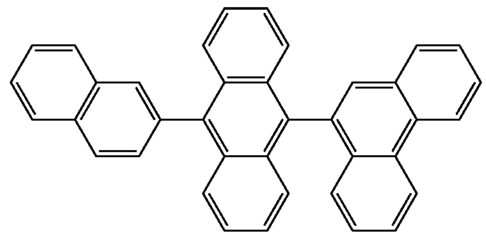

H5

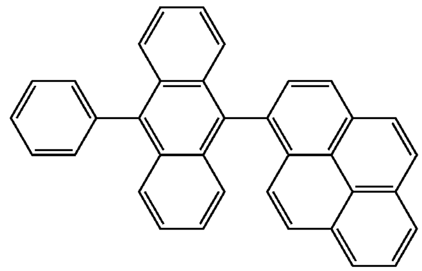

H6

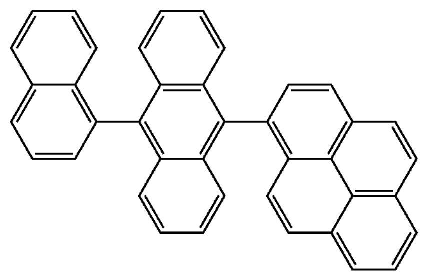

H7

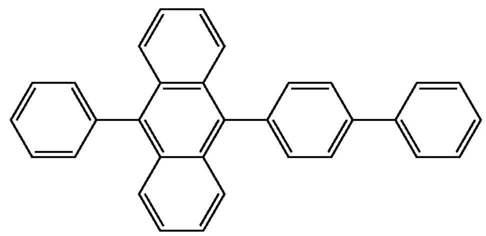

-continued
H8
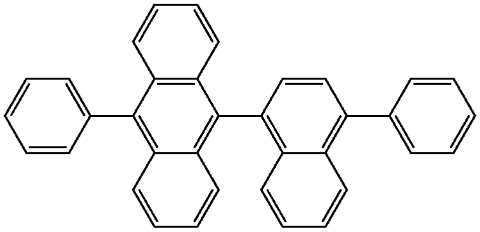
H9
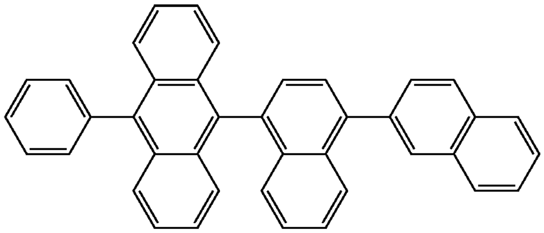
H10
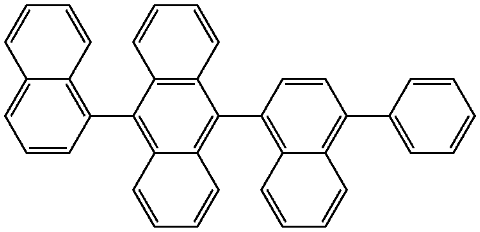
H11
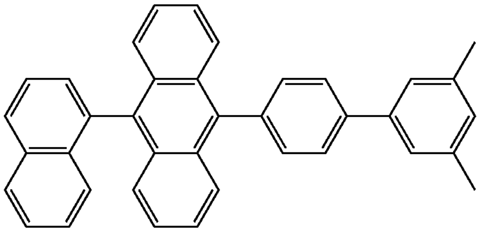
H12
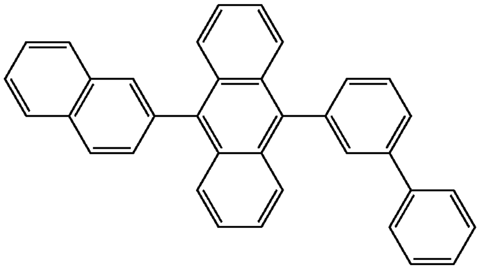
H13
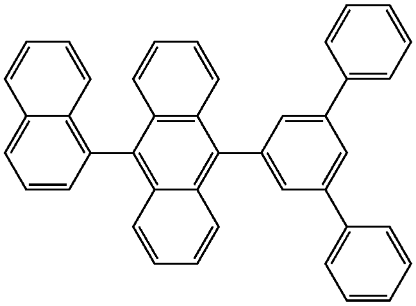
-continued
H14
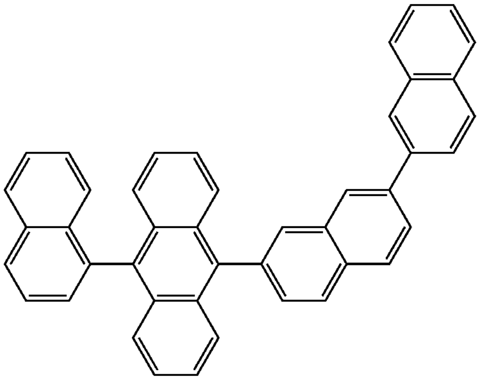
H15
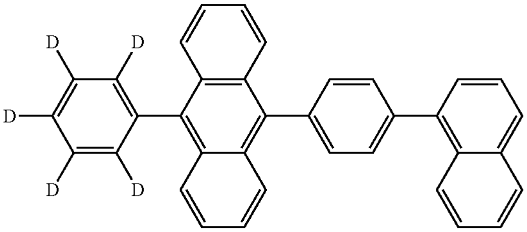
H16
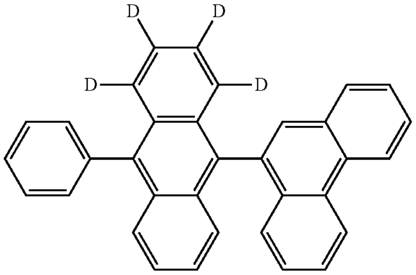
H17
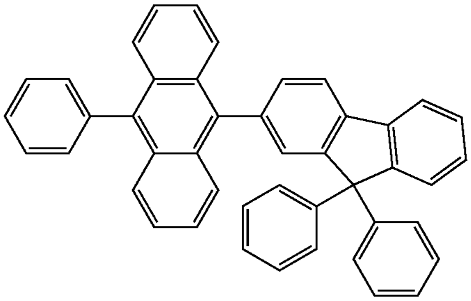
H18
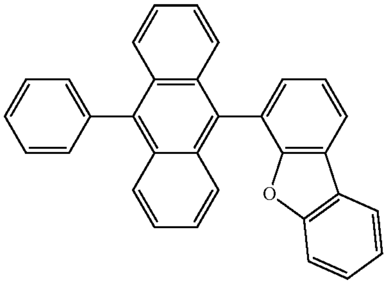

-continued
H19
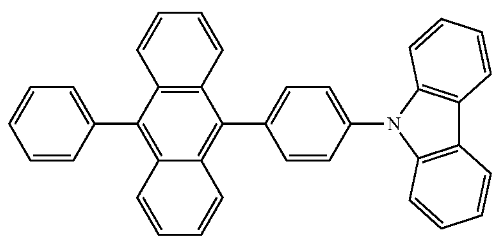
H20
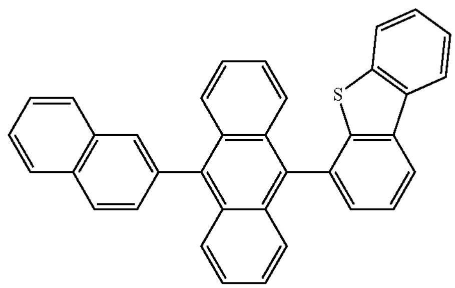
H21
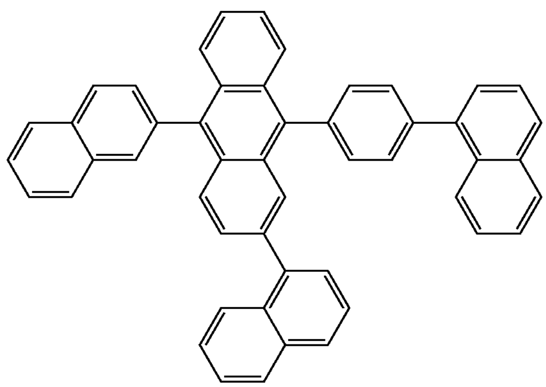
H22
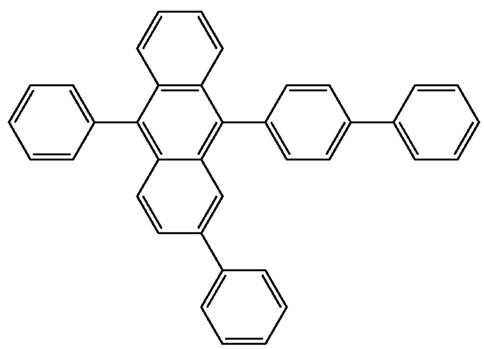
-continued
H23
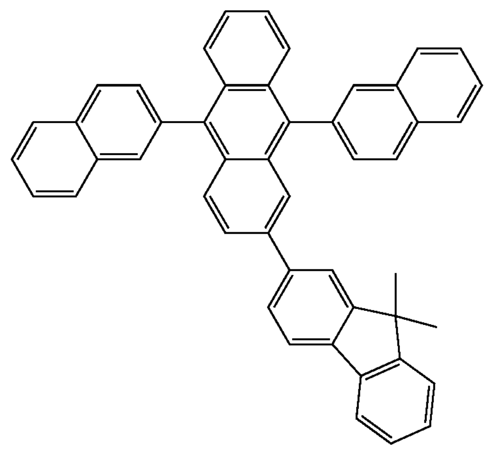
H24
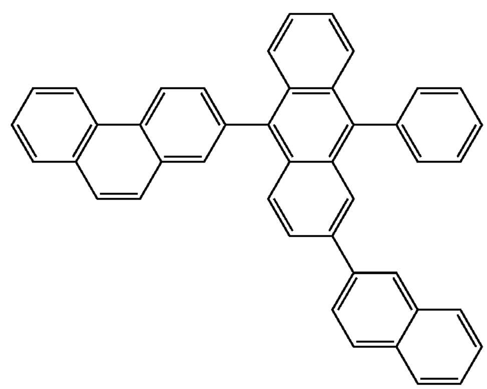
H25
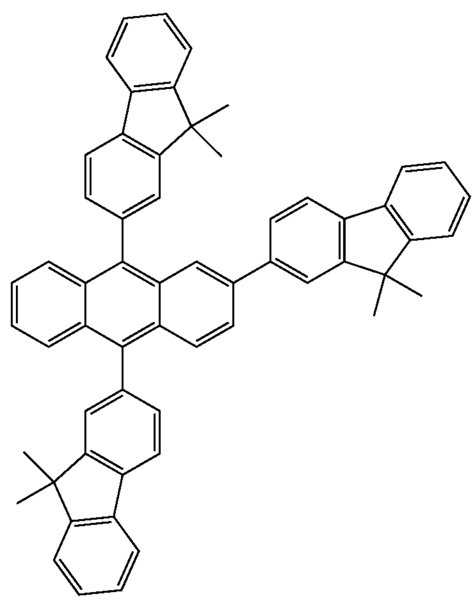

-continued
H26
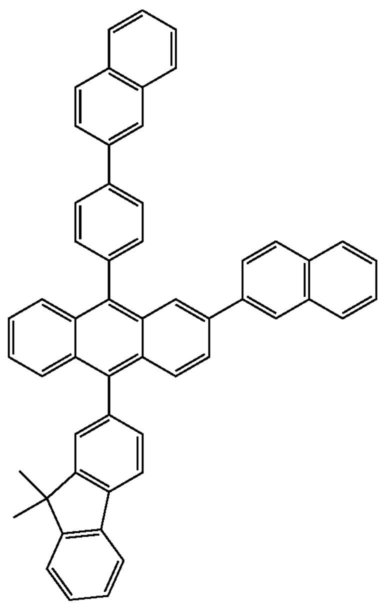
H27
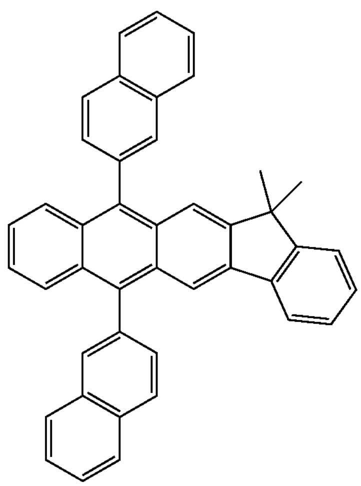
H28
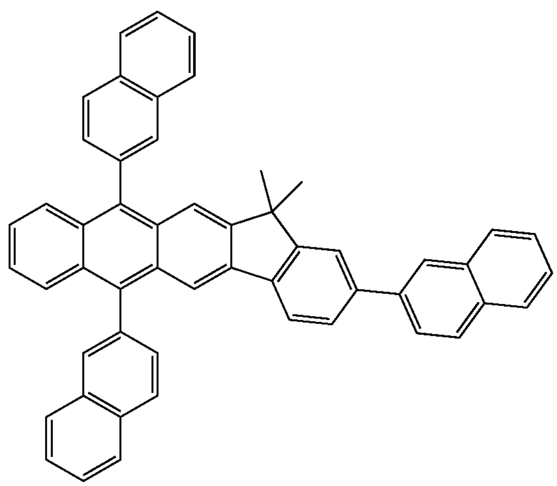
-continued
H29
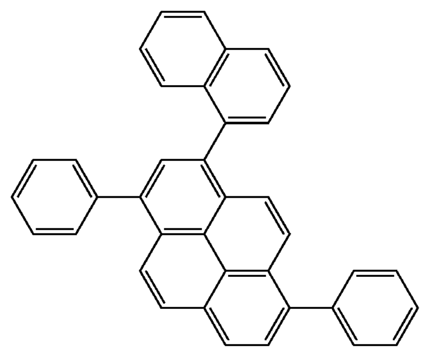
H30
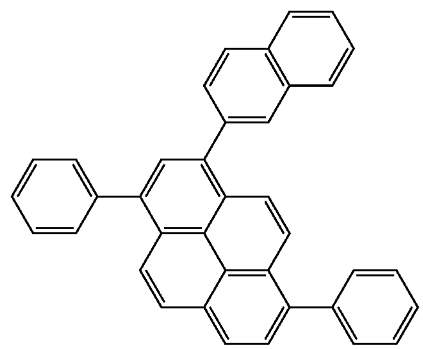
H31
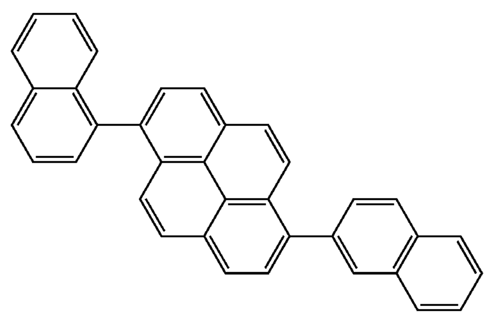
H32
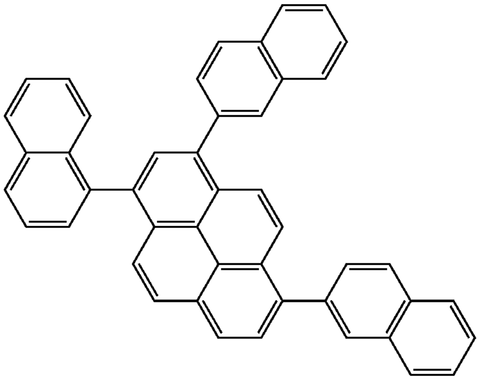
H33
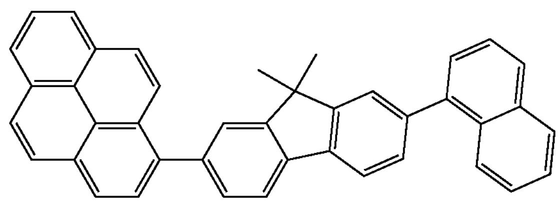

-continued
H34
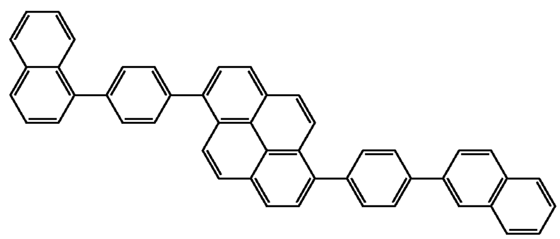
H35
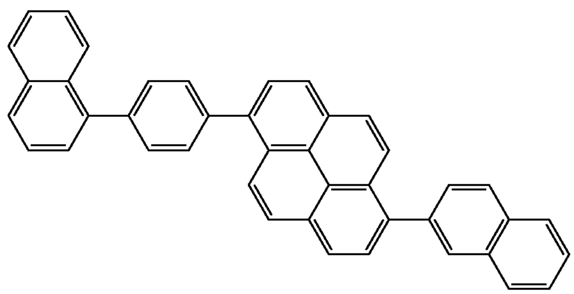
H36
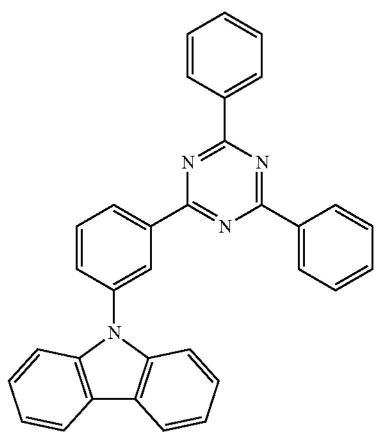
H37
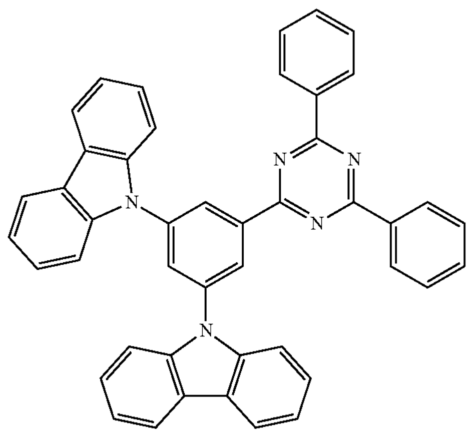
-continued
H38
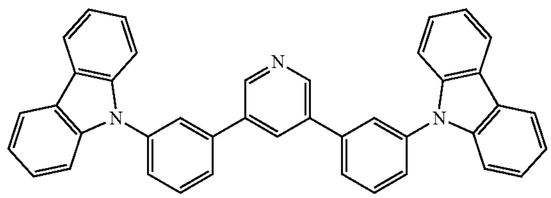
H39
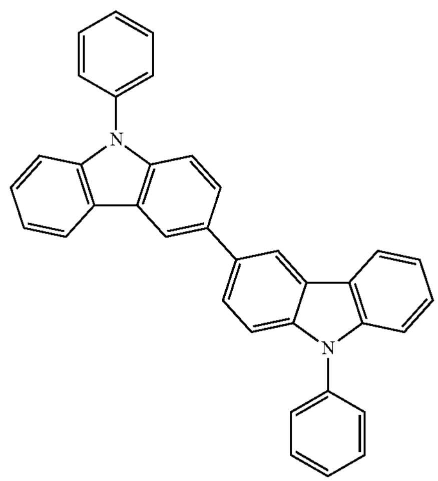
H40
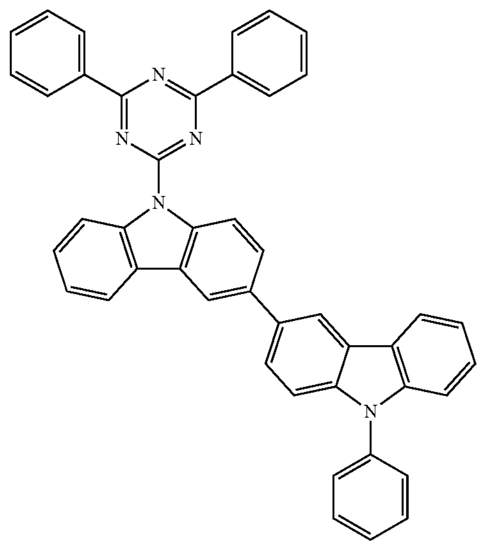

H41
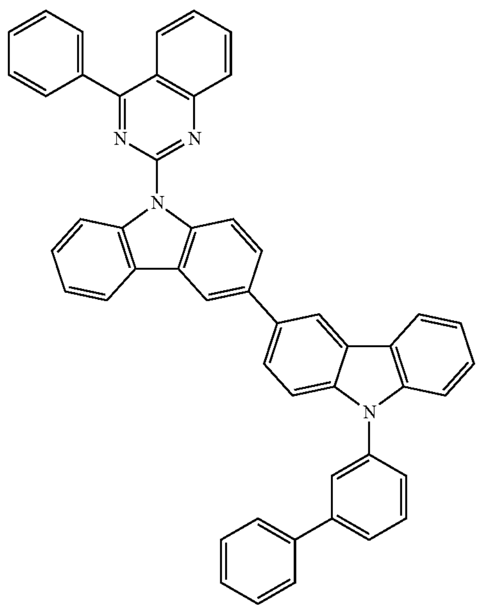
H42
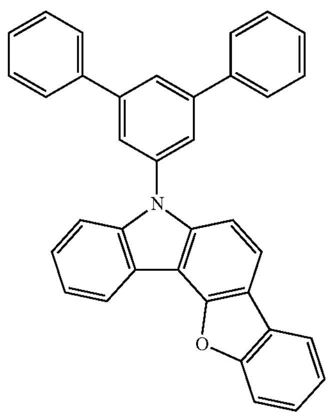
H43
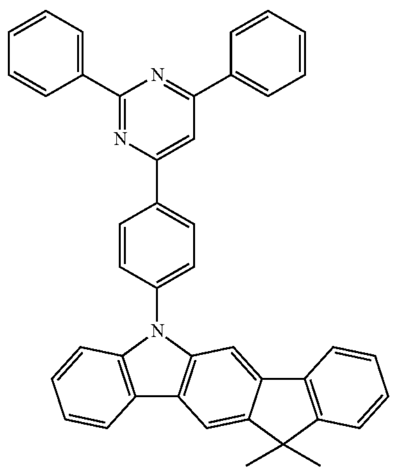
H44
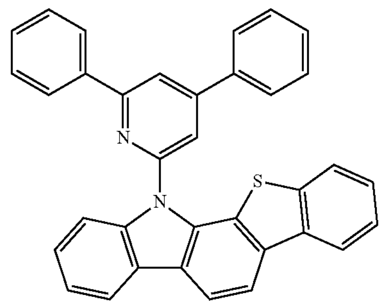
H45
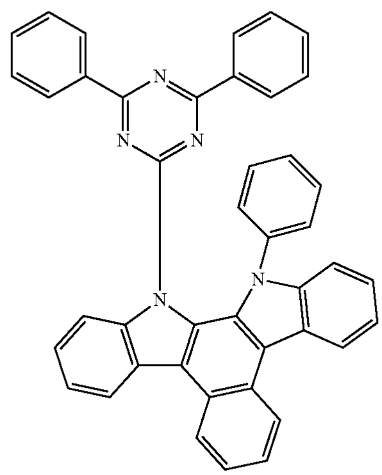
H46
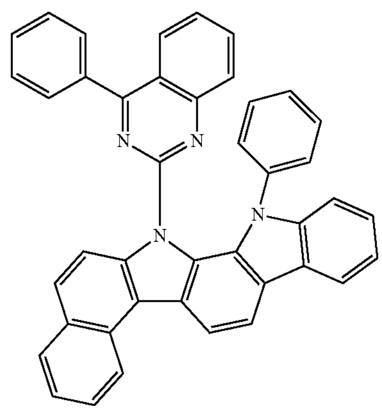
H47
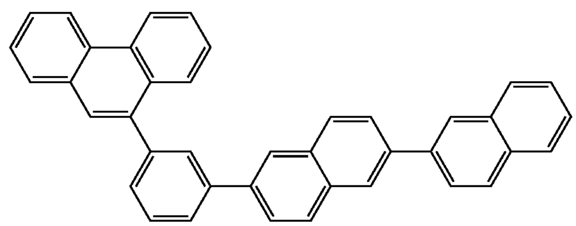

-continued
H48
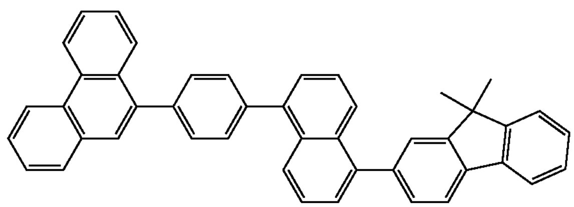
H49
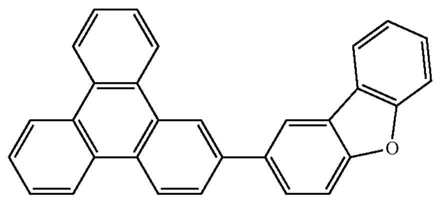
H50
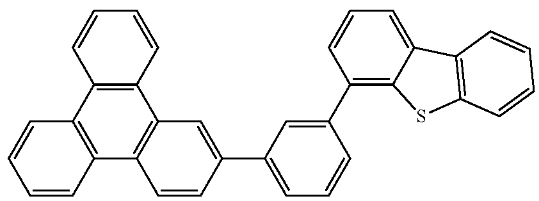
H51
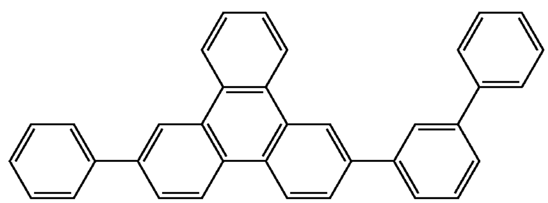
H52
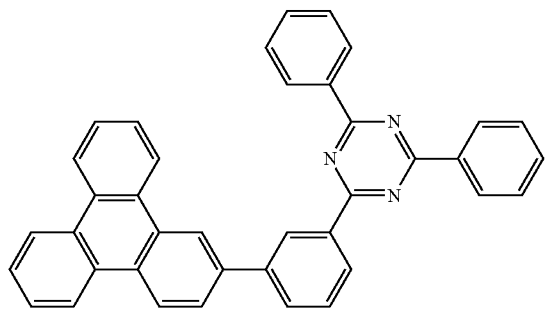
H53
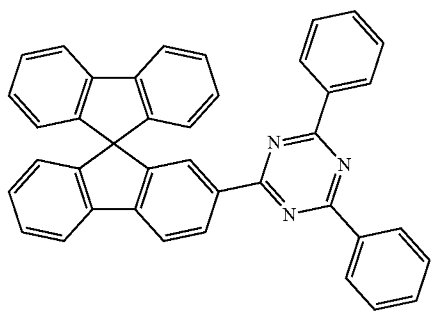
-continued
H54
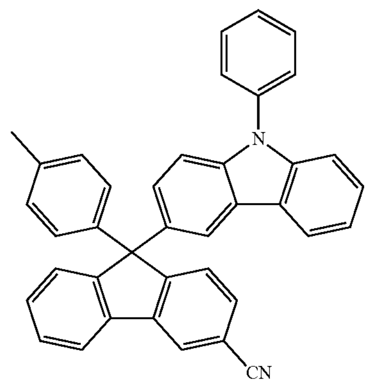
H55
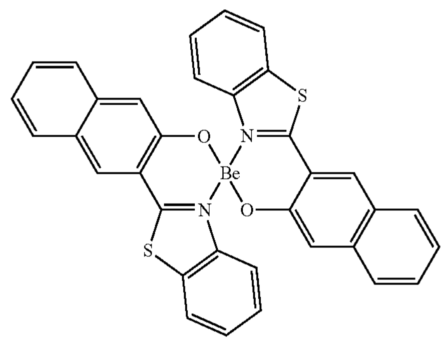
H56
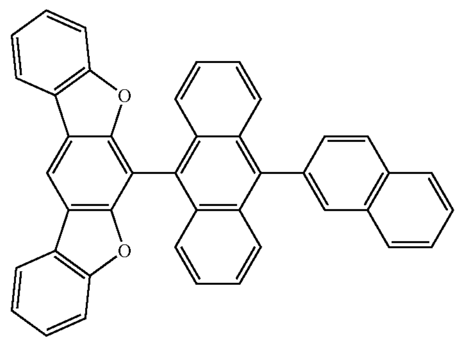
H57
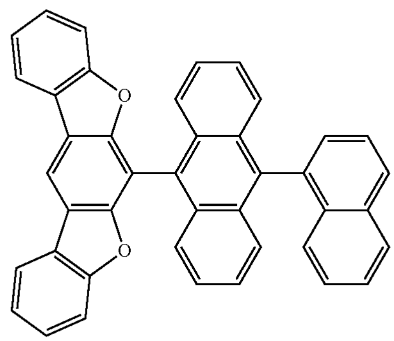

-continued
H58
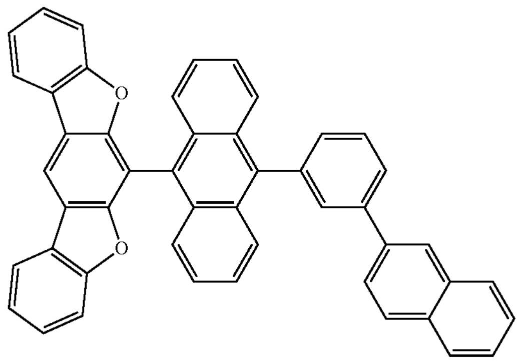
H59
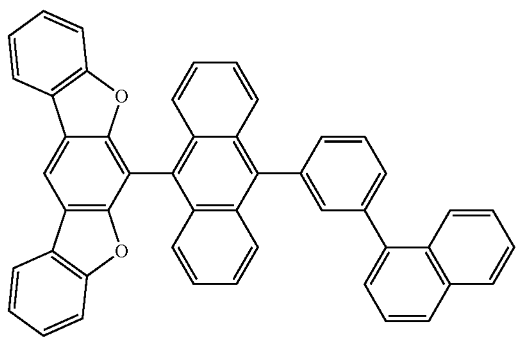
H60
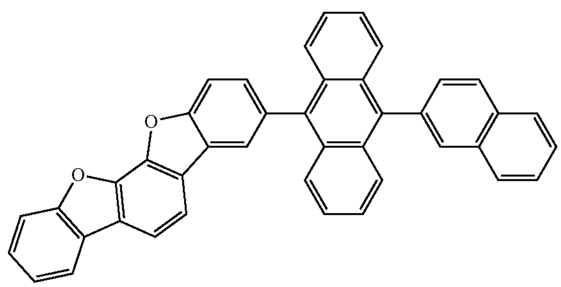
H61
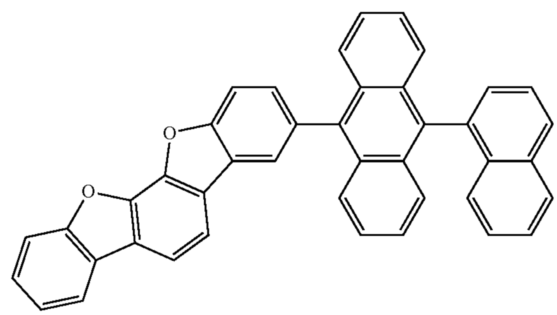
-continued
H62
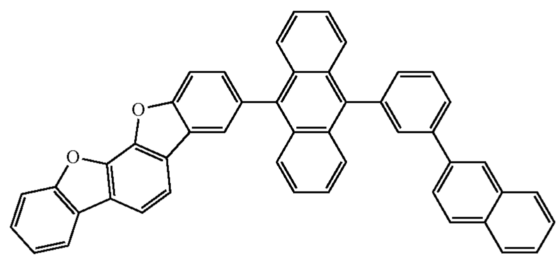
H63
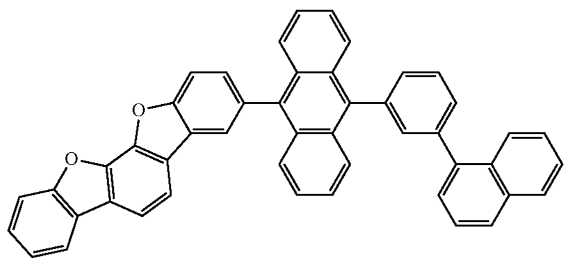
H64
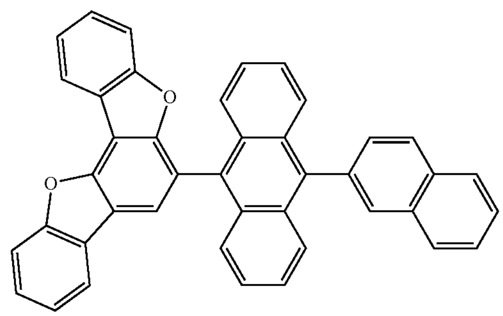
H65
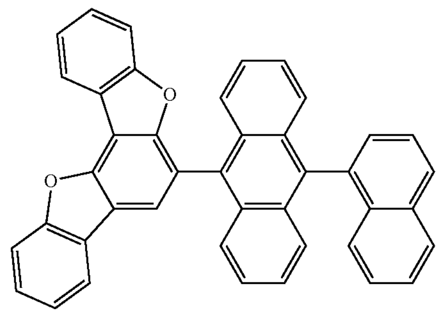
H66
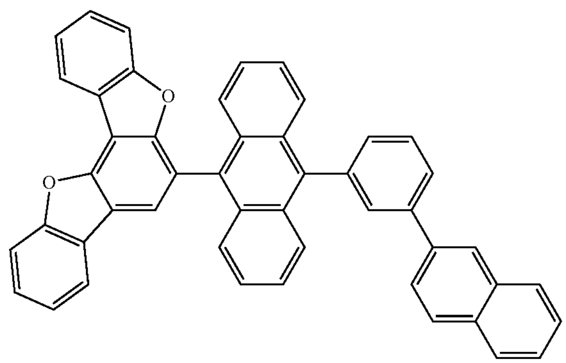

-continued
H67
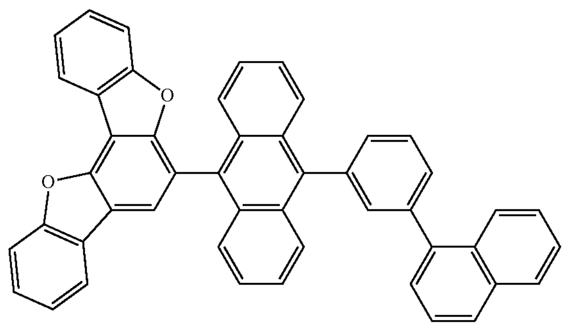
H68
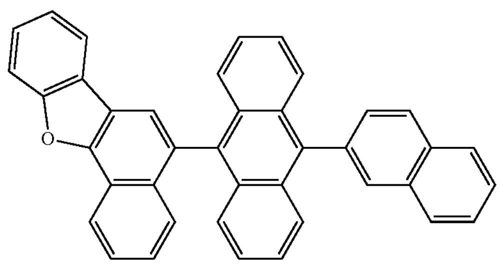
H69
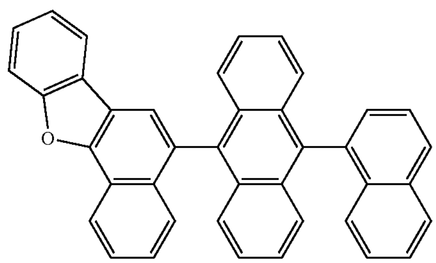
H70
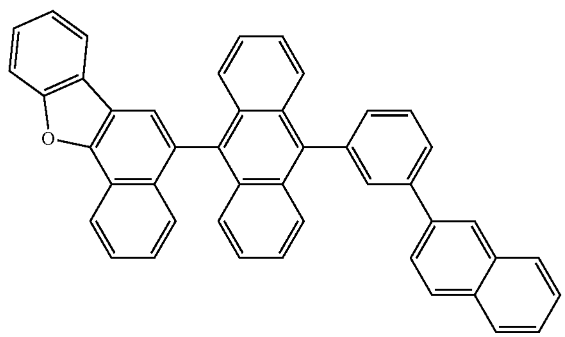
H71
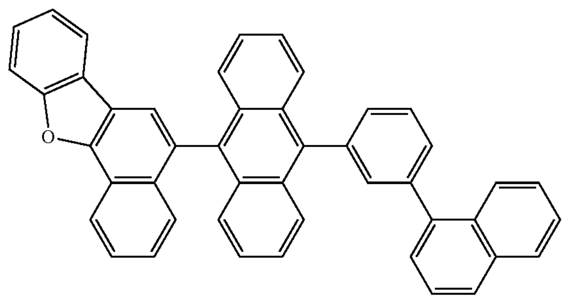
-continued
H72
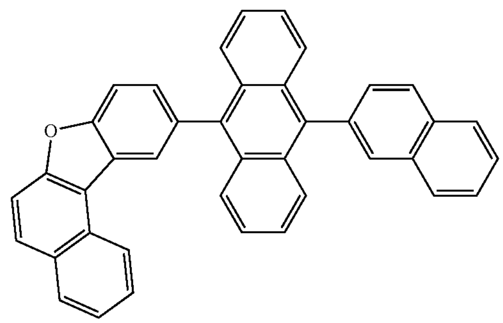
H73
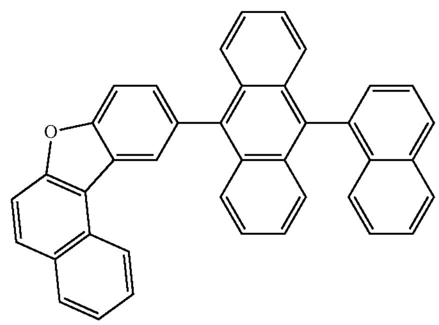
H74
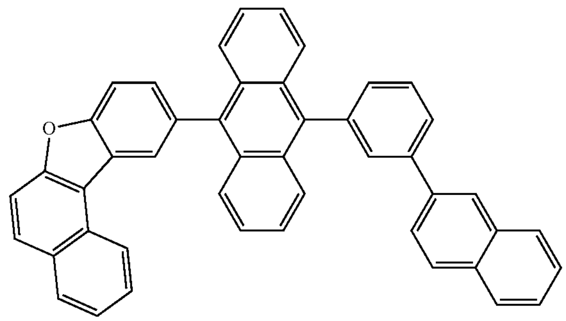
H75
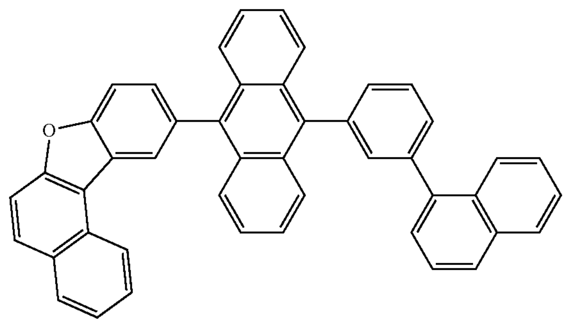
H76
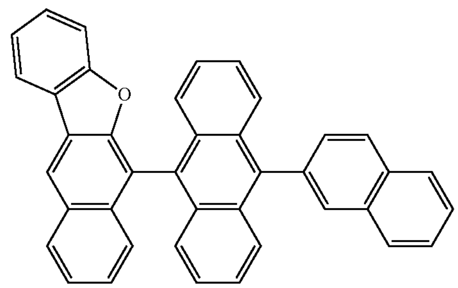

-continued
H77
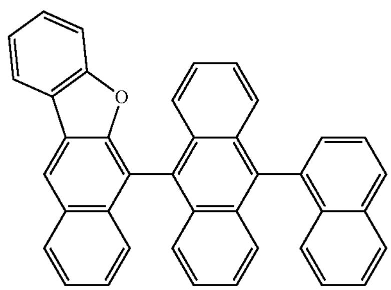
H78
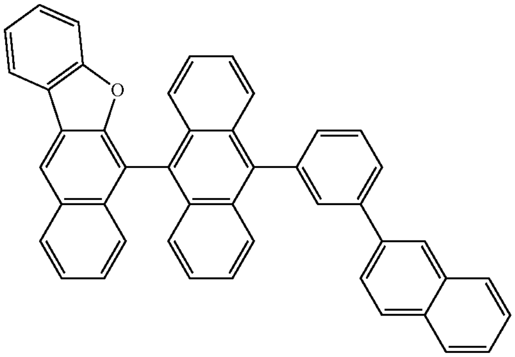
H79
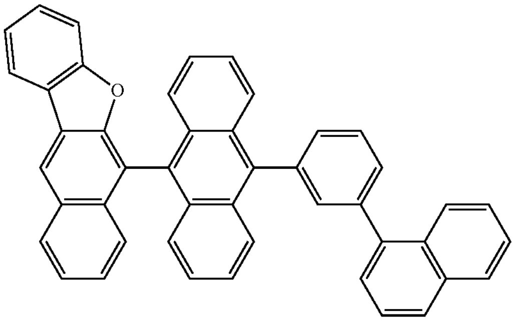
H80
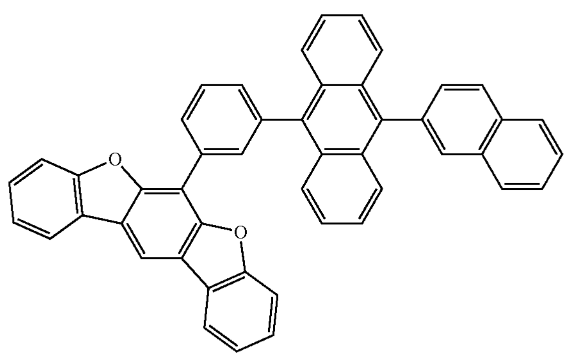
-continued
H81
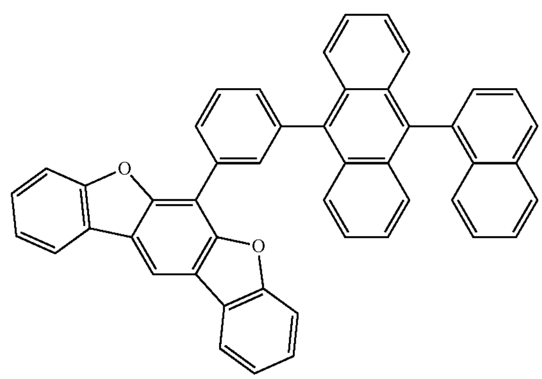
H82
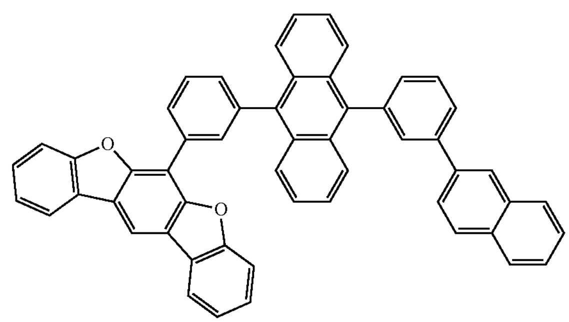
H83
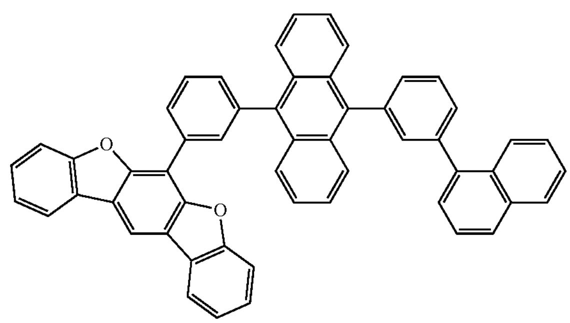
H84
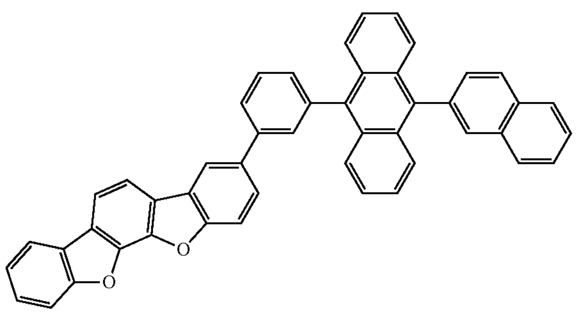

-continued
H85
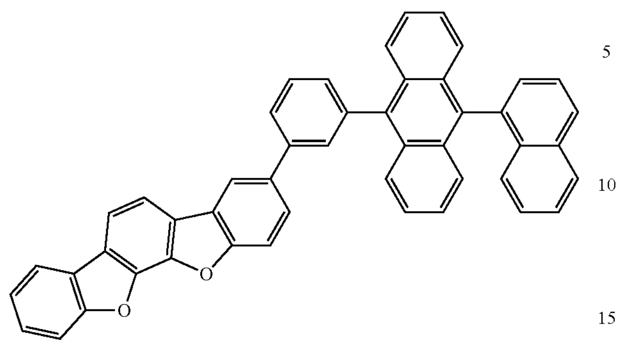
H86
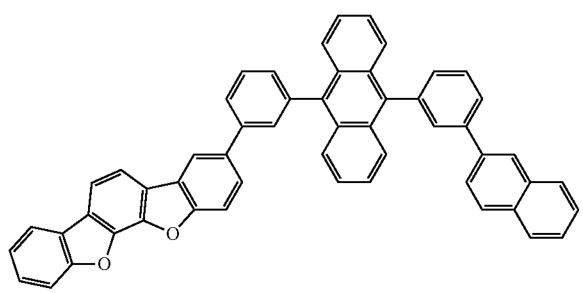
H87
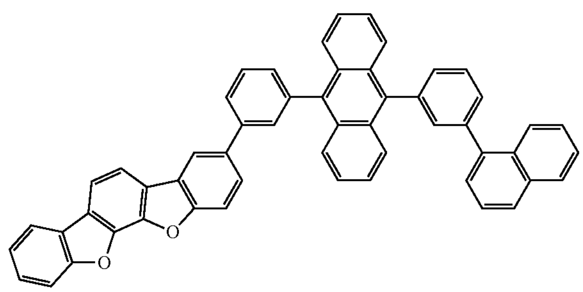
H88
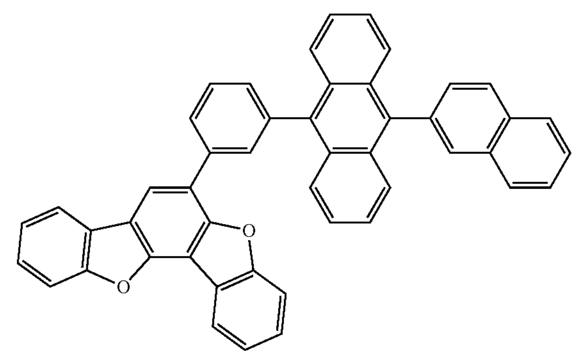
-continued
H89
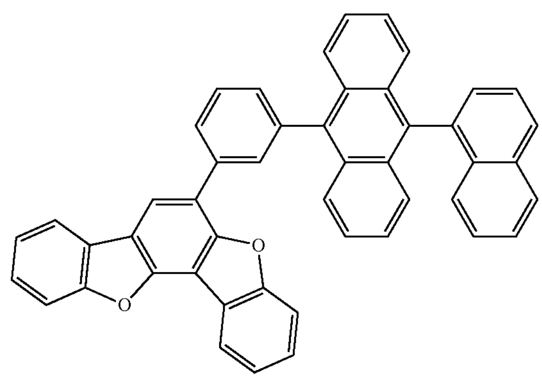
H90
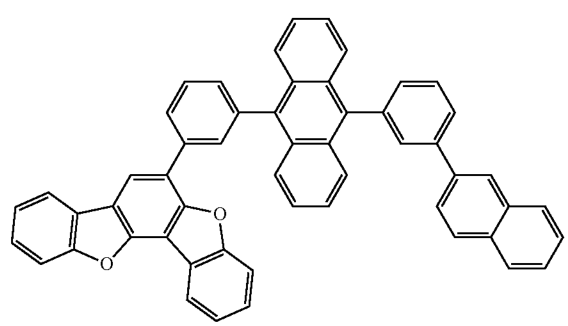
H91
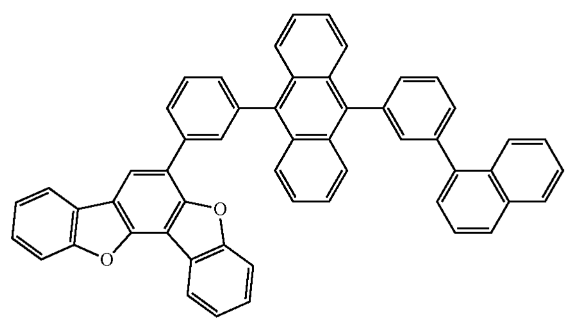
H92
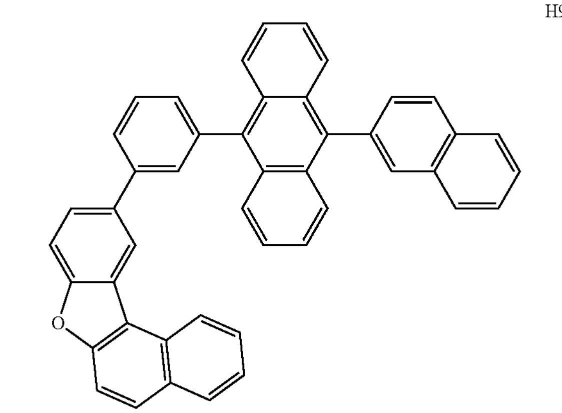

-continued
H93
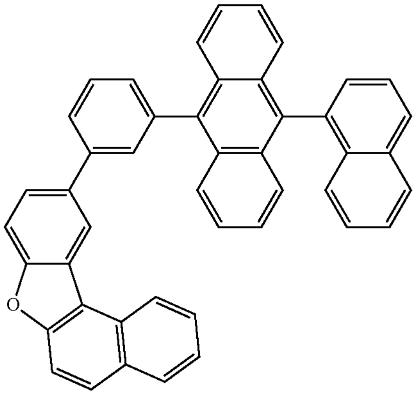
H94
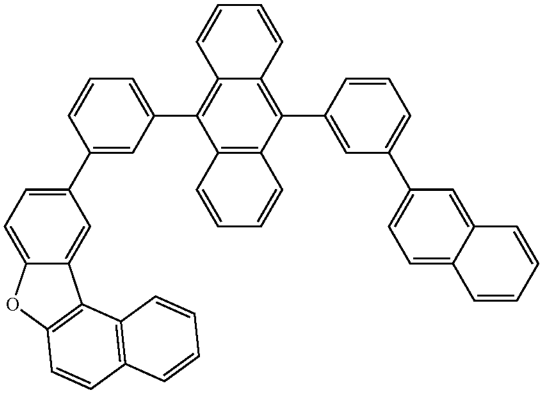
H95
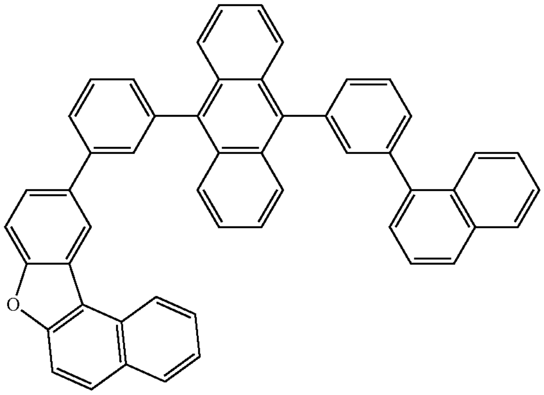
H96
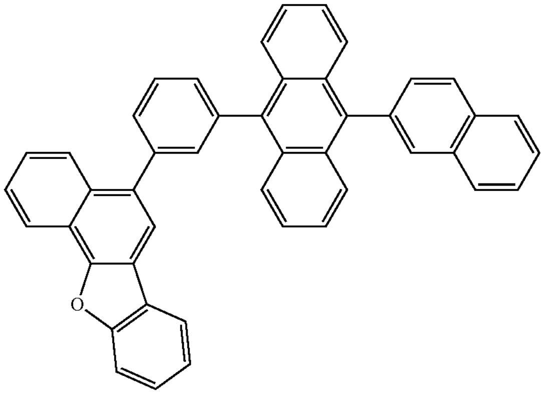
-continued
H97
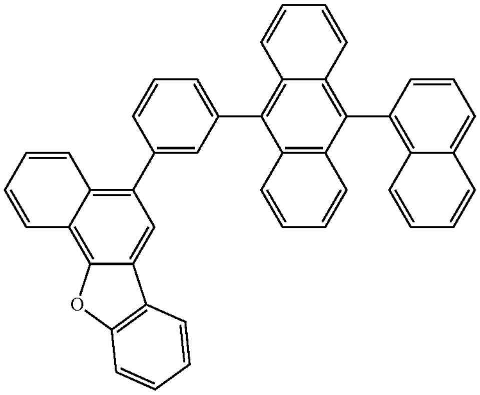
H98
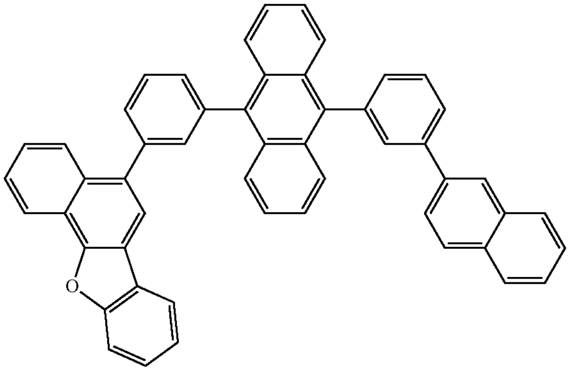
H99
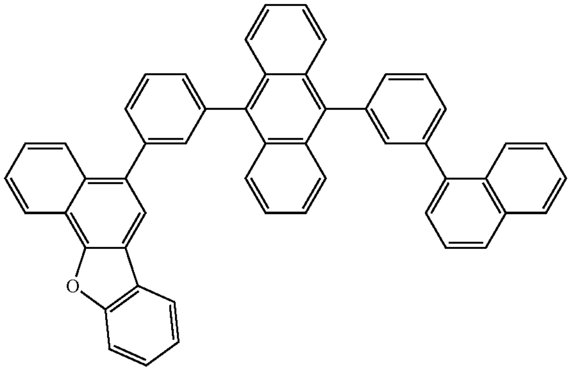
H100
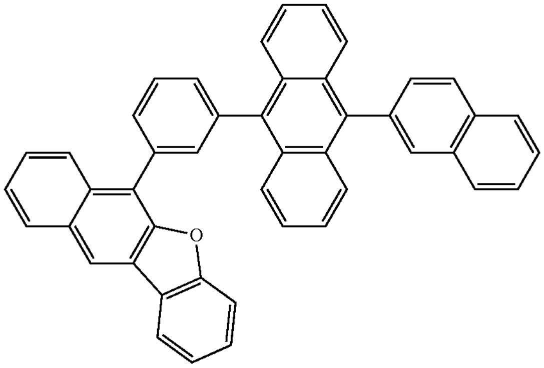

-continued
H101
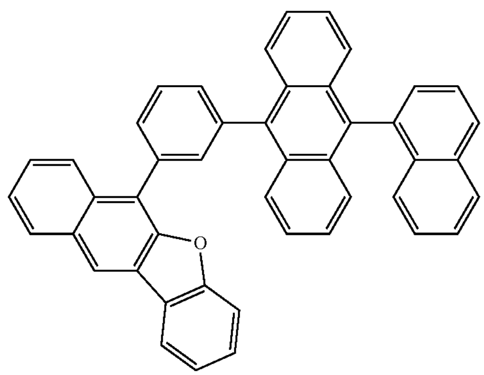
H102
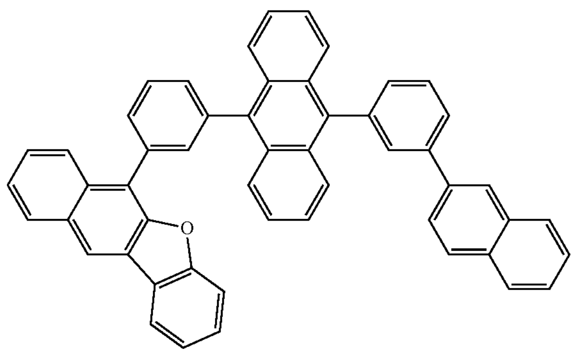
H103
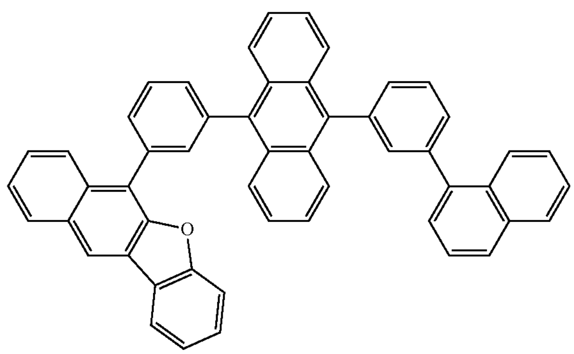
H104
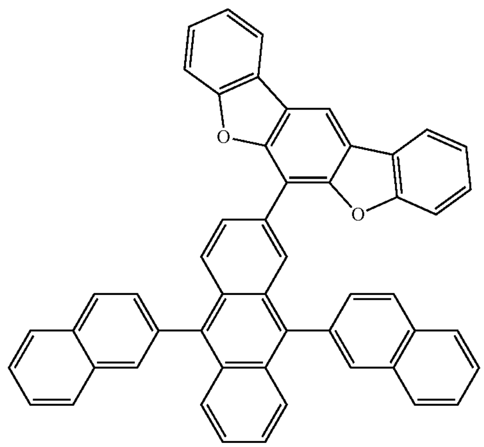
-continued
H105
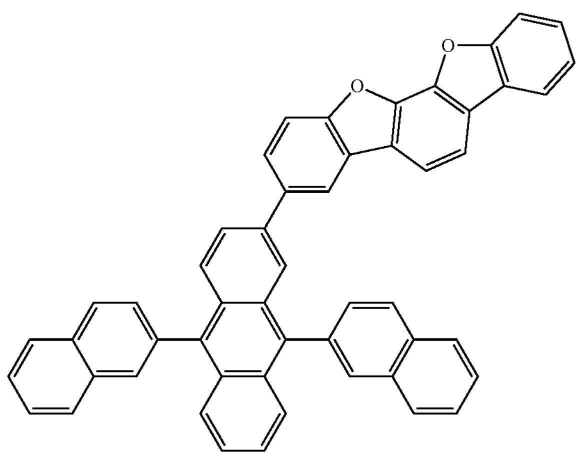
H106
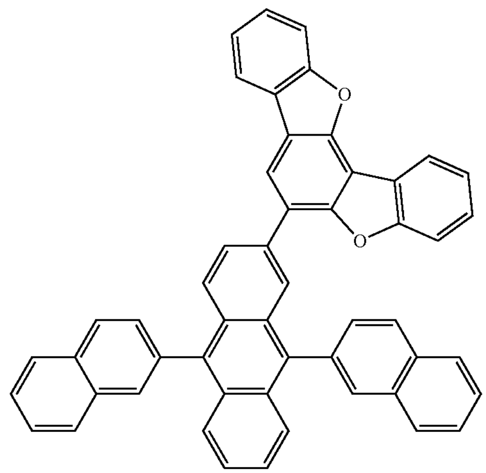
H107
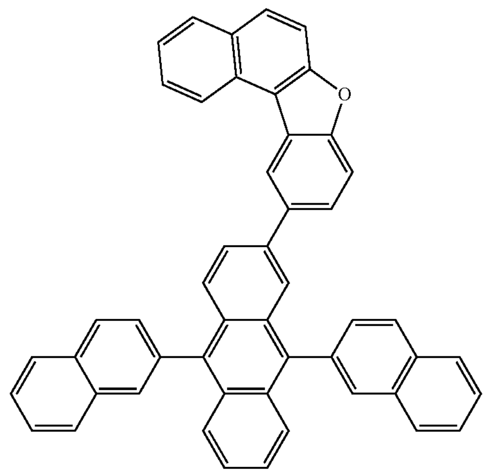

-continued
H108
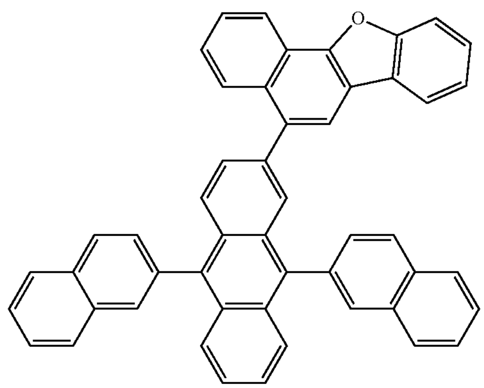
H109
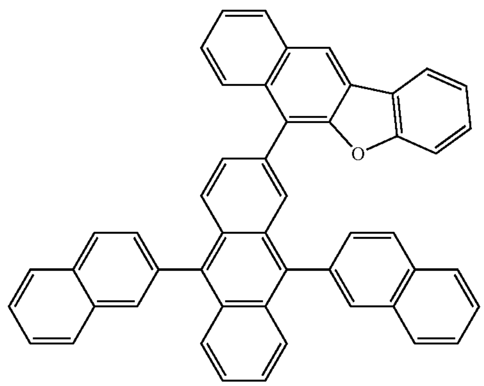
H110
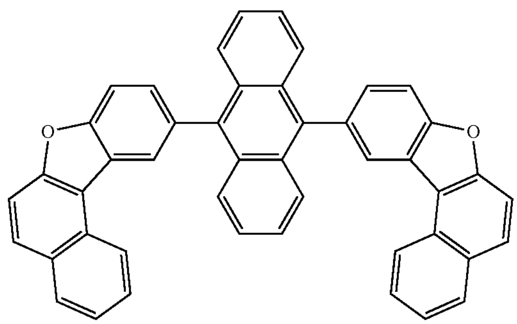
H111
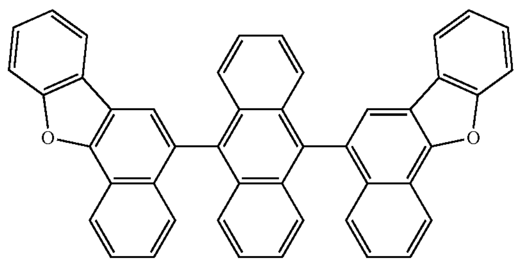
-continued
H112
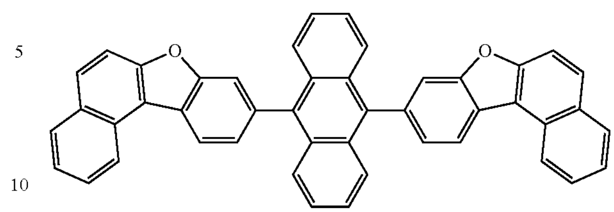
H113
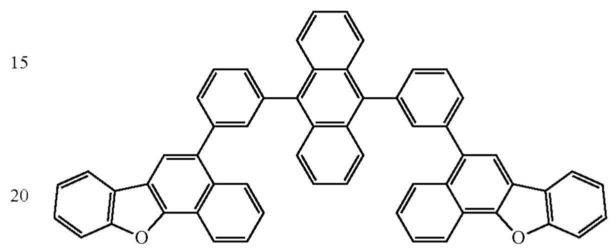
H114
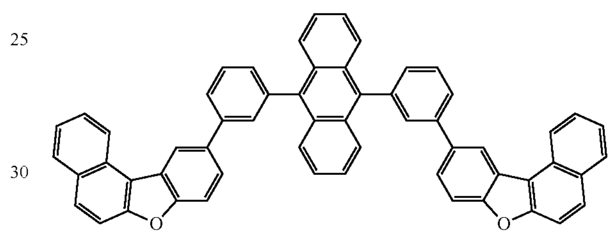
H115
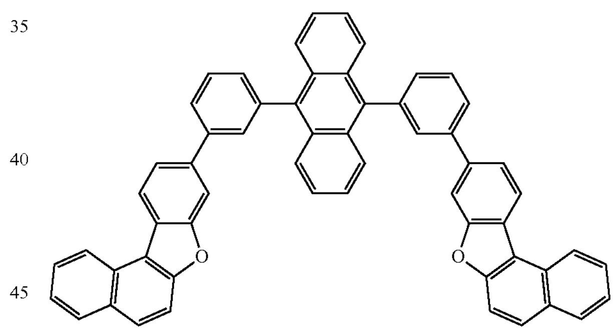
H116
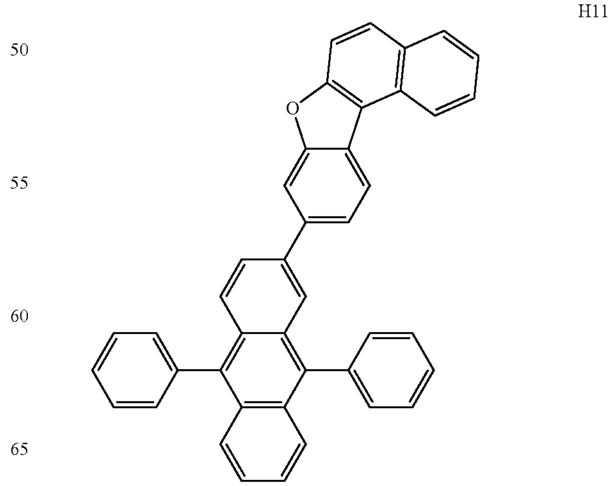

-continued
H117
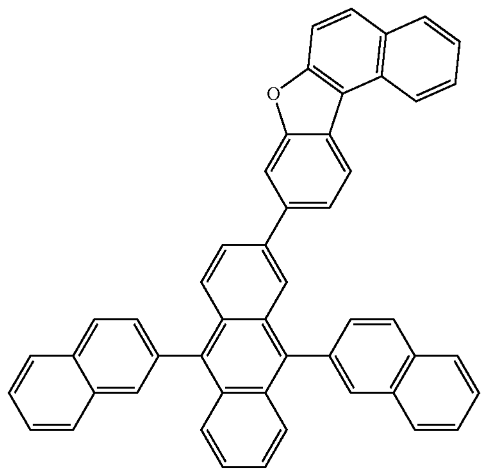
H118
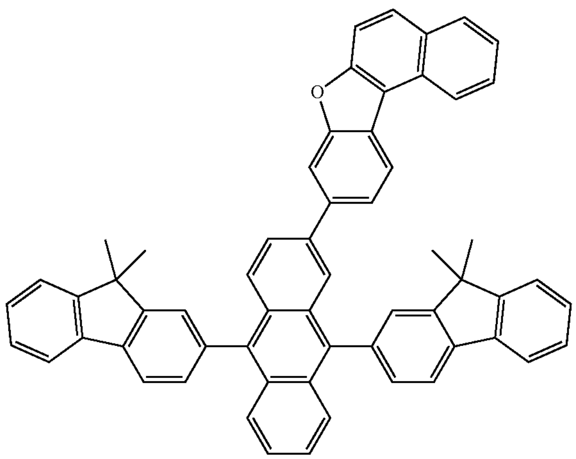
H119
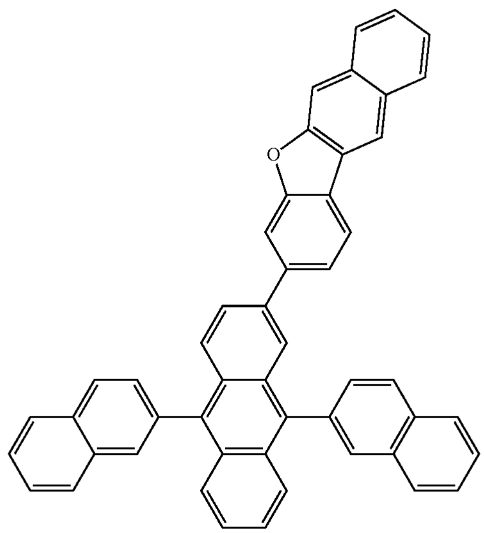
-continued
H120
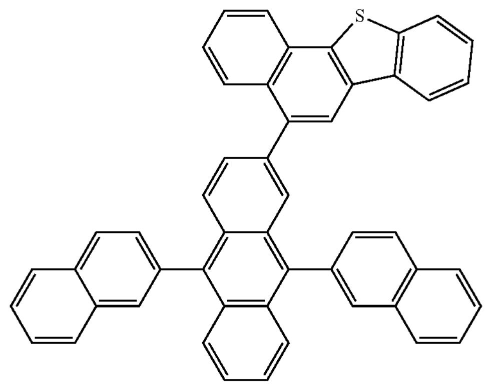
H121
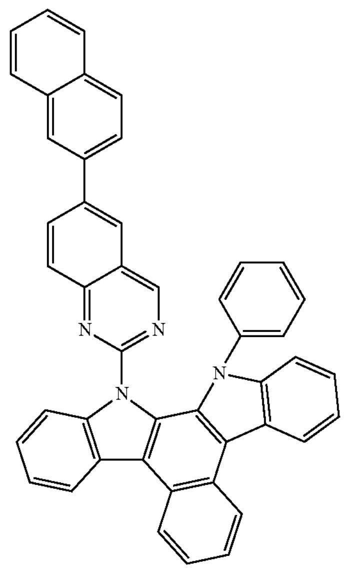
H122
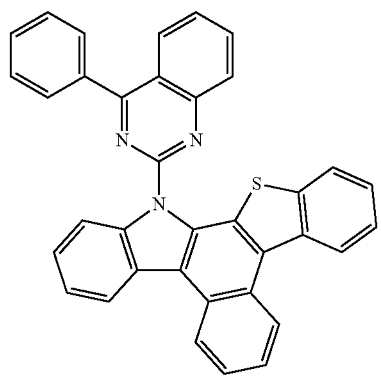

-continued

H123

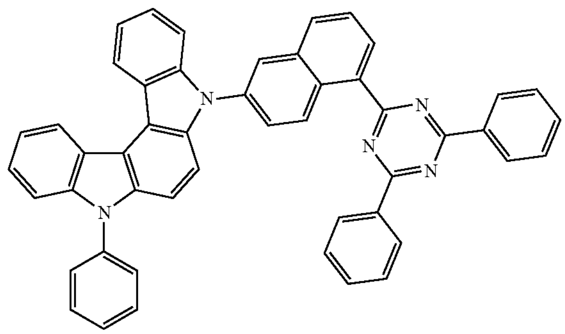

H124

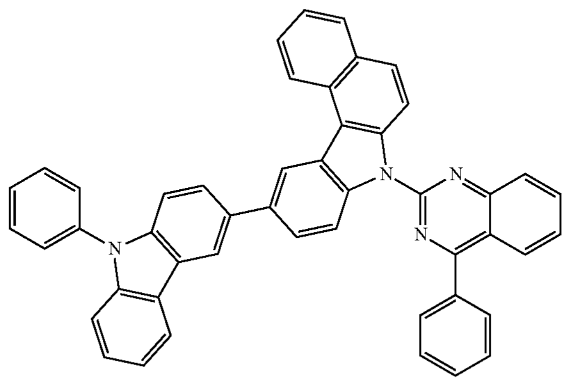

In an embodiment, the host may include a silicon-containing compound, a phosphine oxide-containing compound, or any combination thereof.

The host may have various suitable modifications, For example, the host may include only one kind of compound, or may include two or more kinds of different compounds.

Phosphorescent Dopant

The emission layer may include the first compound as described in the present specification, as a phosphorescent dopant.

In an embodiment, when the emission layer includes the first compound as described in the present specification and the first compound serves as an auxiliary dopant, the emission layer may include a phosphorescent dopant.

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

Formula 401

$$M(L_{401})_{xc1}(L_{402})_{xc2}$$

Formula 402

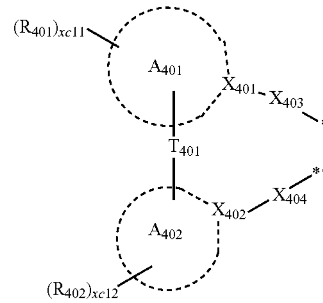

wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more $L_{401}$(s) may be identical to or different from each other, $L_{402}$ may be an organic ligand, and xc2 may be 0, 1, 2, 3, or 4, wherein, when xc2 is 2 or more, two or more $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)*', *—C($Q_{411}$)=C($Q_{412}$)-*', *—C($Q_{411}$)=*', or *=C($Q_{411}$)=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 402 is 2 or more, two ring $A_{401}$ in two or more $L_{401}$(s) may be optionally linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or any combination thereof.

The phosphorescent dopant may include, for example, one of compounds PD1 to PD39, or any combination thereof:

PD1

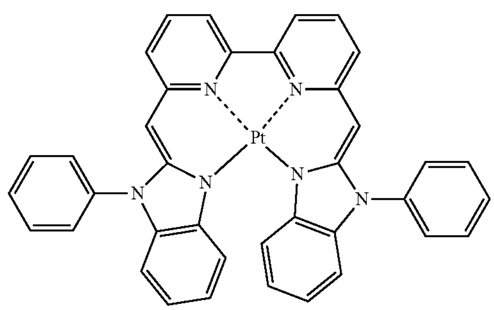

PD2

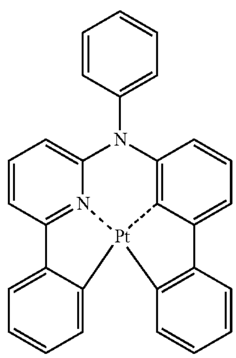

PD3

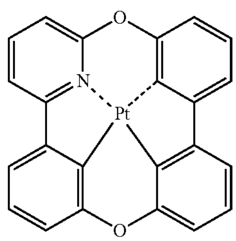

PD4

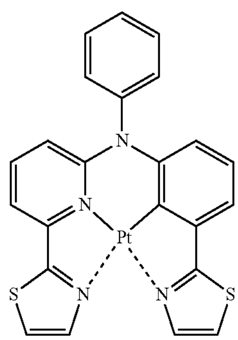

-continued

PD5

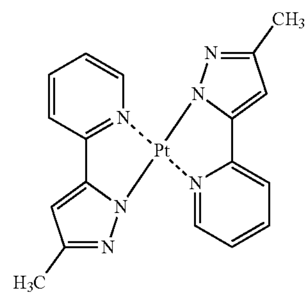

PD6

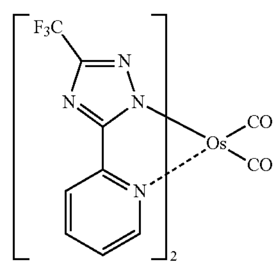

PD7

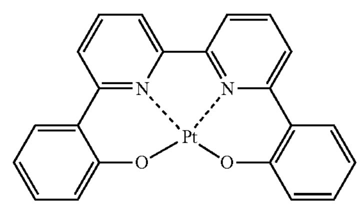

PD8

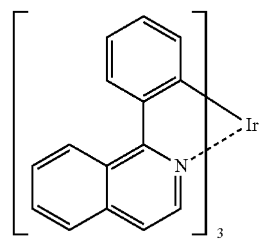

PD9

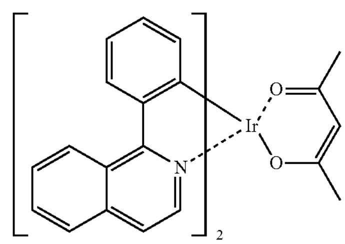

PD10

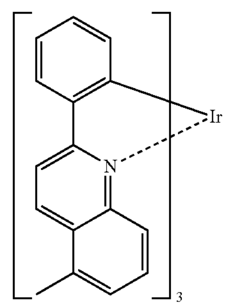

PD11
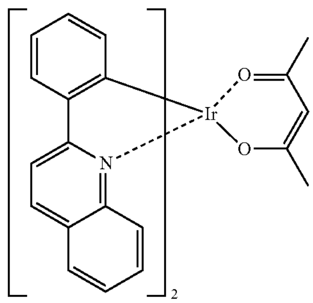
PD12
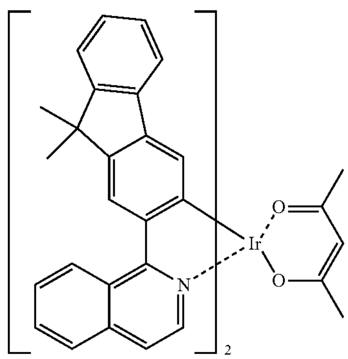
PD13
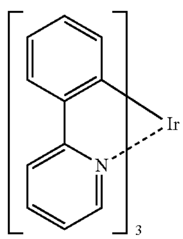
PD14
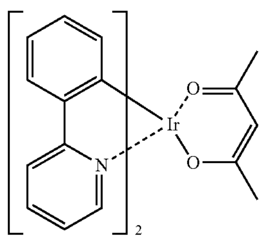
PD15
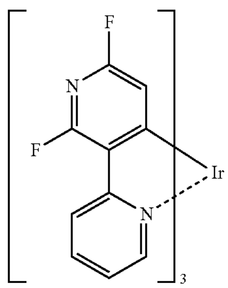
PD16
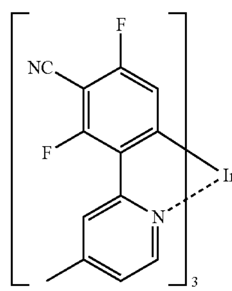
PD17
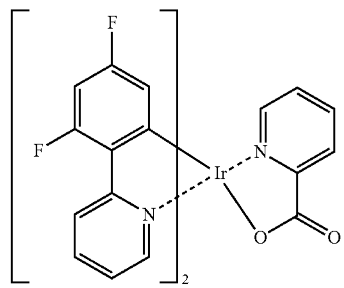
PD18
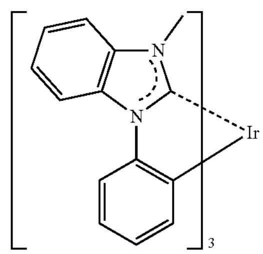
PD19
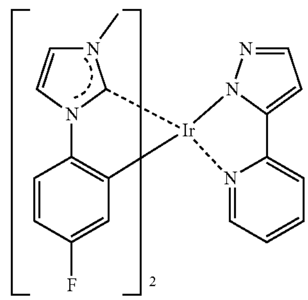
PD20
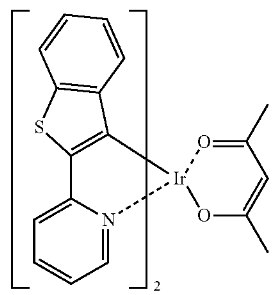

-continued
PD21
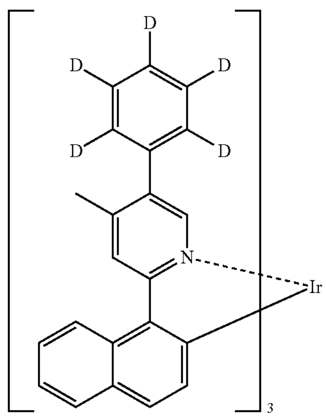
PD22
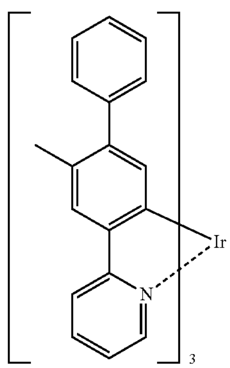
PD23
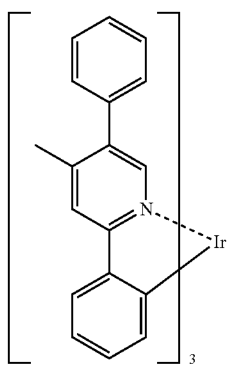
PD24
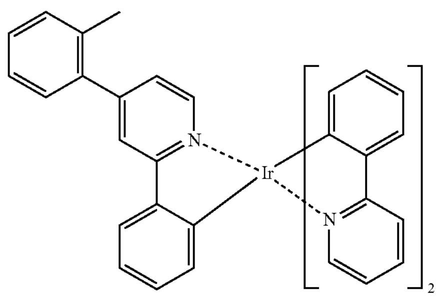
-continued
PD25
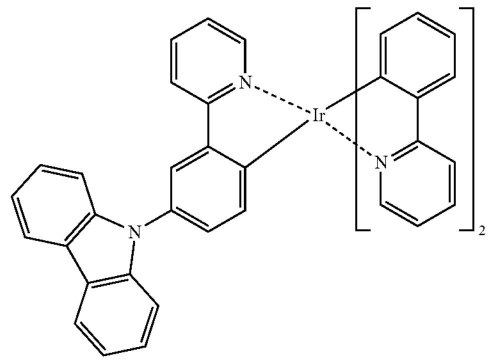
PD26
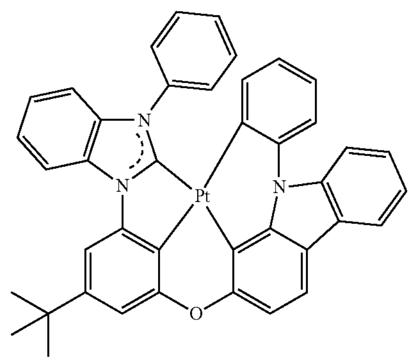
PD27
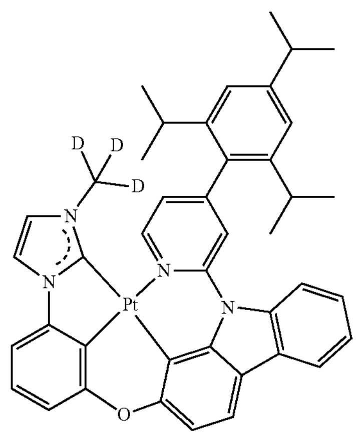
PD28
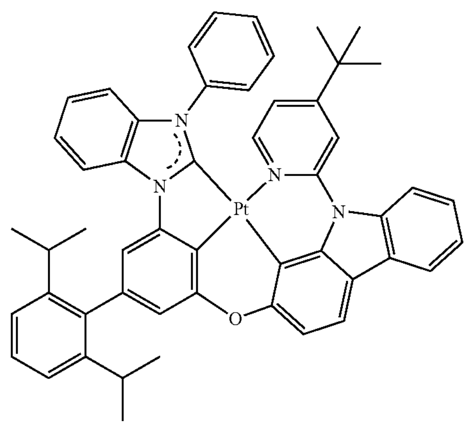

-continued
PD29
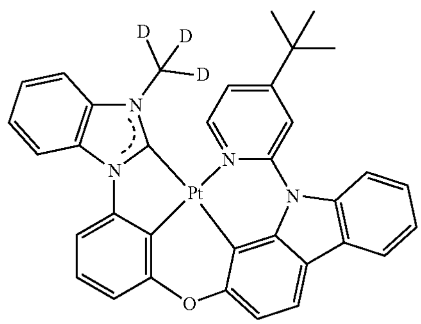
PD30
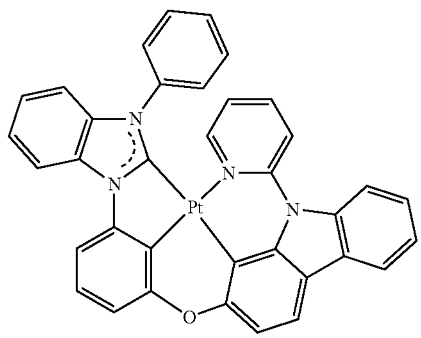
PD31
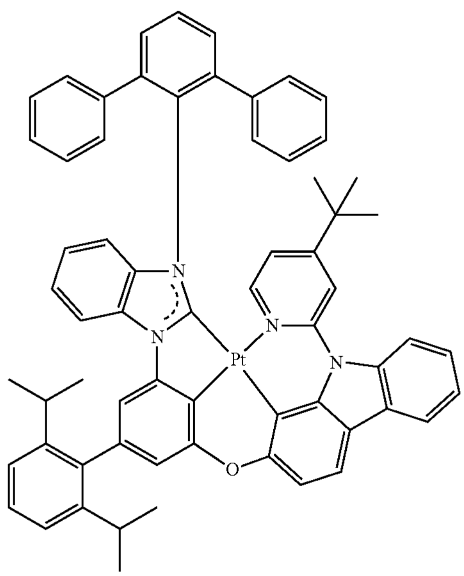
-continued
PD32
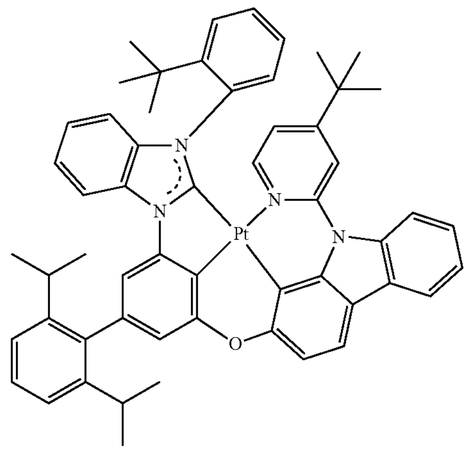
PD33
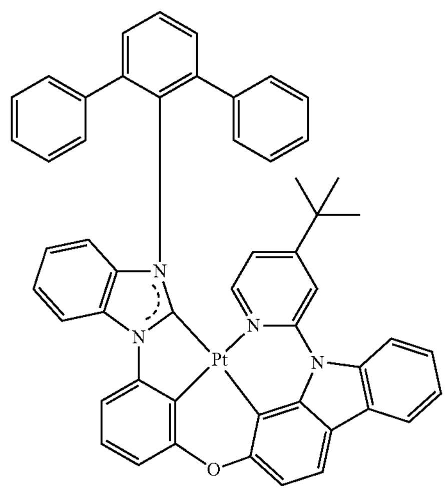
PD34
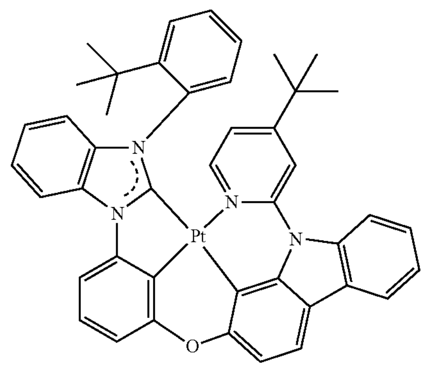

-continued

PD35

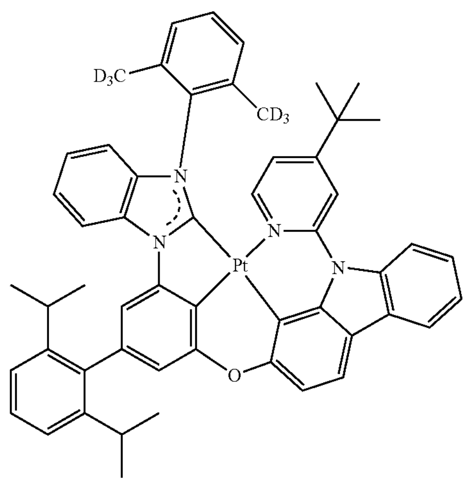

PD36

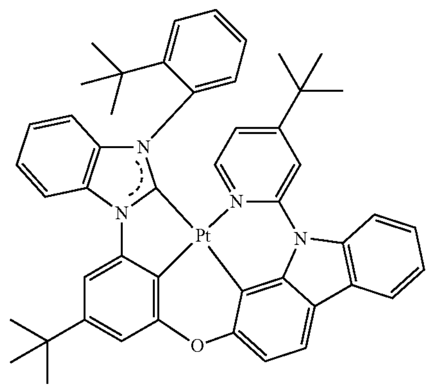

PD37

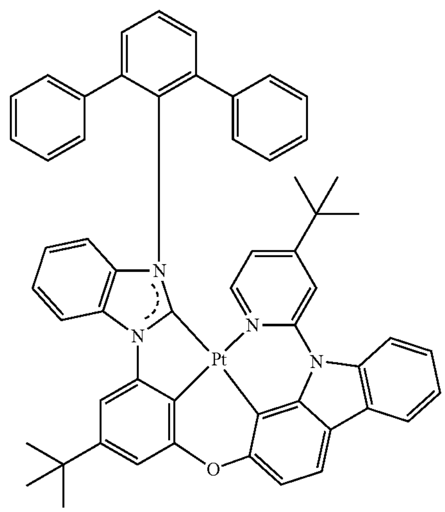

-continued

PD38

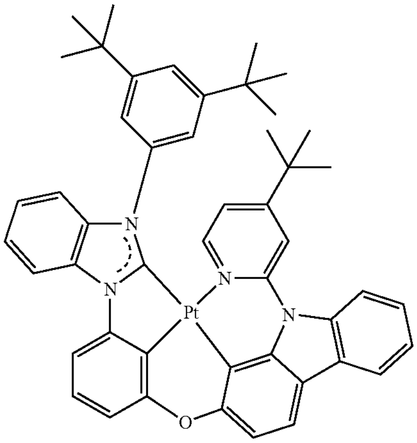

PD39

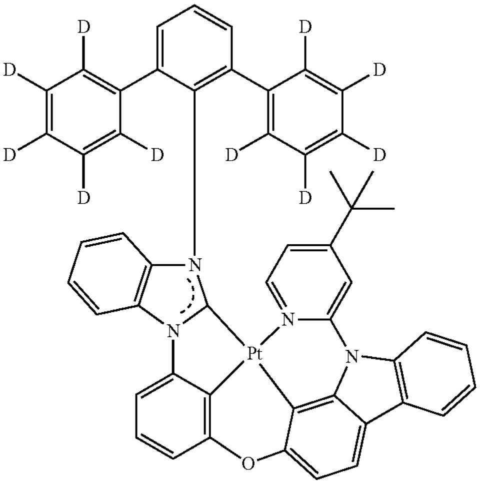

Fluorescent Dopant

When the emission layer includes the first compound as described in the present specification and the first compound serves as an auxiliary dopant, the emission layer may further include a fluorescent dopant.

In an embodiment, when the emission layer includes the first compound as described in the present specification and the first compound serves as a phosphorescent dopant, the emission layer may further include an auxiliary dopant.

The fluorescent dopant and the auxiliary dopant may each independently include an amine group-containing compound, a styryl group-containing compound, or any combination thereof.

In an embodiment, the fluorescent dopant and the auxiliary dopant may each independently include a compound represented by Formula 501:

Formula 501

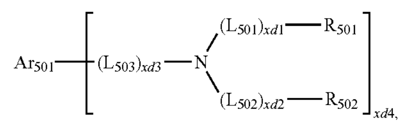

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In an embodiment, xd4 in Formula 501 may be 2.

In an embodiment, the fluorescent dopant and the auxiliary dopant may each independently include one of Compounds FD1 to FD36, DPVBi, DPAVBi, or any combination thereof:

FD1

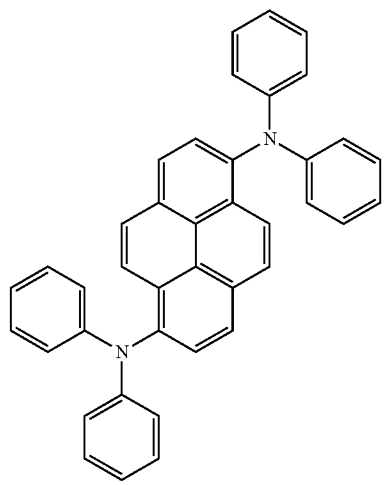

FD2

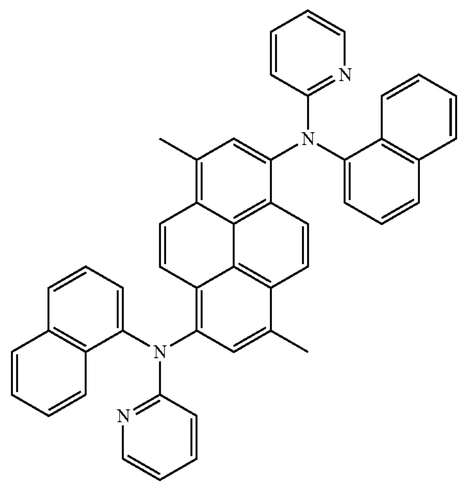

FD3

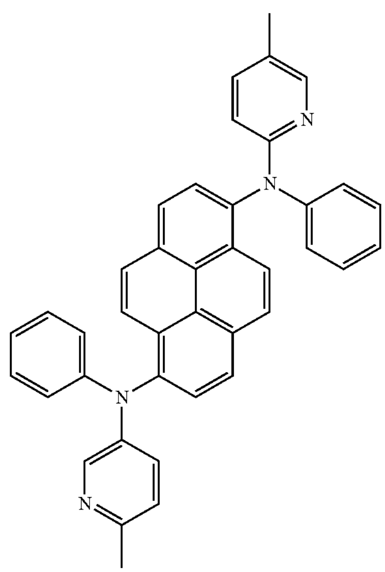

FD4

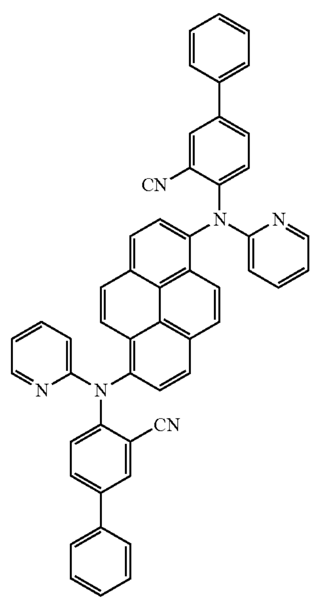

-continued
FD5
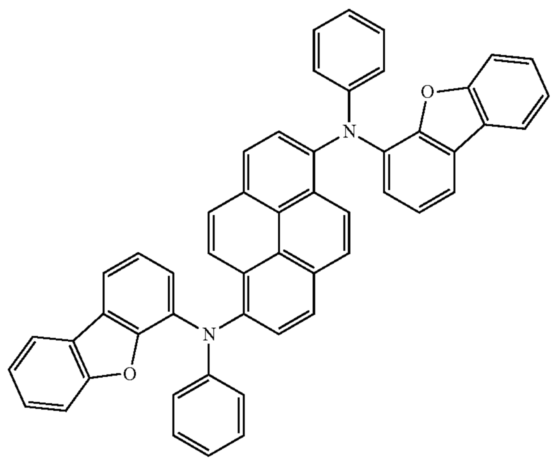
FD6
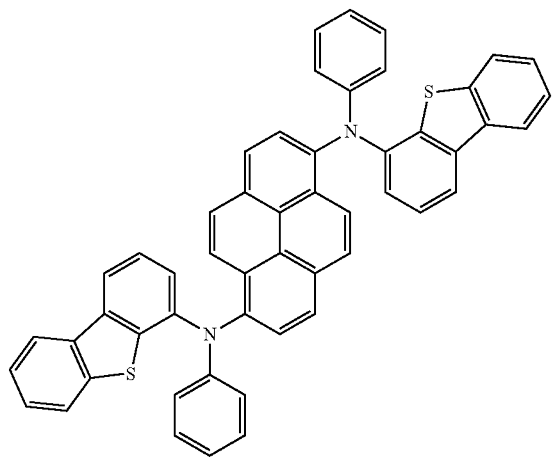
FD7
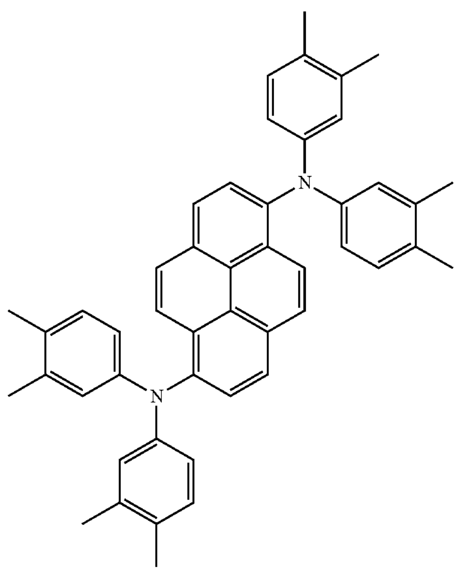
FD8
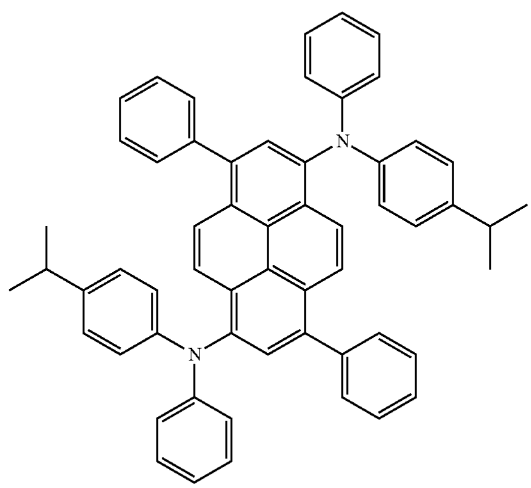
FD9
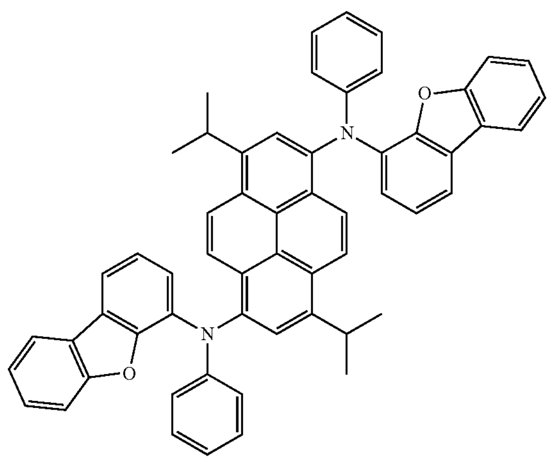
FD10
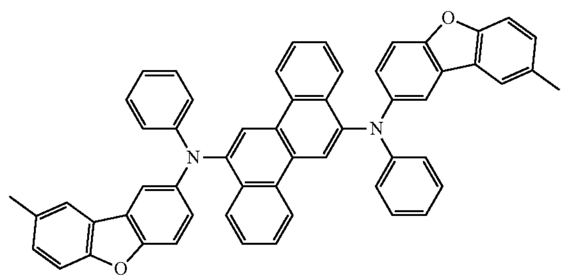

-continued
FD11
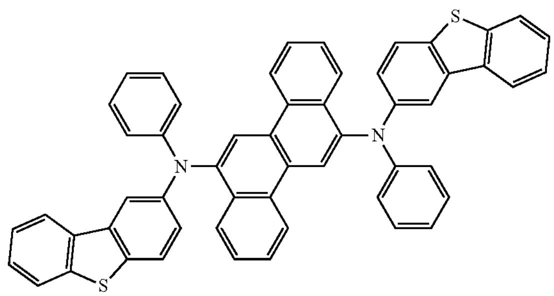
FD12
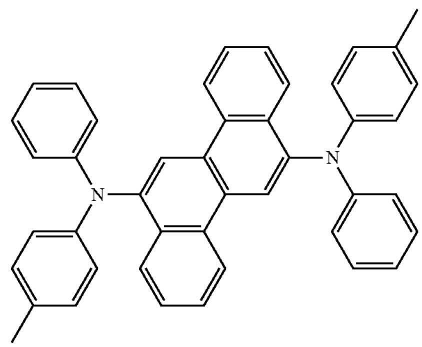
FD13
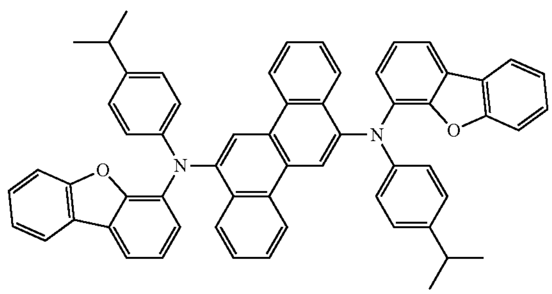
FD14
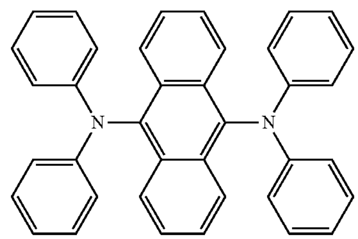
FD15
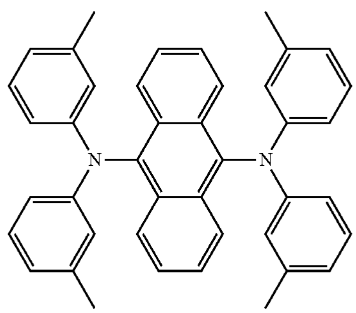
FD16
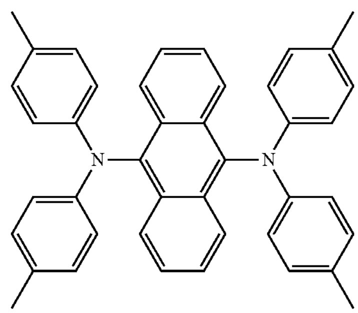
FD17
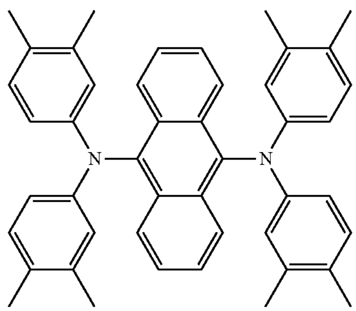
FD18
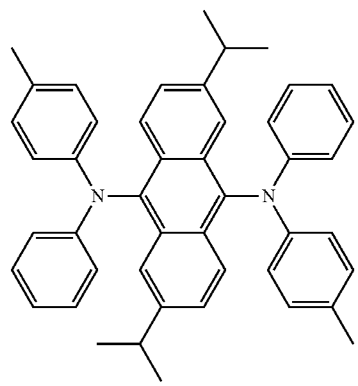

-continued
FD19
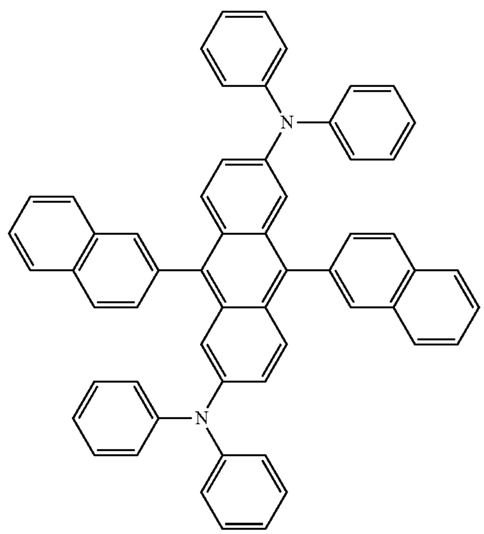
FD20
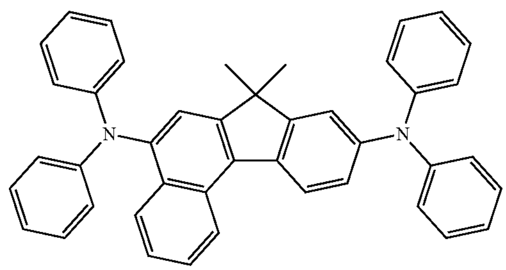
FD21
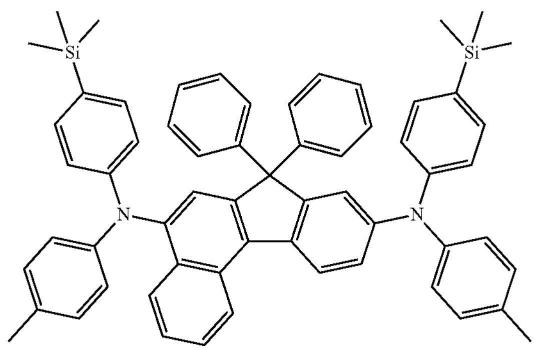
FD22
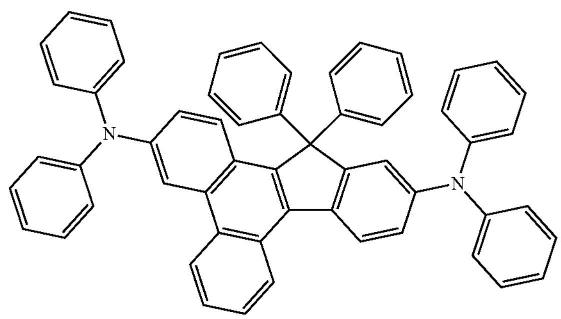
FD23
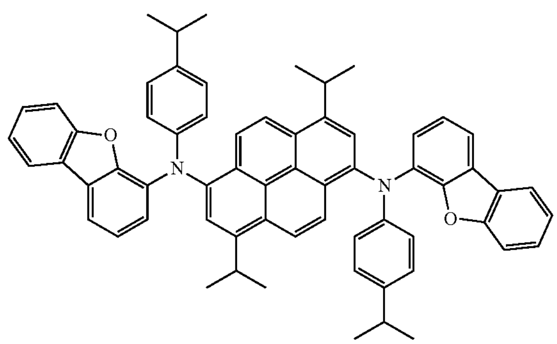
FD24
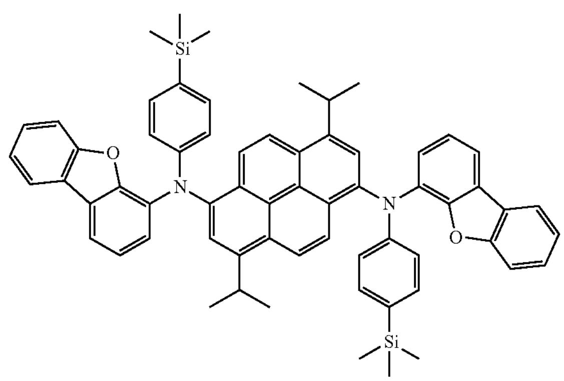

-continued
FD25
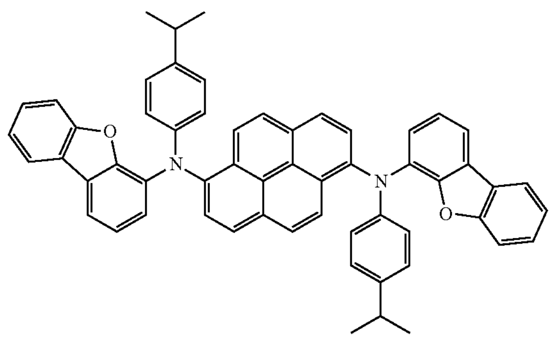
FD26
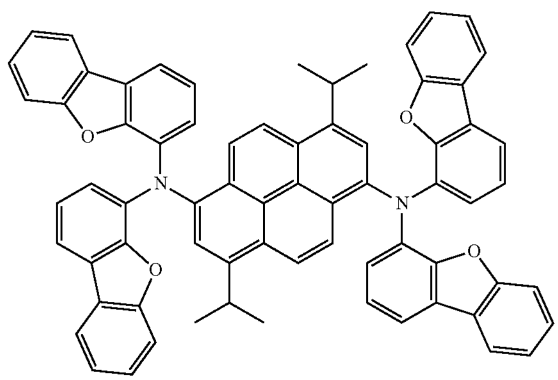
FD27
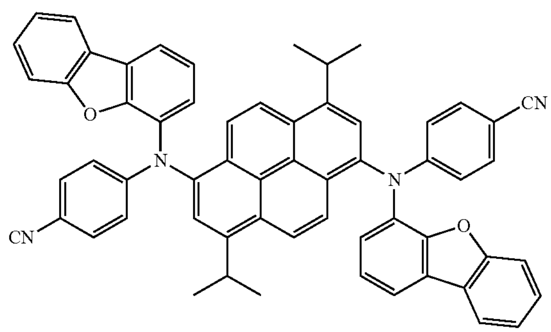
FD28
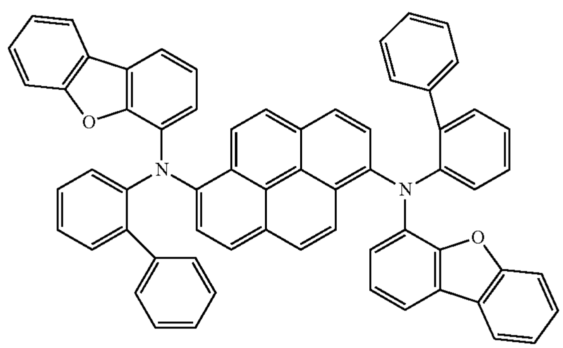
FD29
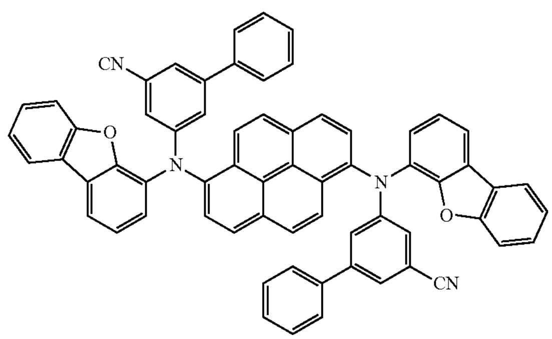
FD30
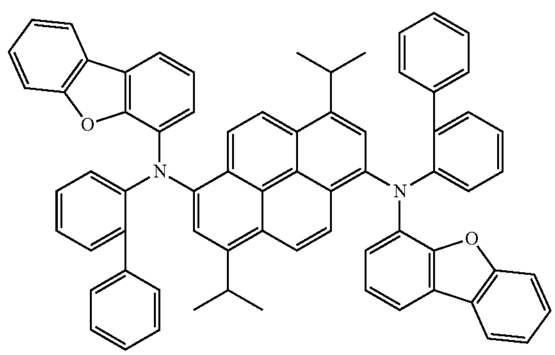
FD31
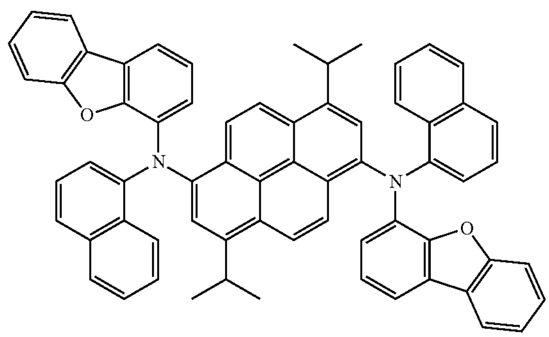
FD32
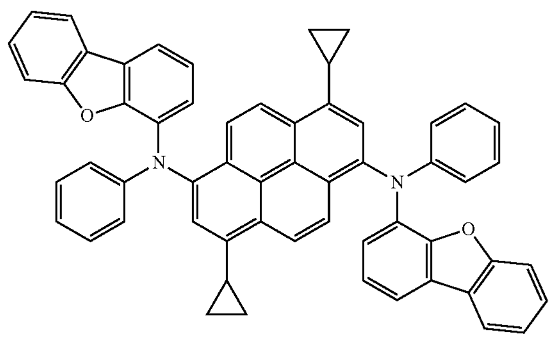

-continued

FD33

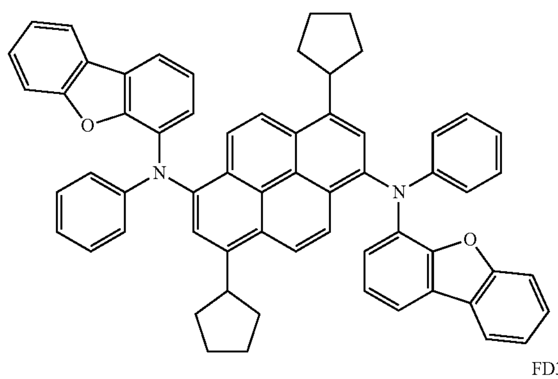

FD34

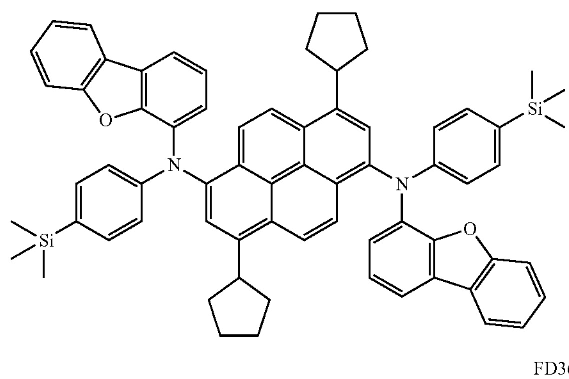

FD35

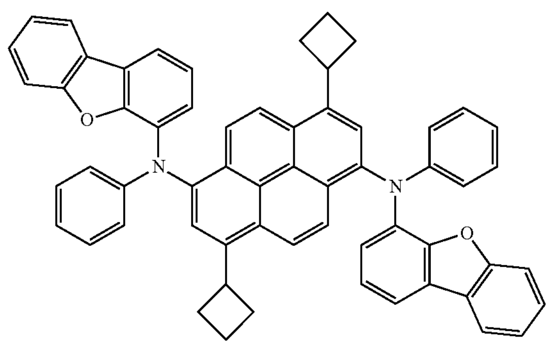

FD36

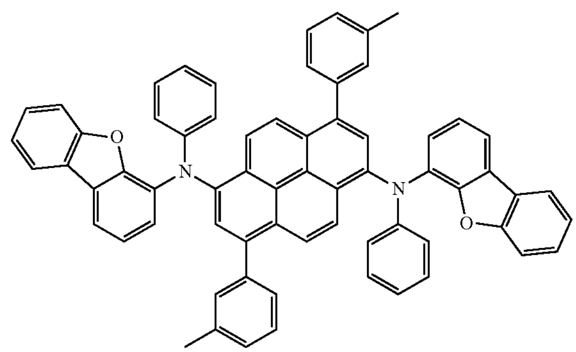

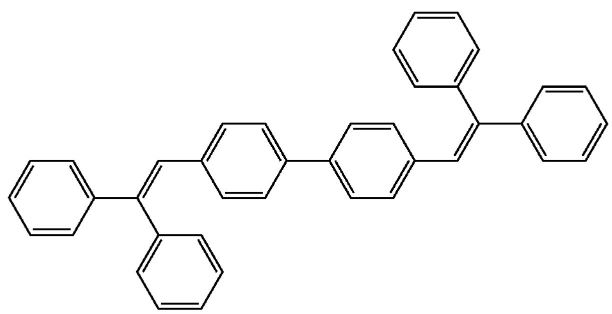

DPVBi

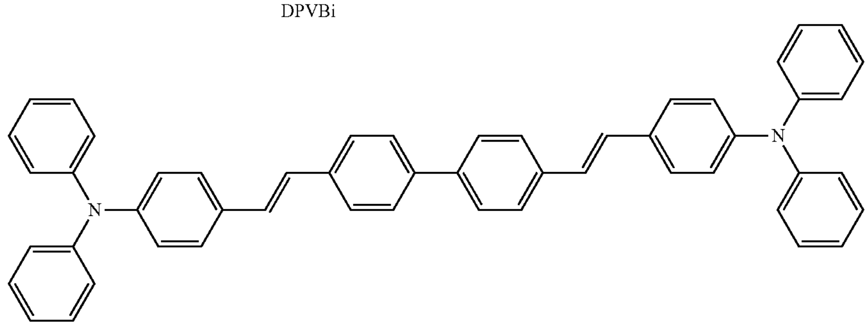

DPAVBi

In an embodiment, the fluorescent dopant and the auxiliary dopant may each independently include the fourth compound represented by Formula 502 or 503 as described in the present specification.

Delayed Fluorescence Material

The emission layer may include the fourth compound as described in the present specification, as a delayed fluorescence material.

In an embodiment, the emission layer may include the fourth compound, and may further include a delayed fluorescence material.

In the present specification, the delayed fluorescence material may be selected from compounds capable of emitting delayed fluorescence based on a delayed fluorescence emission mechanism.

The delayed fluorescence material included in the emission layer may act as a host or a dopant, depending on the type or kind of other materials included in the emission layer.

In an embodiment, the difference between the triplet energy level of the delayed fluorescence material and the singlet energy level of the delayed fluorescence material may be greater than or equal to 0 eV and less than or equal to 0.5 eV. When the difference between the triplet energy level of the delayed fluorescence material and the singlet energy level of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of Compounds DF1 to DF9:

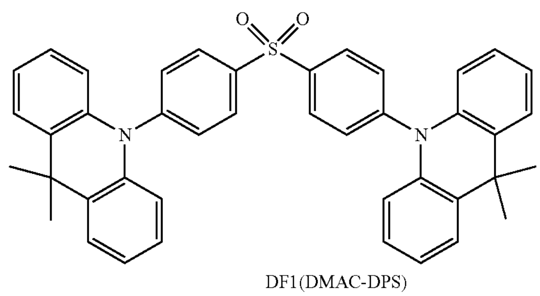

DF1(DMAC-DPS)

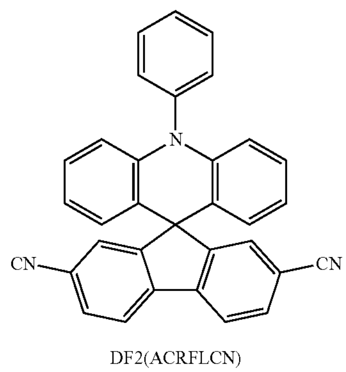

DF2(ACRFLCN)

-continued

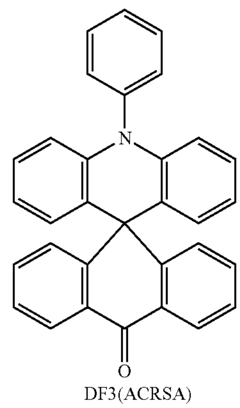

DF3(ACRSA)

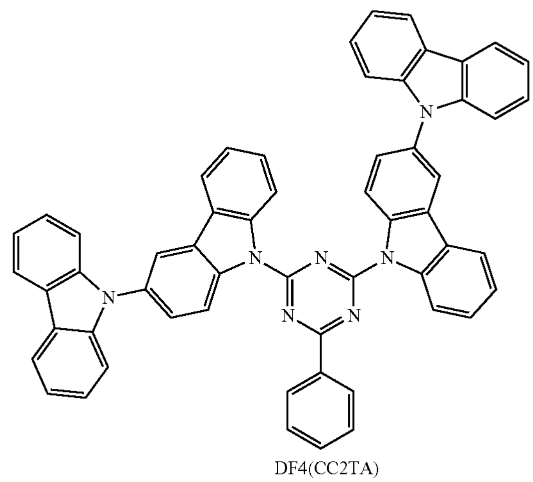

DF4(CC2TA)

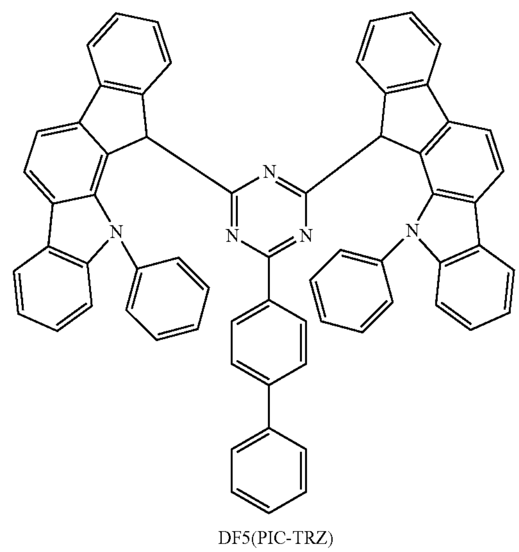

DF5(PIC-TRZ)

-continued

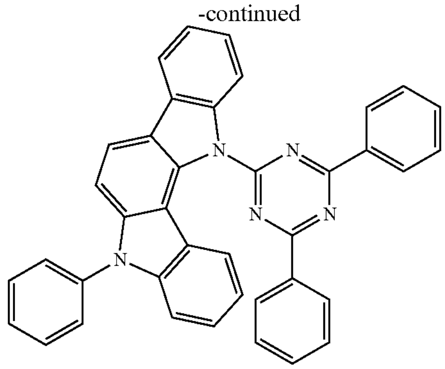

DF6(PIC-TRZ2)

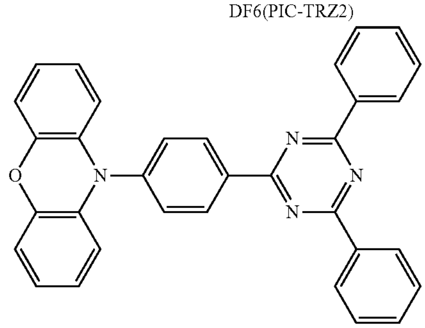

DF7(PXZ-TRZ)

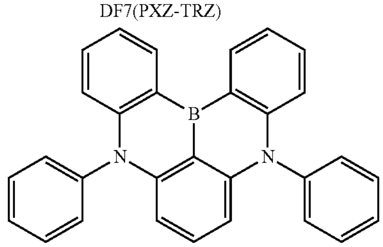

DF8(DABNA-1)

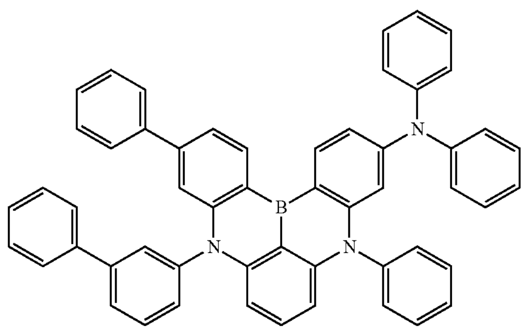

DF9(DABNA-2)

Quantum Dot

The emission layer may include a quantum dot.

In the present specification, a quantum dot refers to a crystal of a semiconductor compound, and may include any material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. As the crystal grows, the organic solvent naturally acts as a dispersant coordinated on the surface of the quantum dot crystal so that the growth of quantum dot particles can be controlled or modulated. Such a process is more easily performed than vapor deposition methods (such as metal organic chemical vapor deposition (MOCVD) or molecular beam epitaxy (MBE)), and has a lower cost.

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound may include: a binary compound (such as CdSe, CdTe, ZnS, ZnSe, ZnTe, ZnO, HgS, HgSe, HgTe, MgSe, and/or MgS); a ternary compound (such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS); a quaternary compound (such as CdZnSeS, CdZnSeTe, CdZnSTe, CdHgSeS, CdHgSeTe, CdHgSTe, HgZnSeS, HgZnSeTe, and/or HgZnSTe); or any combination thereof.

Examples of the Group III-V semiconductor compound may include: a binary compound (such as GaN, GaP, GaAs, GaSb, AlN, AlP, AlAs, AlSb, InN, InP, InAs, and/or InSb); a ternary compound (such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb); a quaternary compound (such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb); or any combination thereof. In an embodiment, the Group III-V semiconductor compound may further include a Group II element(s). Examples of the Group III-V semiconductor compound further including Group II elements may include InZnP, InGaZnP, InAlZnP, and/or the like.

Examples of the Group III-VI semiconductor compound may include: a binary compound (such as GaS, GaSe, $Ga_2Se_3$, GaTe, InS, InSe, $In_2S_3$, $In_2Se_3$, and/or InTe); a ternary compound (such as $InGaS_3$ and/or $InGaSe_3$); or any combination thereof.

Examples of the Group I-III-VI semiconductor compound may include: a ternary compound (such as AgInS, $AgInS_2$, CuInS, $CuInS_2$, $CuGaO_2$, $AgGaO_2$, and/or $AgAlO_2$); or any combination thereof.

Examples of the Group IV-VI semiconductor compound may include: a binary compound (such as SnS, SnSe, SnTe, PbS, PbSe, PbTe, and/or the like); a ternary compound (such as SnSeS, SnSeTe, SnSTe, PbSeS, PbSeTe, PbSTe, SnPbS, SnPbSe, SnPbTe, and/or the like); a quaternary compound (such as SnPbSSe, SnPbSeTe, SnPbSTe, and/or the like); or any combination thereof.

The Group IV element or compound may include: a single element compound (such as Si or Ge); a binary compound (such as SiC or SiGe); or any combination thereof.

Each element included in a multi-element compound (such as the binary compound, ternary compound and/or quaternary compound), may be present in a particle with a substantially uniform concentration (e.g., distribution) or non-uniform concentration.

In an embodiment, the quantum dot may have a single structure or a dual core-shell structure. In the case of the quantum dot having a single structure, the concentration of each element included in the corresponding quantum dot may be substantially uniform. In an embodiment, the material contained in the core and the material contained in the shell may be different from each other.

The shell of the quantum dot may act as a protective layer to prevent or reduce chemical degeneration of the core to maintain semiconductor characteristics and/or as a charging layer to impart electrophoretic characteristics to the quantum dot. The shell may be a single layer or a multi-layer. The element present at or within the interface between the core and the shell of the quantum dot may have a concentration gradient that decreases toward the center of the quantum dot.

Examples of the material forming the shell of the quantum dot may be an oxide of metal, metalloid, or non-metal, a semiconductor compound, and any combination thereof. Examples of the oxide of metal, metalloid, or non-metal may include: a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO); a ternary compound (such as $MgAl_2O_4$, $CoFe_2O_4$, $NiFe_2O_4$, and/or $CoMn_2O_4$); or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. In some embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity or color reproducibility may be increased. In some embodiments, because the light emitted through the quantum dot is emitted in all directions, the wide viewing angle can be improved.

In some embodiments, the quantum dot may be a spherical particle, a pyramidal particle, a multi-arm particle, a cubic nanoparticle, a nanotube particle, a nanowire particle, a nanofiber particle, or a nanoplate particle.

Because the energy band gap can be adjusted by controlling the size of the quantum dot, light having one or more suitable wavelength bands can be obtained from the quantum dot emission layer. Therefore, by utilizing quantum dots of different sizes, a light-emitting device that emits light of one or more suitable wavelengths may be implemented. In an embodiment, the size of the quantum dot(s) may be selected to emit red, green and/or blue light. In some embodiments, the size of the quantum dot(s) may be configured to emit white light by combining light of one or more suitable colors.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron-transporting region may include a buffer layer, a hole-blocking layer, an electron control layer, an electron-transporting layer, an electron injection layer, or any combination thereof.

For example, the electron transport area may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, the constituting layers of each structure being sequentially stacked from an emission layer.

In an embodiment, the electron transport area (for example, the buffer layer, the hole blocking layer, the electron control layer, or the electron transport layer in the electron transport area) may include a metal-free compound including at least one rr electron-deficient nitrogen-containing $C_1$-$C_{60}$ cyclic group.

In an embodiment, the electron transport region may include a compound represented by Formula 601:

Formula 601

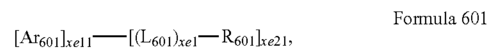

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{601})(Q_{602})(Q_{603})$, $—C(=O)(Q_{601})$, $—S(=O)_2(Q_{601})$, or $—P(=O)(Q_{601})(Q_{602})$, $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a $\pi$ electron-deficient nitrogen-containing $C_1$-$C_{60}$ cyclic group unsubstituted or substituted with at least one $R_{10a}$.

In an embodiment, when xe11 in Formula 601 is 2 or more, two or more $Ar_{601}$(s) may be linked via a single bond.

In an embodiment, $Ar_{601}$ in Formula 601 may be a substituted or unsubstituted anthracene group.

In an embodiment, the electron transport region may include a compound represented by Formula 601-1:

Formula 601-1

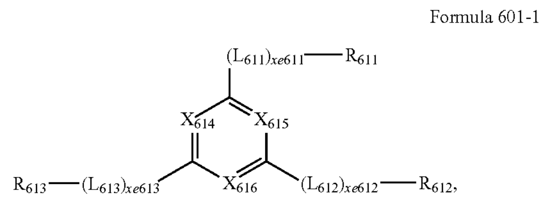

wherein, in Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1

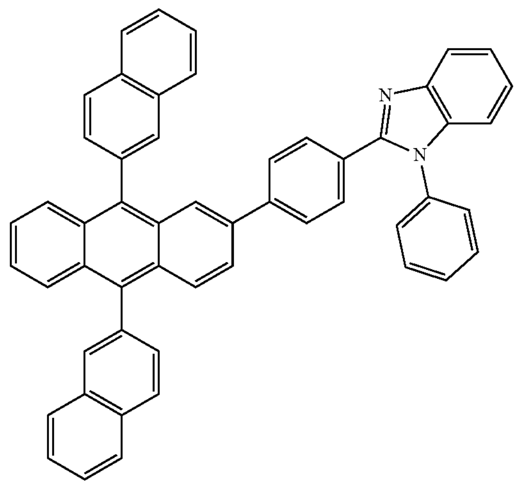

ET2

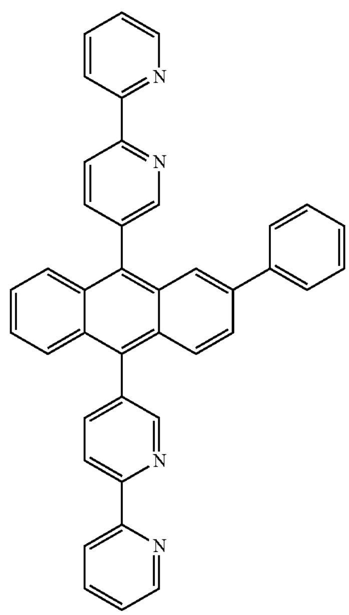

-continued

ET3

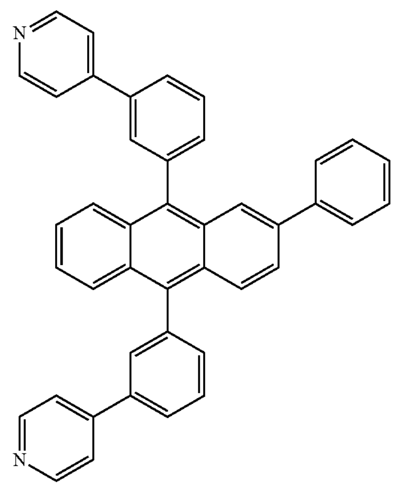

ET4

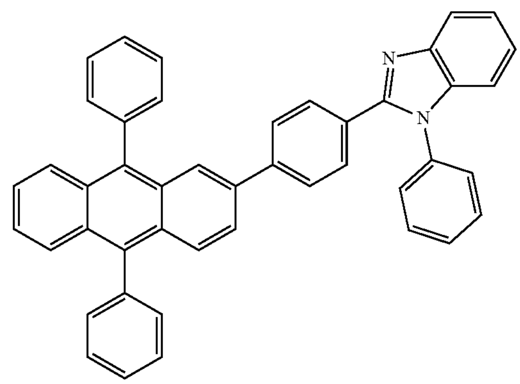

ET5

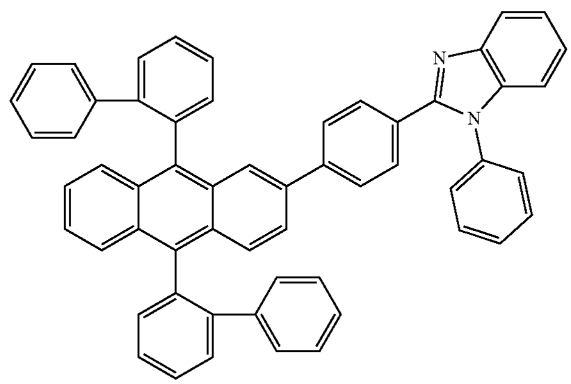

-continued
ET6
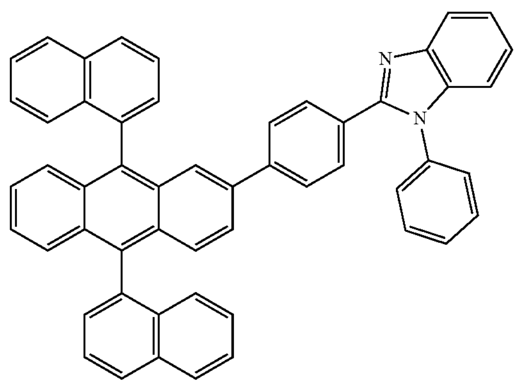
ET7
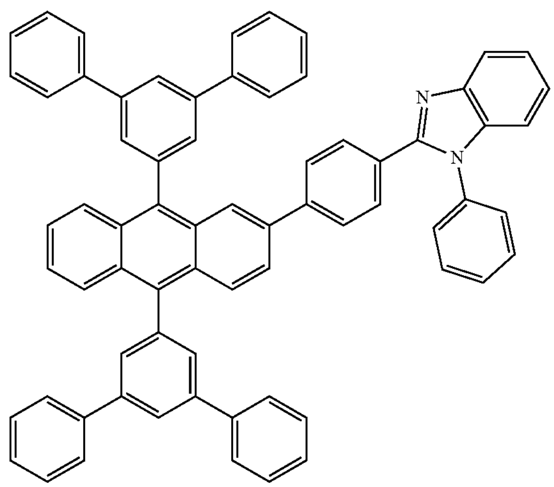
ET8
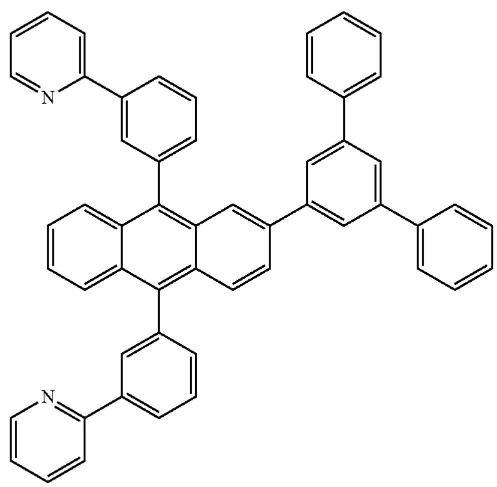
-continued
ET9
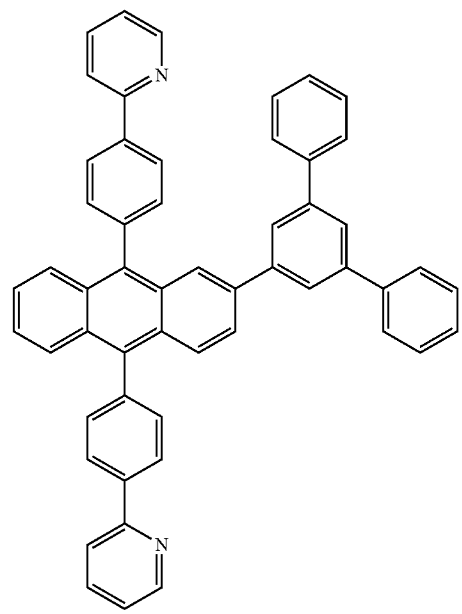
ET10
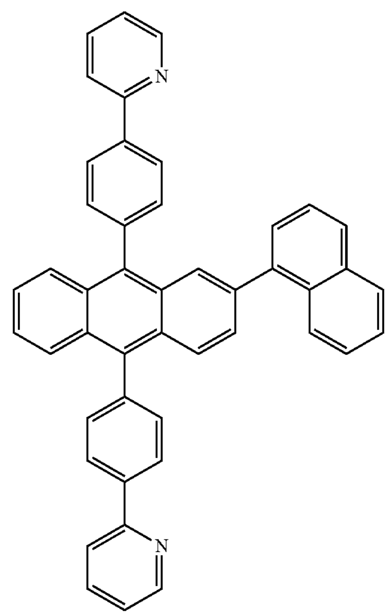

-continued
ET11
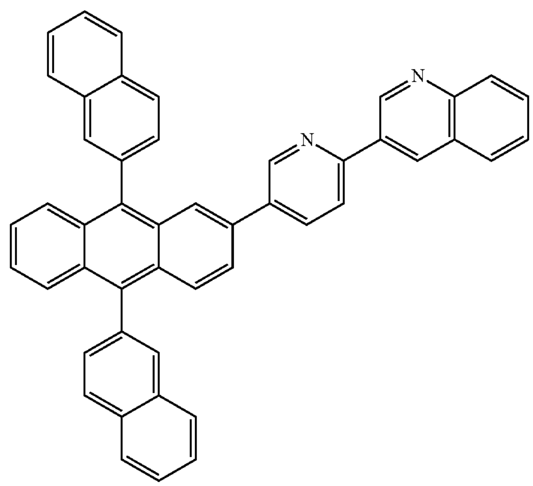
ET12
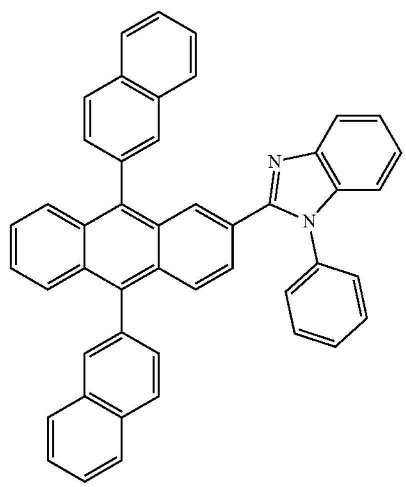
ET13
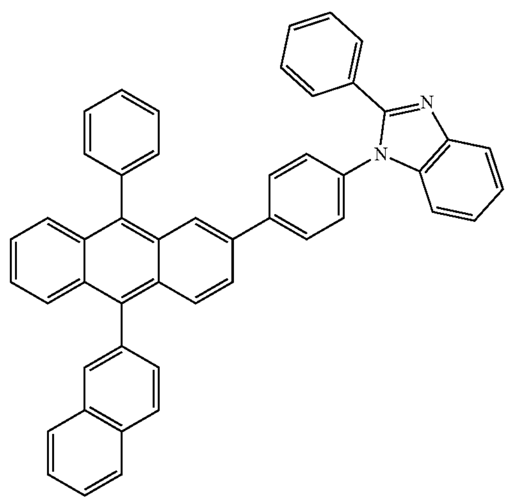
-continued
ET14
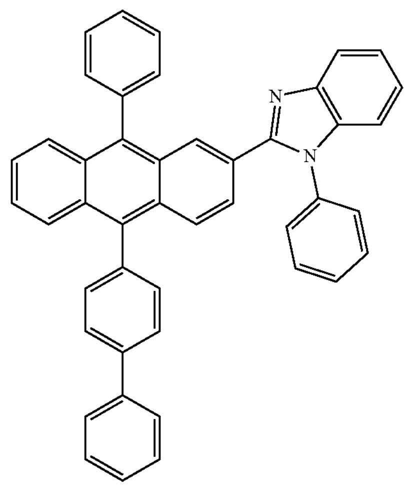
ET15
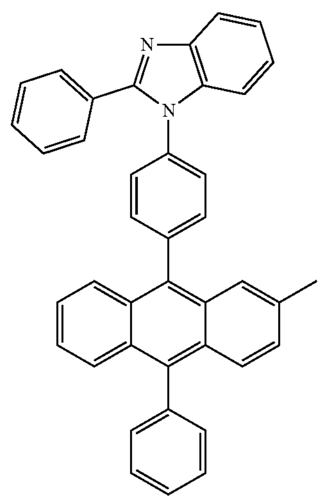
ET16
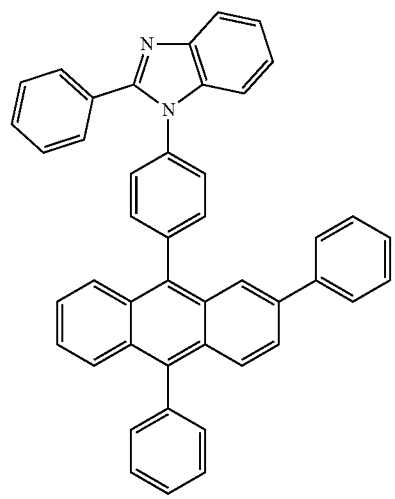

-continued
ET17
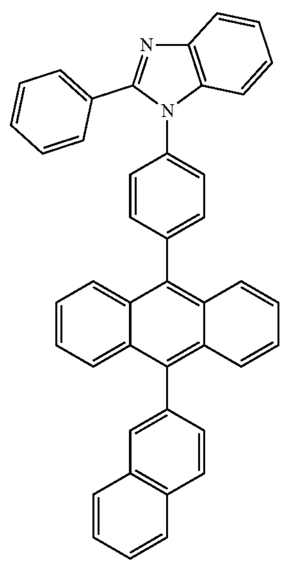
ET18
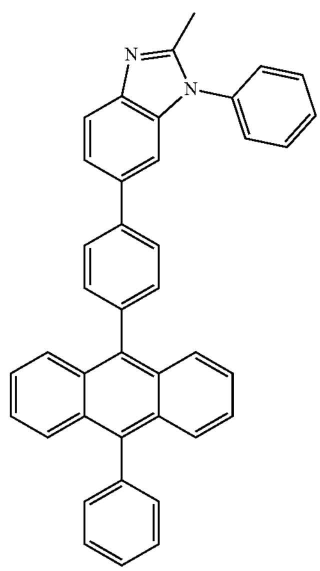
ET19
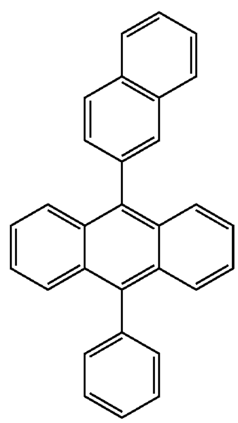
-continued
ET20
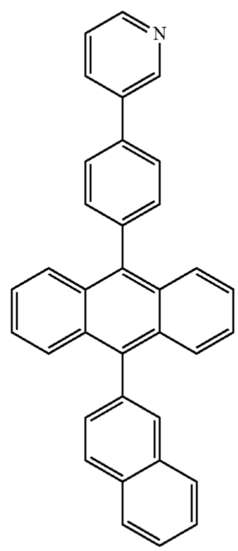
ET21
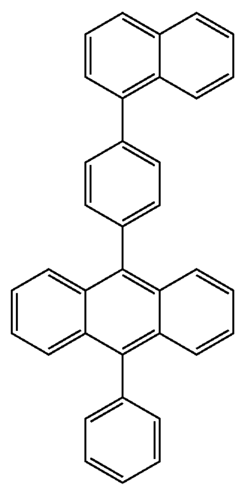
ET22
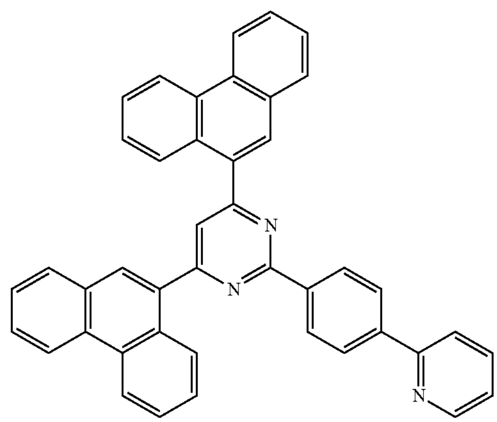

-continued
ET23
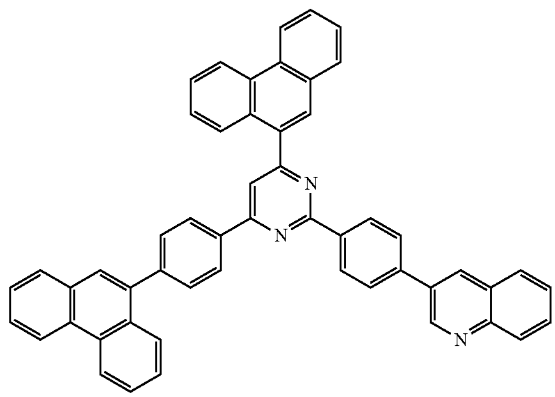
ET24
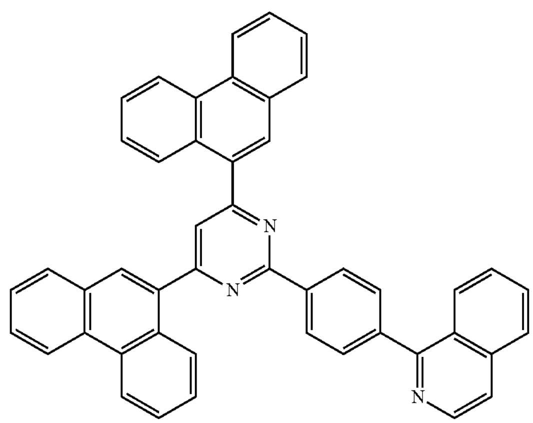
ET25
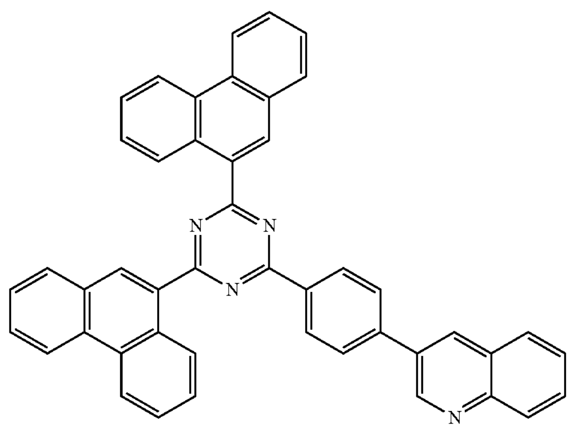
-continued
ET26
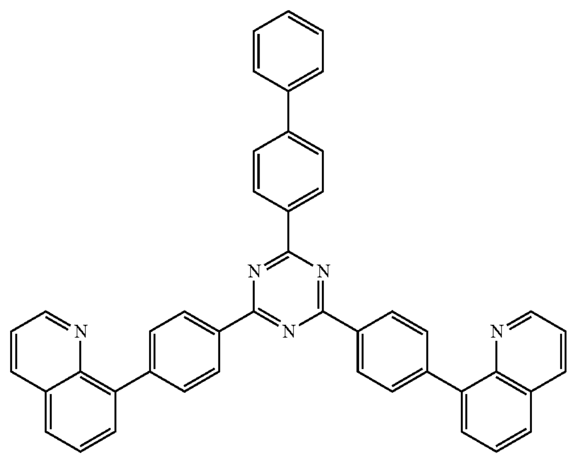
ET27
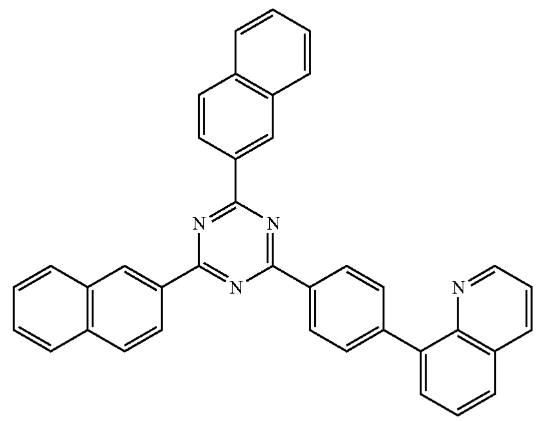
ET28
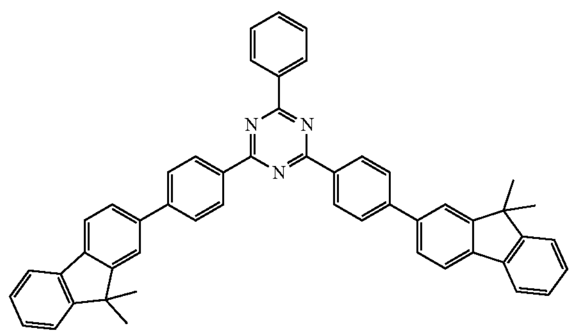

-continued
ET29
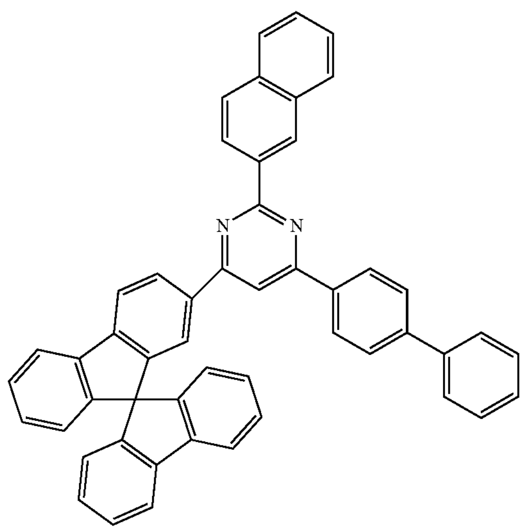
ET30
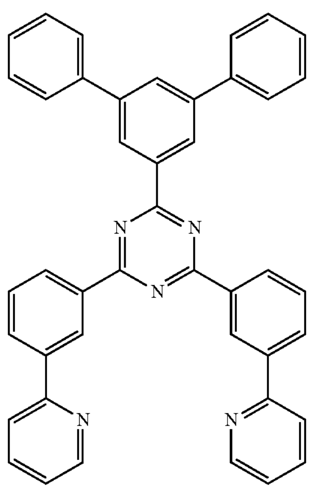
ET31
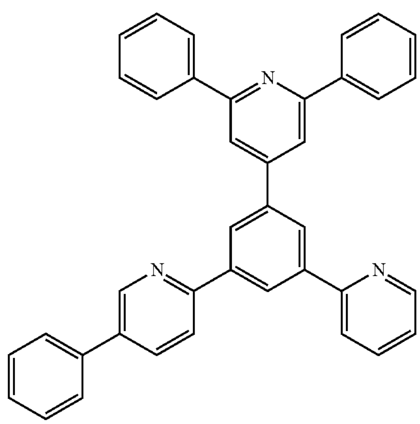
-continued
ET32
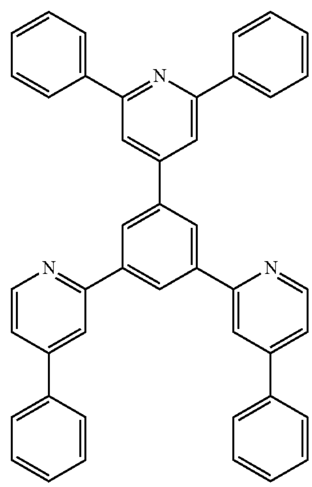
ET33
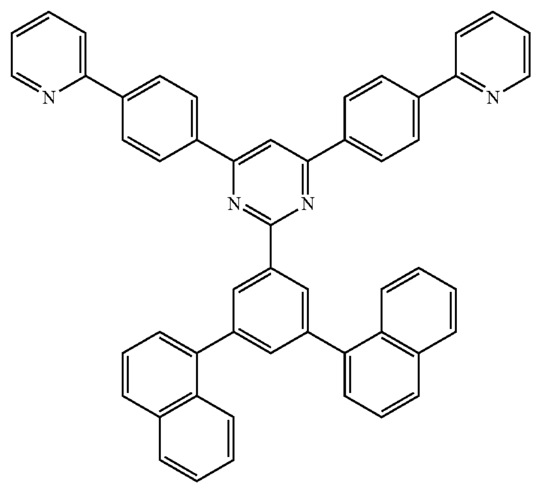
ET34
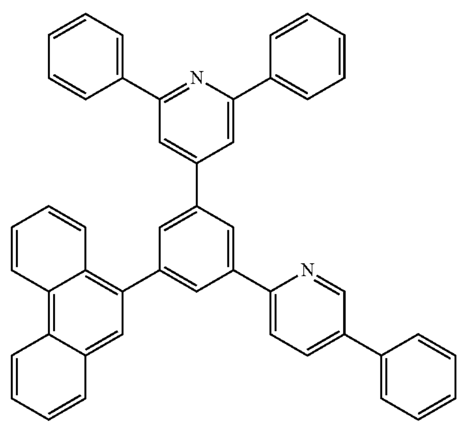

-continued
ET35
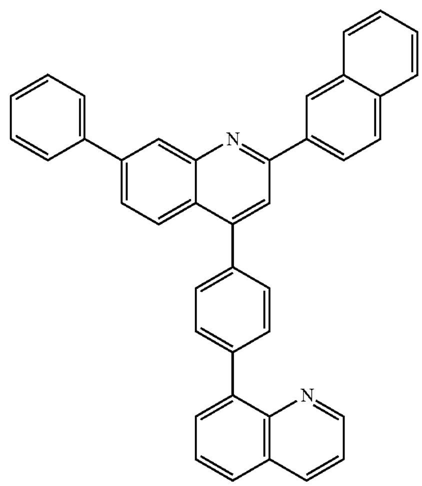
ET36
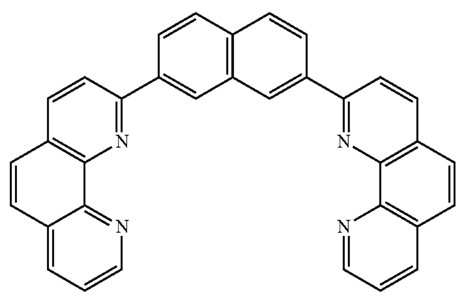
ET37
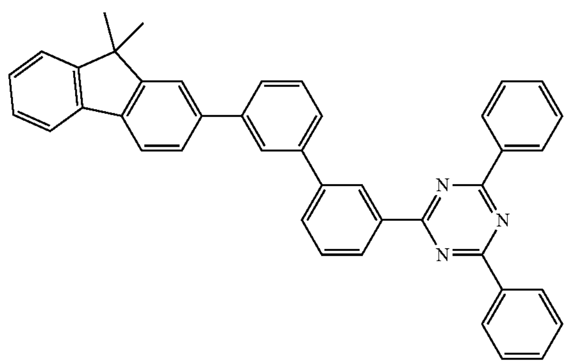
ET38
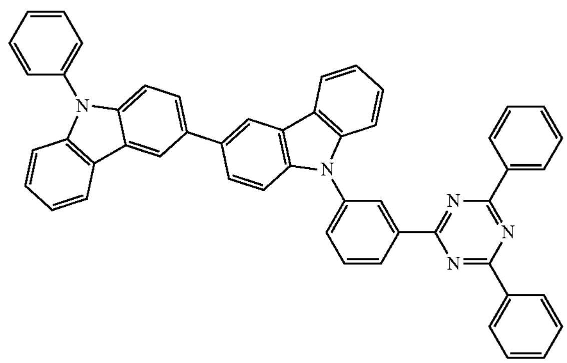
-continued
ET39
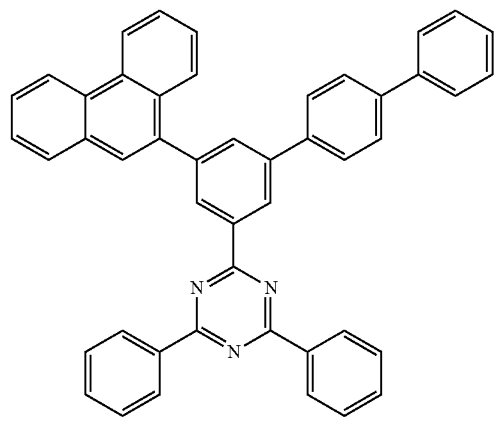
ET40
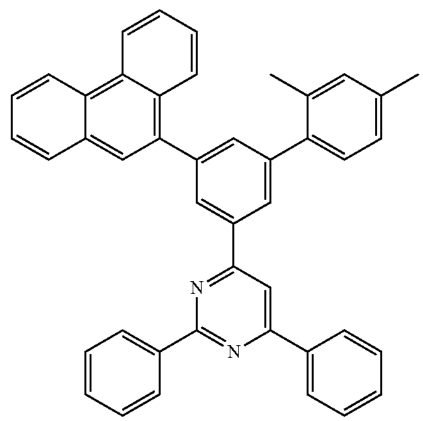
ET41
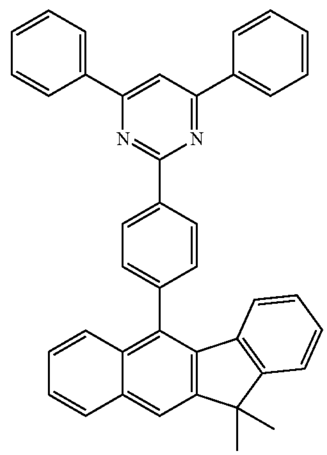

-continued

ET42

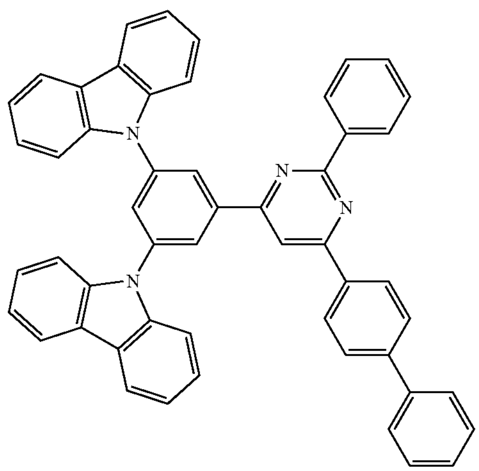

ET43

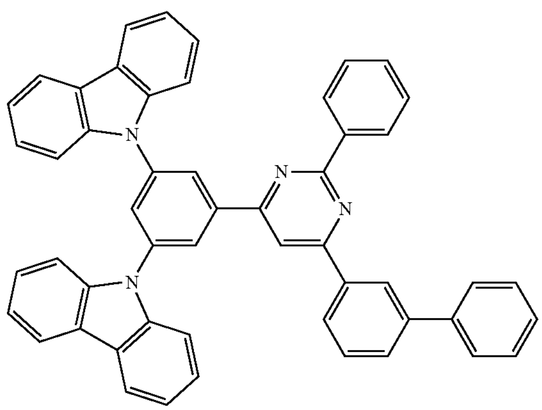

ET44

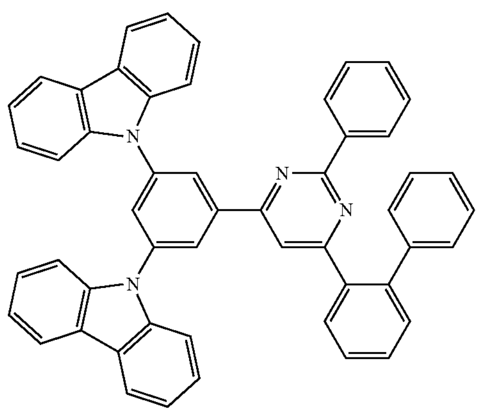

ET45

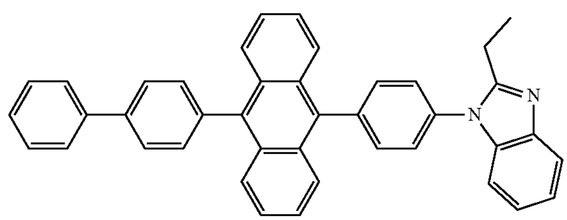

-continued

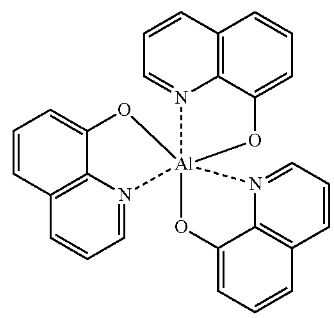

Alq3

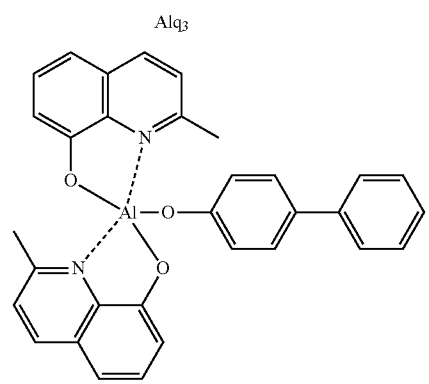

BAlq

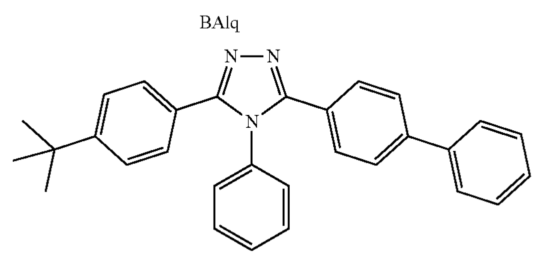

TAZ

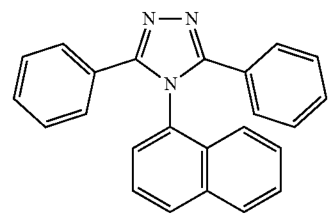

NTAZ

A thickness of the electron transport area may be about 100 Å to about 5,0000 Å, for example, about 160 Å to about 4,000 Å. When the electron transport area includes a buffer layer, a hole blocking layer, an electron control layer, an electron transport layer, or any combination thereof, the thickness of the buffer layer, the hole blocking layer, or the electron control layer may each independently be about 20 Å to about 1,000 Å, for example, about 30 Å to about 300 Å, and the thickness of the electron transport layer may be about 100 Å to about 1000 Å, for example, about 150 Å to about 500 Å. When the thickness of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

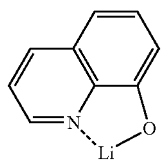

ET-D1

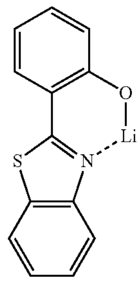

ET-D2.

The electron transport region may include an electron injection layer to facilitate the injection of electrons from the second electrode 150. The electron injection layer may be in direct contact with the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), and/or tellurides of the alkali metal, the alkaline earth metal, and the rare earth metal, or any combination thereof.

The alkali metal-containing compound may include alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth metal-containing compound may include an alkaline earth metal compound (such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), and/or the like). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of an ion of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, and/or the like.

When the electron injection layer further includes an organic material, the alkali metal, alkaline earth metal, rare earth metal, alkali metal-containing compound, alkaline earth metal-containing compound, rare earth metal-containing compound, alkali metal complex, alkaline earth-metal complex, rare earth metal complex, or combination thereof may be substantially homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, satisfactory electron injection characteristics may be obtained without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be utilized.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110 (which is a semi-transmissive electrode or a transmissive electrode) and the first capping layer, or light generated in an emission layer of the interlayer 130 of the light-emitting device 10 may be extracted toward the outside through the second electrode 150 (which is a semi-transmissive electrode or a transmissive electrode) and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer or the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof.

In an embodiment, at least one of the first capping layer or the second capping layer may each independently include an amine group-containing compound.

In an embodiment, at least one of the first capping layer or the second capping layer may each independently include a compound represented by Formula 201, a compound represented by Formula 202, or any combination thereof.

In an embodiment, at least one of the first capping layer or the second capping layer may each independently include one of Compounds HT28 to HT33, one of Compounds CP1 to CP6, β-NPB, or any combination thereof:

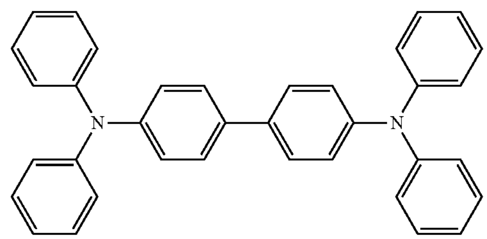

CP1

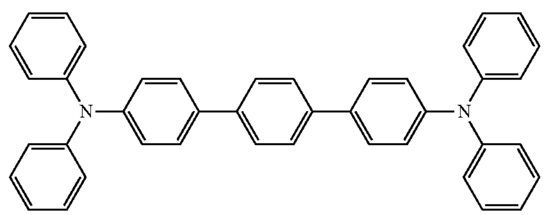

CP2

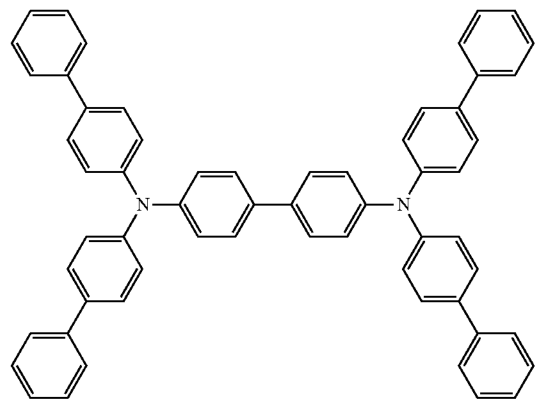

CP3

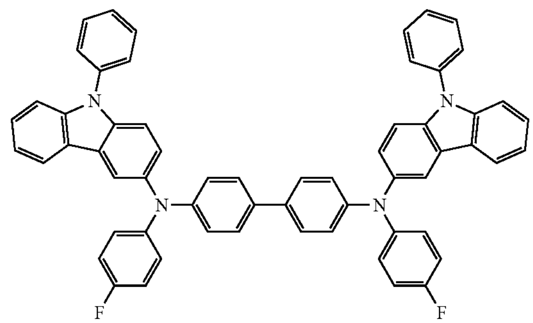

CP4

-continued

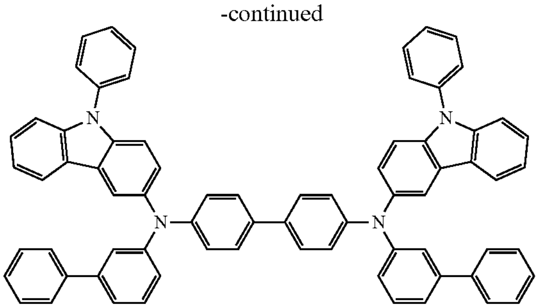

CP5

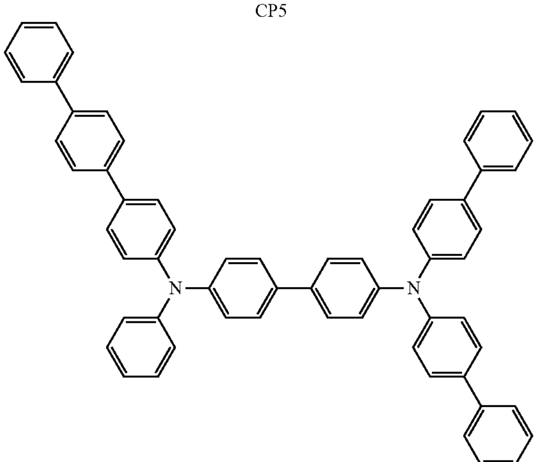

CP6

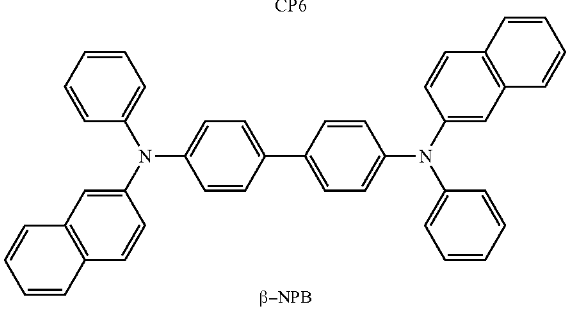

β-NPB

.

Film

The organometallic compound represented by Formula 1 may be included in various suitable films. According to an embodiment, a film including an organometallic compound represented by Formula 1 may be provided. The film may be, for example, an optical member (or a light control member)(for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, and/or the like), a protective member (for example, an insulating layer, a dielectric layer, and/or the like).

Electronic Apparatus

The light-emitting device may be included in one or more suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. For example, the light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area to emit first color light, a second area to emit second color light, and/or a third area to emit third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. For example, the first area may include a red quantum dot, the second area may include a green quantum dot, and the third area may not include (e.g., may exclude) a quantum dot. The quantum dot may be the same as described in the present specification. The first area, the second area, and/or the third area may each further include a scatterer.

In an embodiment, the light-emitting device may be to emit a first light, the first area may be to absorb the first light to emit a first first-color light, the second area may be to absorb the first light to emit a second first-color light, and the third area may be to absorb the first light to emit a third first-color light. In this regard, the first first-color light, the second first-color light, and the third first-color light may each have different maximum emission wavelengths. For example, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein any one of the source electrode and the drain electrode may be electrically connected to any one of the first electrode or the second electrode of the light-emitting device.

The thin-film transistor may further include a gate electrode, a gate insulating film, etc.

The activation layer may include crystalline silicon, amorphous silicon, organic semiconductor, oxide semiconductor, and/or the like.

The electronic apparatus may further include a sealing portion for sealing the light-emitting device. The sealing portion and/or the color conversion layer may be located between the color filter and the light-emitting device. The sealing portion allows light from the light-emitting device to be extracted to the outside, while concurrently (e.g., simultaneously) preventing or reducing ambient air and/or moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the intended use of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and/or the like.

Figure 2:
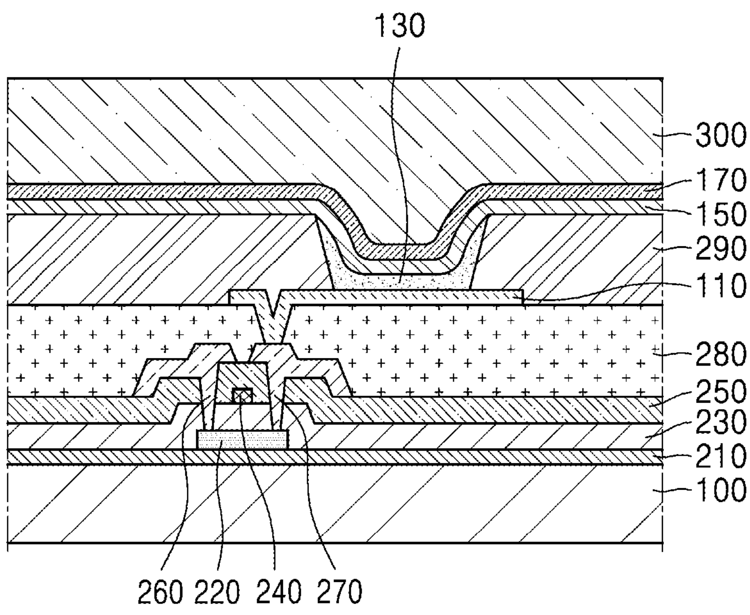
FIGS. 2 and 3 are each a cross-sectional view of a light-emitting apparatus according to an embodiment.
Figure 3:
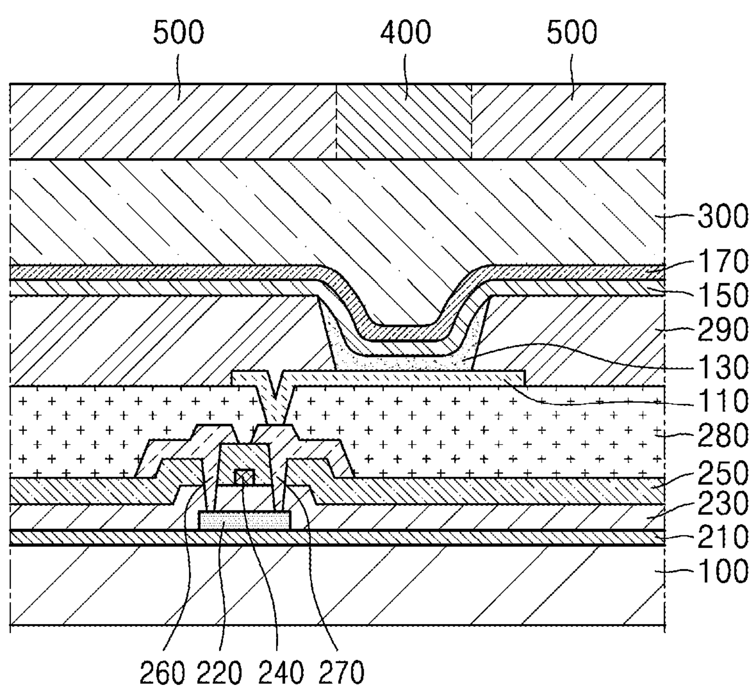

Description of FIGS. 2 and 3

FIG. 2 is a cross-sectional view of a light-emitting apparatus according to an embodiment of the disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be formed on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor (such as silicon or polysilicon), an organic semiconductor, or an oxide semiconductor, and may include a source region, a drain region, and a channel region.

A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide or polyacrylic organic film. In some embodiments, at least some layers of the interlayer 130 may extend beyond the upper portion of the pixel-defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

FIG. 3 is a cross-sectional view of a light-emitting apparatus according to an embodiment of the disclosure.

The light-emitting apparatus of FIG. 3 is the same as the light-emitting apparatus of FIG. 2, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacture Method

Respective layers included in the hole transport region, the emission layer, and respective layers included in the electron transport region may be formed in a certain region by utilizing one or more suitable methods selected from vacuum deposition, spin coating, casting, Langmuir- Blodgett (LB) deposition, ink-jet printing, laser-printing, and laser-induced thermal imaging.

When the layers constituting the hole transport area, the emission layer, and the layers constituting the electron transport area are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

DEFINITION OF TERMS

The term "$C_3$-$C_{60}$ carbocyclic group" as utilized herein refers to a cyclic group consisting of carbon only as a ring-forming atom and having three to sixty carbon atoms, and the term "$C_1$-$C_{60}$ heterocyclic group" as utilized herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring, or a polycyclic group in which two or more rings are condensed with each other. In an embodiment, the $C_1$-$C_{60}$ heterocyclic group has 3 to 61 ring-forming atoms.

The term "cyclic group" as utilized herein may include the $C_3$-$C_{60}$ carbocyclic group and the $C_1$-$C_{60}$ heterocyclic group.

The term "π electron-rich $C_3$-$C_{60}$ cyclic group" as utilized herein refers to a cyclic group that has three to sixty carbon atoms and does not include *—N=*' as a ring-forming moiety, and the term "π electron-deficient nitrogen-containing $C_1$-$C_{60}$ cyclic group" as utilized herein refers to a heterocyclic group that has one to sixty carbon atoms and includes *—N=*' as a ring-forming moiety.

In an embodiment, the $C_3$-$C_{60}$ carbocyclic group may be i) a group T1 (defined below) or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2 (defined below), ii) a condensed cyclic group in which two or more groups T2 are condensed with each other, or iii) a condensed cyclic group in which at least one group T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a group T1, ii) a condensed cyclic group in which two or more groups T1 are condensed with each other, iii) a group T3 (defined below), iv) a condensed cyclic group in which two or more groups T3 are condensed with each other, or v) a condensed cyclic group in which at least one group T3 and at least one group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a group T4 (defined below), ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), where the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as utilized herein refers to a group condensed to any cyclic group or a polyvalent group (for example, a divalent group, a trivalent group, a tetravalent group, etc.), depending on the structure of a formula in connection with which the terms are utilized. In an embodiment, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_6$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as utilized herein refers to a linear or branched aliphatic hydrocarbon monovalent group that has one to sixty carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and/or a tert-decyl group. The term "$C_1$-$C_{60}$ alkylene group" as utilized herein refers to a divalent group having substantially the same structure as the $C_1$-$C_6$ alkyl group.

The term "$C_2$-$C_{60}$ alkenyl group" as utilized herein refers to a monovalent hydrocarbon group having at least one carbon-carbon double bond in the middle or at the terminus of the $C_2$-$C_{60}$ alkyl group, and examples thereof include an ethenyl group, a propenyl group, and/or a butenyl group. The term "$C_2$-$C_{60}$ alkenylene group" as utilized herein refers to a divalent group having substantially the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group, and examples thereof include an ethynyl group and/or a propynyl group. The term "$C_2$-$C_{60}$ alkynylene group" as utilized herein refers to a divalent group having substantially the same structure as the $C_2$-$C_{60}$ alkynyl group.

The term "$C_1$-$C_{60}$ alkoxy group" as utilized herein refers to a monovalent group represented by $-OA_{101}$ (wherein $A_{101}$ is a $C_1$-$C_{60}$ alkyl group), and examples thereof include a methoxy group, an ethoxy group, and/or an isopropyloxy group.

The term "$C_3$-$C_{10}$ cycloalkyl group" as utilized herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and/or a bicyclo[2.2.2]octyl group. The term "$C_3$-$C_{10}$ cycloalkylene group" as utilized herein refers to a divalent group having substantially the same structure as the $C_3$-$C_{10}$ cycloalkyl group.

The term "$C_1$-$C_{10}$ heterocycloalkyl group" as utilized herein refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and/or a tetrahydrothiophenyl group. The term "$C_1$-$C_{10}$ heterocycloalkylene group" as utilized herein refers to a divalent group having substantially the same structure as the $C_1$-$C_{10}$ heterocycloalkyl group.

The term "$C_3$-$C_{10}$ cycloalkenyl group" utilized herein refers to a monovalent cyclic group that has three to ten carbon atoms and at least one carbon-carbon double bond in the ring thereof and no aromaticity, and examples thereof include a cyclopentenyl group, a cyclohexenyl group, and/or a cycloheptenyl group. The term "$C_3$-$C_{10}$ cycloalkenylene group" as utilized herein refers to a divalent group having substantially the same structure as the $C_3$-$C_{10}$ cycloalkenyl group.

The term "$C_1$-$C_{10}$ heterocycloalkenyl group" as utilized herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and/or a 2,3-dihydrothiophenyl group. The term "$C_1$-$C_{10}$ heterocycloalkenylene group" as utilized herein refers to a divalent group having substantially the same structure as the $C_1$-$C_{10}$ heterocycloalkenyl group.

The term "$C_6$-$C_{60}$ aryl group" as utilized herein refers to a monovalent group having a carbocyclic aromatic system having six to sixty carbon atoms, and the term "$C_6$-$C_{60}$ arylene group" as utilized herein refers to a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and/or an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as utilized herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and/or a naphthyridinyl group. When the $C_1$-$C_6$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as utilized herein refers to a divalent group having substantially the same structure as a monovalent non-aromatic condensed polycyclic group.

The term "monovalent non-aromatic condensed heteropolycyclic group" as utilized herein refers to a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as utilized herein refers to a divalent group having substantially the same structure as a monovalent non-aromatic condensed heteropolycyclic group.

The term "$C_6$-$C_{60}$ aryloxy group" as utilized herein indicates —$OA_{102}$ (wherein $A_{102}$ is a $C_6$-$C_{60}$ aryl group), and the term "$C_6$-$C_{60}$ arylthio group" as utilized herein indicates —$SA_{103}$ (wherein $A_{103}$ is a $C_6$-$C_{60}$ aryl group).

The term "$C_7$-$C_{60}$ aryl alkyl group" utilized herein refers to -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" utilized herein refers to -$A_{106}A_{107}$ (where $A_{106}$ may be a $C_1$-$C_{59}$ alkylene group, and $A_{107}$ may be a $C_1$-$C_{59}$ heteroaryl group).

$R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_6$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ utilized herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as utilized herein refers to any atom other than a carbon atom. Examples of the heteroatom may include O, S, N, P, Si, B, Ge, Se, and/or any combination thereof.

The term "the third-row transition metal" utilized herein includes hafnium (Hf), tantalum (Ta), tungsten (W), rhenium (Re), osmium (Os), iridium (Ir), platinum (Pt), gold (Au), and/or the like.

"Ph" as utilized herein refers to a phenyl group, "Me" as utilized herein refers to a methyl group, "Et" as utilized herein refers to an ethyl group, "tert-Bu" or "Bu$^t$" as utilized herein refers to a tert-butyl group, and "OMe" as utilized herein refers to a methoxy group.

The term "biphenyl group" as utilized herein refers to "a phenyl group substituted with a phenyl group." In other words, the "biphenyl group" is a substituted phenyl group having a $C_6$-$C_{60}$ aryl group as a substituent.

The term "terphenyl group" as utilized herein refers to "a phenyl group substituted with a biphenyl group". The "terphenyl group" is a substituted phenyl group having, as a substituent, a $C_6$-$C_{60}$ aryl group substituted with a $C_6$-$C_{60}$ aryl group.

* and *' as utilized herein, unless defined otherwise, each refer to a binding site to a neighboring atom in a corresponding formula or moiety.

Hereinafter, compounds according to embodiments and light-emitting devices according to embodiments will be described in more detail with reference to the following synthesis examples and examples. The wording "B was utilized instead of A," used in describing Synthesis Examples, indicates that an identical molar equivalent of B was utilized in place of A.

EXAMPLES

Synthesis Example 1: Synthesis of Compound 1

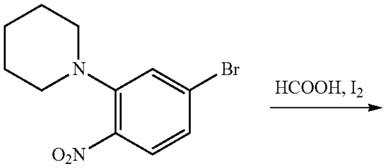

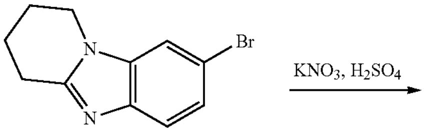

1-a

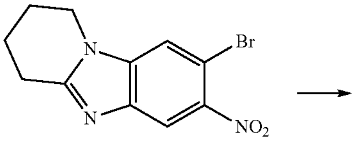

1-b

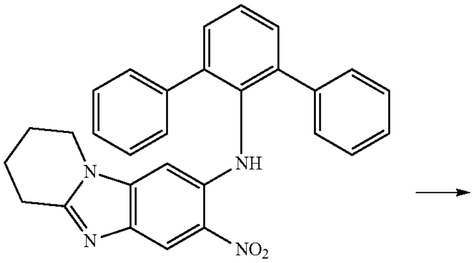

1-c

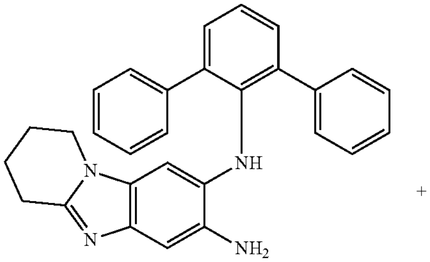

1-d

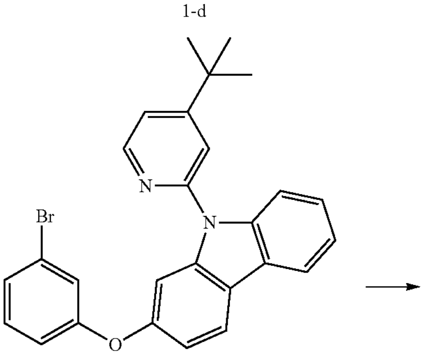

-continued

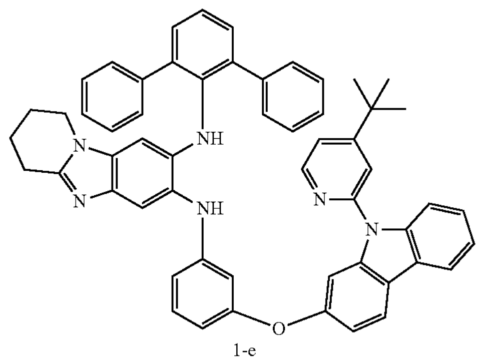

1-e

-continued

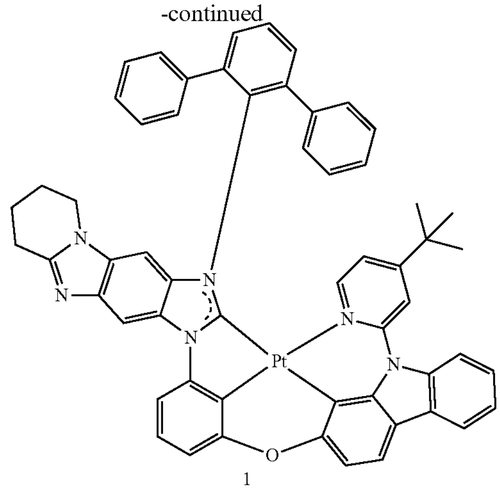

1

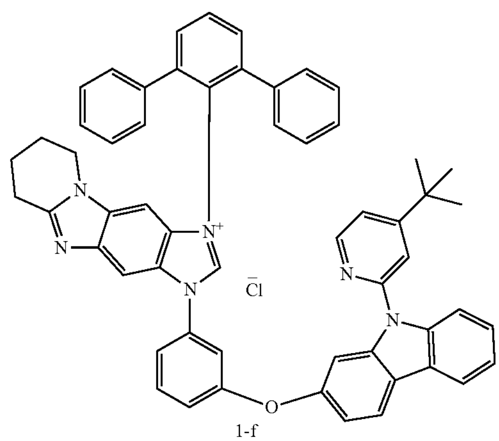

1-f

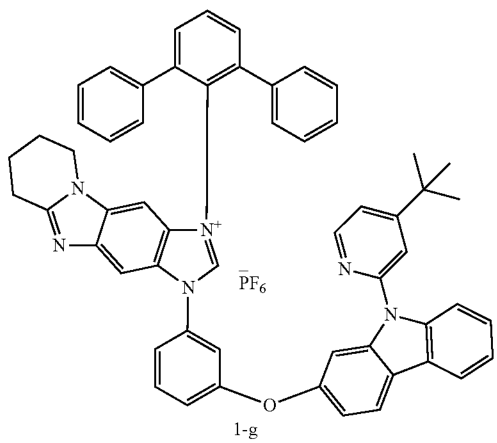

1-g (1) Synthesis of Intermediate Compound [1-a]

1-(5-bromo-2-nitrophenyl)-piperidine (7.3 mmol, 1.0 eq) and 8% HCl aqueous solution (60 mL) were mixed together and then heated at 80° C. to thereby obtain a solution. A $SnCl_2$ (1.2 eq) and 8% HCl aqueous solution (40 mL) mixed solution was slowly added to the solution and then stirred for 30 min at 80° C., to thereby obtain a product (e.g., an intermediate reaction product). The product was cooled to room temperature, neutralized utilizing ammonia water, and then subjected to an extraction process three times utilizing dichloromethane and water, to thereby obtain an organic layer. The obtained organic layer was dried utilizing magnesium sulfate and concentrated, and column chromatography was utilized to purify Intermediate Compound 1-a (yield: 80%).

(2) Synthesis of Intermediate Compound[1-b]

Intermediate Compound [1-a] (5 mmol, 1.0 eq) was dissolved in $H_2SO_4$ (20 mL) to thereby obtain a solution. $KNO_3$ (1.1 eq) was dissolved in $H_2SO_4$ (20 mL) and then slowly added to the solution. The mixture was stirred for an hour, neutralized utilizing ammonia water at 0° C., washed utilizing water, and then subjected to filtration, to thereby obtain Intermediate Compound 1-b (yield: 90%).

(3) Synthesis of Intermediate Compound [1-c]

2,6-diphenylaniline (1.0 eq), Intermediate Compound [1-b] (1.2 eq), $Pd_2(dba)_3$ (5 mol %), Sphos (7 mol %), and sodium tert-butoxide (2.0 eq) were dissolved in toluene (0.1 M) and then stirred for 12 hours at 110° C. to thereby obtain a product. The product was cooled at room temperature and then subjected to an extraction process three times utilizing dichloromethane and water to thereby obtain an organic layer. The obtained organic layer was dried utilizing magnesium sulfate and concentrated, and column chromatography was utilized to purify Intermediate Compound 1-c (yield: 72%).

(4) Synthesis of Intermediate Compound [1-d]

Intermediate Compound [1-c] (1.0 eq), Sn (1.5 eq), and HCl (30 eq) were dissolved in ethanol and then stirred for 12 hours at 80° C. to thereby obtain a product. The product was cooled at room temperature and then neutralized utilizing a NaOH solution. The neutralized product was subjected to an extraction process utilizing dichloromethane and water to obtain an organic layer, and then subjected to filtration through Celite/silica gel. The filtrate was dried utilizing magnesium sulfate and concentrated, and column chromatography (MC:hexane=a volume ratio of 1:3) was utilized to purify Intermediate Compound 1-d (yield: 86%).

(5) Synthesis of Intermediate Compound [1-e]

Intermediate Compound [1-d] (1.2 eq), 2-(3-bromophenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then stirred for 3 hours at 110° C., to thereby obtain a product. The product was cooled at room temperature and then subjected to an extraction process three times utilizing dichloromethane and water to thereby obtain an organic layer. The obtained organic layer was dried by utilizing magnesium sulfate and concentrated, and column chromatography (ethyl acetate:hexane=a volume ratio of 1:9) was utilized to purify Intermediate Compound 1-e (yield: 78%).

(6) Synthesis of Intermediate Compound [1-f]

Intermediate compound [1-e] (1.0 eq) was dissolved in triethyl orthoformate (30 eq), and then 37% HCl (1.5 eq) was added thereto, followed by stirring for 12 hours at 80° C. The reaction was cooled to room temperature and concentrated, followed by an extraction process three times utilizing dichloromethane and water to thereby obtain an organic layer. The obtained organic layer was dried utilizing magnesium sulfate and concentrated, and column chromatography (MC:methanol=a volume ratio of 95:5) was utilized to purify Intermediate Compound 1-f (yield: 85%).

(7) Synthesis of Intermediate Compound [1-g]

Intermediate Compound [1-f] (1.0 eq) and ammonium hexafluorophosphate (3.0 eq) were dissolved in methanol (0.5 M), and distilled water was added thereto, followed by stirring for 3 hours at room temperature, to thereby obtain a product. The product was washed utilizing distilled water and subjected to filtration to thereby obtain a solid, and the solid was subjected to an extraction process three times utilizing dichloromethane and water, to thereby obtain an organic layer. The obtained organic layer was dried utilizing magnesium sulfate and concentrated, to thereby purify Intermediate Compound 1-g (yield of 90%).

(8) Synthesis of Compound [1]

Intermediate Compound [1-g], dichloro(1,5-cyclooctadiene)platinum (II)(1.1 eq), and sodium acetate (2.0 eq) were dissolved in anhydrous 1,4-dioxane (0.05 M), and then stirred for 4 days at 120° C. in the nitrogen condition, to thereby obtain a product. The product was cooled at room temperature and then subjected to an extraction process three times utilizing dichloromethane and water to thereby obtain an organic layer. The obtained organic layer was dried utilizing magnesium sulfate and concentrated, and column chromatography (MC:hexane=a volume ratio of 3:7) was utilized to purify Compound 1 (yield: 19%).

Synthesis Example 2: Synthesis of Compound 9

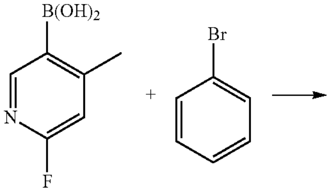

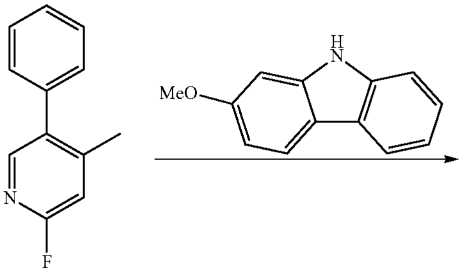

9-a

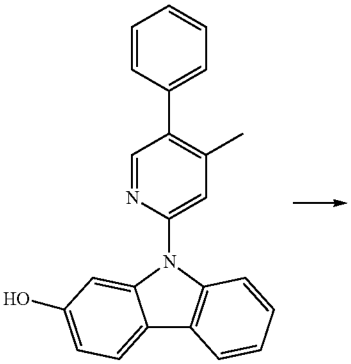

9-b

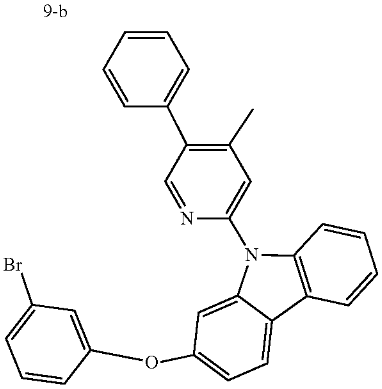

9-c

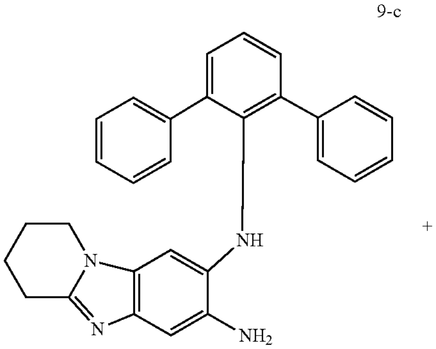

1-d

-continued

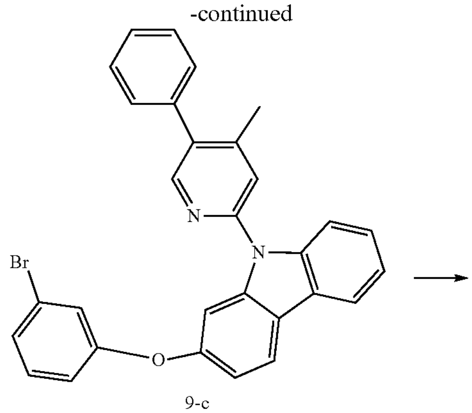

9-c

-continued

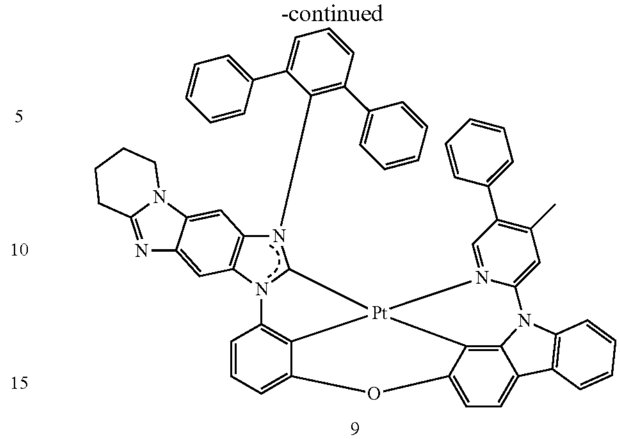

9

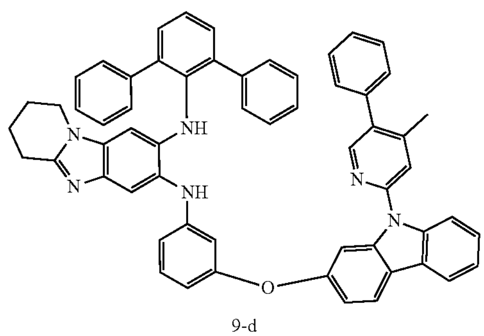

9-d

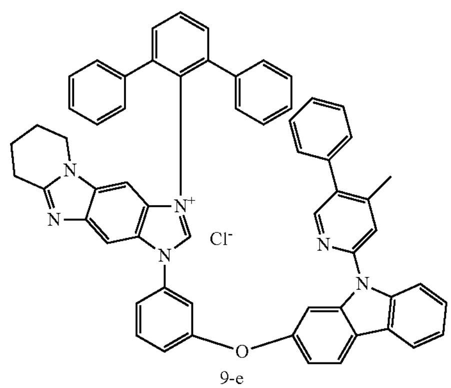

9-e

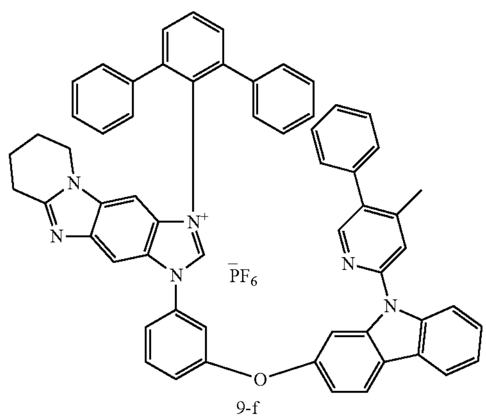

9-f (1) Synthesis of Intermediate Compound [9-a]

(6-fluoro-4-methylpyridin-3-yl)boronic acid (1.2 eq), bromobenzene (1.0 eq), $Pd(PPh_3)_4$ (0.05 eq), and $K_3PO_4$ (2.0 eq) were mixed in 1,4-dioxane:$H_2O$ (a volume ratio=4:1) (0.1 M), and then stirred for 15 hours at 100° C. to thereby obtain a product. The reaction was cooled to room temperature and then subjected to an extraction process three times utilizing ethyl acetate and water to thereby obtain an organic layer. The obtained organic layer was dried utilizing magnesium sulfate and concentrated, and column chromatography was utilized to purify Intermediate Compound 9-a (yield: 86%).

(2) Synthesis of Intermediate Compound[9-b]

Intermediate Compound [9-a] (1.0 eq), 2-methoxy-9H-carbazole (1.1 eq), and $K_3PO_4$ (2.0 eq) were mixed in DMF (0.1 M), and then stirred for 16 hours at 160° C., to thereby obtain a product. The reaction was cooled to room temperature and then distilled under reduced pressure to remove residual DMF solvent, followed by an extraction process three times utilizing dichloromethane and water to thereby obtain an organic layer. The obtained organic layer was dried utilizing magnesium sulfate and concentrated, and column chromatography was utilized to obtain a solid compound. The obtained solid compound, Sn (1.5 eq), and HCl (30 eq) were dissolved in ethanol and then stirred for 12 hours at 80° C. to thereby obtain a product. The reaction was cooled to room temperature and then neutralized utilizing a NaOH solution. The neutralized reaction was subjected to an extraction process utilizing dichloromethane and water to obtain an organic layer, and then subjected to filtration through Celite/silica gel. The filtrate was dried utilizing magnesium sulfate and concentrated, and column chromatography (MC:hexane=a volume ratio of 1:3) was utilized to purify Intermediate Compound 9-b (yield: 70%).

(3) Synthesis of Intermediate Compound [9-c]

Intermediate Compound [9-b] (1.0 eq), 1,3-dibromobenzene (1.5 eq), CuI (0.1 eq), 2-picolinic acid (0.1 eq), and $K_3PO_4$ (2.0 eq) were dissolved in DMSO (0.2 M) and then stirred for 12 hours at 120° C., to thereby obtain a product. The reaction was cooled to room temperature and then subjected to an extraction process three times utilizing ethyl acetate and water to thereby obtain an organic layer. The obtained organic layer was dried utilizing magnesium sulfate and concentrated, and column chromatography was utilized to purify Intermediate Compound 9-c (yield: 64%).

(4) Synthesis of Intermediate Compound [9-d]

Intermediate Compound [1-d] (1.2 eq), Intermediate Compound [9-c] (1.0 eq), $Pd_2(dba)_3$ (5 mol %), Sphos (7 mol %), and sodium tert-butoxide (2.0 eq) were dissolved in dioxane (0.1 M) and then stirred for 3 hours at 110° C. to thereby obtain a product. The product was cooled at room temperature and then subjected to an extraction process three times utilizing dichloromethane and water to thereby obtain an organic layer. The obtained organic layer was dried utilizing magnesium sulfate and concentrated, and column chromatography (dichloromethane:hexane=a volume ratio of 1:9) was utilized to purify Intermediate Compound 9-d (yield: 75%).

(5) Synthesis of Intermediate Compound [9-e]

Intermediate Compound [9-e] was synthesized in substantially the same manner as utilized to synthesize Intermediate Compound [1-f] of Synthesis Example 1, except that Intermediate Compound [9-d] was utilized instead of Intermediate Compound [1-e]. (yield: 85%)

(6) Synthesis of Intermediate Compound [9-f]

Intermediate Compound [9-f] was synthesized in substantially the same manner as utilized to synthesize Intermediate Compound [1-g] of Synthesis Example 1, except that Intermediate Compound [9-e] was utilized instead of Intermediate Compound [1-f]. (yield: 91%)

(7) Synthesis of Compound [9]

Compound [9] was synthesized in substantially the same manner as utilized to synthesize Compound [1] of Synthesis Example 1, except that Intermediate Compound [9-f] was utilized instead of Intermediate Compound [1-g]. (yield: 22%)

Synthesis Example 3: Synthesis of Compound 10

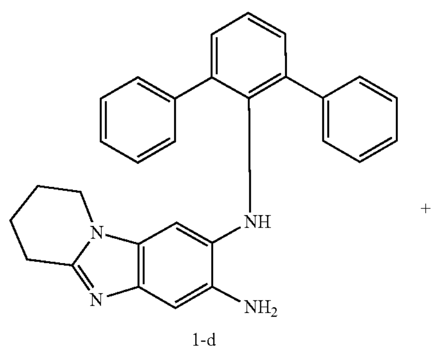

1-d

+

-continued

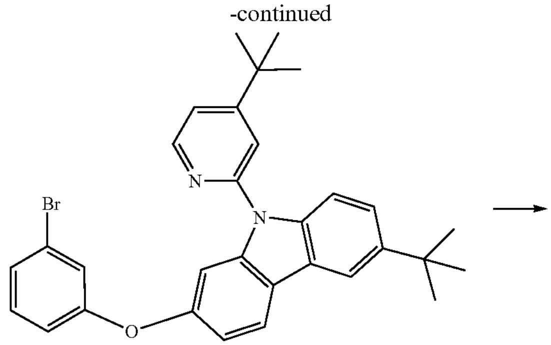

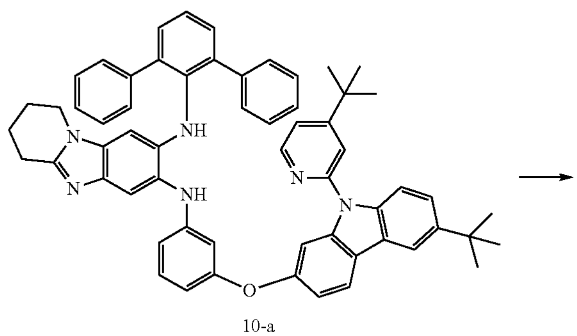

10-a

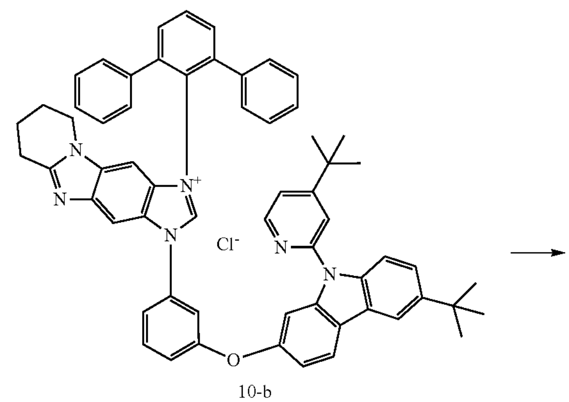

10-b

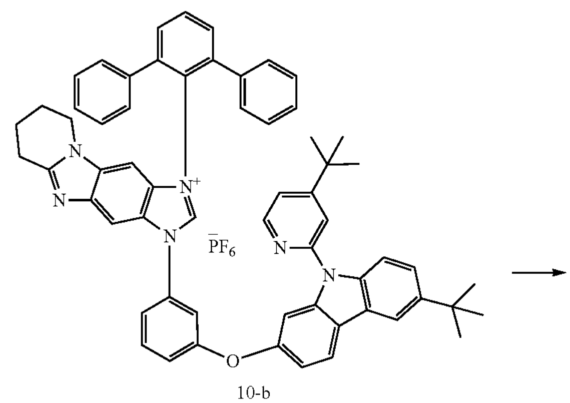

10-b

-continued

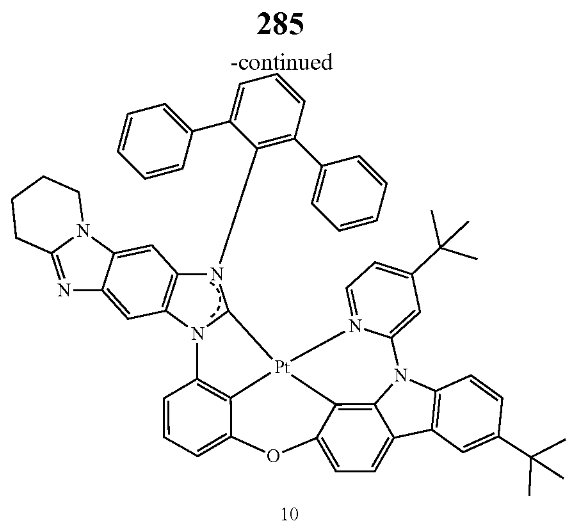

10

(1) Synthesis of Intermediate Compound [10-a]

Intermediate Compound [1-d] (1.2 eq), 2-(3-bromophenoxy)-6-(tert-butyl)-9-(4-(tert-butyl)pyridin-2-yl)-9H-carbazole (1.0 eq), $Pd_2(dba)_3$ (5 mol %), Xphos (7 mol %), and sodium tert-butoxide (2.0 eq) were dissolved in dioxane (0.1M) and then stirred for 3 hours at 110° C. to thereby generate a product. The reaction was cooled to room temperature and then subjected to an extraction process three times utilizing dichloromethane and water to thereby obtain an organic layer. The obtained organic layer was dried utilizing magnesium sulfate and concentrated, and column chromatography (dichloromethane:hexane=a volume ratio of 1:9) was utilized to purify Intermediate Compound 10-a (yield: 81%).

(2) Synthesis of Intermediate Compound[10-b]

Intermediate Compound [10-b] was synthesized in substantially the same manner as utilized to synthesize Intermediate Compound [1-f] of Synthesis Example 1, except that Intermediate Compound [10-a] was utilized instead of Intermediate Compound [1-e]. (yield: 90%)

(3) Synthesis of Intermediate Compound [10-c]

Intermediate Compound [10-b] was synthesized in substantially the same manner as utilized to synthesize Intermediate Compound [1-g] of Synthesis Example 1, except that Intermediate Compound [10-c] was utilized instead of Intermediate Compound [1-f]. (yield: 91%)

(5) Synthesis of Compound [10]

Compound [10] was synthesized in substantially the same manner as utilized to synthesize Compound [1] of Synthesis Example 1, except that Intermediate Compound [10-c] was utilized instead of Intermediate Compound [1-g]. (yield: 20%)

Synthesis Example 4: Synthesis of Compound 13

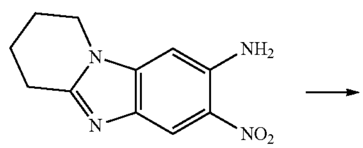

-continued

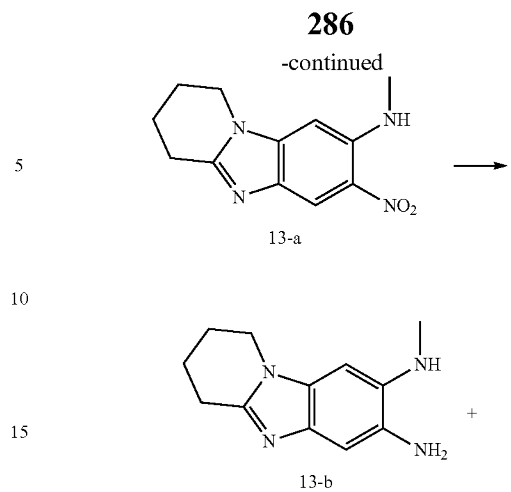

13-a 13-b

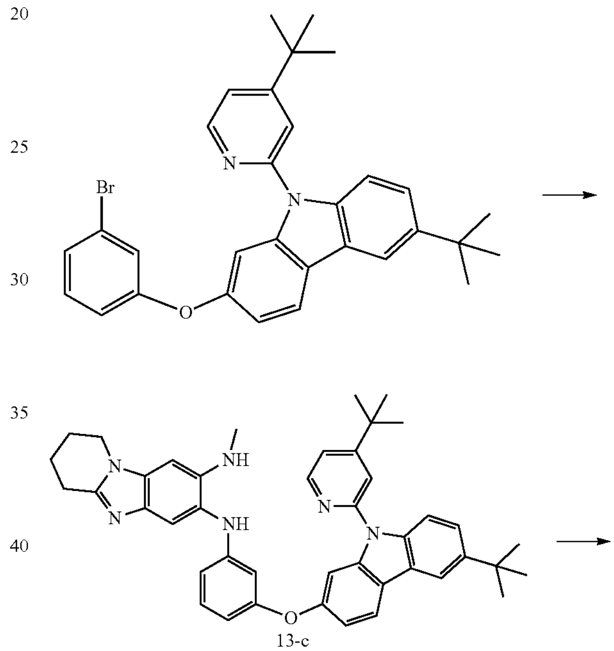

13-c

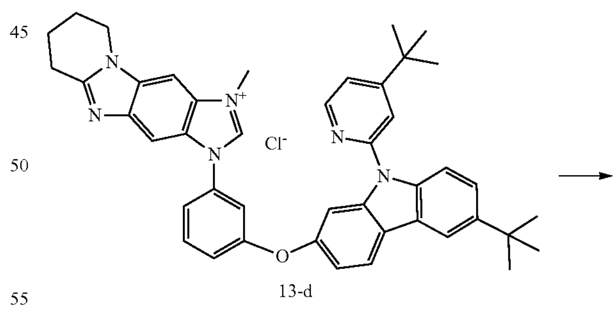

13-d

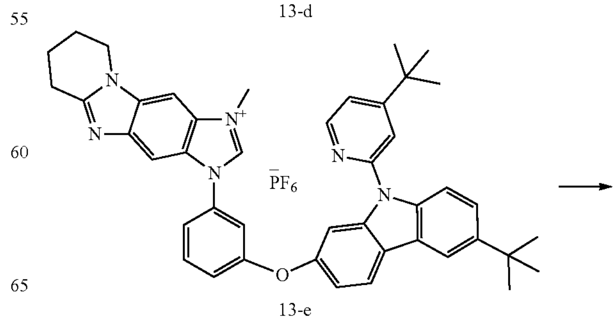

13-e

-continued

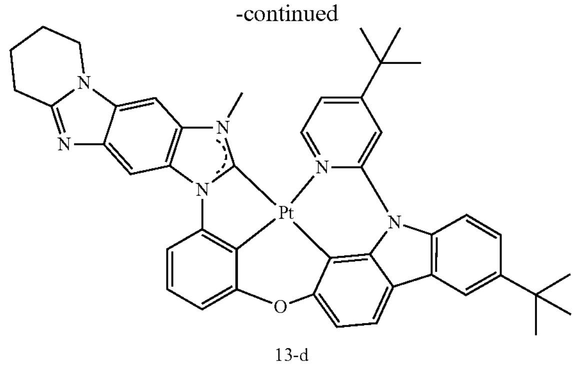

13-d (1) Synthesis of Intermediate Compound [13-a]

7-nitro-1,2,3,4-tetrahydrobenzo[4,5]imidazo[1,2-a]pyridin-8-amine (1.0 eq), iodomethane (1.2 eq), $Pd_2(dba)_3$ (5 mol %), Sphos (7 mol %), and sodium tert-butoxide (2.0 eq) were dissolved in toluene (0.1 M) and then stirred for 12 hours at 110° C., to thereby obtain a product. The reaction was cooled to room temperature and then subjected to an extraction process three times utilizing dichloromethane and water to thereby obtain an organic layer. The obtained organic layer was dried utilizing magnesium sulfate and concentrated, and column chromatography was utilized to purify Intermediate Compound 13-a (yield: 47%).

(2) Synthesis of Intermediate Compound[13-b]

Intermediate Compound [13-a] (1.0 eq), Sn (1.5 eq), and HCl (30 eq) were dissolved in ethanol and then stirred for 12 hours at 80° C., to thereby obtain a product. The reaction was cooled at room temperature and then neutralized utilizing a NaOH solution. The neutralized reaction was subjected to an extraction process utilizing dichloromethane and water to obtain an organic layer, and then subjected to filtration through Celite/silica gel. The filtrate was dried utilizing magnesium sulfate to purify Intermediate Compound 13-b (yield: 88%).

(3) Synthesis of Intermediate Compound [13-c]

Intermediate Compound [13-b] (1.2 eq), 2-(3-bromophenoxy)-6-(tert-butyl)-9-(4-(tert-butyl)pyridin-2-yl)-9H-carbazole (1.0 eq), $Pd_2(dba)_3$ (5 mol %), Xphos (7 mol %), and sodium tert-butoxide (2.0 eq) were dissolved in dioxane (0.1M) and then stirred for 2 hours at 110° C., to thereby a product. The reaction was cooled to room temperature and then subjected to an extraction process three times utilizing dichloromethane and water to thereby obtain an organic layer. The obtained organic layer was dried by utilizing magnesium sulfate and concentrated, and column chromatography (ethyl acetate:hexane=a volume ratio of 1:9) was utilized to purify Intermediate Compound 13-c (yield: 79%).

(4) Synthesis of Intermediate Compound [13-d]

Intermediate Compound [13-d] was synthesized in substantially the same manner as utilized to synthesize Intermediate Compound [1-f] of Synthesis Example 1, except that Intermediate Compound [13-c] was utilized instead of Intermediate Compound [1-e]. (yield: 88%)

(5) Synthesis of Intermediate Compound [13-e]

Intermediate Compound [13-e] was synthesized in substantially the same manner as utilized to synthesize Intermediate Compound [1-g] of Synthesis Example 1, except that Intermediate Compound [13-d] was utilized instead of Intermediate Compound [1-f]. (yield: 93%)

(6) Synthesis of Compound [13]

Compound [13] was synthesized in substantially the same manner as utilized to synthesize Compound [1] of Synthesis Example 1, except that Intermediate Compound [13-e] was utilized instead of Intermediate Compound [1-g]. (yield: 22%)

Synthesis Example 5: Synthesis of Compound 19

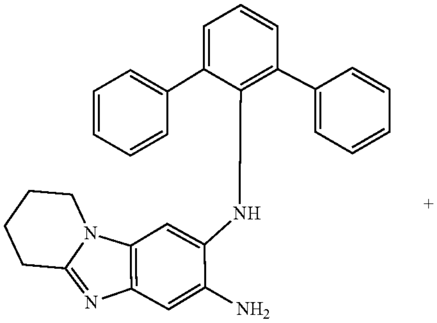

1-d

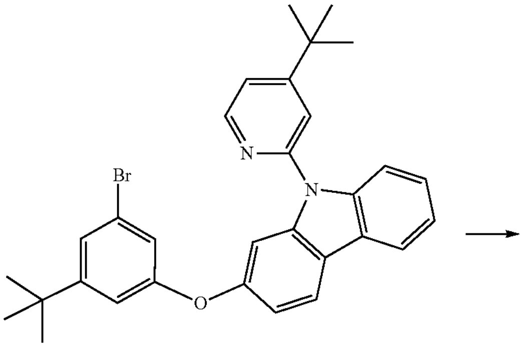

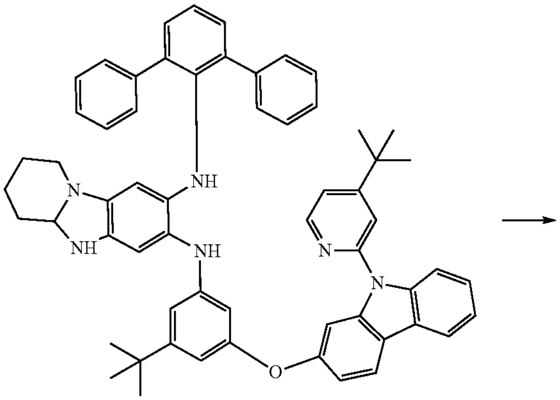

19-a

-continued

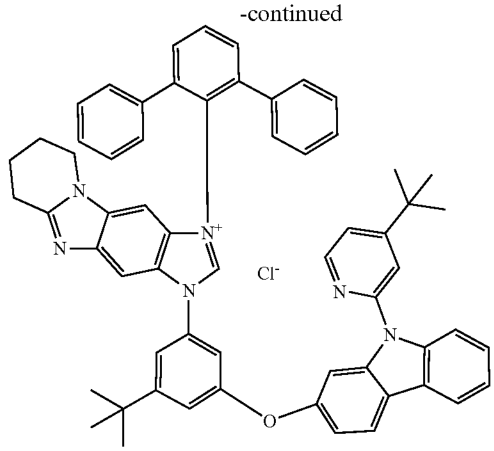

19-b

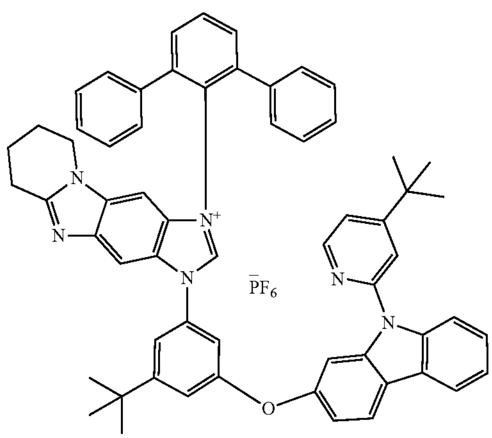

19-c

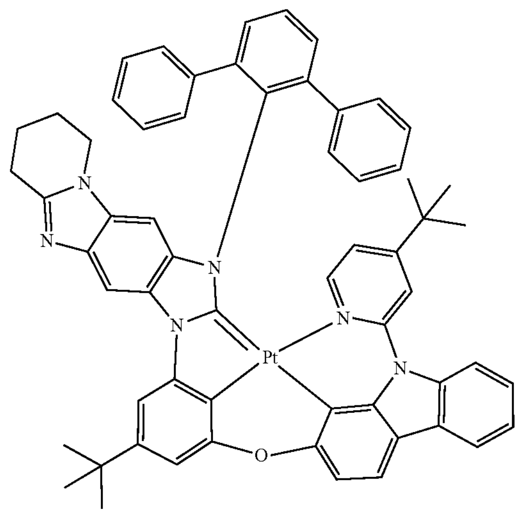

19

(1) Synthesis of Intermediate Compound [19-a]

Intermediate Compound [1-d] (1.2 eq), 2-(3-bromo-5-(tert-butyl)phenoxy)-9-(4-(tert-butyl)pyridin-2-yl)-9H-carbazole (1.0 eq), $Pd_2(dba)_3$ (5 mol %), Xphos (7 mol %), and sodium tert-butoxide (2.0 eq) were dissolved in dioxane (0.1M) and then stirred for 2 hours at 110° C., to thereby obtain a product. The reaction was cooled to room temperature and then subjected to an extraction process three times utilizing dichloromethane and water to thereby obtain an organic layer. The obtained organic layer was dried utilizing magnesium sulfate and concentrated, and column chromatography (dichloromethane:hexane=a volume ratio of 1:9) was utilized to purify Intermediate Compound 19-a (yield: 85%).

(2) Synthesis of Intermediate Compound[19-b]

Intermediate Compound [19-b] was synthesized in substantially the same manner as utilized to synthesize Intermediate Compound [1-f] of Synthesis Example 1, except that Intermediate Compound [19-a] was utilized instead of Intermediate Compound [1-e]. (yield: 89%)

(3) Synthesis of Intermediate Compound [19-c]

Intermediate Compound [19-c] was synthesized in substantially the same manner as utilized to synthesize Intermediate Compound [1-g] of Synthesis Example 1, except that Intermediate Compound [19-b] was utilized instead of Intermediate Compound [1-f]. (yield: 91%)

(4) Synthesis of Compound [19]

Compound [19] was synthesized in substantially the same manner as utilized to synthesize Compound [1] of Synthesis Example 1, except that Intermediate Compound [19-c] was utilized instead of Intermediate Compound [1-g]. (yield: 24%)

Synthesis Example 6: Synthesis of Compound 47

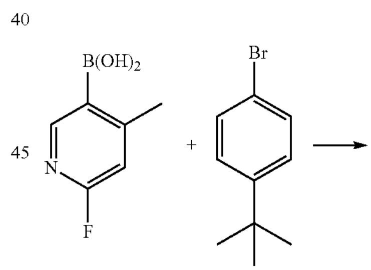

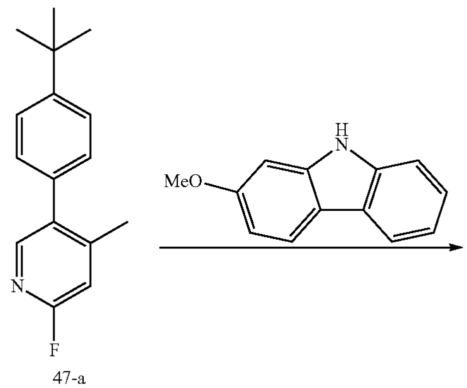

47-a

-continued
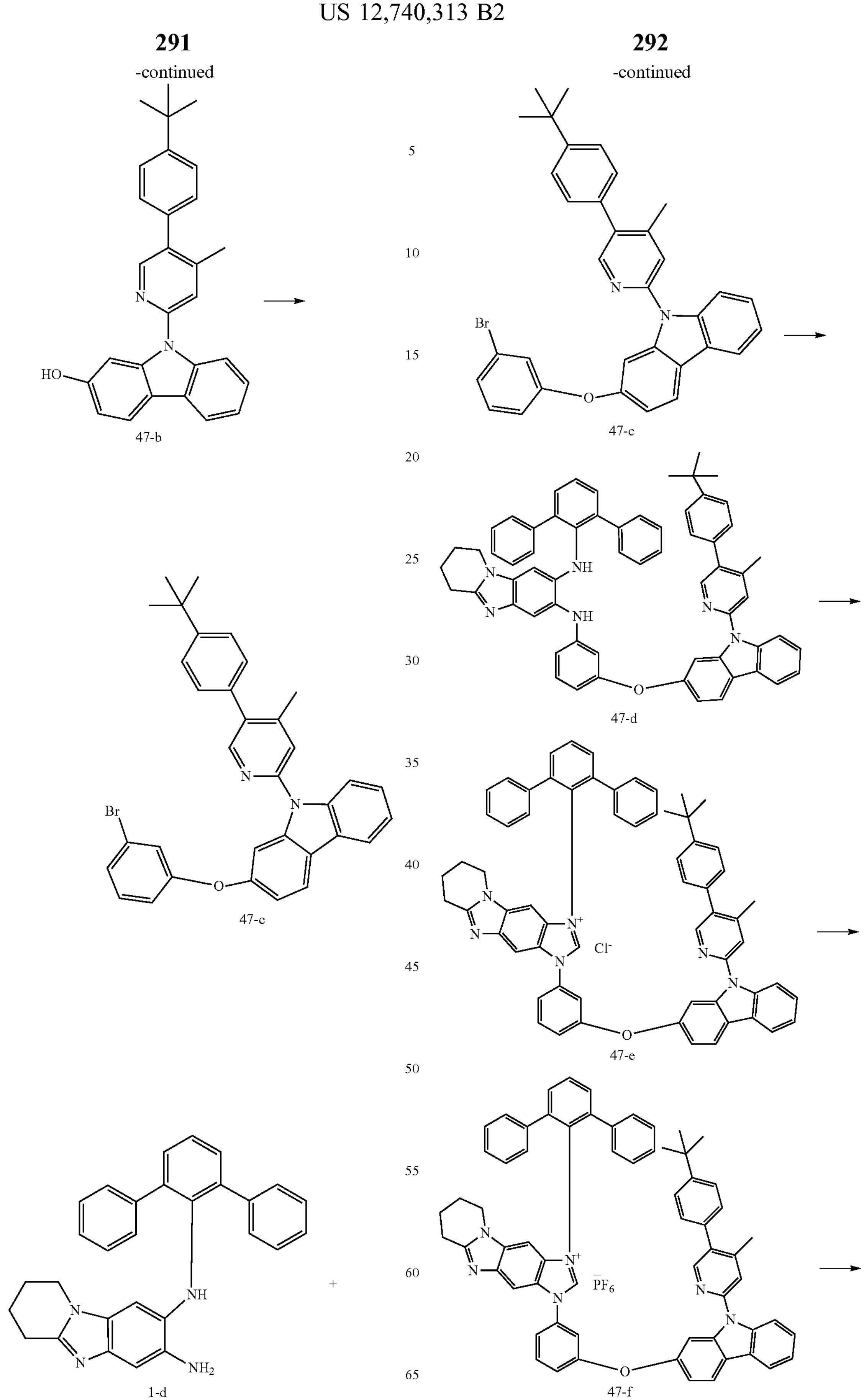
47-b
47-c
47-c
47-d
47-e
1-d
+
47-f

-continued

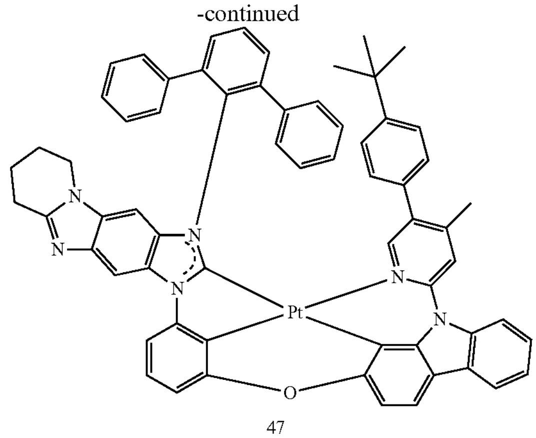

47

(1) Synthesis of Intermediate Compound [47-a]

(6-fluoro-4-methylpyridin-3-yl)boronic acid (1.2 eq), 1-bromo-4-tert-butylbenzene (1.0 eq), $Pd(PPh_3)_4$ (0.05 eq), and $K_3PO_4$ (2.0 eq) were mixed in 1,4-dioxane:$H_2O$ (a volume ratio=4:1)(0.1 M) and then stirred for 15 hours at 100° C. to thereby obtain a product. The reaction was cooled at room temperature and then subjected to an extraction process three times utilizing ethyl acetate and water to thereby obtain an organic layer. The obtained organic layer was dried utilizing magnesium sulfate and concentrated, and column chromatography was utilized to purify Intermediate Compound 47-a (yield: 95%).

(2) Synthesis of Intermediate Compound[47-b]

Intermediate Compound [47-a] (1.0 eq), 2-methoxy-9H-carbazole (1.1 eq), and $K_3PO_4$ (2.0 eq) were mixed in DMF (0.1 M), and then stirred for 16 hours at 160° C., to thereby obtain a product. The reaction was cooled to room temperature and then distilled under reduced pressure to remove residual DMF solvent, followed by an extraction process three times utilizing dichloromethane and water to thereby obtain an organic layer. The obtained organic layer was dried utilizing magnesium sulfate and concentrated, and column chromatography was utilized to obtain a solid compound. The obtained solid compound, Sn (1.5 eq), and HCl (30 eq) were dissolved in ethanol and then stirred for 12 hours at 80° C., to thereby obtain a product. The product was cooled at room temperature and then neutralized utilizing a NaOH solution. The neutralized reaction was subjected to an extraction process utilizing dichloromethane and water to obtain an organic layer, and then subjected to filtration through Celite/silica gel. The filtrate was dried utilizing magnesium sulfate and concentrated, and column chromatography (MC:hexane=a volume ratio of 1:3) was utilized to purify Intermediate Compound 47-b (yield: 75%).

(3) Synthesis of Intermediate Compound [47-c]

Intermediate Compound [47-b] (1.0 eq), 1,3-dibromobenzene (1.5 eq), CuI (0.1 eq), 2-picolinic acid (0.1 eq), and $K_3PO_4$ (2.0 eq) were dissolved in DMSO (0.2 M) and then stirred for 12 hours at 120° C., to thereby obtain a product. The reaction was cooled to room temperature and then subjected to an extraction process three times utilizing ethyl acetate and water to thereby obtain an organic layer. The obtained organic layer was dried utilizing magnesium sulfate and concentrated, and column chromatography was utilized to synthesize Intermediate Compound 47-c (yield: 60%).

(4) Synthesis of Intermediate Compound [47-d]

Intermediate Compound [1-d] (1.2 eq), Intermediate Compound [47-c] (1.0 eq), $Pd_2(dba)_3$ (5 mol %), Sphos (7 mol %), and sodium tert-butoxide (2.0 eq) were dissolved in dioxane (0.1 M) and then stirred for 3 hours at 110° C., to thereby obtain a product. The reaction was cooled to room temperature and then subjected to an extraction process three times utilizing dichloromethane and water to thereby obtain an organic layer. The obtained organic layer was dried utilizing magnesium sulfate and concentrated, and column chromatography (dichloromethane:hexane=a volume ratio of 1:9) was utilized to purify Intermediate Compound 47-d (yield: 72%).

(5) Synthesis of Intermediate Compound [47-e]

Intermediate Compound [47-e] was synthesized in substantially the same manner as utilized to synthesize Intermediate Compound [1-f] of Synthesis Example 1, except that Intermediate Compound [47-d] was utilized instead of Intermediate Compound [1-e]. (yield: 89%)

(6) Synthesis of Intermediate Compound [47-f]

Intermediate Compound [47-f] was synthesized in substantially the same manner as utilized to synthesize Intermediate Compound [1-g] of Synthesis Example 1, except that Intermediate Compound [47-e] was utilized instead of Intermediate Compound [1-f]. (yield: 91%)

(7) Synthesis of Compound [47]

Compound [47] was synthesized in substantially the same manner as utilized to synthesize Compound [1] of Synthesis Example 1, except that Intermediate Compound [47-f] was utilized instead of Intermediate Compound [1-g]. (yield: 18%)

Synthesis Example 7: Synthesis of Compound 51

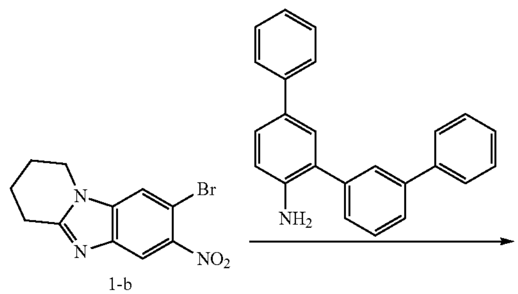

1-b

-continued
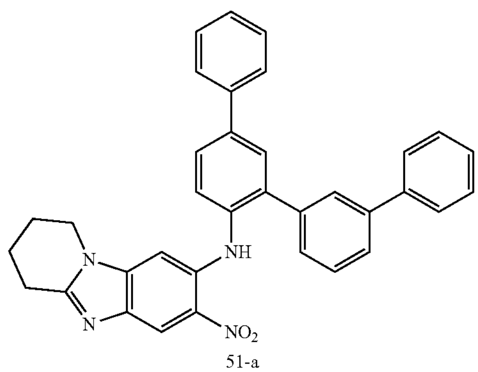
51-a
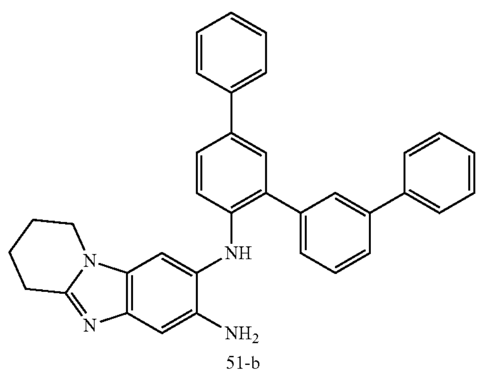
51-b
+
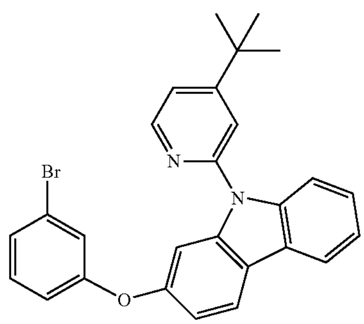
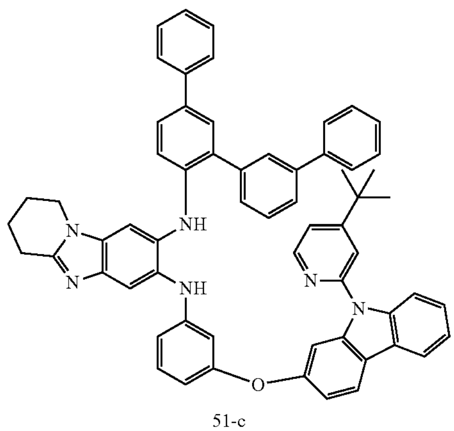
51-c
-continued
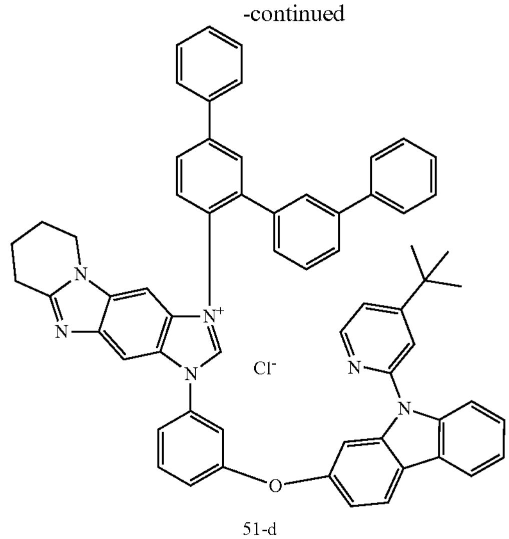
51-d
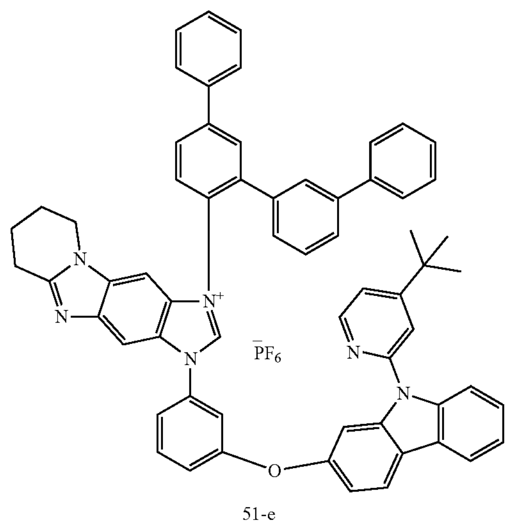
51-e
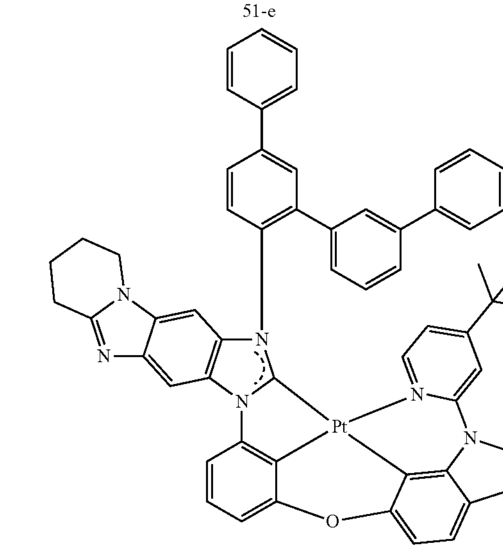
51
(1) Synthesis of Intermediate Compound [51-a]
[1,1':3',1":3",1'"-quaterphenyl]-4'-amine (1.0 eq), Intermediate Compound [1-b] (1.2 eq), $Pd_2(dba)_3$ (5 mol %), Sphos (7 mol %), and sodium tert-butoxide (2.0 eq) were dissolved in toluene (0.1 M) and then stirred for 12 hours at 110° C., to thereby obtain a product. The reaction was cooled to room temperature and then subjected to an extraction process three times utilizing dichloromethane and water to thereby obtain an organic layer. The obtained organic layer was dried utilizing magnesium sulfate and concentrated, and column chromatography was utilized to purify Intermediate Compound 51-a (yield: 61%).

(2) Synthesis of Intermediate Compound[51-b]

Intermediate Compound [51-a] (1.0 eq), Sn (1.5 eq), and HCl (30 eq) were dissolved in ethanol and then stirred for 12 hours at 80° C., to thereby obtain a product. The reaction was cooled to room temperature and then neutralized utilizing a NaOH solution. The neutralizer was subjected to an extraction process utilizing dichloromethane and water to obtain an organic layer, and then subjected to filtration through Celite/silica gel. The filtrate was dried utilizing magnesium sulfate, thereby isolating Intermediate Compound 51-b (yield: 86%).

(3) Synthesis of Intermediate Compound [51-c]

Intermediate Compound [51-b] (1.2 eq), 2-(3-bromophenoxy)-9-(4-(tert-butyl)pyridin-2-yl)-9H-carbazole (1.0 eq), $Pd_2(dba)_3$ (5 mol %), Sphos (7 mol %), and sodium tert-butoxide (2.0 eq) were dissolved in toluene (0.1 M), and then, stirred for 3 hours at 110° C., to thereby obtain a product. The reaction was cooled to room temperature and then subjected to an extraction process three times utilizing dichloromethane and water to thereby obtain an organic layer. The obtained organic layer was dried by utilizing magnesium sulfate and concentrated, and column chromatography (ethyl acetate:hexane=a volume ratio of 1:9) was utilized to purify Intermediate Compound 51-c (yield: 71%).

(4) Synthesis of Intermediate Compound [51-d]

Intermediate Compound [51-d] was synthesized in substantially the same manner as utilized to synthesize Intermediate Compound [1-f] of Synthesis Example 1, except that Intermediate Compound [51-c] was utilized instead of Intermediate Compound [1-e]. (yield: 88%)

(5) Synthesis of Intermediate Compound [51-e]

Intermediate Compound [51-e] was synthesized in substantially the same manner as utilized to synthesize Intermediate Compound [1-g] of Synthesis Example 1, except that Intermediate Compound [51-d] was utilized instead of Intermediate Compound [1-f]. (yield: 93%)

(6) Synthesis of Compound [51]

Compound [51] was synthesized in substantially the same manner as utilized to synthesize Compound [1] of Synthesis Example 1, except that Intermediate Compound [51-e] was utilized instead of Intermediate Compound [1-g]. (yield: 21%)

Synthesis Example 8: Synthesis of Compound 74

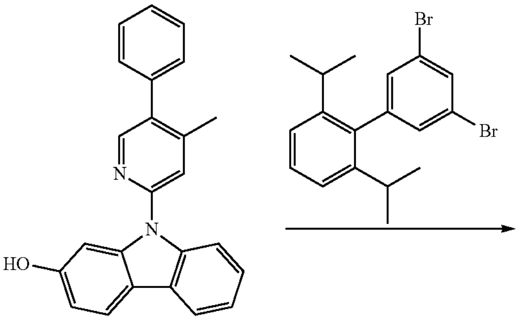

9-b

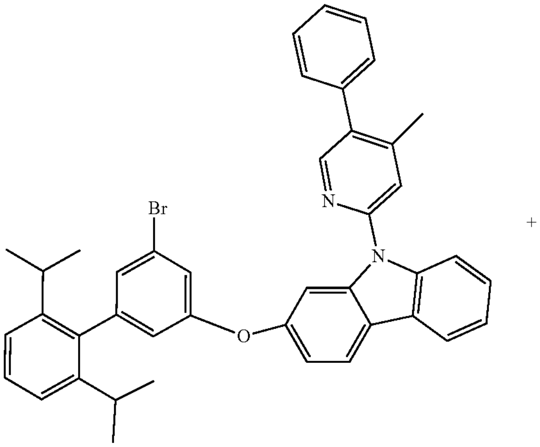

74-a

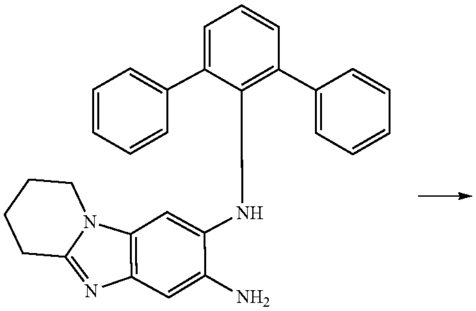

1-d

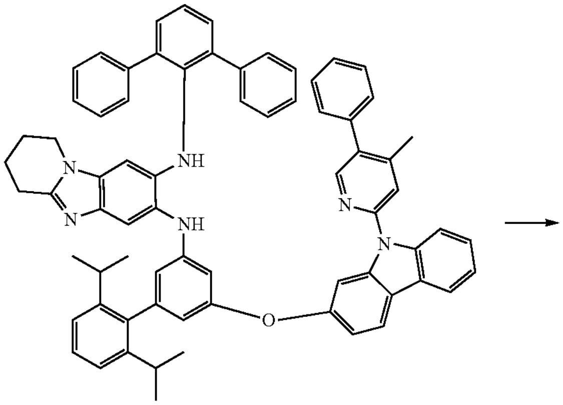

74-b

-continued

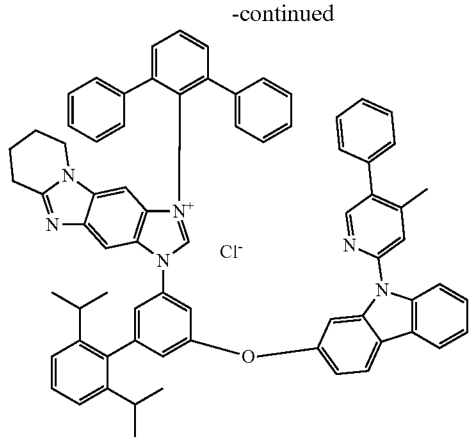

74-c

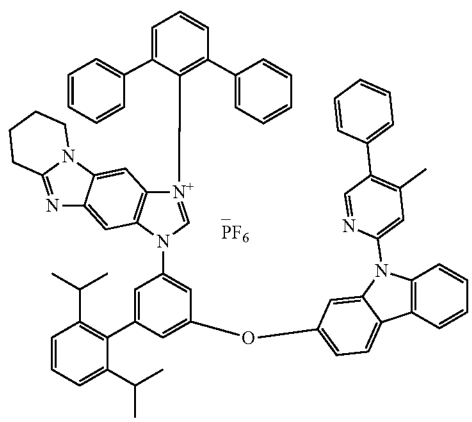

74-d

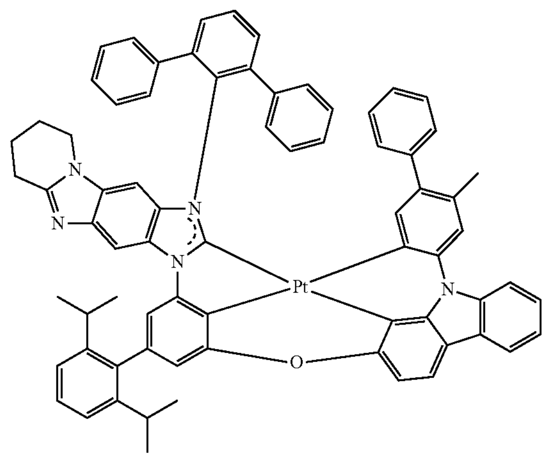

74

(1) Synthesis of Intermediate Compound [74-a]

Intermediate Compound [9-b] (1.0 eq), 3',5'-dibromo-2,6-diisopropyl-1,1'-biphenyl (1.5 eq), CuI (0.1 eq), 2-picolinic acid (0.1 eq), and $K_3PO_4$ (2.0 eq) were dissolved in DMSO (0.2 M) and then stirred for 12 hours at 120° C., to thereby obtain a product. The reaction was cooled to room temperature and then subjected to an extraction process three times utilizing ethyl acetate and water, to thereby obtain an organic layer. The obtained organic layer was dried utilizing magnesium sulfate and concentrated, and column chromatography was utilized to purify Intermediate Compound 74-a (yield: 57%).

(2) Synthesis of Intermediate Compound[74-b]

Intermediate Compound [74-a] (1.0 eq), Intermediate Compound [1-d] (1.2 eq), $Pd_2(dba)_3$ (5 mol %), Xphos (7 mol %), and sodium tert-butoxide (2.0 eq) were dissolved in 1,4-dioxane (0.1 M) and then stirred for 3 hours at 110° C., to thereby obtain a product. The reaction was cooled to room temperature and then subjected to an extraction process three times utilizing dichloromethane and water to thereby obtain an organic layer. The obtained organic layer was dried by utilizing magnesium sulfate and concentrated, and column chromatography (ethyl acetate:hexane=a volume ratio of 1:9) was utilized to purify Intermediate Compound 74-b (yield: 85%).

(3) Synthesis of Intermediate Compound [74-c]

Intermediate Compound [74-c] was synthesized in substantially the same manner as utilized to synthesize Intermediate Compound [1-f] of Synthesis Example 1, except that Intermediate Compound [74-b] was utilized instead of Intermediate Compound [1-e]. (yield: 91%)

(4) Synthesis of Intermediate Compound [74-d]

Intermediate Compound [74-d] was synthesized in substantially the same manner as utilized to synthesize Intermediate Compound [1-g] of Synthesis Example 1, except that Intermediate Compound [74-c] was utilized instead of Intermediate Compound [1-f]. (yield: 90%)

(5) Synthesis of Compound [74]

Compound [74] was synthesized in substantially the same manner as utilized to synthesize Compound [1] of Synthesis Example 1, except that Intermediate Compound [74-d] was utilized instead of Intermediate Compound [1-g]. (yield: 22%)

Synthesis Example 9: Synthesis of Compound 81

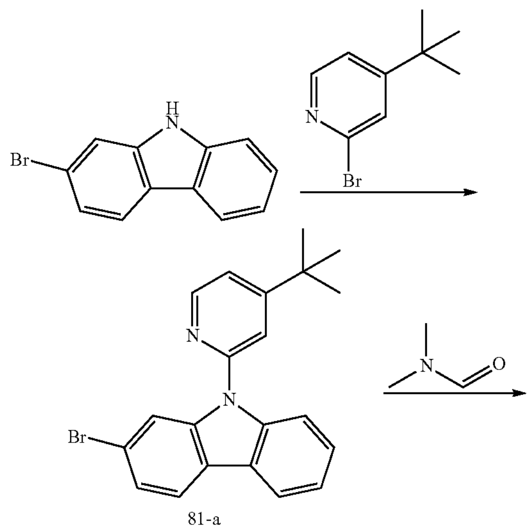

81-a

-continued

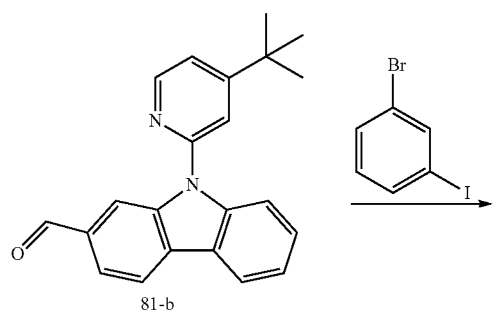

81-b

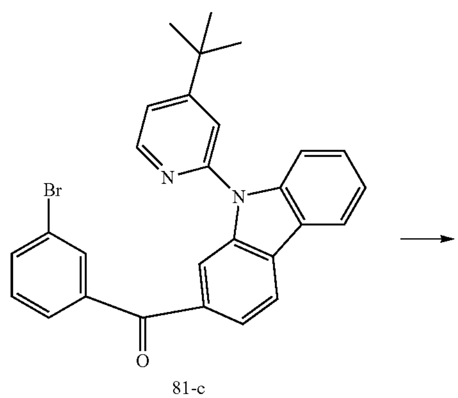

81-c

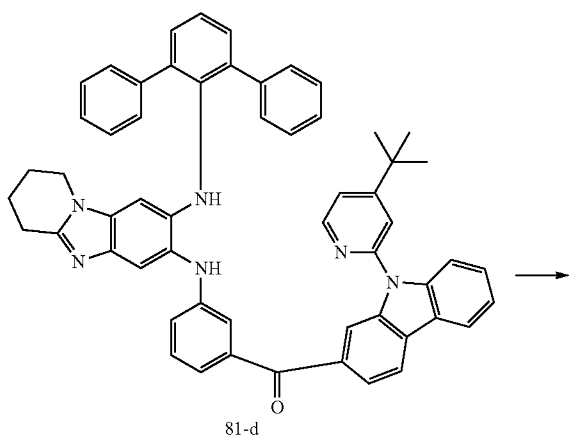

81-d

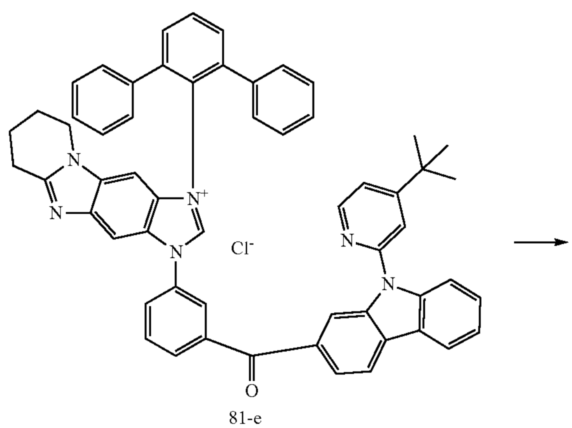

81-e

-continued

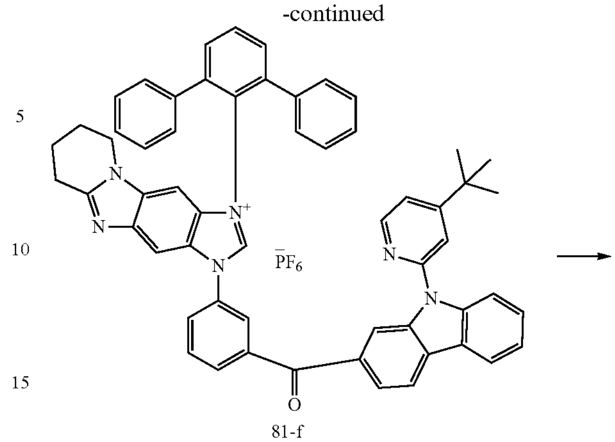

81-f

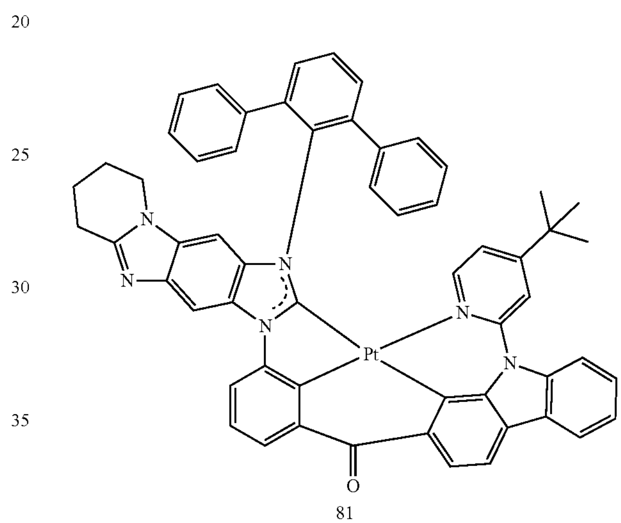

81

(1) Synthesis of Intermediate Compound [81-a]

2-bromo-9H-carbazole (1.0 eq), 2-bromo-4-tert-butyl pyridine (1.1 eq), $Pd_2(dba)_3$ (5 mol %), Sphos (7 mol %), and sodium tert-butoxide (2.0 eq) were dissolved in toluene (0.1 M) and then stirred for 12 hours at 110° C., to thereby obtain a product. The reaction was cooled to room temperature and then subjected to an extraction process three times utilizing dichloromethane and water to thereby obtain an organic layer. The obtained organic layer was dried utilizing magnesium sulfate and then concentrated, and column chromatography (ethyl acetate:hexane=a volume ratio of 1:4) was utilized to purify Intermediate Compound 81-a (yield: 92%).

(2) Synthesis of Intermediate Compound[81-b]

Intermediate Compound [81-a] (1.0 eq) was dissolved in anhydrous THF (0.1 M), and then 1.0 M n-BuLi in hexane (1.1 eq) was slowly added thereto at −78° C., followed by stirring for an hour. Anhydrous DMF (2.5 eq) was added to the reaction and then stirred for 12 hours at room temperature. The reaction was cooled to room temperature and then subjected to an extraction process three times utilizing dichloromethane and water, to thereby obtain an organic layer. The obtained organic layer was dried utilizing magnesium sulfate and then concentrated, and column chromatography (ethyl acetate:hexane=a volume ratio of 1:10) was utilized to purify Intermediate Compound 81-b (yield: 54%).

(3) Synthesis of Intermediate Compound [81-c]

Intermediate Compound [81-b] (1.0 eq), 1-bromo-3-iodobenzene (1.3 eq), Ni(dppe)$Br_2$ ([1,2-bis(diphenylphosphino)ethane]dibromo nickel(II))(0.1 eq), and Zn powder (2.7 eq) were dissolved in THF (0.1 M) and then stirred for 30 hours at 110° C., to thereby obtain a product. The reaction was cooled to room temperature and then subjected to an extraction process three times utilizing ether and water, to thereby obtain an organic layer. The obtained organic layer was dried utilizing magnesium sulfate and then concentrated, and column chromatography (ethyl acetate:hexane=a volume ratio of 5:95) was utilized to purify Intermediate Compound 81-c (yield: 73%).

(4) Synthesis of Intermediate Compound [81-d]

Intermediate Compound [1-d] (1.2 eq), Intermediate Compound [81-c] (1.0 eq), $Pd_2(dba)_3$ (5 mol %), Sphos (7 mol %), and sodium tert-butoxide (2.0 eq) were dissolved in dioxane (0.1 M) and then stirred for 2 hours at 110° C. to thereby obtain a product. The reaction was cooled to room temperature and then subjected to an extraction process three times utilizing dichloromethane and water to thereby obtain an organic layer. The obtained organic layer was dried utilizing magnesium sulfate and concentrated, and column chromatography (dichloromethane:hexane=a volume ratio of 1:9) was utilized to purify Intermediate Compound 81-d (yield: 76%).

(5) Synthesis of Intermediate Compound [81-e]

Intermediate Compound [81-e] was synthesized in substantially the same manner as utilized to synthesize Intermediate Compound [1-f] of Synthesis Example 1, except that Intermediate Compound [81-d] was utilized instead of Intermediate Compound [1-e]. (yield: 85%)

(6) Synthesis of Intermediate Compound [81-f]

Intermediate Compound [81-f] was synthesized in substantially the same manner as utilized to synthesize Intermediate Compound [1-g] of Synthesis Example 1, except that Intermediate Compound [81-e] was utilized instead of Intermediate Compound [1-f]. (yield: 90%)

(7) Synthesis of Compound [81]

Compound [81] was synthesized in substantially the same manner as utilized to synthesize Compound [1] of Synthesis Example 1, except that Intermediate Compound [81-f] was utilized instead of Intermediate Compound [1-g]. (yield: 20%)

Synthesis Example 10: Synthesis of Compound 90

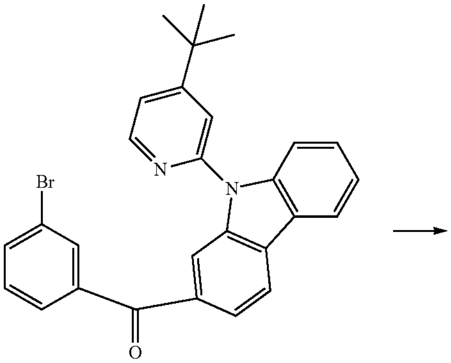

81-c

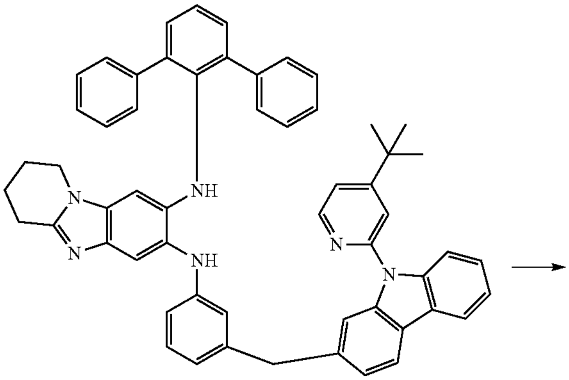

90-b

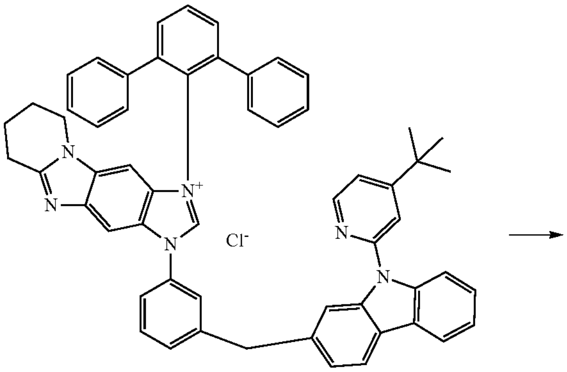

90-c

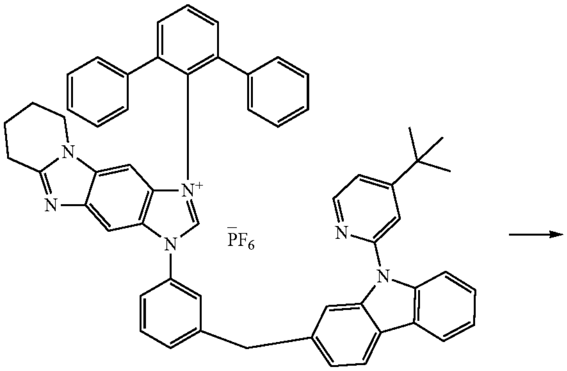

90-d

-continued

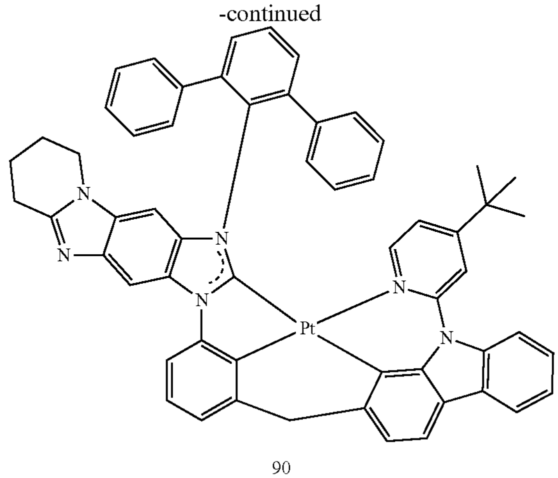

90

(1) Synthesis of Intermediate Compound [90-a]

Intermediate Compound [81-c] (1.0 eq), triethylsilane (2.0 eq), and 1,3-dimethyl-1H-naphtho[1,8-de]-1,2,3-triazinium tetrakis(2,3,4,5,6-pentafluorophenyl)borate (0.05 eq) were dissolved in dichloromethane (0.1 M) and then stirred for 24 hours at room temperature to thereby obtain a product. The reaction was cooled to room temperature and then subjected to an extraction process three times utilizing dichloromethane and water to thereby obtain an organic layer. The obtained organic layer was dried utilizing magnesium sulfate and concentrated, and column chromatography was utilized to purify Intermediate Compound 90-a (yield: 95%).

(2) Synthesis of Intermediate Compound[90-b]

Intermediate Compound [1-d] (1.2 eq), Intermediate Compound [90-a] (1.0 eq), $Pd_2(dba)_3$ (5 mol %), Xphos (7 mol %), and sodium tert-butoxide (2.0 eq) were dissolved in 1,4-dioxane (0.1 M) and then stirred for 2 hours at 110° C. to thereby obtain a product. The reaction was cooled to room temperature and then subjected to an extraction process three times utilizing dichloromethane and water to thereby obtain an organic layer. The obtained organic layer was dried utilizing magnesium sulfate and concentrated, and column chromatography (dichloromethane:hexane=a volume ratio of 1:9) was utilized to purify Intermediate Compound 90-b (yield: 69%).

(3) Synthesis of Intermediate Compound [90-c]

Intermediate Compound [90-c] was synthesized in substantially the same manner as utilized to synthesize Intermediate Compound [1-f] of Synthesis Example 1, except that Intermediate Compound [90-b] was utilized instead of Intermediate Compound [1-e]. (yield: 89%)

(4) Synthesis of Intermediate Compound [90-d]

Intermediate Compound [90-c] was synthesized in substantially the same manner as utilized to synthesize Intermediate Compound [1-g] of Synthesis Example 1, except that Intermediate Compound [90-c] was utilized instead of Intermediate Compound [1-f]. (yield 95%)

(5) Synthesis of Compound [90]

Compound [90] was synthesized in substantially the same manner as utilized to synthesize Compound [1] of Synthesis Example 1, except that Intermediate Compound [90-d] was utilized instead of Intermediate Compound [1-g]. (yield: 21%)

$^1$H NMR and MALDI-TOF MS of the compounds synthesized according to Synthesis Examples 1 to 10 are shown in Table 1. Synthesis methods of other compounds in addition to the compounds synthesized in Synthesis Examples 1 to 10 may be easily recognized by those skilled in the art by referring to the synthesis paths and source materials.

TABLE 1

| | | MALDI-TOF MS [M$^+$] | |
|---|---|---|---|
| Compound | $^1$H NMR ($CDCl_3$, 500 MHz) | found | calc. |
| 1 | 8.74 (1H, dd), 8.39 (1H, m), 8.20-8.19 (3H, m), 7.58 (1H, s), 7.50 (1H, s), 7.44 (2H, m), 7.41 (1H, s), 7.40 (1H, s), 7.39 (1H, dd), 7.21 (1H, s), 7.17 (1H, dd), 7.08 (4H, m), 6.90 (1H, s), 6.69 (1H, dd), 6.66 (1H, s), 3.99 (2H, t), 2.53 (2H, t), 2.09 (2H, t), 1.87 (2H, t), 1.32 (9H, s) | 1024.10 | 1024.16 |
| 9 | 9.08 (1H, s), 8.39 (1H, dd), 8.20-8.19 (3H, m), 7.59 (1H, s), 7.58 (1H, s), 7.51 (2H, m), 7.50 (1H, s), 7.46 (2H, m), 7.42 (1H, s), 7.44 (2H, m), 7.39 (1H, dd), 7.21 (1H, s), 7.17 (1H, dd), 7.08 (4H, m), 6.90 (1H, s), 6.69 (1H, dd), 6.66 (1H, s), 3.99 (2H, t), 2.68 (3H, s), 2.53 (2H, t), 2.09 (2H, t), 1.87 (2H, t) | 1058.12 | 1058.10 |
| 10 | 8.74 (1H, dd), 8.39 (1H, d), 8.36 (1H, dd), 8.20 (3H, m), 7.62 (1H, dd), 7.50 (1H, s), 7.44 (2H, m), 7.43 (4H, m), 7.41 (3H, m), 7.40 (1H, s), 7.39 (1H, t), 7.17 (1H, dd), 7.08 (4H, dd), 6.90 (1H, s), 6.69 (1H, s), 6.66 (1H, dd), 3.99 (2H, t), 2.53 (2H, tt), 2.09 (2H, tt), 1.87 (2H, m), 1.43 (9H, s), 1.32 (9H, s) | 1079.39 | 1079.32 |
| 13 | 8.74 (1H, dd), 8.39 (1H, d), 8.36 (2H, dd), 7.62 (1H, dd), 7.50 (1H, s), 7.44 (2H, m), 7.40 (1H, s), 7.17 (1H, dd), 6.90 (1H, s), 6.69 (1H, s), 6.66 (1H, dd), 3.99 (2H, t), 3.36 (3H, s), 2.53 (2H, tt), 2.09 (2H, tt), 1.87 (2H, m), 1.43 (9H, s), 1.32 (9H, s) | 865.95 | 865.71 |

TABLE 1-continued

| Compound | $^1H$ NMR ($CDCl_3$, 500 MHz) | MALDI-TOF MS [$M^+$] found | calc. |
|---|---|---|---|
| 19 | 8.74 (1H, dd), 8.39 (1H, m), 8.20-8.19 (3H, m), 7.58 (1H, s), 7.50 (1H, s), 7.44 (2H, m), 7.41 (1H, s), 7.40 (1H, s), 7.39 (1H, dd), 7.21 (1H, s), 7.08 (4H, m), 6.90 (1H, s), 6.69 (1H, dd), 6.66 (1H, s), 3.99 (2H, t), 2.53 (2H, t), 2.09 (2H, t), 1.87 (2H, t), 1.32 (18H, s) | 1024.10 | 1024.25 |
| 47 | 9.08 (1H, s), 8.39 (1H, dd), 8.20-8.19 (3H, m), 7.59 (1H, s), 7.58 (1H, s), 7.51 (2H, m), 7.50 (1H, s), 7.46 (2H, m), 7.44 (2H, m), 7.39 (1H, dd), 7.21 (1H, s), 7.17 (1H, dd), 7.08 (4H, m), 6.90 (1H, s), 6.69 (1H, dd), 6.66 (1H, s), 3.99 (2H, t), 2.68 (3H, s), 2.53 (2H, t), 2.09 (2H, t), 1.87 (2H, t), 1.33 (9H, s) | 1114.23 | 1114.25 |
| 51 | 8.74 (1H, dd), 8.39 (1H, m), 8.19 (1H, s), 7.94 (1H, s), 7.90 (1H, dd), 7.75 (4H, m), 7.73 (1H, s), 7.65 (1H, s), 7.61 (2H, dd), 7.58 (1H, s), 7.56 (1H, s), 7.50 (1H, s), 7.49 (4H, m), 7.44 (2H, m), 7.41 (2H, m), 7.40 (1H, s), 7.21 (1H, s), 7.17 (1H, dd), 6.90 (1H, s), 6.69 (1H, dd), 6.66 (1H, s), 3.99 (2H, t), 2.53 (2H, t), 2.09 (2H, t), 1.87 (2H, t), 1.32 (9H, s) | 1110.20 | 1110.29 |
| 74 | 9.08 (1H, s), 8.39 (1H, dd), 8.20-8.19 (3H, m), 7.63 (1H, s), 7.59 (1H, s), 7.58 (1H, s), 7.51 (2H, m), 7.50 (1H, s), 7.46 (2H, m), 7.42 (1H, s), 7.44 (2H, m), 7.41 (2H, dd), 7.39 (1H, dd), 7.21 (1H, s), 7.08 (4H, m), 6.90 (1H, s), 6.69 (1H, dd), 6.66 (1H, s), 3.99 (2H, t), 2.88 (2H, tt), 2.68 (3H, s), 2.53 (2H, t), 2.09 (2H, t), 1.87 (2H, t), 1.18 (12H, dd) | 1218.38 | 1218.33 |
| 81 | 8.74 (1H, dd), 8.39 (1H, m), 8.20-8.19 (3H, m), 7.58 (1H, s), 7.50 (1H, s), 7.44 (2H, m), 7.41 (1H, s), 7.40 (1H, s), 7.39 (1H, dd), 7.21 (1H, s), 7.17 (1H, dd), 7.08 (4H, m), 6.90 (1H, s), 6.69 (1H, dd), 6.66 (1H, s), 3.99 (2H, t), 2.53 (2H, t), 2.09 (2H, t), 1.87 (2H, t), 1.32 (9H, s) | 1036.12 | 1036.11 |
| 90 | 8.74 (1H, dd), 8.39 (1H, m), 8.20 (3H, m), 7.58 (1H, s), 7.50 (1H, s), 7.44 (2H, m), 7.41 (1H, s), 7.40 (1H, s), 7.39 (1H, dd), 7.21 (1H, s), 7.17 (1H, dd), 7.08 (4H, m), 6.90 (1H, s), 6.69 (1H, dd), 6.66 (1H, s), 4.35 (2H, s), 3.99 (2H, t), 2.53 (2H, t), 2.09 (2H, t), 1.87 (2H, t), 1.32 (9H, s) | 1022.13 | 1022.16 |

Evaluation Example 1

HOMO energies, LUMO energies, $^3$MLCT(%), simulated (e.g., calculated) maximum emission wavelengths ($\lambda_{max}^{sim}$), real (e.g., experimental) maximum emission wavelengths ($\lambda_{max}^{exp}$), and $^3$MC energies of the compounds prepared in Synthesis Examples 1 to 10 and Comparative Examples 1 to 3 were measured, and the results are shown in Table 2.

For example, characteristics of Compounds 1, 9, 10, 13, 19, 47, 51, 74, 81, and 90, and Compounds A and B (as comparative compounds) were evaluated, and the HOMO and LUMO energy were measured by differential pulse voltammetry. The "bandgap" is an absolute value of a difference between a LUMO energy level and a HOMO energy level. The $^3$MC state energy level value was evaluated utilizing the B3LYP functional. The $^3$MLCT(%) value was measured by structural optimization at the level of B3LYP, 6-31 G(d,p) utilizing a density functional theory (DFT) calculation method of the Gaussian program.

TABLE 2

| | Compound | HOMO (eV) | LUMO (eV) | Bandgap (eV) | $\lambda_{max}^{sim}$ (nm) | $\lambda_{max}^{exp}$ (nm) | $^3$MC (Kcal/mol) | $^3$MLCT (%) |
|---|---|---|---|---|---|---|---|---|
| Synthesis Example 1 | 1 | −4.92 | −1.44 | 3.48 | 469 | 458 | 0.62 | 12.1 |
| Synthesis Example 2 | 9 | −4.92 | −1.48 | 3.44 | 467 | 460 | 0.67 | 13.6 |
| Synthesis Example 3 | 10 | −4.95 | −1.42 | 3.53 | 465 | 458 | 0.55 | 12.1 |
| Synthesis Example 4 | 13 | −4.88 | −1.41 | 3.47 | 465 | 465 | 0.48 | 11.3 |
| Synthesis Example 5 | 19 | −4.99 | −1.41 | 3.58 | 463 | 457 | 0.68 | 12.8 |

TABLE 2-continued
| | Compound | HOMO (eV) | LUMO (eV) | Bandgap (eV) | $\lambda_{max}^{sim}$ (nm) | $\lambda_{max}^{exp}$ (nm) | $^3$MC (Kcal/mol) | $^3$MLCT (%) |
|---|---|---|---|---|---|---|---|---|
| Synthesis Example 6 | 47 | −5.01 | −1.29 | 3.72 | 465 | 456 | 0.62 | 12.1 |
| Synthesis Example 7 | 51 | −4.92 | −1.36 | 3.56 | 462 | 459 | 0.62 | 12.1 |
| Synthesis Example 8 | 74 | −4.98 | −1.47 | 3.51 | 459 | 457 | 0.67 | 10.8 |
| Synthesis Example 9 | 81 | −4.97 | −1.34 | 3.63 | 459 | 458 | 0.67 | 11.3 |
| Synthesis Example 10 | 90 | −4.89 | −1.45 | 3.44 | 456 | 462 | 0.68 | 12.1 |
| Comparative Example 1 | A | −4.76 | −1.77 | 2.99 | 469 | 462 | 0.33 | 8.4 |
| Comparative Example 2 | B | −5.01 | −1.68 | 3.33 | 470 | 461 | 0.45 | 11.1 |
| Comparative Example 3 | C | −4.88 | −1.50 | 3.38 | 468 | 471 | 0.21 | 8.8 |
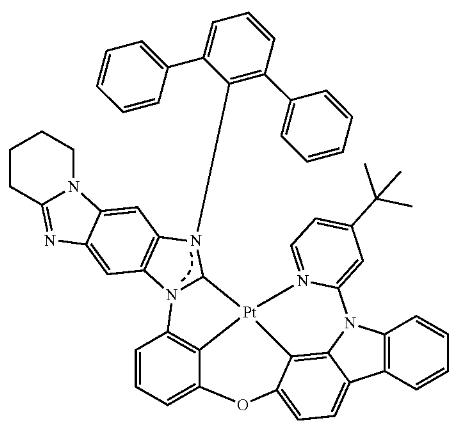
1
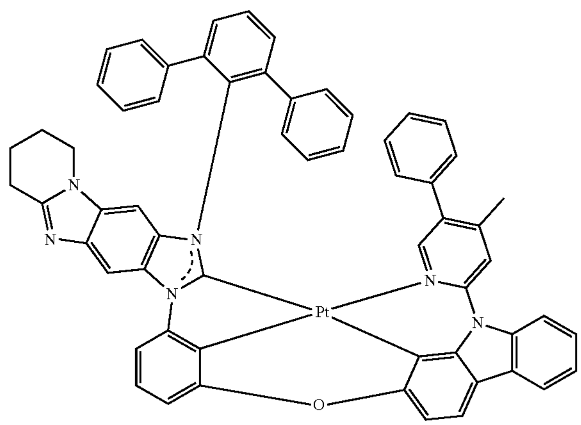
9

TABLE 2-continued
| Compound | HOMO (eV) | LUMO (eV) | Bandgap (eV) | $\lambda_{max}^{sim}$ (nm) | $\lambda_{max}^{exp}$ (nm) | $^3$MC (Kcal/mol) | $^3$MLCT (%) |
|---|---|---|---|---|---|---|---|
| 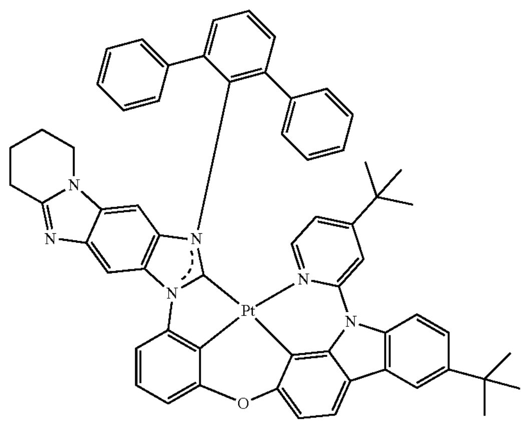 10 | | | | | | | |
| 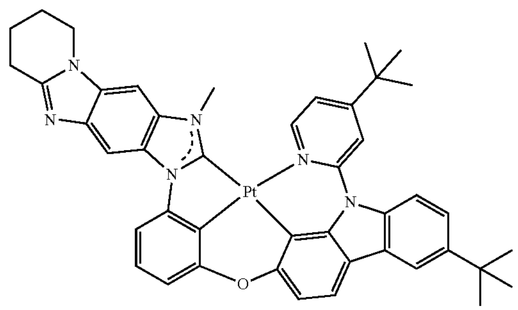 13 | | | | | | | |
| 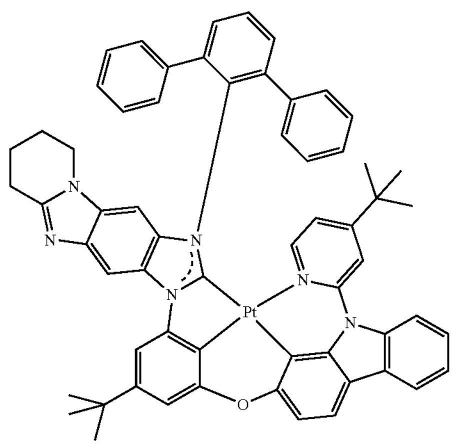 19 | | | | | | | |

TABLE 2-continued
| Compound | HOMO (eV) | LUMO (eV) | Bandgap (eV) | $\lambda_{max}^{sim}$ (nm) | $\lambda_{max}^{exp}$ (nm) | $^3$MC (Kcal/mol) | $^3$MLCT (%) |
|---|---|---|---|---|---|---|---|
| 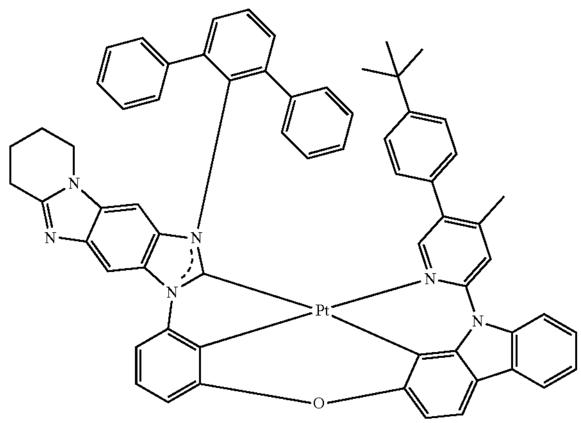 47 | | | | | | | |
| 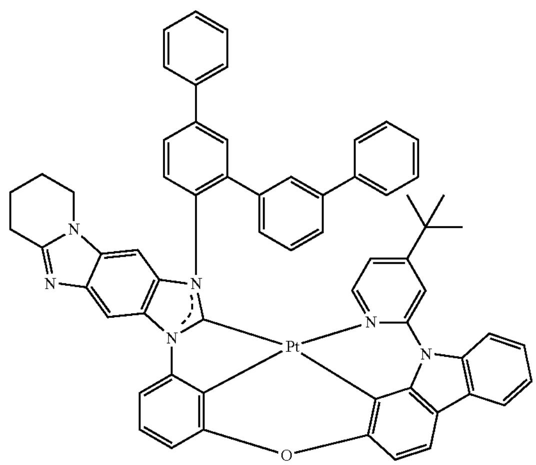 51 | | | | | | | |
| 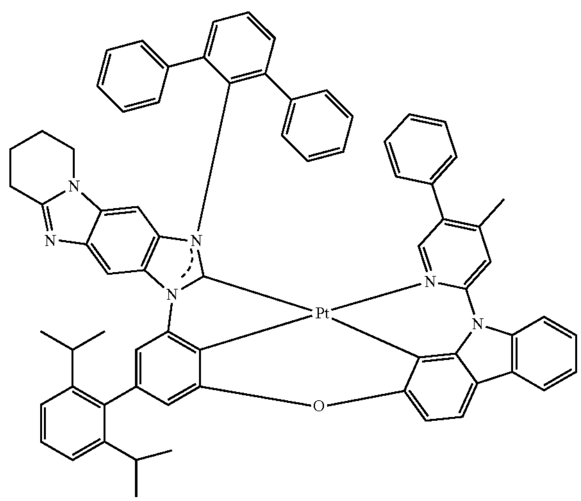 74 | | | | | | | |

TABLE 2-continued
| Compound | HOMO (eV) | LUMO (eV) | Bandgap (eV) | $\lambda_{max}^{sim}$ (nm) | $\lambda_{max}^{exp}$ (nm) | $^3$MC (Kcal/mol) | $^3$MLCT (%) |
|---|---|---|---|---|---|---|---|
| 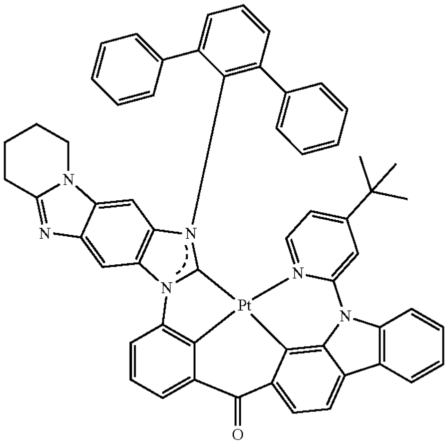 81 | | | | | | | |
| 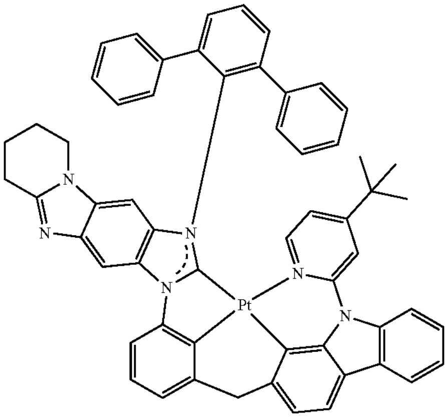 90 | | | | | | | |
| 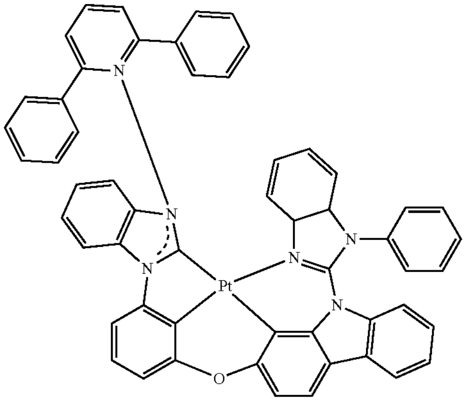 A | | | | | | | |

TABLE 2-continued

| Compound | HOMO (eV) | LUMO (eV) | Bandgap (eV) | $\lambda_{max}^{sim}$ (nm) | $\lambda_{max}^{exp}$ (nm) | $^3$MC (Kcal/mol) | $^3$MLCT (%) |
|---|---|---|---|---|---|---|---|
| 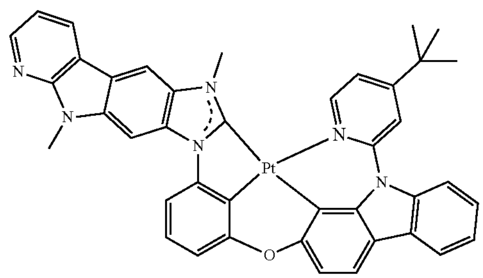 B | | | | | | | |
| 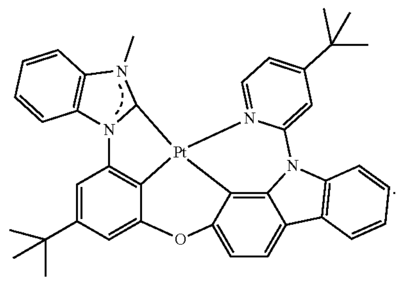 C | | | | | | | |

Example 1

As an anode, a glass substrate (product of Corning Inc.) with a 15 Ω/cm$^2$ (1,200 Å) ITO formed thereon was cut to a size of 50 mm×50 mm×0.7 mm, sonicated utilizing isopropyl alcohol and pure water each for 5 minutes, washed by irradiation of ultraviolet rays and exposure of ozone thereto for 30 minutes, and then mounted on a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, referred as "NPB") was vacuum-deposited on the hole injection layer to form a hole transport layer having a thickness of 300 Å.

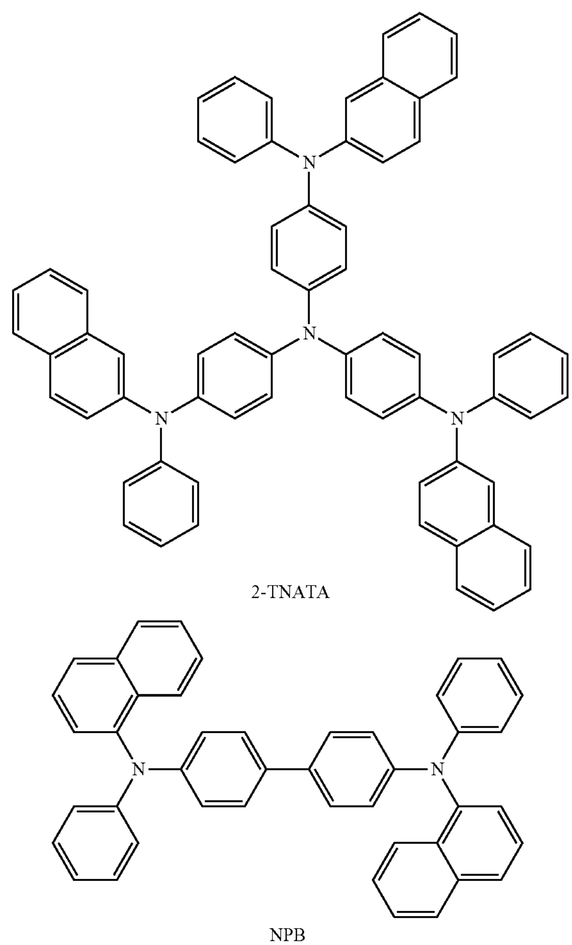
2-TNATA

NPB

Compound 1 (first compound), Compound ETH66 (second compound), and Compound HTH29 (third compound) were vacuum-deposited on the hole transport layer to form an emission layer having a thickness of 400 Å. In this regard, an amount of Compound 1 was 10 wt % based on the total weight of the emission layer (100 wt %), and a weight ratio of Compound ETH66 and Compound HTH29 was adjusted to 3:7.

Compound ETH2 was vacuum-deposited on the emission layer to form a hole blocking layer having a thickness of 50 Å, Alq3 was vacuum-deposited on the hole blocking layer to form an electron transport layer having a thickness of 300 Å, LiF was vacuum-deposited on the electron transport layer to form an electron injection layer having a thickness of 10 Å, and then Al was vacuum-deposited thereon to form a cathode having a thickness of 3,000 Å, thereby completing manufacture of an organic light-emitting device.

-continued

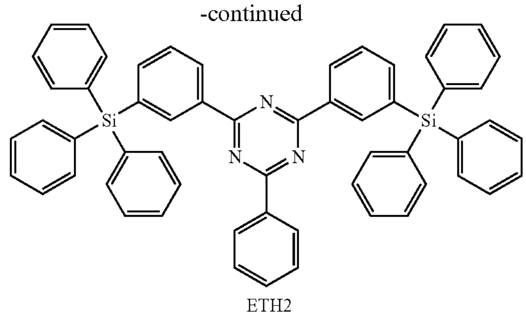

ETH2

Examples 2 to 10

Additional organic light-emitting devices were manufactured in substantially the same manner as in Example 1, except that the compounds described in Table 3 were utilized as the first compound, the second compound, and the third compound in the formation of the emission layer.

Example 11

In forming an emission layer, an organic light-emitting device was manufactured in substantially the same manner as in Example 1, except that Compound 1 (first compound), Compound ETH66 (second compound), Compound HTH29 (third compound), and Compound DFD1 (fourth compound) instead of Compound 1 (first compound), Compound ETH66 (second compound), and Compound HTH29 (third compound) were vacuum-deposited on the hole transport layer. In this regard, an amount of Compound 1 was 10 wt % based on the total weight of the emission layer (100 wt %), an amount of Compound DFD1 is 0.5 wt % based on the total weight of the emission layer (100 wt %), and a weight ratio of Compound ETH66 to Compound HTH29 was adjusted to 3:7.

Evaluation Example 2

Driving voltage (V) at 1,000 cd/m$^2$, luminescence efficiency (cd/A), color conversion efficiency (cd/A/y), maximum emission wavelength (nm), and lifespan ($T_{90}$) of the organic light-emitting devices manufactured in Examples 1 to 11 were each measured utilizing a Keithley MU 236 and a luminance meter PR650, and results thereof are shown in Tables 3 and 4, respectively. In Table 4, the lifespan ($T_{90}$) is a measure of the time (hr) taken when the luminance reaches 90% of the initial luminance.

TABLE 3

| | Dopant | Host | | Auxiliary dopant | | Driving | Luminescence |
|---|---|---|---|---|---|---|---|
| No. | First compound | Second compound | Third compound | Fourth compound | Luminance (cd/m$^2$) | Voltage (V) | efficiency (cd/A) |
| Example 1 | 1 | ETH66 | HTH29 | — | 1000 | 4.8 | 52.3 |
| Example 2 | 9 | ETH66 | HTH29 | — | 1000 | 4.8 | 49.0 |
| Example 3 | 10 | ETH66 | HTH41 | — | 1000 | 4.9 | 53.7 |
| Example 4 | 13 | ETH66 | HTH29 | — | 1000 | 4.9 | 45.6 |
| Example 5 | 19 | ETH66 | HTH29 | — | 1000 | 4.8 | 51.1 |
| Example 6 | 47 | ETH66 | HTH29 | — | 1000 | 4.9 | 45.9 |
| Example 7 | 51 | ETH66 | HTH29 | — | 1000 | 4.8 | 46.1 |
| Example 8 | 74 | ETH66 | HTH29 | — | 1000 | 4.9 | 47.0 |
| Example 9 | 81 | ETH66 | HTH29 | — | 1000 | 4.9 | 43.3 |
| Example 10 | 90 | ETH66 | HTH29 | — | 1000 | 4.9 | 43.0 |
| Example 11 | 1 | ETH66 | HTH29 | DFD1 | 1000 | 4.9 | 44.3 |
| Comparative Example 1 | A | ETH66 | HTH29 | — | 1000 | 5.4 | 21.4 |
| Comparative Example 2 | B | ETH66 | HTH29 | — | 1000 | 5.5 | 30.0 |
| Comparative Example 3 | C | ETH66 | HTH29 | — | 1000 | 5.0 | 22.3 |
| Comparative Example 4 | B | ETH66 | HTH29 | DFD1 | 1000 | 5.1 | 39.6 |

TABLE 4

| | Dopant | Host | | Auxiliary dopant | Color conversion | Maximum wavelength | Lifespan |
|---|---|---|---|---|---|---|---|
| No. | First compound | Second compound | Third compound | Fourth compound | efficiency (cd/A/y) | emission (nm) | ($T_{90}$) (hr) |
| Example 1 | 1 | ETH66 | HTH29 | — | 366 | 458 | 87 |
| Example 2 | 9 | ETH66 | HTH29 | — | 345 | 460 | 76 |
| Example 3 | 10 | ETH66 | HTH41 | — | 376 | 458 | 75 |
| Example 4 | 13 | ETH66 | HTH29 | — | 319 | 465 | 77 |
| Example 5 | 19 | ETH66 | HTH29 | — | 355 | 457 | 70 |
| Example 6 | 47 | ETH66 | HTH29 | — | 321 | 456 | 80 |
| Example 7 | 51 | ETH66 | HTH29 | — | 322 | 459 | 65 |
| Example 8 | 74 | ETH66 | HTH29 | — | 327 | 457 | 81 |
| Example 9 | 81 | ETH66 | HTH29 | — | 300 | 458 | 79 |
| Example 10 | 90 | ETH66 | HTH29 | — | 301 | 462 | 75 |
| Example 11 | 1 | ETH66 | HTH29 | DFD1 | 310 | 460 | 97 |

TABLE 4-continued
| No. | Dopant | Host | | Auxiliary dopant | Color conversion | Maximum wavelength | Lifespan |
|---|---|---|---|---|---|---|---|
| | First compound | Second compound | Third compound | Fourth compound | efficiency (cd/A/y) | emission (nm) | ($T_{90}$) (hr) |
| Comparative Example 1 | A | ETH66 | HTH29 | — | 126 | 462 | 61 |
| Comparative Example 2 | B | ETH66 | HTH29 | — | 210 | 461 | 71 |
| Comparative Example 3 | C | ETH66 | HTH29 | — | 160 | 471 | 53 |
| Comparative Example 4 | B | ETH66 | HTH29 | DFD1 | 206 | 461 | 76 |
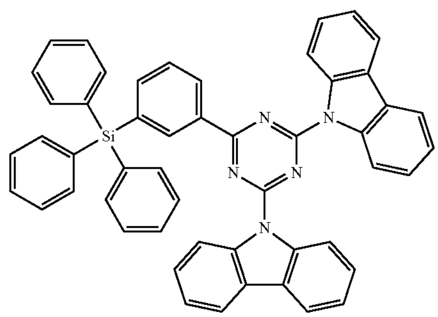
ETH66
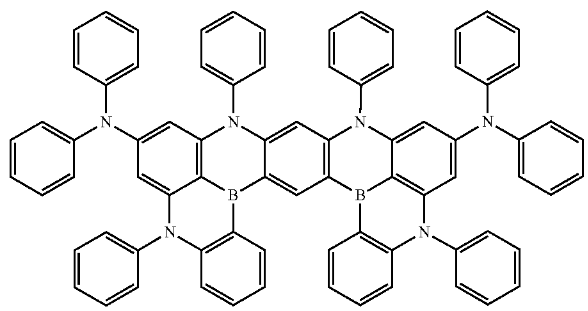
DFD1
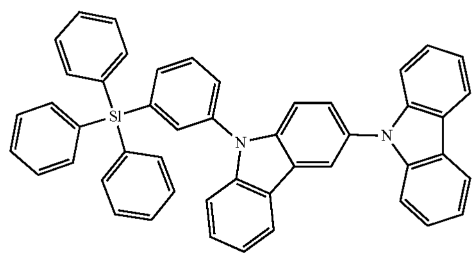
HTH29
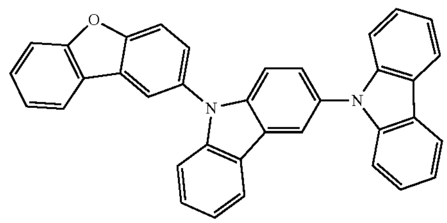
HTH41

From Tables 3 and 4, it may be confirmed that the organic light-emitting devices of Examples 1 to 11 each emit deep blue light, and also have excellent or suitable driving voltage, luminescence efficiency, color conversion efficiency, and/or lifespan characteristics.

Terms such as "substantially," "about," and "~" are used as terms of approximation and not as terms of degree, and are intended to account for the inherent deviations in measured or calculated values that would be recognized by those of ordinary skill in the art. They may be inclusive of the stated value and an acceptable range of deviation as determined by one of ordinary skill in the art, considering the limitations and error associated with measurement of that quantity. For example, "about" may refer to one or more standard deviations, or ±30%, 20%, 10%, 5% of the stated value.

Numerical ranges disclosed herein include and are intended to disclose all subsumed sub-ranges of the same numerical precision. For example, a range of "1.0 to 10.0" includes all subranges having a minimum value equal to or greater than 1.0 and a maximum value equal to or less than 10.0, such as, for example, 2.4 to 7.6. Applicant therefore reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that various changes in form and details may be made therein without departing from the spirit and scope as defined by the following claims and equivalents thereof.

What is claimed is:

1. A light-emitting device comprising:

a first electrode;

a second electrode facing the first electrode; and an interlayer between the first electrode and the second electrode and comprising an emission layer, wherein the emission layer comprises:

i) a first compound, which is an organometallic compound represented by Formula 1;

ii) a second compound comprising at least one π electron-deficient nitrogen-containing $C_1$-$C_{60}$ cyclic group, a third compound comprising a group represented by Formula 3, a fourth compound to emit delayed fluorescence, or any combination thereof, wherein the first compound, the second compound, the third compound, and the fourth compound are different from each other:

Formula 1

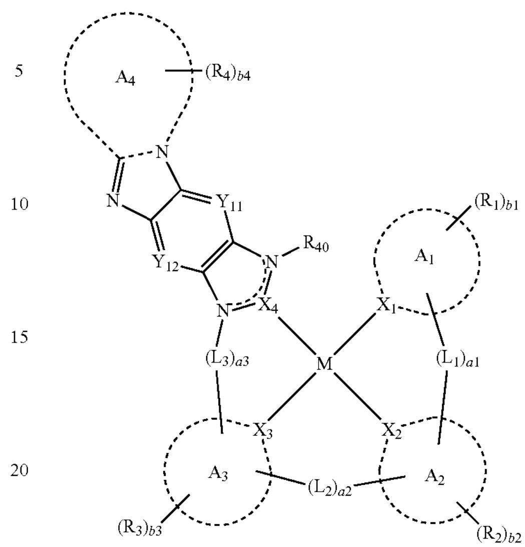

Formula 3

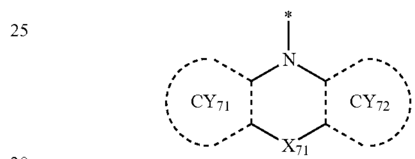

Formulae A4(1) to A4(8)

A4(1)

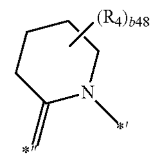

A4(2)

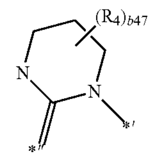

A4(3)

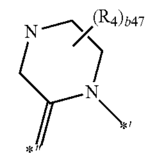

A4(4)

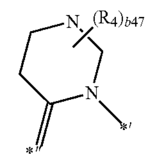

-continued

A4(5)

A4(6)

A4(7)

A4(8)

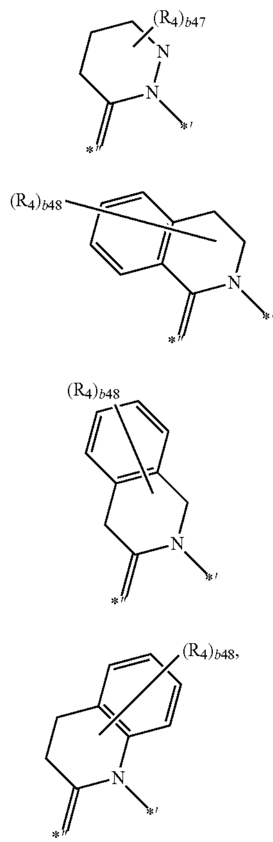

wherein, in Formula 1 and Formulae A4(1) to A4(8),

M is platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_4$ are each independently C or N, $Y_{11}$ is $C(Z_{11})$ or N, $Y_{12}$ is $C(Z_{12})$ or N, $A_1$ to $A_3$ are each independently a $C_3$-$C_{60}$ carbocyclic group or a $C_1$-$C_{60}$ heterocyclic group, a group in Formula 1 represented by

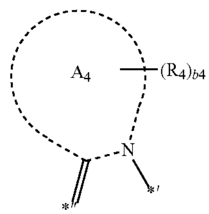

is represented by one of Formulae A4(1) to A4(8), $L_1$ to $L_3$ are each independently a single bond, a double bond, *—N($Z_{21}$)—*', *—B($Z_{21}$)—*', *—P($Z_{21}$)—*', *—C($Z_{21}$)($Z_{22}$)—*', *—Si($Z_{21}$)($Z_{22}$)—*', *—Ge($Z_{21}$)($Z_{22}$)—*', *—S—*', *—Se—*', *—O—*', *—C(═O)*', *—S(═O)$_2$—*', *—C($Z_{21}$)═*', *═C($Z_{21}$)—*', *—C($Z_{21}$)═C($Z_{22}$)—*', *—C(═S)—*', or *≡C C—*',

*, *' and *" each indicate a binding site to a neighboring atom, a1 to a3 are each independently an integer from 0 to 3, b48 is an integer from 0 to 8, b47 is an integer from 0 to 7, $R_1$ to $R_4$, $R_{40}$, $Z_{11}$, $Z_{12}$, $Z_{21}$, and $Z_{22}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), two or more neighboring groups of $R_1$ to $R_4$, $R_{40}$, $Z_{11}$, $Z_{12}$, $Z_{21}$, and $Z_{22}$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b1 to b3 are each independently an integer from 0 to 10, when b1 is 2 or more, two or more $R_1$(s) are identical to or different from each other, when b2 is 2 or more, two or more $R_2$(s) are identical to or different from each other, and when b3 is 2 or more, two or more $R_3$(s) are identical to or different from each other, $R_{10a}$ is:

deuterium, —F, —Cl, —Br, —I, a hydroxyl group, a cyano group, or a nitro group;

a $C_1$-$C_{60}$ alkylgroup, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a -hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(═O)($Q_{11}$), —S(═O)($Q_{11}$), —S(═O)$_2$($Q_{11}$), —P(═O)($Q_{11}$)($Q_{12}$), —P(═S)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(═O)($Q_{21}$), —S(═O)($Q_{21}$), —S(═O)$_2$($Q_{21}$), —P(═O)($Q_{21}$)($Q_{22}$), —P(═S)($Q_{21}$)($Q_{22}$), or any combination thereof; or —Si($Q_{31}$)($Q_{32}$)($Q_3$), —N($Q_{31}$)($Q_{32}$), —B($Q_{31}$)($Q_{32}$), —P($Q_{31}$)($Q_{32}$), —C(═O)($Q_{31}$), —S(═O)($Q_{31}$), —S(═O)$_2$($Q_{31}$), —P(═O)($Q_{31}$)($Q_{32}$), or —P(═S)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently:

hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and wherein, in Formula 3, ring $CY_{71}$ and ring $CY_{72}$ are each independently a π electron-rich $C_3$-$C_{60}$ cyclic group or a pyridine group, $X_{71}$ is a single bond or a linking group comprising O, S, N, B, C, Si, or any combination thereof, and

* indicates a binding site to a neighboring atom in Formula 3.

2. The light-emitting device of claim 1, wherein the at least one IT electron-deficient nitrogen-containing $C_1$-$C_{60}$ cyclic group in the second compound comprises a pyridine group, a pyrimidine group, a pyrazine group, a pyridazine group, a triazine group, or any combination thereof.

3. The light-emitting device of claim 1, wherein the emission layer comprises the second compound.

4. The light-emitting device of claim 3, wherein the emission layer further comprises the third compound and/or the fourth compound.

5. The light-emitting device of claim 1, wherein the fourth compound comprises at least one cyclic group comprising boron (B) and nitrogen (N) as ring-forming atoms.

6. The light-emitting device of claim 1, wherein the fourth compound comprises a condensed cyclic ring in which at least one third ring and at least one fourth ring are condensed with each other, the third ring is a cyclopentane group, a cyclohexane group, a cycloheptane group, a cyclooctane group, a cyclopentene group, a cyclohexene group, a cycloheptane group, a cyclooctene group, an adamantane group, a norbornene group, a norbornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring is a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

7. The light-emitting device of claim 1, wherein the emission layer comprises the fourth compound.

8. The light-emitting device of claim 1, wherein the first compound in the emission layer is configured to emit phosphorescent or fluorescent light, and the phosphorescent or fluorescent light is blue light.

9. The light-emitting device of claim 1, wherein at least one of Condition 1 to Condition 3 is satisfied:

LUMO energy level of the first compound >−1.50 eV — Condition 1

Absolute value of a difference between a LUMO energy level and a HOMO energy level of the first compound ≥3.40 eV — Condition 2

Energy level of $^3$MC state of the first compound >0.45 kcal/mol, and — Condition 3 wherein the highest occupied molecular orbital (HOMO) energy level and the lowest unoccupied molecular orbital (LUMO) energy level of the first compound are each measured by differential pulse voltammetry, and the energy level of the triplet metal centered ($^3$MC) state of the first compound is evaluated utilizing a density functional theory (DFT) method.

10. An electronic apparatus comprising:

the light-emitting device of claim 1; and a thin-film transistor, wherein the thin-film transistor comprises a source electrode and a drain electrode, and the first electrode of the light-emitting device is electrically connected to the source electrode or the drain electrode of the thin-film transistor.

11. The electronic apparatus of claim 10, further comprising a color filter, a color conversion layer, a touch screen layer, a polarizing layer, or any combination thereof.

12. An organometallic compound represented by Formula 1:

Formula 1

Formula 1

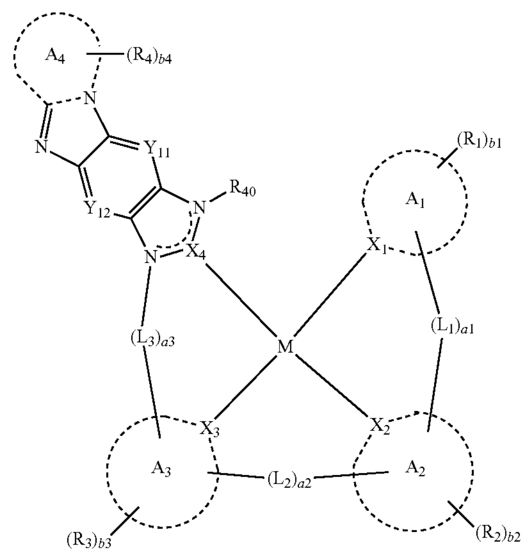

Formulae A4(1) to A4(8)

A4(1)

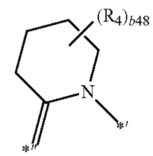

A4(2)

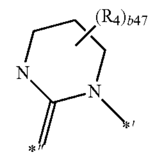

A4(3)

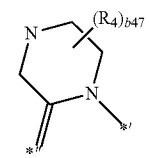

-continued

A4(4)

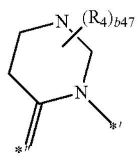

A4(5)

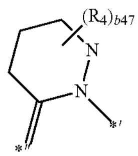

A4(6)

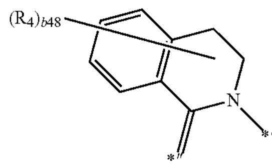

A4(7)

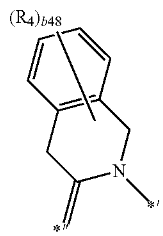

A4(8)

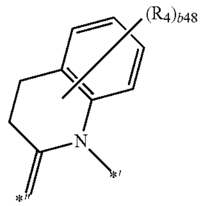

wherein, in Formula 1 and Formulae A4(1) to A4(8),

M is platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_4$ are each independently C or N, $Y_{11}$ is $C(Z_{11})$ or N, $Y_{12}$ is $C(Z_{12})$ or N, $A_1$ to $A_3$ are each independently a $C_3$-$C_{60}$ carbocyclic group or a $C_1$-$C_{60}$ heterocyclic group, a group in Formula 1 represented by

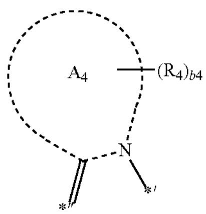

is represented by one of Formulae A4(1) to A4(8), $L_1$ to $L_3$ are each independently a single bond, a double bond, *—N($Z_{21}$)—*', *—B($Z_{21}$)—*', *—P($Z_{21}$)—*', *—C($Z_{21}$)($Z_{22}$)—*, *—Si($Z_{21}$)($Z_{22}$)—*, *—Ge($Z_{21}$)($Z_{22}$)—*, *—S—*', *—Se—*, *—O—*, *—C(═O)*, *—S(═O)$_2$—*', *—C($Z_{21}$)=*, *═C($Z_{21}$)—*, *—C($Z_{21}$) ═C($Z_{22}$)—*, *—C(═S)—*', or *≡C C—*',

*,*' and *'' each indicate a binding site to a neighboring atom, a1 to a3 are each independently an integer from 0 to 3, b48 is an integer from 0 to 8, b47 is an integer from 0 to 7, $R_1$ to $R_4$, $R_{40}$, $Z_{11}$, $Z_{12}$, $Z_{21}$, and $Z_{22}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(═O)($Q_1$), —S(═O)($Q_1$), —S(═O)$_2$($Q_1$), —P(═O)($Q_1$)($Q_2$), or —P(═S)($Q_1$)($Q_2$), two or more neighboring groups of $R_1$ to $R_4$, $R_{40}$, $Z_{11}$, $Z_{12}$, $Z_{21}$, and $Z_{22}$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, b1 to b3 are each independently an integer from 0 to 10, when b1 is 2 or more, two or more $R_1$ (s) are identical to or different from each other, when b2 is 2 or more, two or more $R_2$ (s) are identical to or different from each other, and when b3 is 2 or more, two or more $R_3$ (s) are identical to or different from each other, $R_{10a}$ is:

deuterium, —F, —Cl, —Br, —I, a hydroxyl group, a cyano group, or a nitro group;

a $C_1$-$C_{60}$ alkylgroup, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a -hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(═O)($Q_{11}$), —S(═O)($Q_{11}$), —S(═O)$_2$($Q_{11}$), —P(═O)($Q_{11}$)($Q_{12}$), —P(═S)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(═O)($Q_{21}$), —S(═O)($Q_{21}$), —S(═O)$_2$($Q_{21}$), —P(═O)($Q_{21}$)($Q_{22}$), —P(═S)($Q_{21}$)($Q_{22}$), or any combination thereof; or —Si($Q_{31}$)($Q_{32}$)($Q_3$), —N($Q_{31}$)($Q_{32}$), —B($Q_{31}$)($Q_{32}$), —P($Q_{31}$)($Q_{32}$), —C(═O)($Q_{31}$), —S(═O)($Q_{31}$), —S(═O)$_2$($Q_{31}$), —P(═O)($Q_{31}$)($Q_{32}$), or —P(═S)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently:

hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

13. The organometallic compound of claim 12, wherein the bond between $X_1$ and M, the bond between $X_2$ and M, and the bond between $X_3$ and M are each a covalent bond, and the bond between $X_4$ and M is a coordinate bond.

14. The organometallic compound of claim 12, wherein $Y_{11}$ is C($Z_{11}$), $Y_{12}$ is C($Z_{12}$), and $Z_{11}$ and $Z_{12}$ are each independently:

hydrogen, deuterium, —F, —Cl, —Br, —I, a hydroxyl group, a cyano group, or a nitro group; or a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, —Si($Q_{31}$)($Q_{32}$)($Q_{33}$), —B($Q_{31}$)($Q_{32}$), or any combination thereof.

15. The organometallic compound of claim 12, wherein $A_1$ to $A_3$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

16. The organometallic compound of claim 12, wherein $L_1$ to $L_3$ are each independently a single bond, *—C($Z_{21}$)($Z_{22}$)—*', *—S—*', *—O—*', *—C(═O)—*', or *—S(═O)—*'.

17. The organometallic compound of claim 12, wherein $R_1$ to $R_4$, $R_{40}$, $Z_{11}$, $Z_{12}$, $Z_{21}$, and $Z_{22}$ are each independently:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopropyl group, a cyclobutyl group, a cyclopentyl group, a cyclohexyl group, a cycloheptyl group, a cyclooctyl group, an adamantanyl group, a norbornanyl group, a norbornenyl group, a cyclopropenyl group, a cyclobutenyl group, a cyclopentenyl group, a cyclohexenyl group, a cycloheptenyl group, a phenyl group, a naphthyl group, —Si($Q_{31}$)($Q_{32}$)($Q_{33}$), —B($Q_{31}$)($Q_{32}$), or any combination thereof;

a cyclopropyl group, a cyclobutyl group, a cyclopentyl group, a cyclohexyl group, a cycloheptyl group, a cyclooctyl group, an adamantanyl group, a norbornanyl group, a norbornenyl group, a cyclopropenyl group, a cyclobutenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, a carbazolyl group, a phenanthrolinyl group, a benzofuranyl group, a benzothiophenyl group, a dibenzofuranyl group, a dibenzothiophenyl group, a benzocarbazolyl group, or a dibenzocarbazolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopropyl group, a cyclobutyl group, a cyclopentyl group, a cyclohexyl group, a cycloheptyl group, a cyclooctyl group, an adamantanyl group, a norbornanyl group, a norbornenyl group, a cyclopropenyl group, a cyclobutenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, a carbazolyl group, a phenanthrolinyl group, a benzofuranyl group, a benzothiophenyl group, a dibenzofuranyl group, a dibenzothiophenyl group, a benzocarbazolyl group, a dibenzocarbazolyl group, —Si($Q_{31}$)($Q_{32}$)($Q_{33}$), —B($Q_{31}$)($Q_{32}$), or any combination thereof; or —Si($Q_1$)($Q_2$)($Q_3$) or —B($Q_1$)($Q_2$), and $Q_1$ to $Q_3$ and $Q_{31}$ to $Q_{33}$ are each independently the same as described above.

18. The organometallic compound of claim 12, wherein the organometallic compound is selected from Compounds 1 to 98:

1
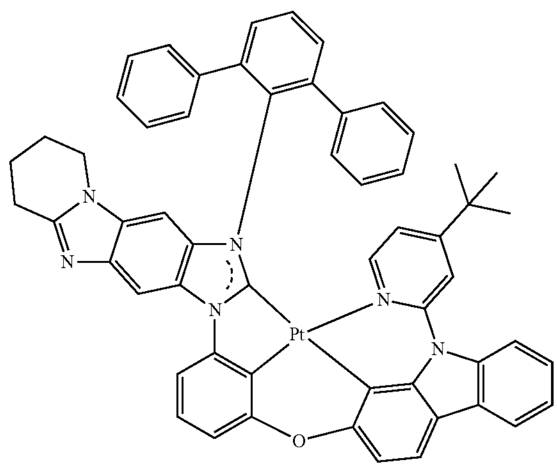
2
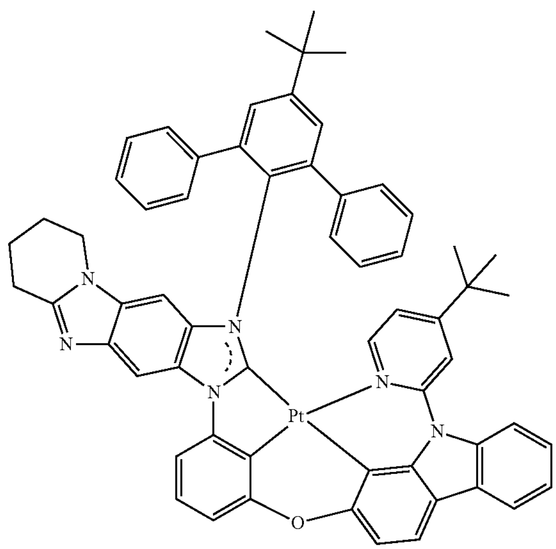
3
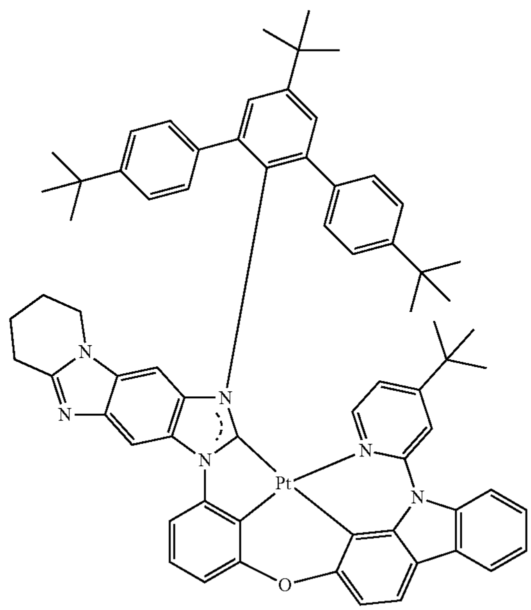
4
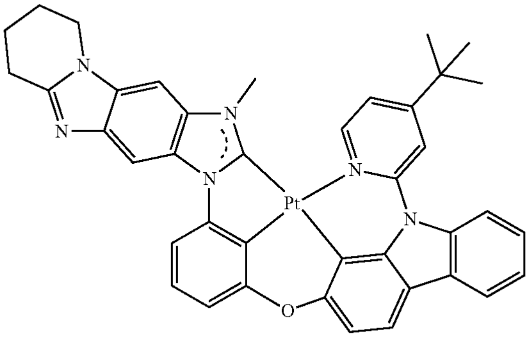
5
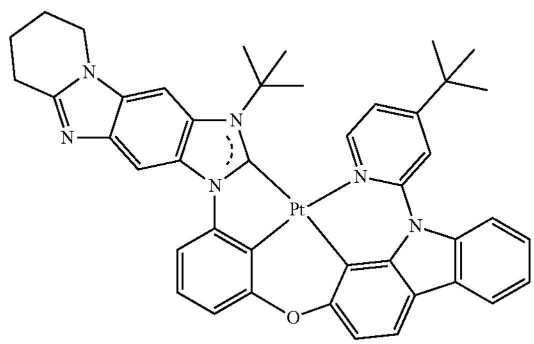
6
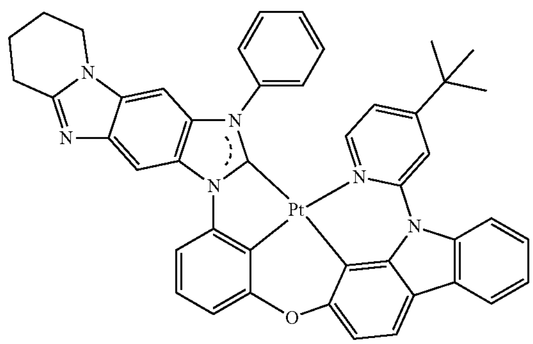

-continued
7
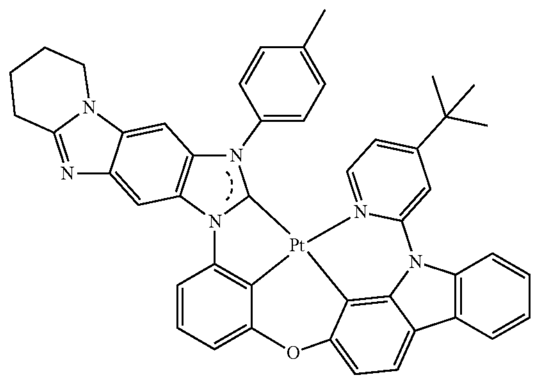
8
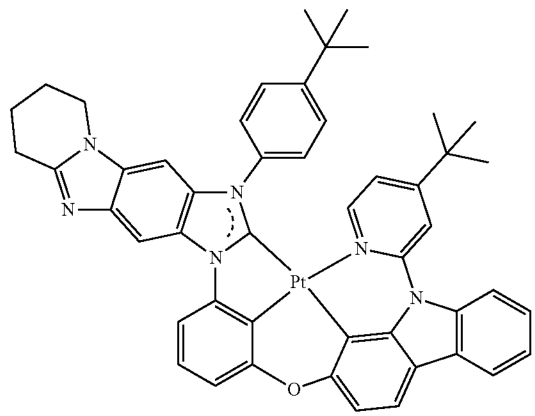
9
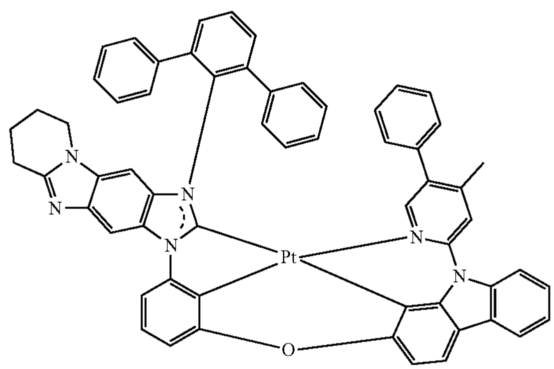
10
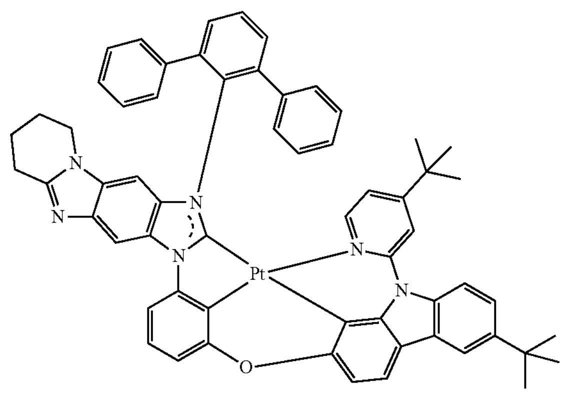
11
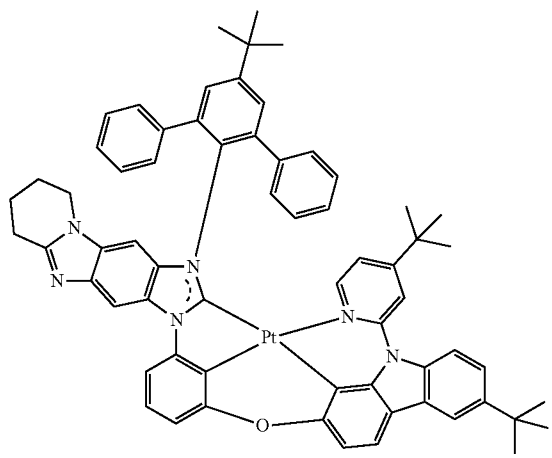
12
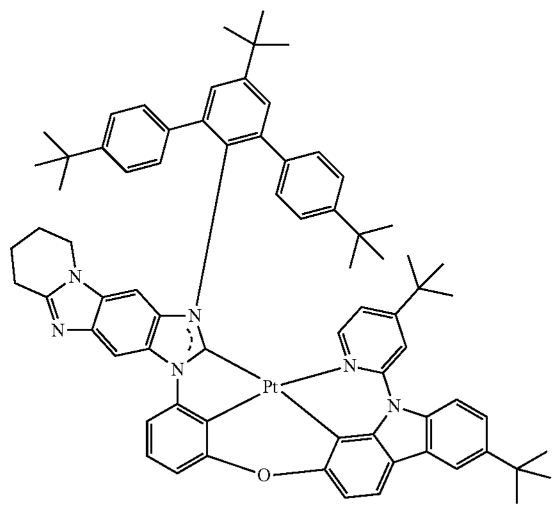
13
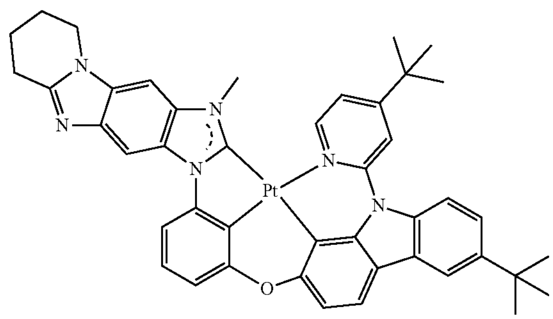
14
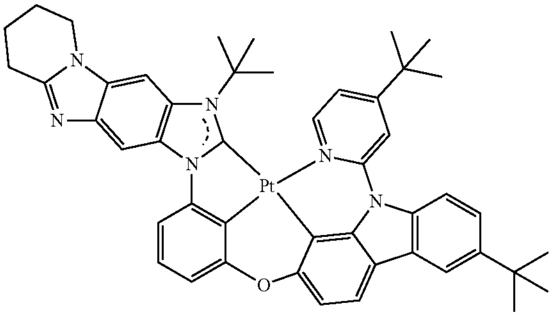

-continued
15
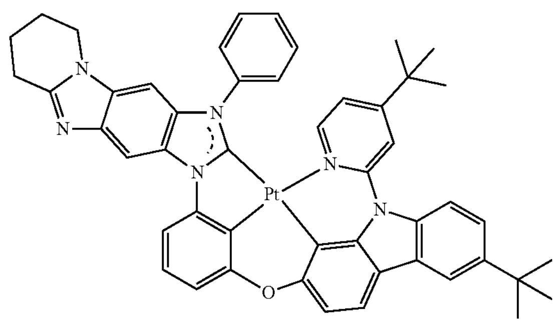
16
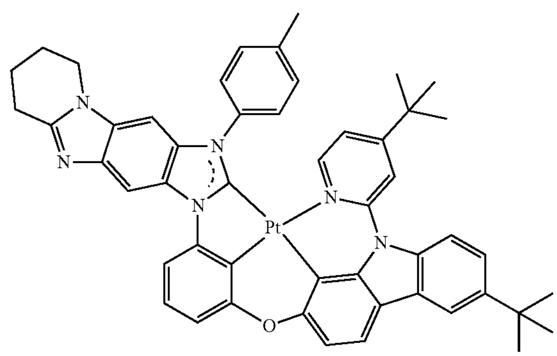
17
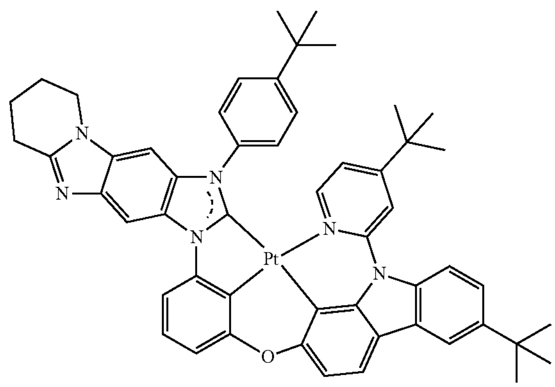
18
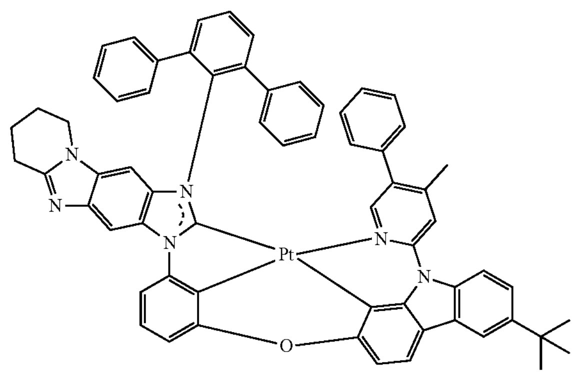
19
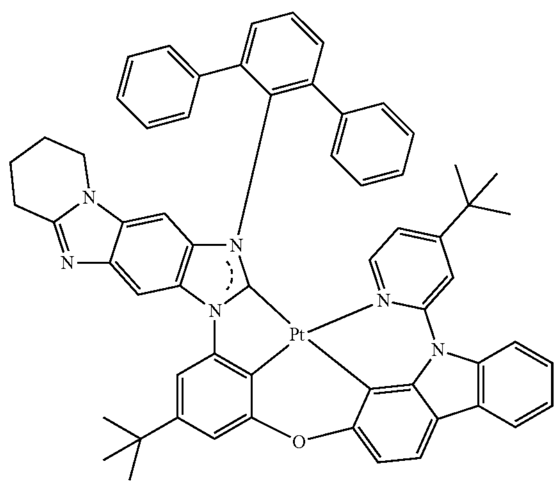
20
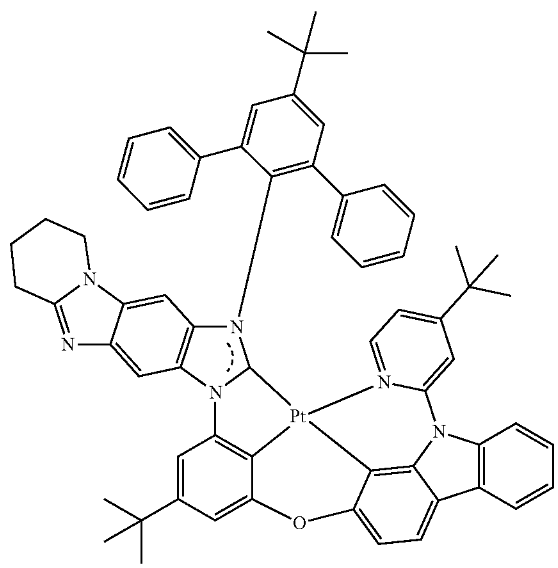

-continued
21
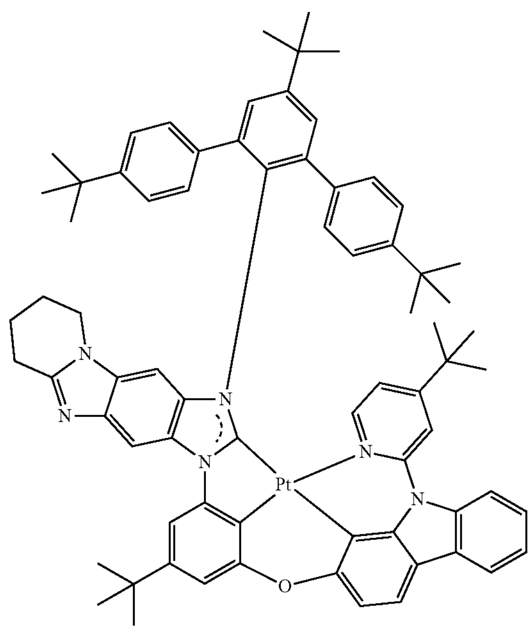
22
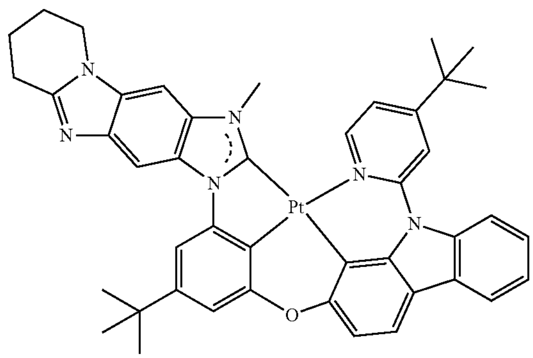
23
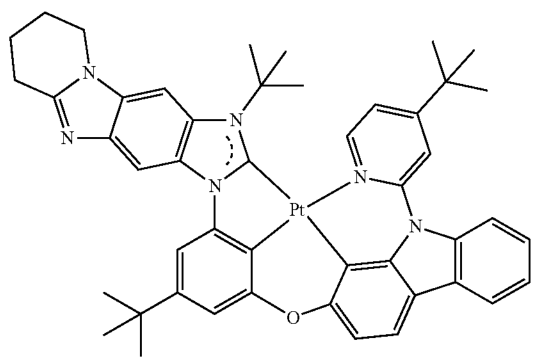
24
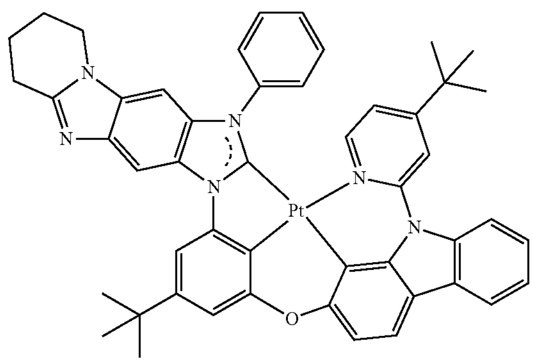
25
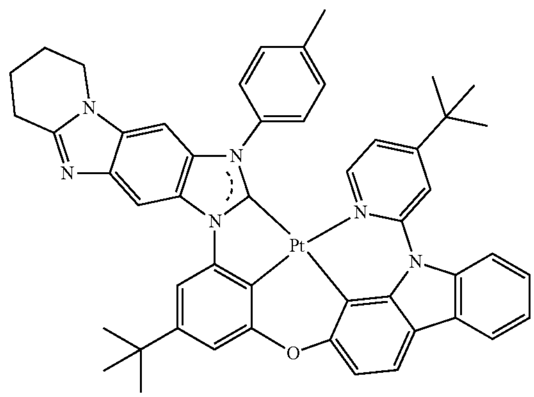
26
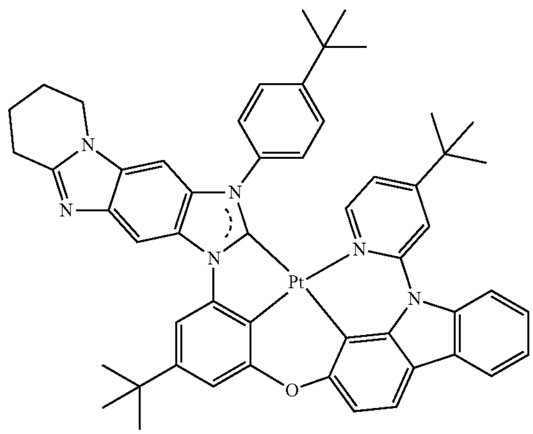

-continued
27
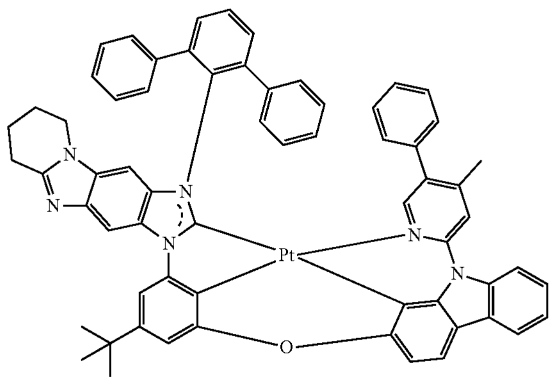
28
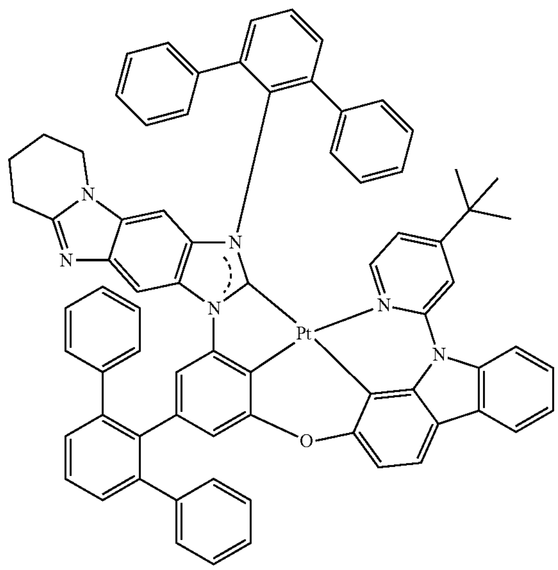
29
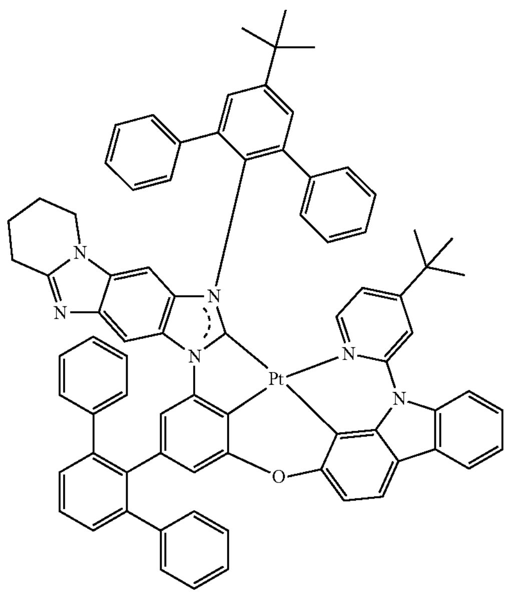
30
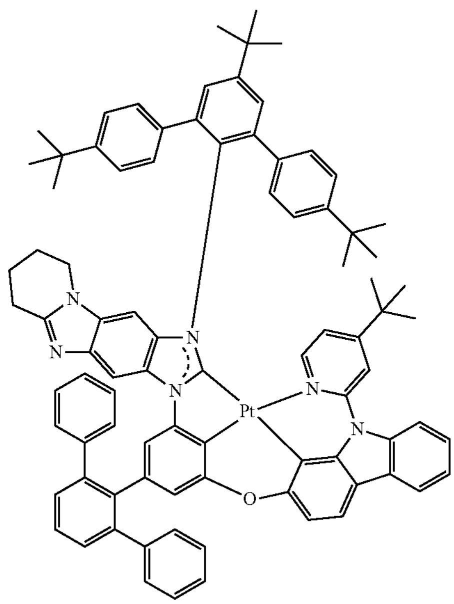
31
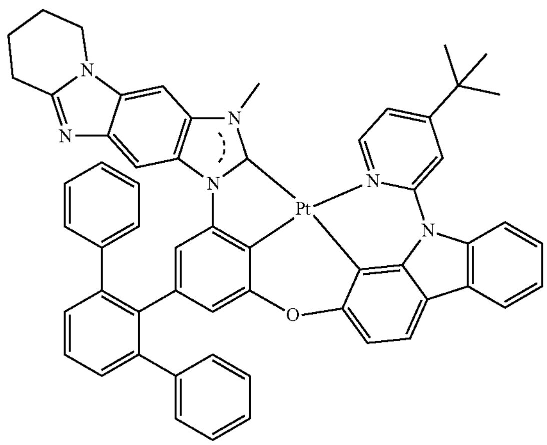
32
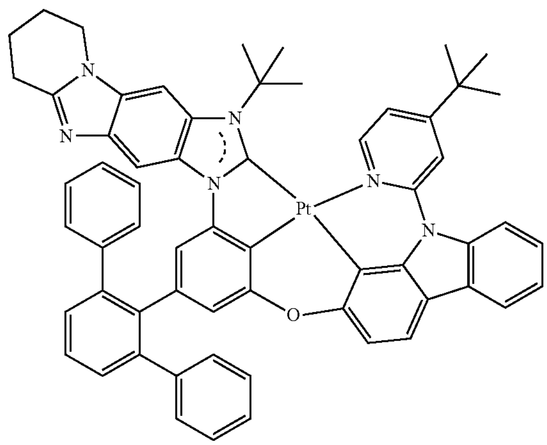

-continued
33
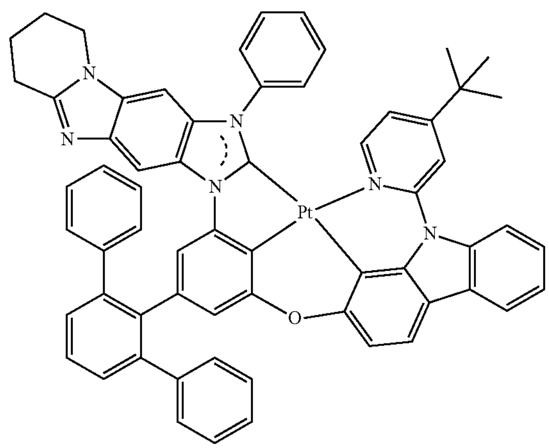
34
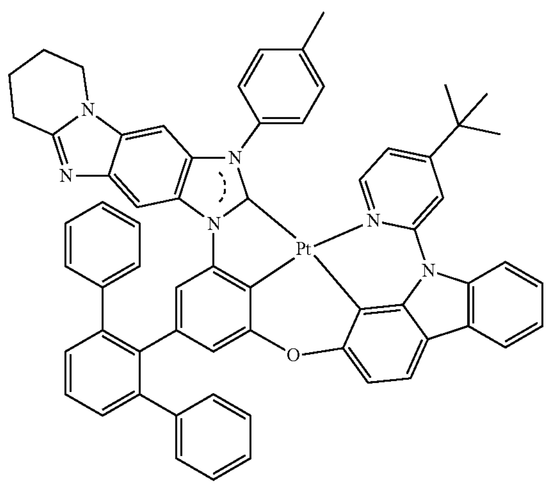
35
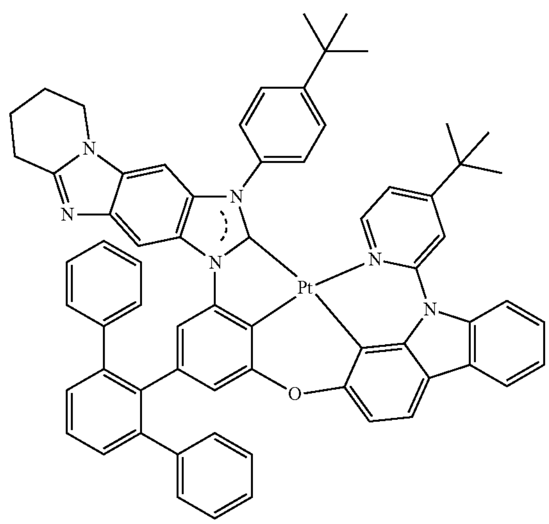
36
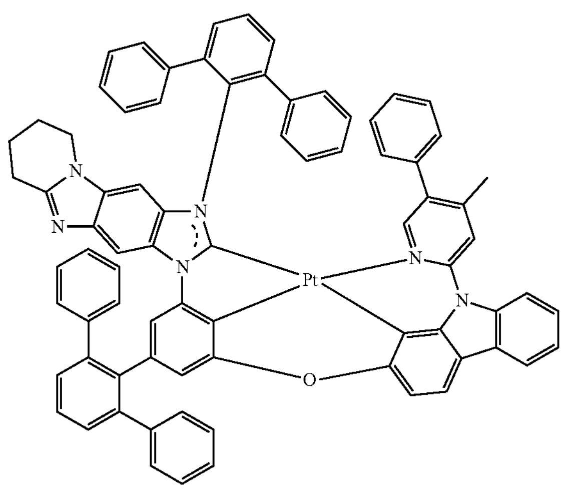
37
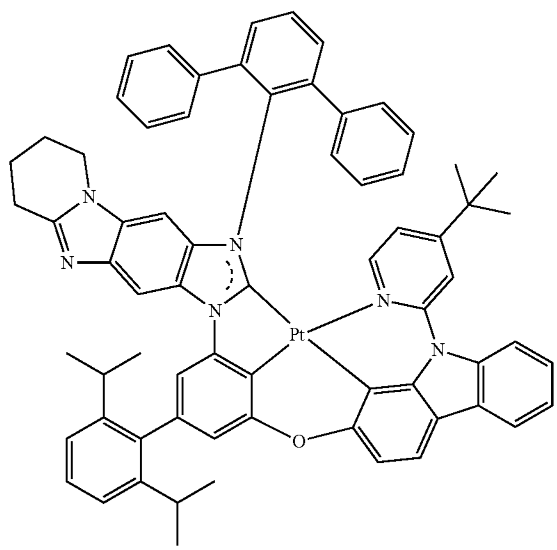
38
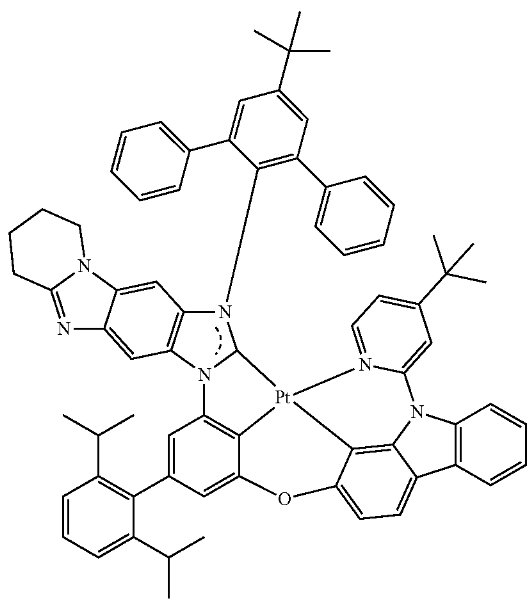

-continued
39
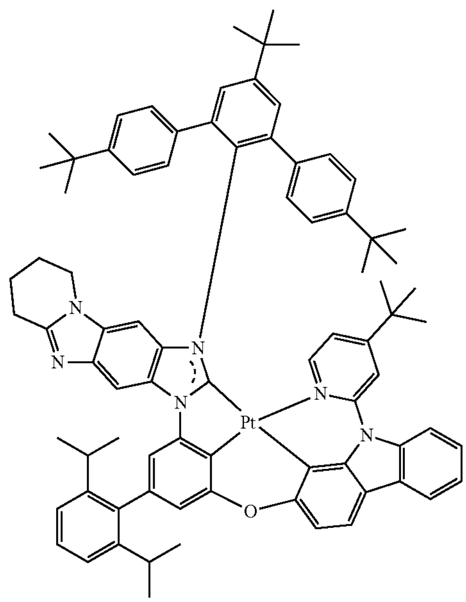
40
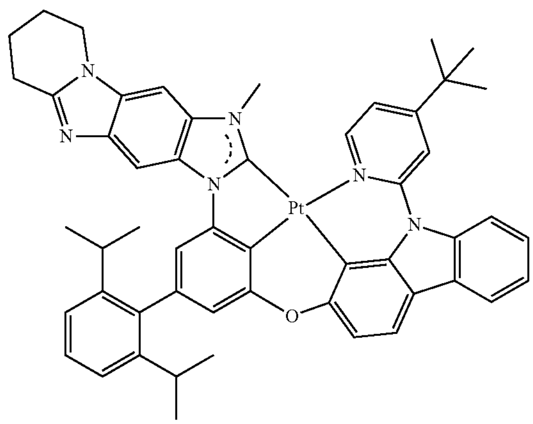
41
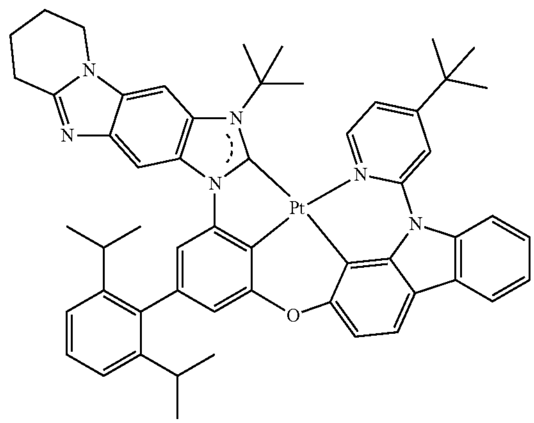
42
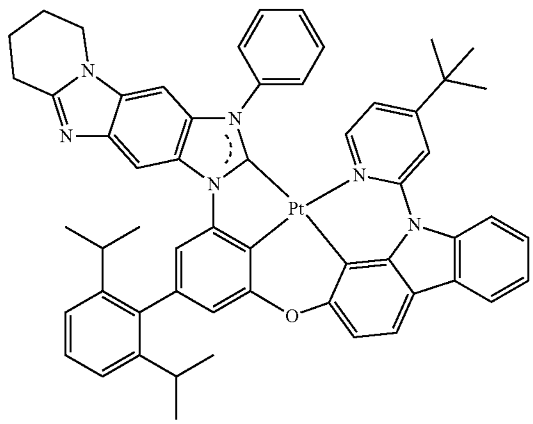
43
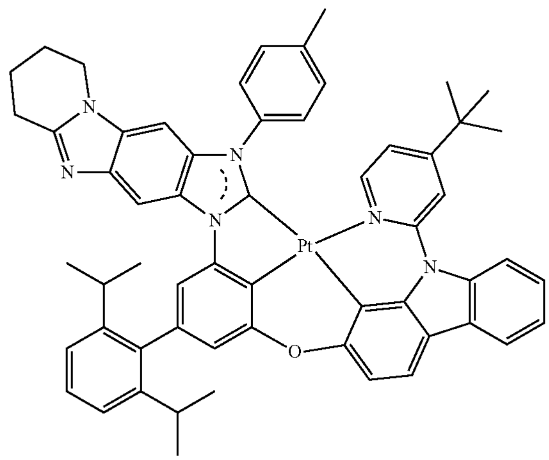
44
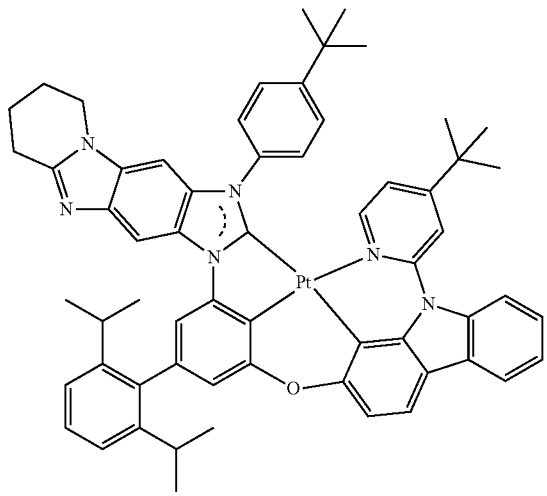

-continued
45
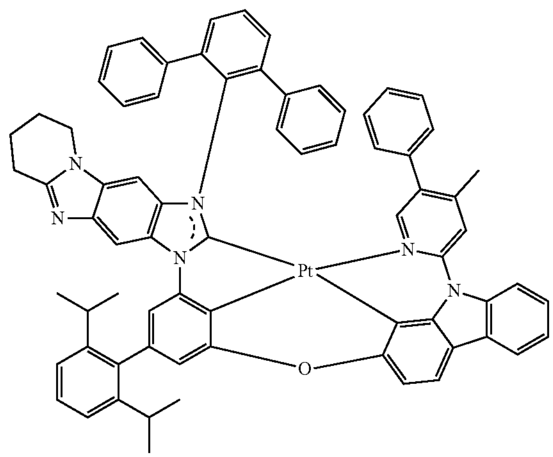
46
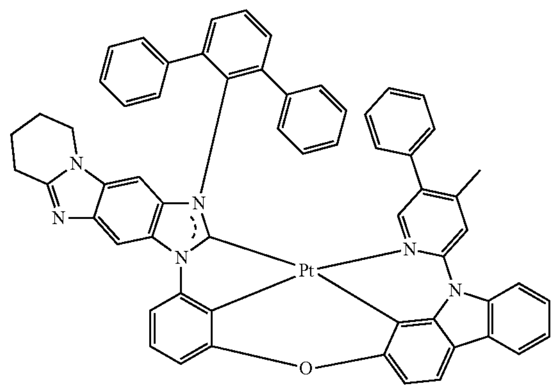
47
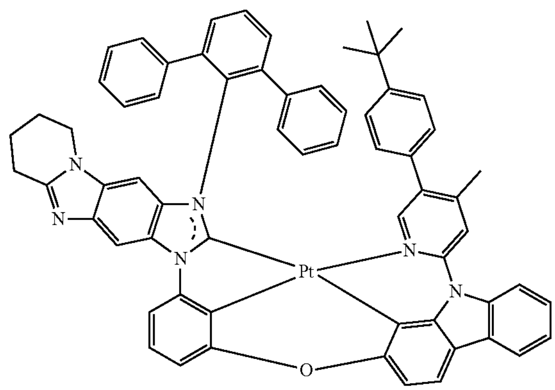
48
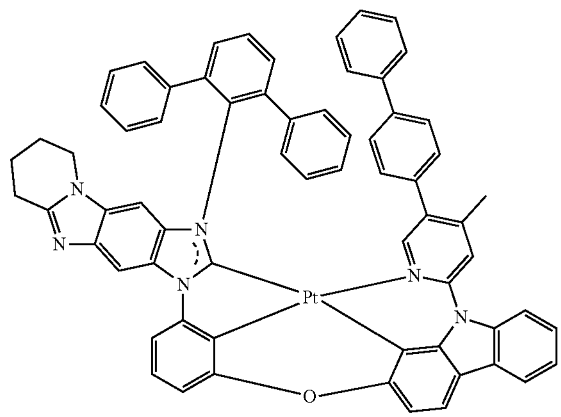
49
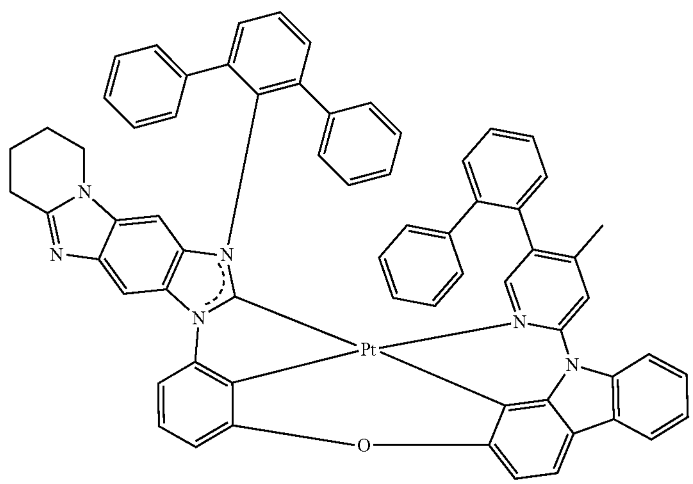

-continued
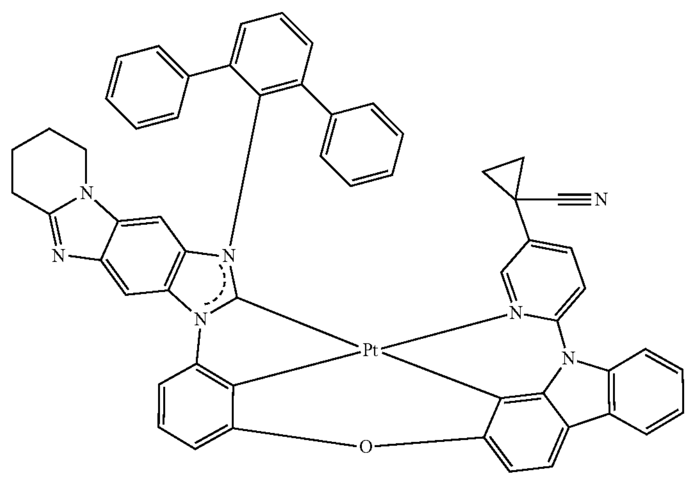
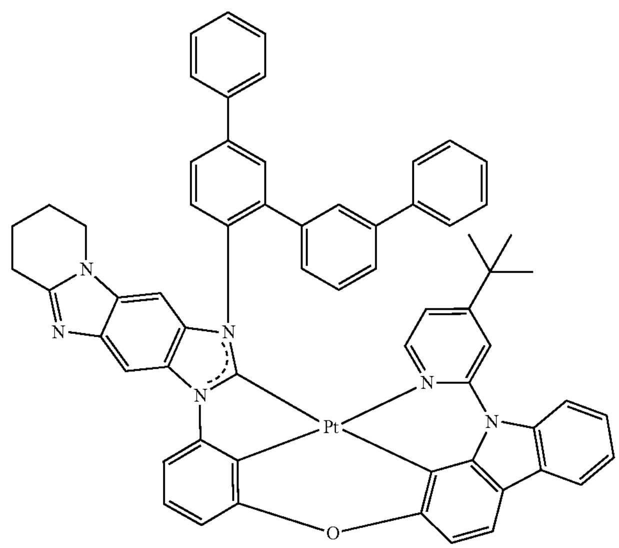
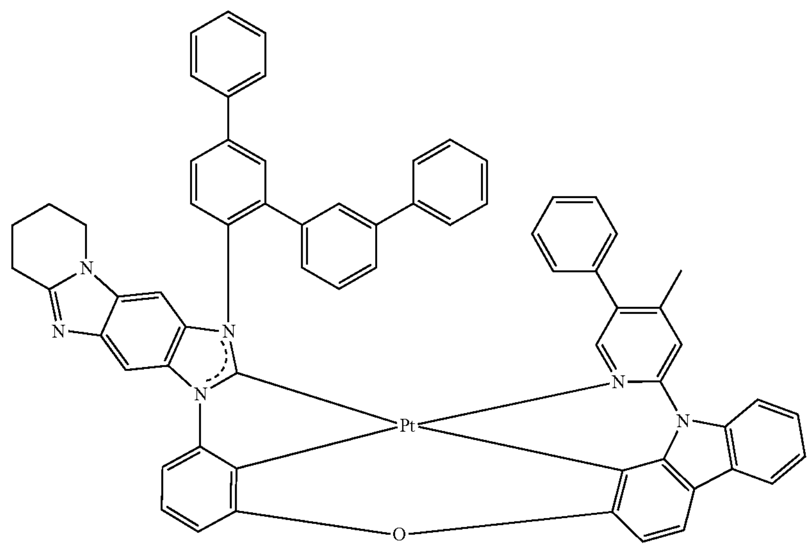

-continued
53
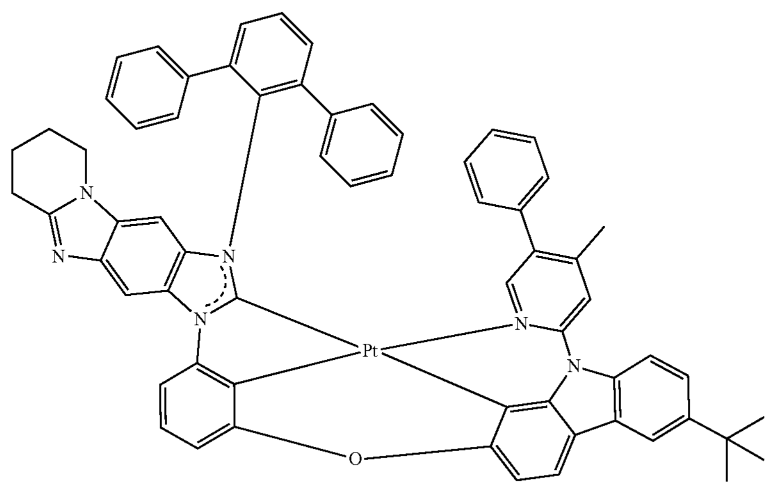
54
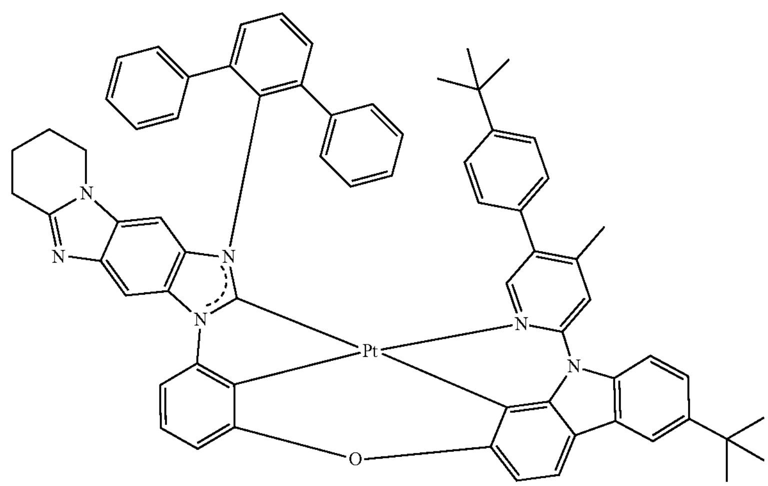
55
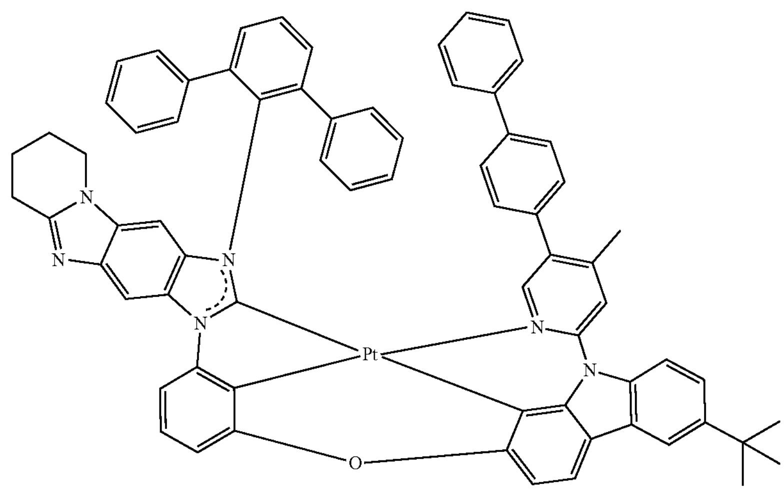

-continued
56
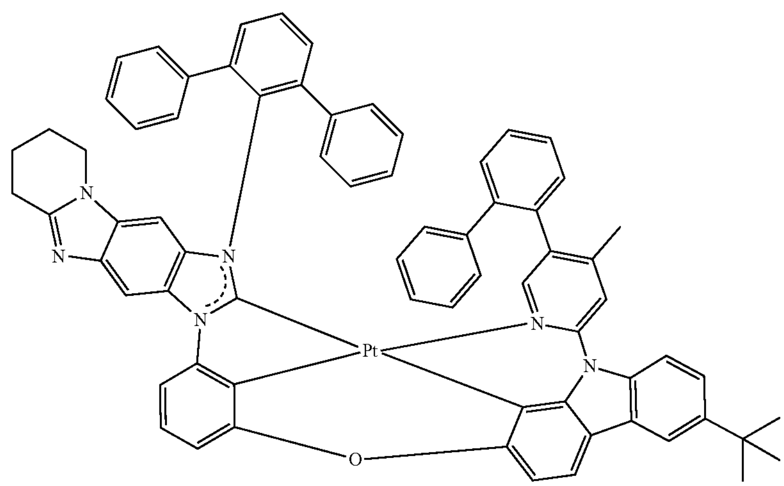
57
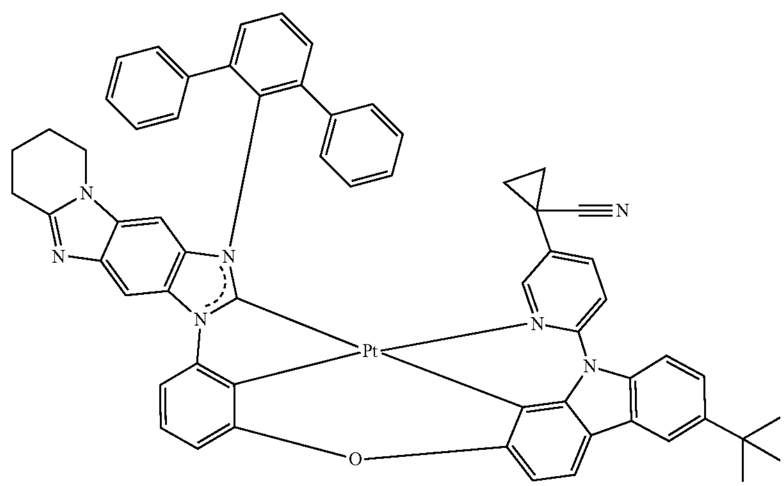
58
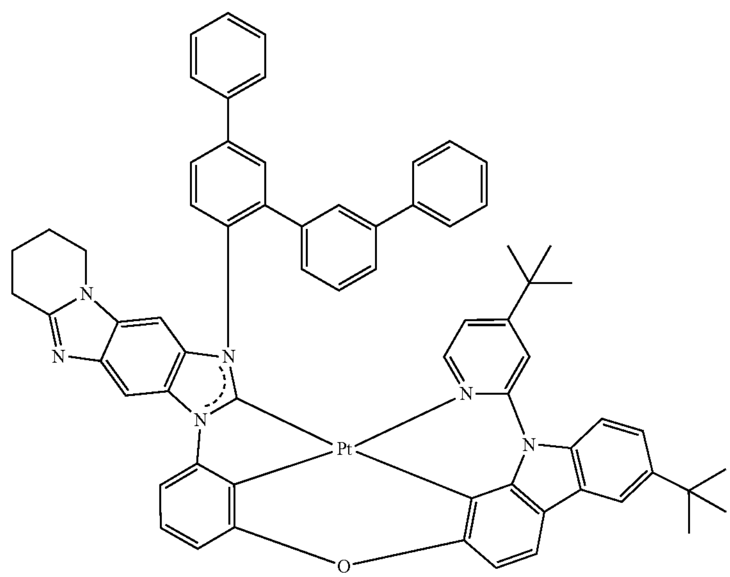

-continued
59
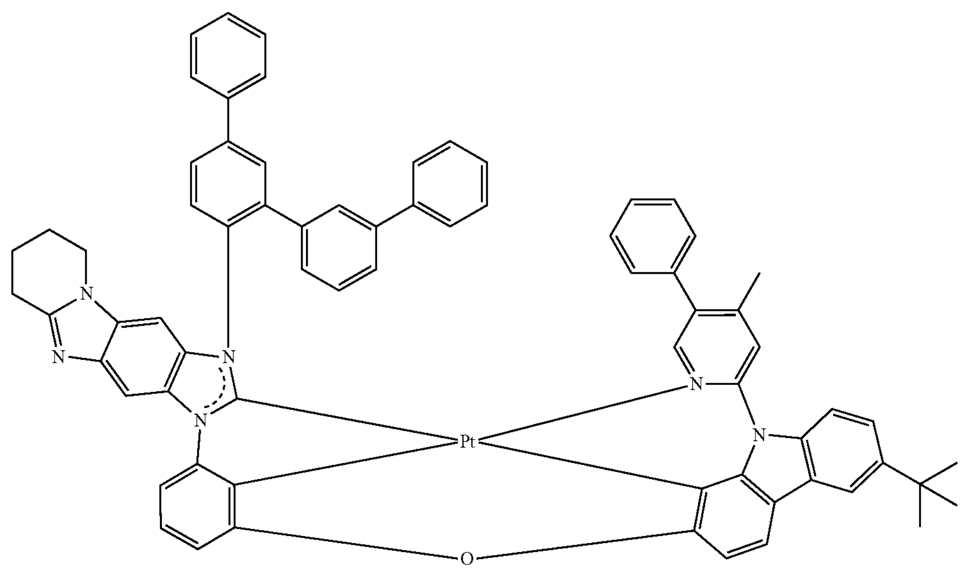
60
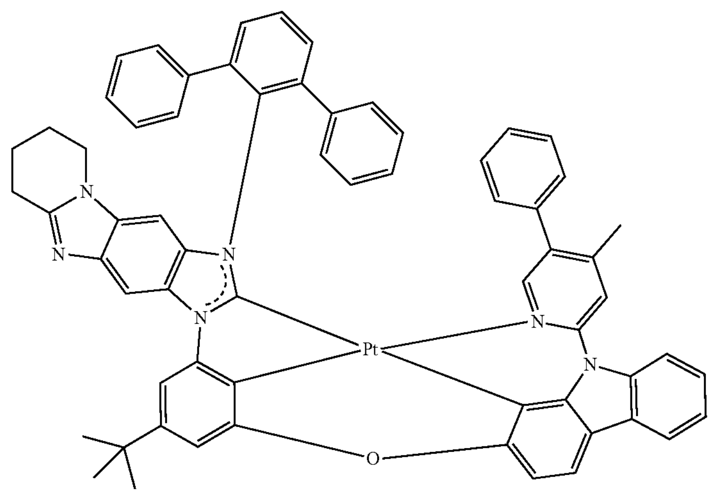
61
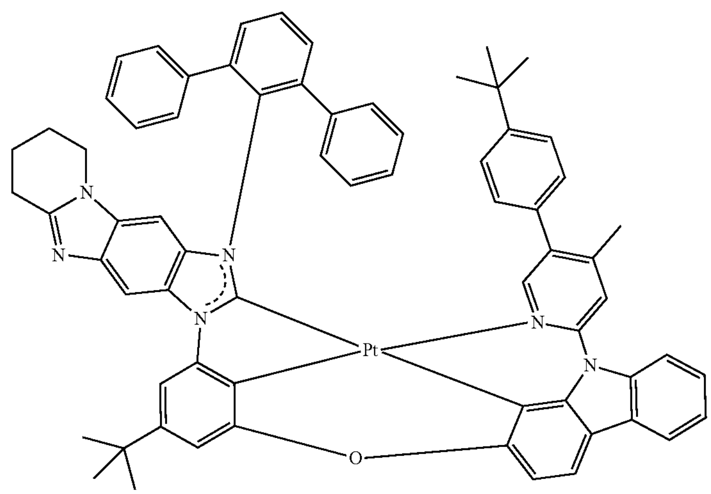

-continued
62
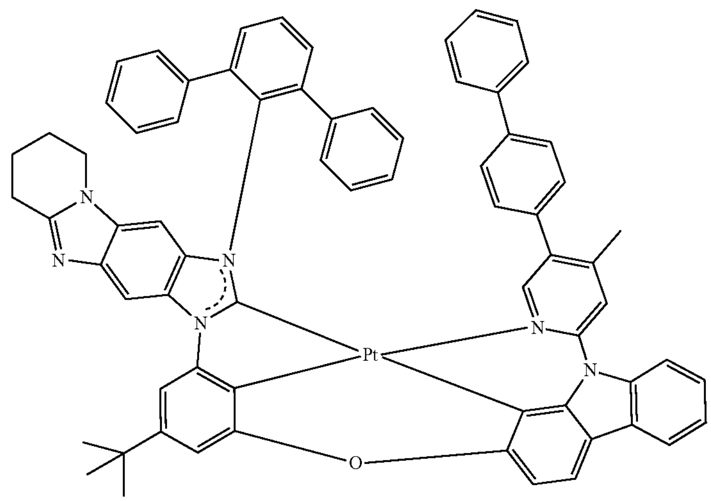
63
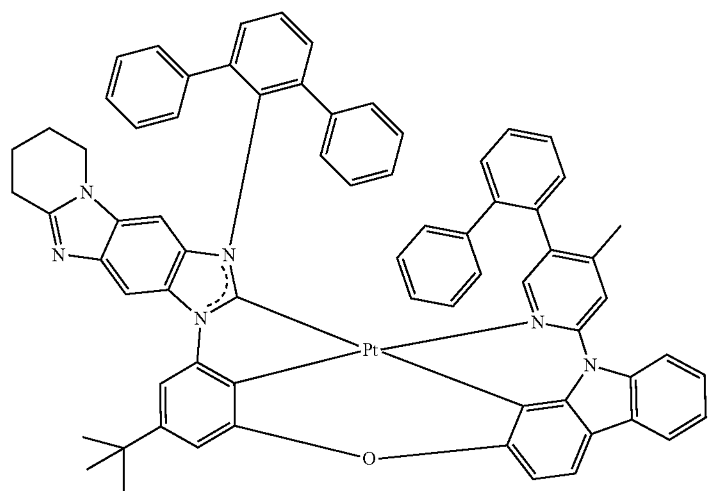
64
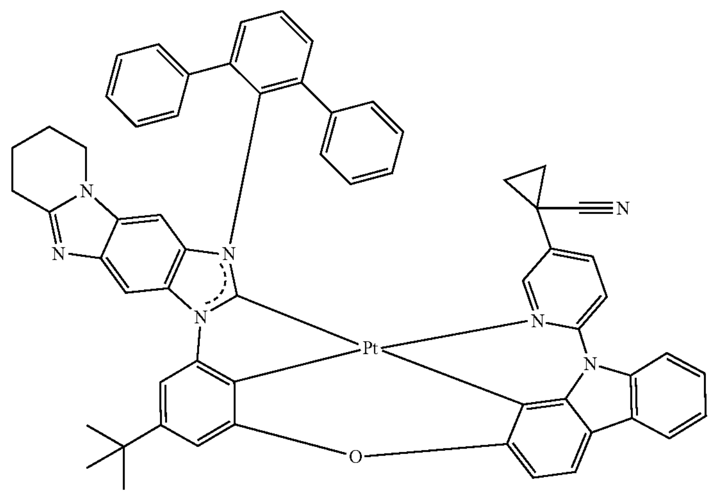

-continued
65
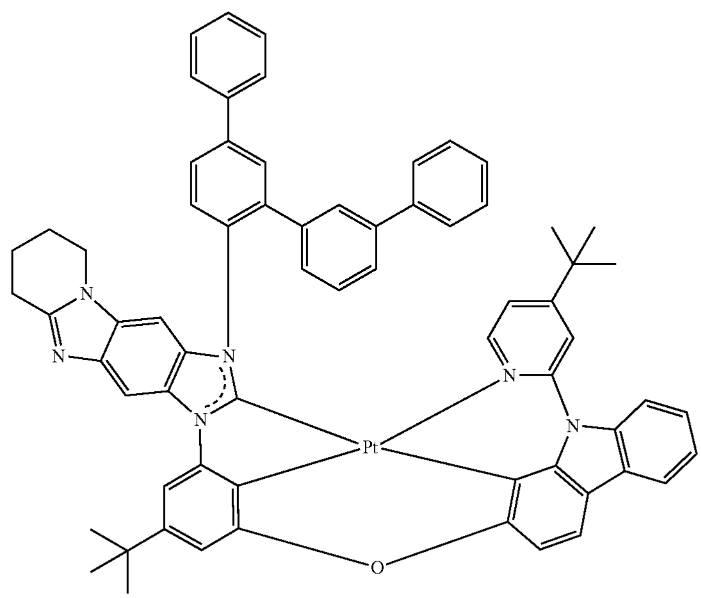
66
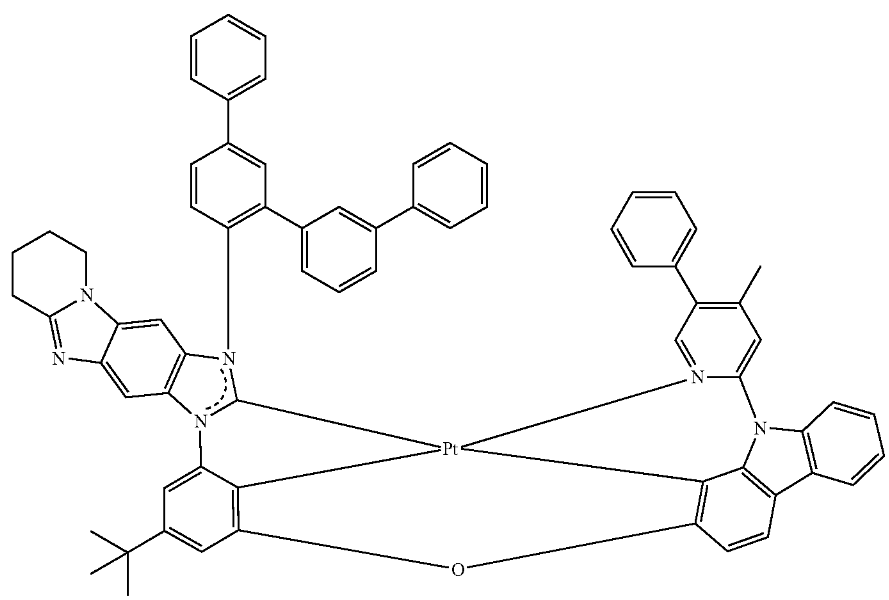

-continued
67
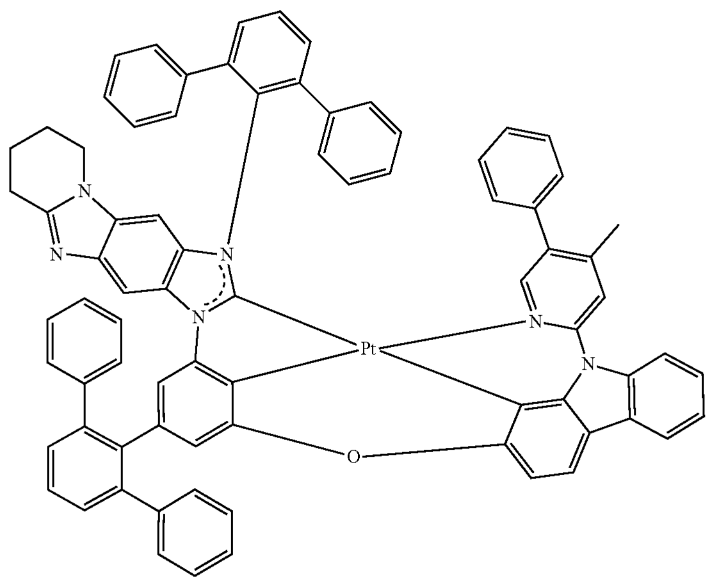
68
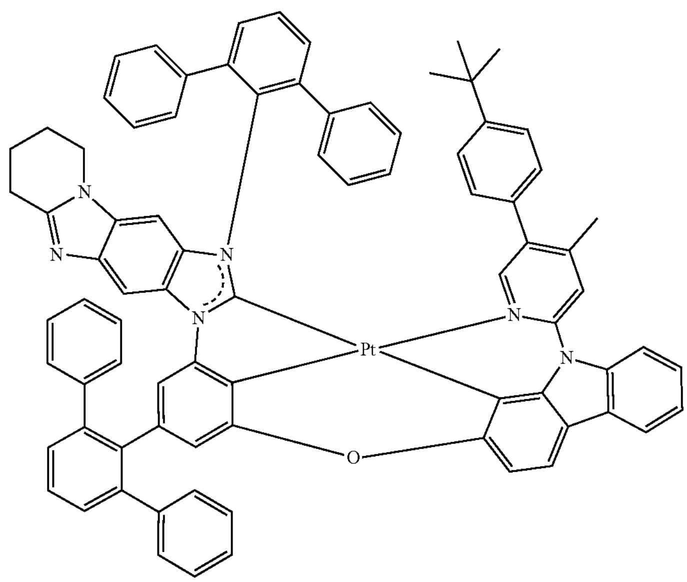

-continued
69
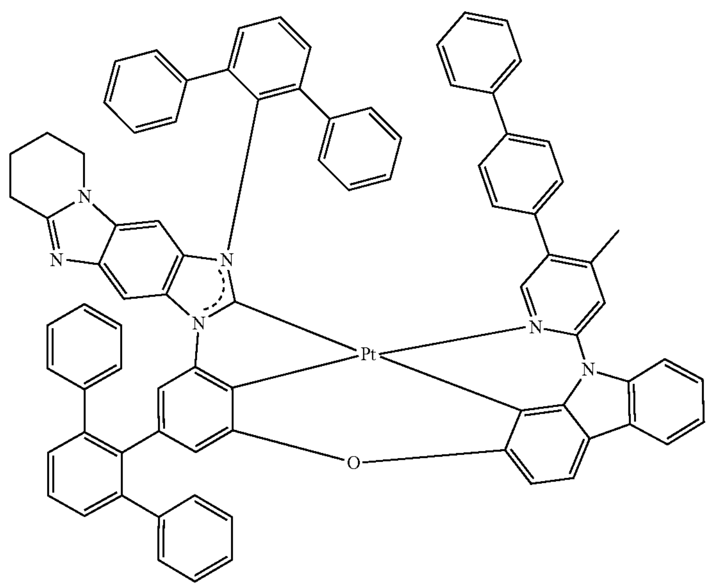
70
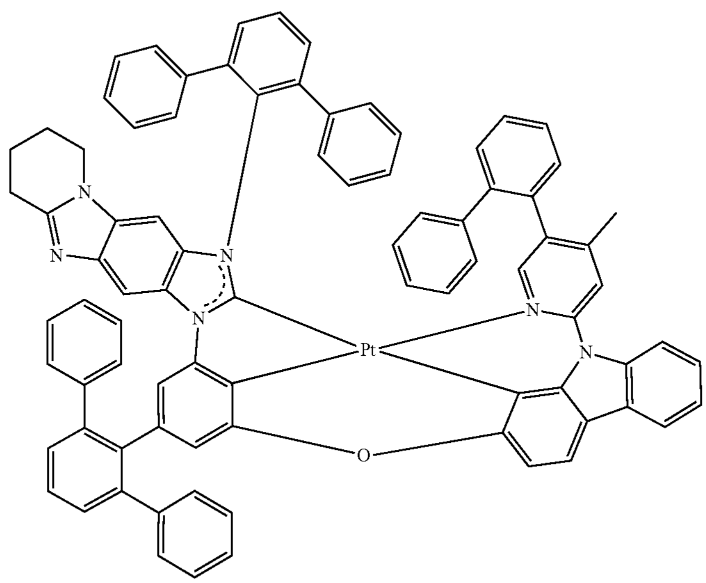

-continued
71
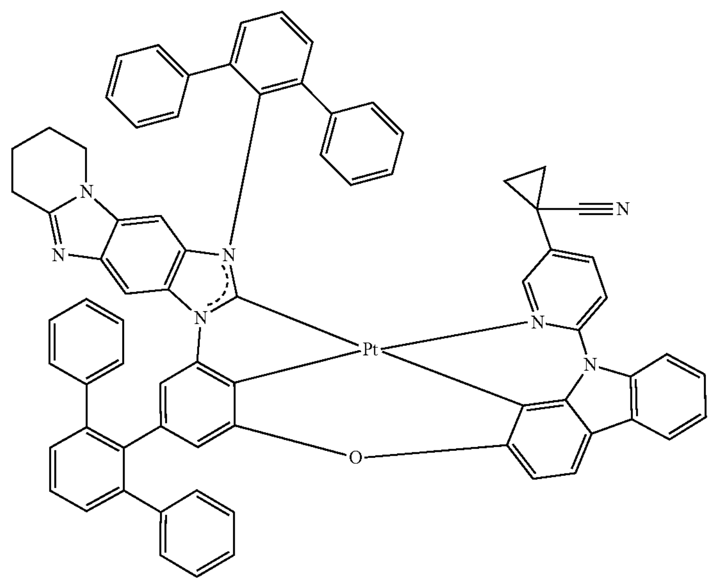
72
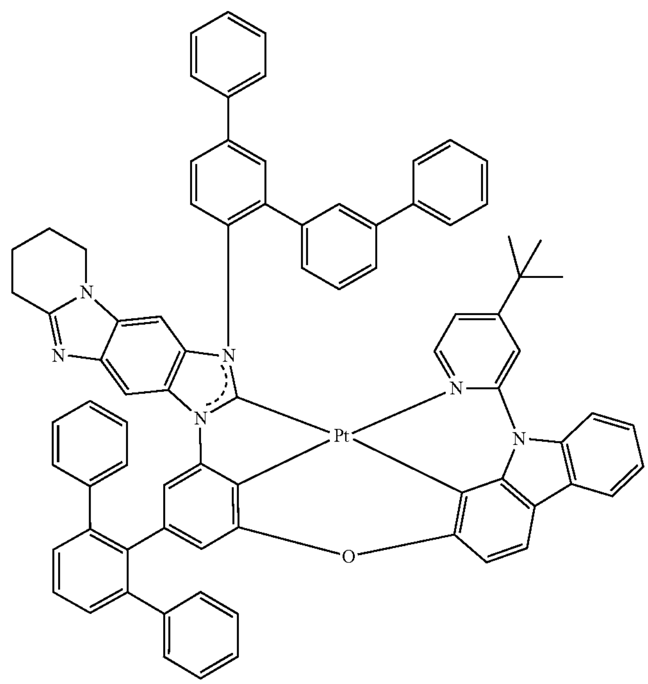

-continued
73
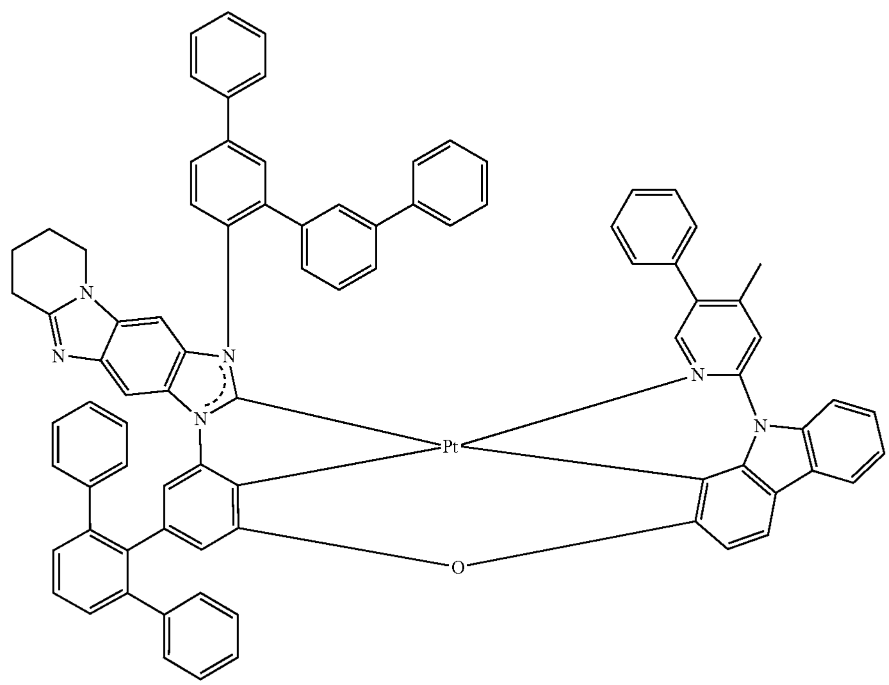
74
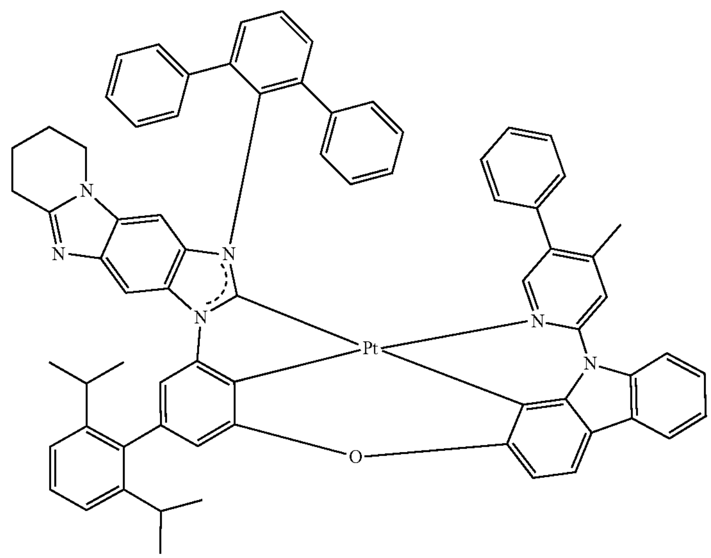

-continued
75
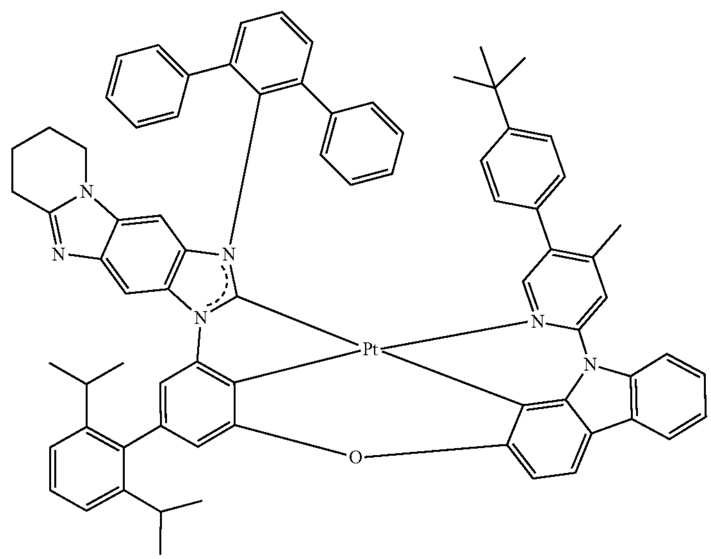
76
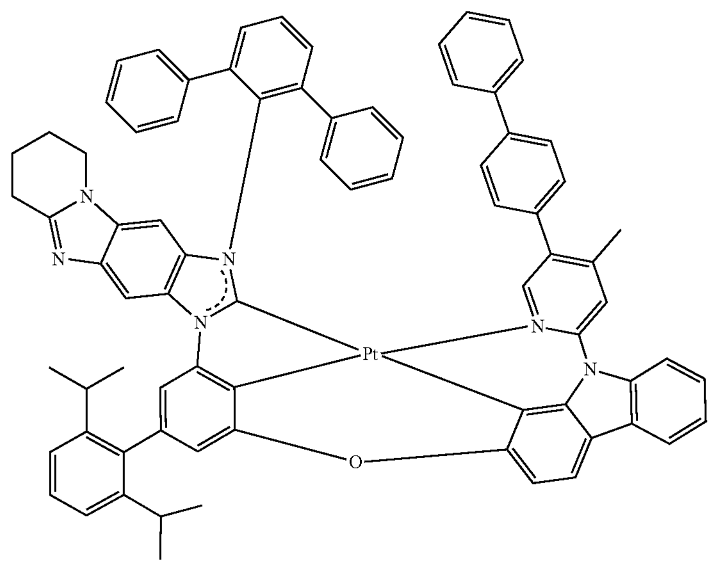
77
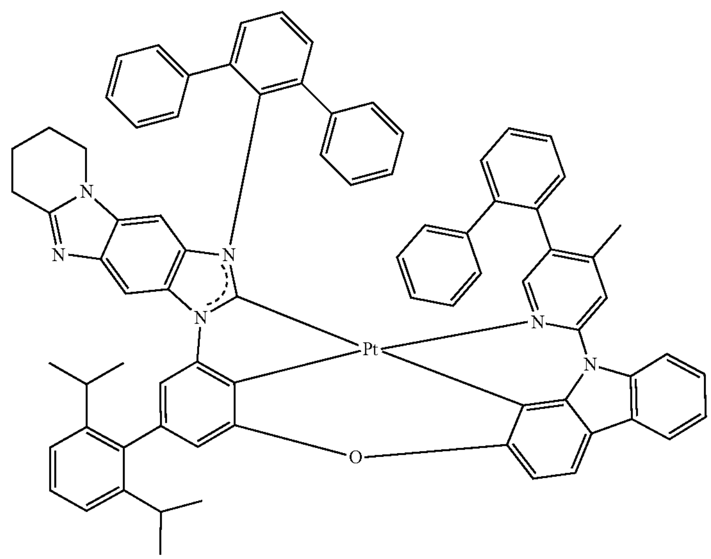

-continued
78
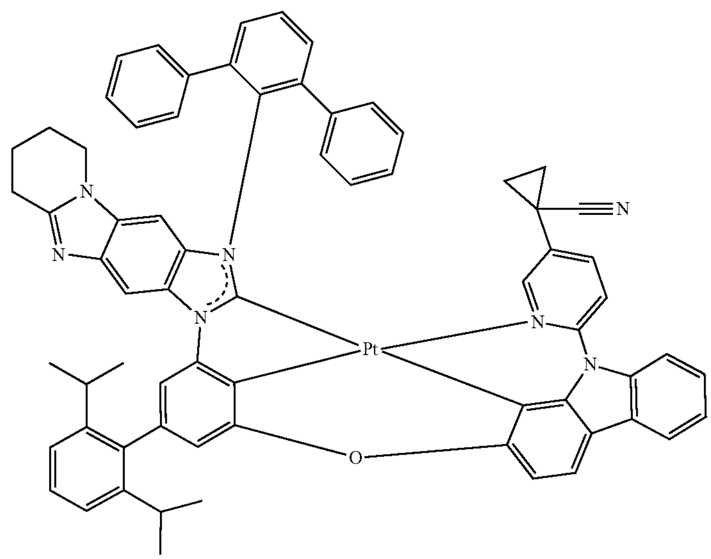
79
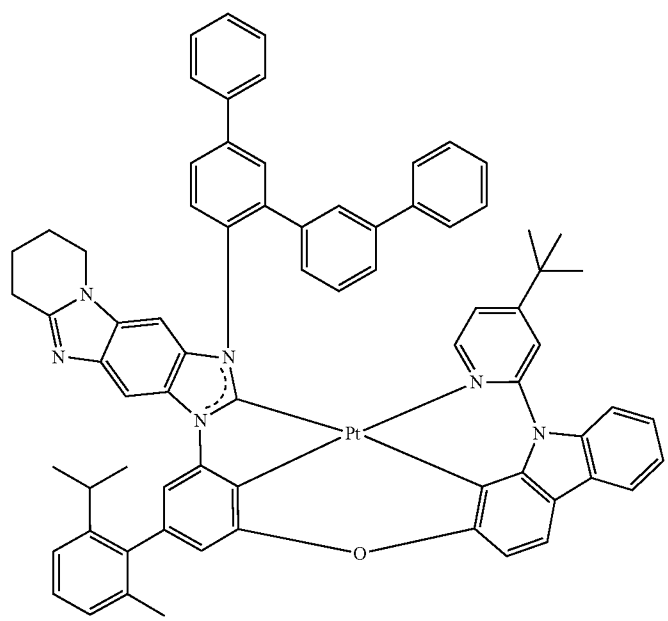

-continued
80
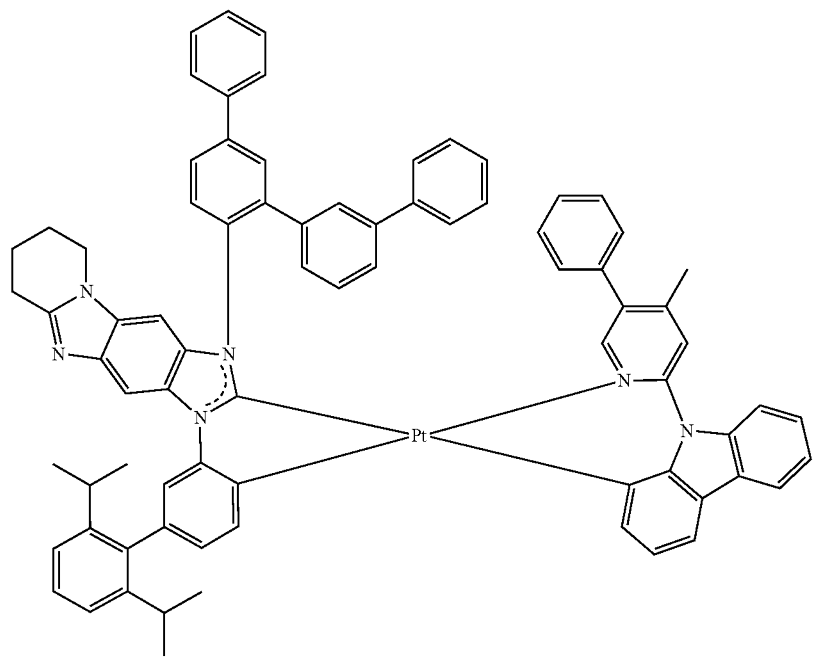
81
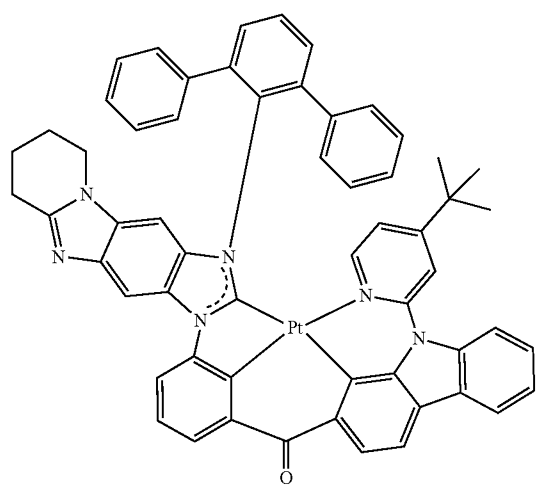
82
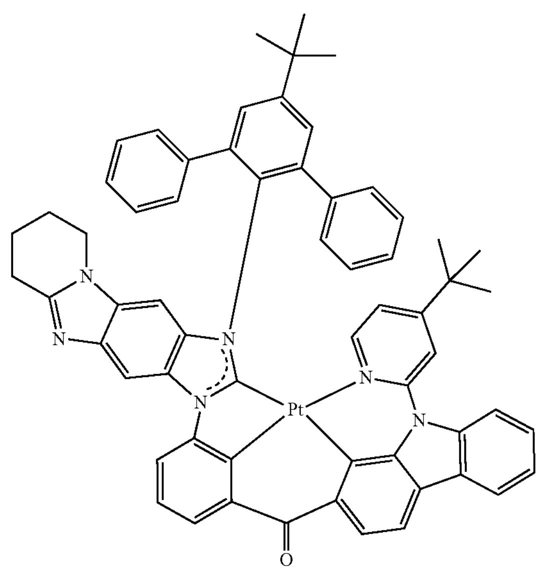

-continued
83
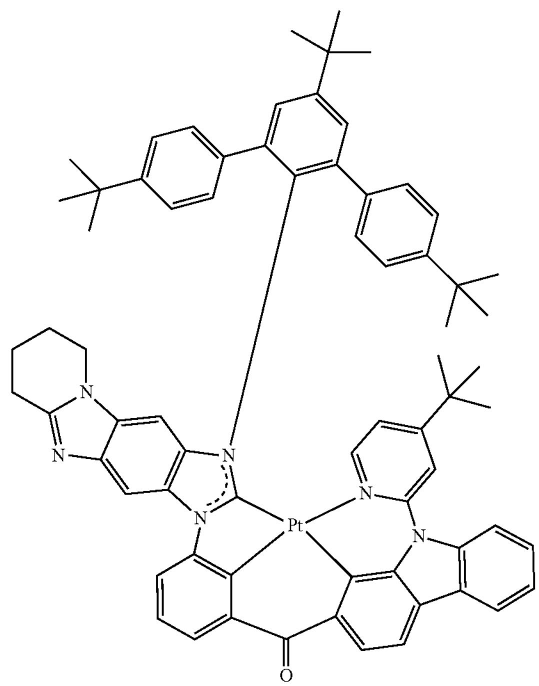
84
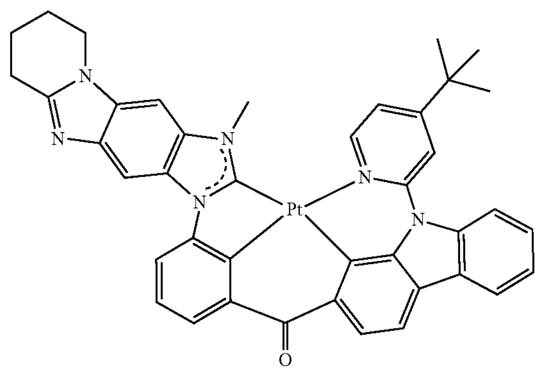
85
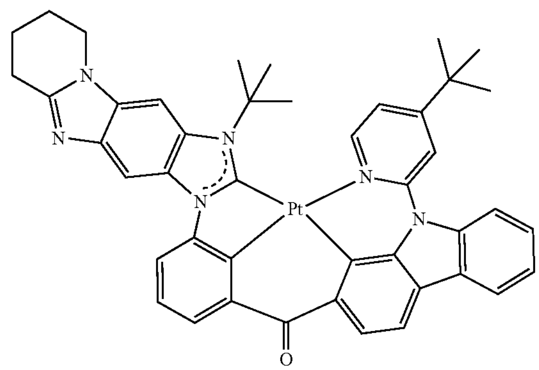
86
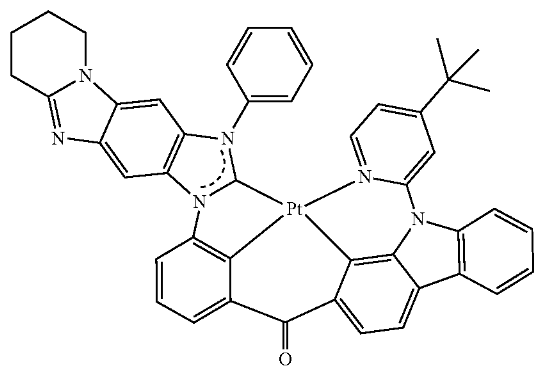
87
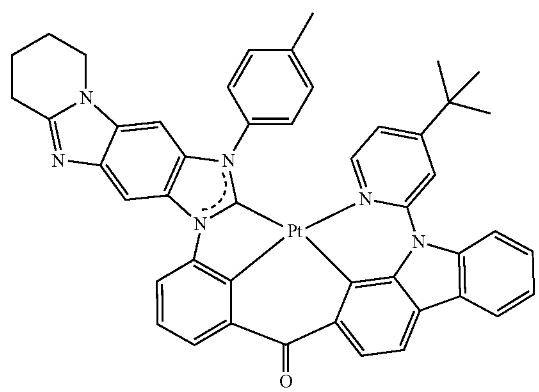
88
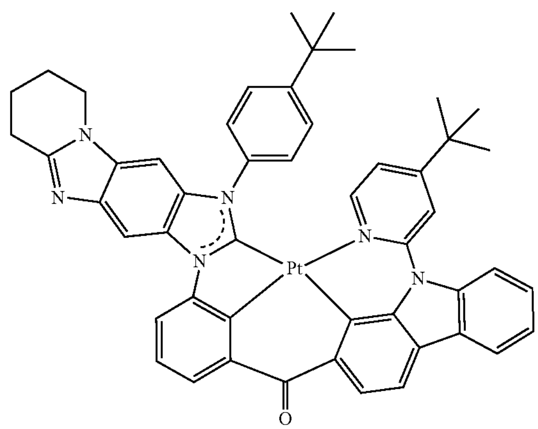

-continued
89
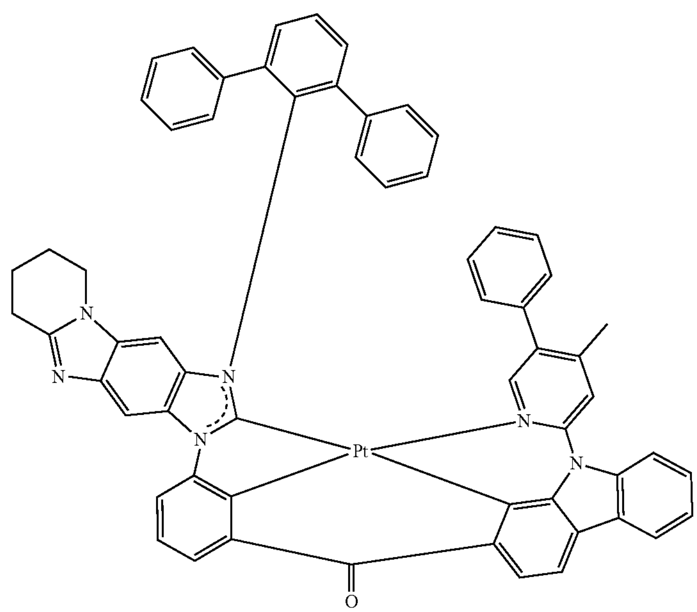
90
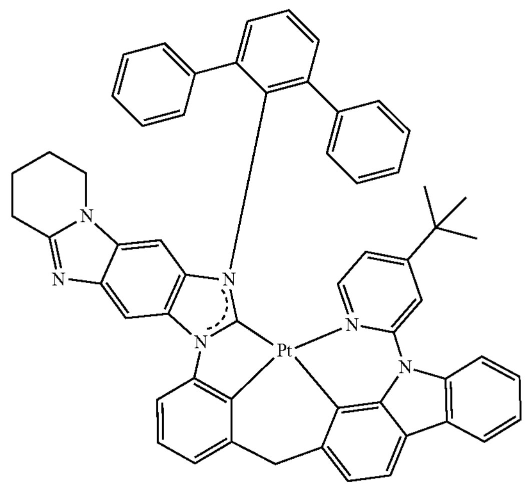
91
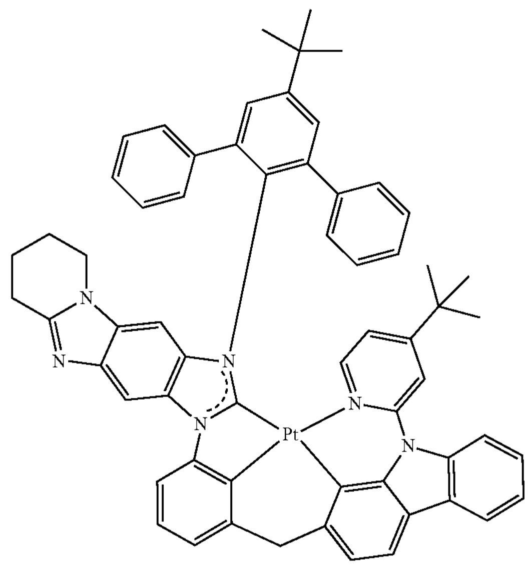

-continued
92
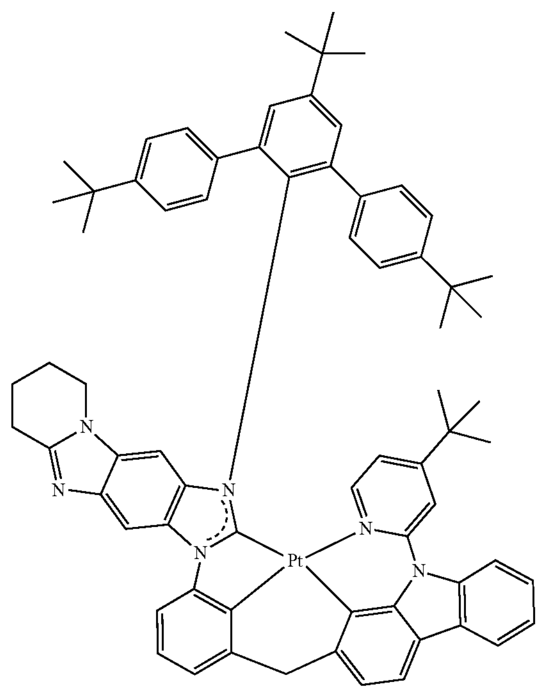
93
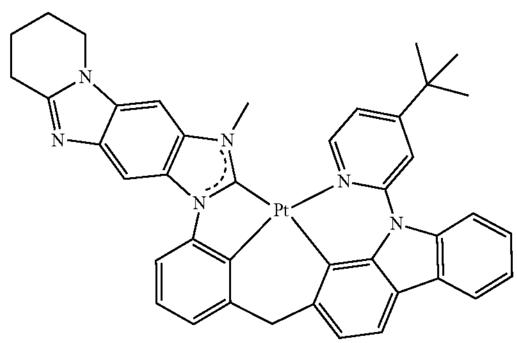
94
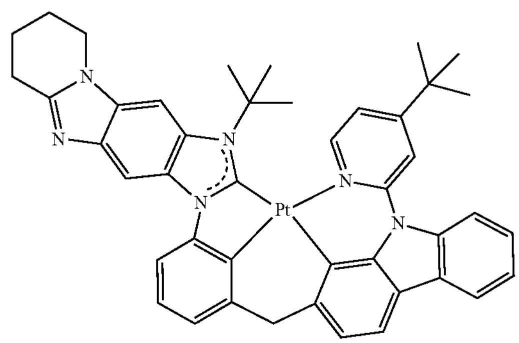
95
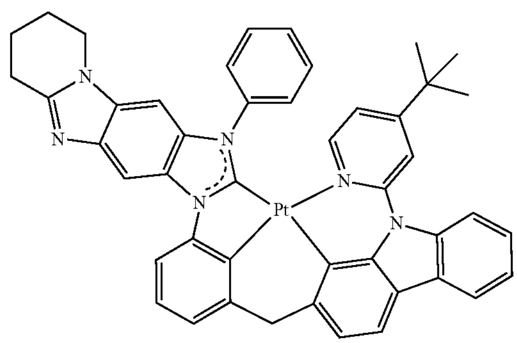
96
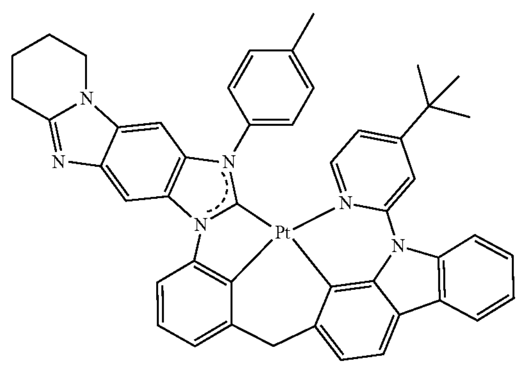
97
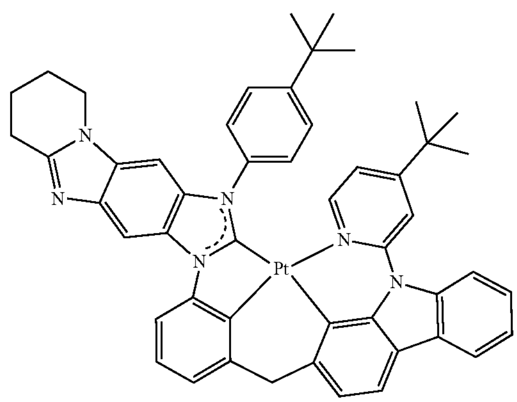

-continued

98

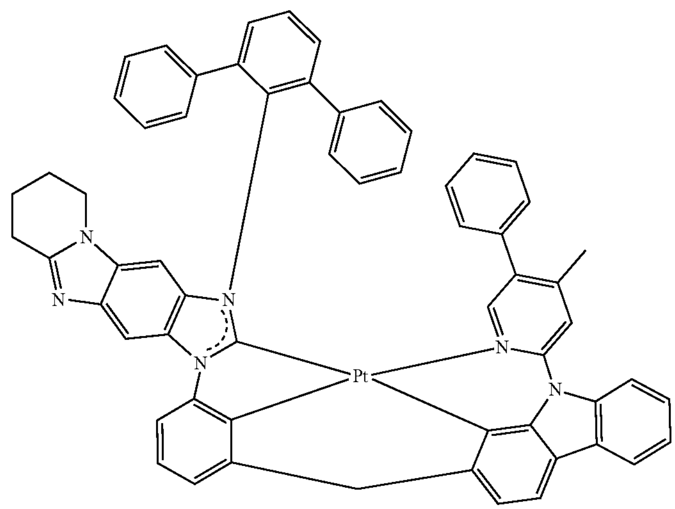

19. The organometallic compound of claim 12, wherein at least one of Condition 1 to Condition 3 is satisfied:

LUMO energy level of the organometallic compound >−1.50 eV    Condition 1

Absolute value of a difference between a LUMO energy level and a HOMO energy level of the organometallic compound ≥3.40 eV    Condition 2

Energy level of $^{3}$MC state of the first compound >0.45 kcal/mol, and    Condition 3 wherein the highest occupied molecular orbital (HOMO) energy level and the lowest unoccupied molecular orbital (LUMO) energy level of the first compound are each measured by differential pulse voltammetry, and the energy level of the triplet metal centered ($^{3}$MC) state of the organometallic compound is evaluated utilizing a density functional theory (DFT) method.

* * * * *